US012191887B2

(12) United States Patent
Wang et al.

(10) Patent No.: US 12,191,887 B2
(45) Date of Patent: *Jan. 7, 2025

(54) THREE-DIMENSIONAL DATA ENCODING METHOD, THREE-DIMENSIONAL DATA DECODING METHOD, THREE-DIMENSIONAL DATA ENCODING DEVICE, AND THREE-DIMENSIONAL DATA DECODING DEVICE

(71) Applicant: Panasonic Intellectual Property Corporation of America, Torrance, CA (US)

(72) Inventors: Chi Wang, Singapore (SG); Pongsak Lasang, Singapore (SG); Toshiyasu Sugio, Osaka (JP); Tatsuya Koyama, Kyoto (JP)

(73) Assignee: PANASONIC INTELLECTUAL PROPERTY CORPORATION OF AMERICA, Torrance, CA (US)

( * ) Notice: Subject to any disclaimer, the term of this patent is extended or adjusted under 35 U.S.C. 154(b) by 179 days.

This patent is subject to a terminal disclaimer.

(21) Appl. No.: 17/952,682

(22) Filed: Sep. 26, 2022

(65) Prior Publication Data
US 2023/0014086 A1 Jan. 19, 2023

Related U.S. Application Data

(63) Continuation of application No. 16/932,155, filed on Jul. 17, 2020, now Pat. No. 11,824,562, and a
(Continued)

(51) Int. Cl.
H03M 7/00 (2006.01)
G06F 8/41 (2018.01)
(Continued)

(52) U.S. Cl.
CPC ............ *H03M 13/658* (2013.01); *G06F 8/43* (2013.01); *G06F 40/146* (2020.01); *G06T 9/40* (2013.01);
(Continued)

(58) Field of Classification Search
CPC ........ H03M 7/30; H03M 7/40; H03M 7/6005; H03M 7/6011; H03M 7/70; H03M 7/3059;
(Continued)

(56) References Cited

U.S. PATENT DOCUMENTS 6,005,981 A * 12/1999 Ng .......................... H04N 19/96
382/253
6,381,280 B1 * 4/2002 Lynch .................. H04N 19/186
375/240.19
(Continued)

FOREIGN PATENT DOCUMENTS

| EP | 3 716 218 | 9/2020 |
| JP | 2005-235210 | 9/2005 |

(Continued)

OTHER PUBLICATIONS

Notice of Allowance issued Jul. 7, 2023 in U.S. Appl. No. 16/932,155.
(Continued)

*Primary Examiner* — Linh V Nguyen
(74) *Attorney, Agent, or Firm* — Wenderoth, Lind & Ponack, L.L.P.

(57) ABSTRACT

A three-dimensional data encoding method includes: generating an N-ary tree structure of three-dimensional points included in three-dimensional data, where N is an integer greater than or equal to 2; generating first encoded data by encoding a first branch using a first encoding process, the first branch having, as a root, a first node included in a first layer that is one of layers included in the N-ary tree
(Continued)

structure; generating second encoded data by encoding a second branch using a second encoding process different from the first encoding process, the second branch having, as a root, a second node included in the first layer and different from the first node; and generating a bitstream including the first encoded data and the second encoded data.

14 Claims, 77 Drawing Sheets

Related U.S. Application Data continuation of application No. PCT/JP2019/001143, filed on Jan. 16, 2019.

(60) Provisional application No. 62/619,313, filed on Jan. 19, 2018.

(51) Int. Cl.
*G06F 40/146* (2020.01)
*G06T 9/40* (2006.01)
*G06T 15/08* (2011.01)
*H03M 7/30* (2006.01)
*H03M 7/40* (2006.01)
*H03M 13/00* (2006.01)

(52) U.S. Cl.
CPC .......... *G06T 15/08* (2013.01); *H03M 7/3059* (2013.01); *H03M 7/40* (2013.01)

(58) Field of Classification Search
CPC ............. H03M 7/3071; H03M 7/3077; H03M 7/3079; H03M 7/4006; H03M 7/4018; H03M 7/405; H04N 19/12; H04N 19/124; H04N 19/172; H04N 19/18; H04N 19/30; H04N 19/36; H04N 19/46; H04N 19/60; H04N 19/96; G06T 9/40; G06T 17/005; G06T 9/001; G06T 17/00; G06T 17/20; G06T 17/205; G06T 9/00
USPC .................................................. 341/51, 107
See application file for complete search history.

(56) References Cited

U.S. PATENT DOCUMENTS

| | | | |
|---|---|---|---|
| 6,727,803 | B2 | 4/2004 | Hulvey |
| 6,774,766 | B1 * | 8/2004 | Moyer ............... G06K 7/10049 340/8.1 |
| 9,300,957 | B2 * | 3/2016 | Cheon .................... H04N 19/96 |
| 9,807,427 | B2 * | 10/2017 | Helle .................... H04N 19/513 |
| 10,200,719 | B2 | 2/2019 | Zhang et al. |
| 10,248,966 | B2 | 4/2019 | Helle et al. |
| 10,848,767 | B2 | 11/2020 | Winken |
| 10,861,196 | B2 * | 12/2020 | Mammou ............ H04N 19/593 |
| 11,824,562 | B2 * | 11/2023 | Wang .................. H03M 7/3059 |
| 2004/0150639 | A1 * | 8/2004 | Park ........................ G06T 9/001 345/419 |
| 2005/0180340 | A1 | 8/2005 | Lee |
| 2005/0195191 | A1 | 9/2005 | Lee et al. |
| 2011/0299788 | A1 | 12/2011 | Suzuki et al. |
| 2012/0170648 | A1 * | 7/2012 | Chen ...................... H04N 19/70 375/240.03 |
| 2014/0210652 | A1 * | 7/2014 | Bartnik ................... H03M 7/40 341/67 |
| 2014/0375638 | A1 | 12/2014 | Tomaru et al. |
| 2016/0029040 | A1 * | 1/2016 | Deng .................. H04N 19/597 375/240.16 |
| 2016/0071313 | A1 | 3/2016 | Laine |
| 2017/0347122 | A1 * | 11/2017 | Chou ........................ G06T 9/00 |
| 2018/0278956 | A1 | 9/2018 | Toma et al. |

FOREIGN PATENT DOCUMENTS

| | | |
|---|---|---|
| JP | 2017-126890 | 7/2017 |
| WO | 2014/020663 | 2/2014 |
| WO | 2017/104115 | 6/2017 |

OTHER PUBLICATIONS

International Search Report (ISR) issued on Apr. 2, 2019 in International (PCT) Application No. PCT/JP2019/001143.
Extended European Search Report dated Feb. 12, 2021 in corresponding European Patent Application No. 19741387.5.
Song et al., "Progressive Compression of PointTexture Images", Proceedings of SPIE, IEEE, vol. 5308, No. 1, Jan. 2004, pp. 1159-1168.

* cited by examiner

FIRST SPC

GOS INDEX NUMBER (ENCODING ORDER)

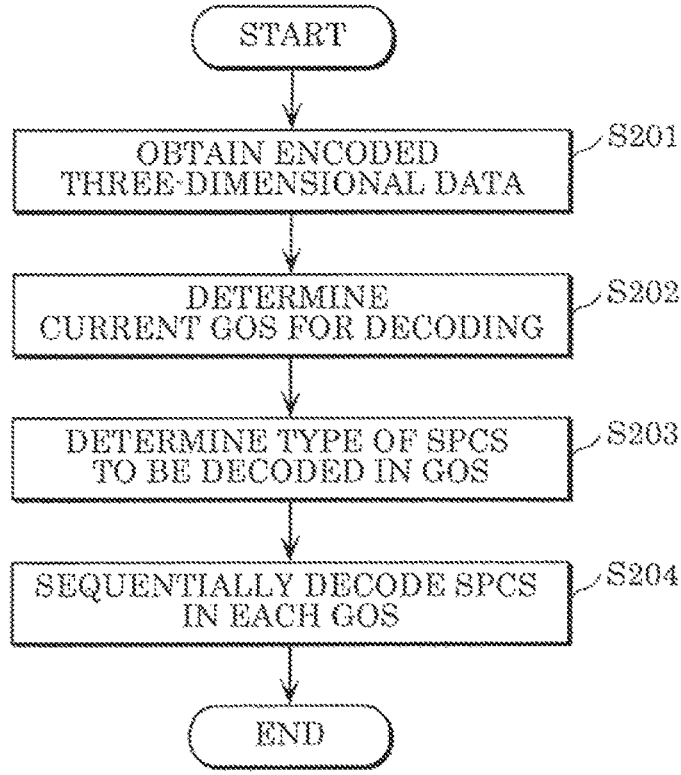

FIG. 41

A  BIT SEQUENCE WHEN SCANNING NODES AND LEAVES BREADTH-FIRST : 10010000 10000001 00000010 leaf1 leaf2 leaf3

B  BIT SEQUENCE WHEN SCANNING NODES AND LEAVES DEPTH-FIRST : 10010000 10000001 leaf1 leaf2 00000010 leaf3

FIG. 46

```
space_header() {
    ...
    for (i=0; i<MaxRefSpc_10;i++) {
        RT_flag_10[i]
        if (RT_flag_10[i]) {
            R_10[i]
            T_10[i]
        }
    }
    ...
    for (i=0; i<MaxRefSpc_11;i++) {
        RT_flag_11[i]
        if (RT_flag_11[i]) {
            R_11[i]
            T_11[i]
        }
    }
    ...
}
```

FIG. 56

```
sub_map_header() {
...
NumOfPoint
sub_coordinate_x
sub_coordinate_y
sub_coordinate_z
...
sub_map_data()
...
} sub_map_data() {
...
for (i=0; i<NumOfPoint; i++) {
 diff_x[i]
 diff_y[i]
 diff_z[i]
}
...
}
```

FIG. 58

```
sub_map_header() {
...
coding_type
If (coding_type == non_octree)
{
 NumOfPoint
 sub_coordinate_x
 sub_coordinate_y
 sub_coordinate_z
}
else if (coding_type==octree) {
{
  octree_info()
}
...
sub_map_data()
...
} sub_map_data() {
...
if (coding_type==non_octree)
{
 for (i=0; i<NumOfPoint; i++) {
  diff_x[i]
  diff_y[i]
  diff_z[i]
 }
 else (coding_type==octree) {
  octree_data()
 }
 ...
}
```

SUBCOORDINATES

SUBCOORDINATES

SUBCOORDINATES

SUBCOORDINATES

FIG. 68

```
volume_header() {
...
coding_type
If (coding_type == non_octree)
{
 NumOfPoint
 sub_coordinate_x
 sub_coordinate_y
 sub_coordinate_z
}
else if (coding_type==octree) {
{
 octree_info()
}
...
volume_data()
...
} volume_data() {
...
if (coding_type==non_octree)
{
 for (i=0; i<NumOfPoint; i++) {
  diff_x[i]
  diff_y[i]
  diff_z[i]
 }
 else (coding_type==octree) {
  octree_data()
 }
 ...
}
```

FIG. 83

```
node(depth, index) {
  . . .
  isleaf
  if (isleaf) {  //leaf
    point_flag
  }
  else {  //node
    coding_type
    if (coding_type == location coding)
      numPoint
      for (i=0; i<numPoint; i++) {
        num_idx[i]
        for (j=0; j<num_idx[i]; j++) {
          idx[i][j]
        }
        . . .
      }
    else if (coding_type==occupancy coding) {
      occupancy_code
      for (i=0; i<8; i++) {
        if (occupancy_code&(0x01<<i) == 1) {
          node(depth+1, i)
          . . .
        }
      }
    }
  }
}
```

DENSE BRANCH

SPARSE BRANCH

FIG. 101
```
pc_header() {
...
num_sub_pc
for (i=0; i<num_sub_pc; i++)
    numPoint[i]
    coding_type[i]
    data_sub_cloud[i]()
}
data_sub_cloud() {
if (coding_type == 00)
{
    coding_type_00_data
}
else if (coding_type == 01)
{
    coding_type_01_data
}
...
end_of_data
}
```
FIG. 102
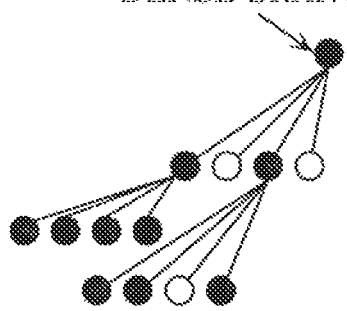
DENSE BRANCH
FIG. 103
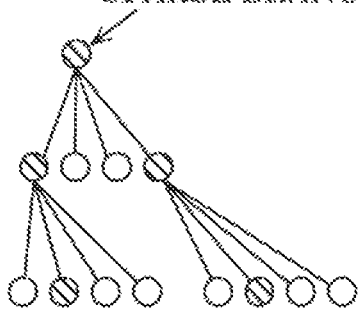
SPARSE BRANCH

FIG. 107

```
pc_header() {
...
num_sub_pc
for (i=0; i<num_sub_pc; i++)
  layer_id[i]
  branch_id[i]
    numPoint[i]
  coding_type[i]
  data_sub_cloud[i]()
} data_sub_cloud() { if (coding_type == 00)
  {
    coding_type_00_data
  }
  else if (coding_type == 01)
  {
    coding_type_01_data
  }
  ...
  end_of_data
}
```

THREE-DIMENSIONAL DATA ENCODING METHOD, THREE-DIMENSIONAL DATA DECODING METHOD, THREE-DIMENSIONAL DATA ENCODING DEVICE, AND THREE-DIMENSIONAL DATA DECODING DEVICE

CROSS REFERENCE TO RELATED APPLICATIONS

This application is a continuation of U.S. application Ser. No. 16/932,155, filed Jul. 17, 2020, which is a U.S. continuation application of PCT International Patent Application Number PCT/JP2019/001143 filed on Jan. 16, 2019, claiming the benefit of priority of U.S. Provisional Patent Application No. 62/619,313 filed on Jan. 19, 2018, the entire contents of which are hereby incorporated by reference.

BACKGROUND

1. Technical Field

The present disclosure relates to a three-dimensional data encoding method, a three-dimensional data decoding method, a three-dimensional data encoding device, and a three-dimensional data decoding device.

2. Description of the Related Art

Devices or services utilizing three-dimensional data are expected to find their widespread use in a wide range of fields, such as computer vision that enables autonomous operations of cars or robots, map information, monitoring, infrastructure inspection, and video distribution. Three-dimensional data is obtained through various means including a distance sensor such as a rangefinder, as well as a stereo camera and a combination of a plurality of monocular cameras.

Methods of representing three-dimensional data include a method known as a point cloud scheme that represents the shape of a three-dimensional structure by a point group in a three-dimensional space. In the point cloud scheme, the positions and colors of a point group are stored. While point cloud is expected to be a mainstream method of representing three-dimensional data, a massive amount of data of a point group necessitates compression of the amount of three-dimensional data by encoding for accumulation and transmission, as in the case of a two-dimensional moving picture (examples include MPEG-4 AVC and HEVC standardized by MPEG).

Meanwhile, point cloud compression is partially supported by, for example, an open-source library (Point Cloud Library) for point cloud-related processing.

Furthermore, a technique for searching for and displaying a facility located in the surroundings of the vehicle is known (for example, see International Publication WO 2014/020663).

SUMMARY

There has been a demand for improving coding efficiency in encoding of three-dimensional data.

The present disclosure has an object to provide a three-dimensional data encoding method, a three-dimensional data decoding method, a three-dimensional data encoding device, or a three-dimensional data decoding device that makes it possible to improve the coding efficiency.

A three-dimensional data encoding method according to one aspect of the present disclosure includes: generating an N-ary tree structure of three-dimensional points included in three-dimensional data, where N is an integer greater than or equal to 2; generating first encoded data by encoding a first branch using a first encoding process, the first branch having, as a root, a first node included in a first layer that is one of layers included in the N-ary tree structure; generating second encoded data by encoding a second branch using a second encoding process different from the first encoding process, the second branch having, as a root, a second node included in the first layer and different from the first node; and generating a bitstream including the first encoded data and the second encoded data.

A three-dimensional data decoding method according to one aspect of the present disclosure includes obtaining, from a bitstream, first encoded data and second encoded data, the first encoded data being generated by encoding a first branch having, as a root, a first node included in a first layer that is one of layers included in an N-ary tree structure of three-dimensional points, where N is an integer greater than or equal to 2, the second encoded data being generated by encoding a second branch having, as a root, a second node included in the first layer and different from the first node; generating first decoded data of the first branch by decoding the first encoded data using a first decoding process; generating second decoded data of the second branch by decoding the second encoded data using a second decoding process different from the first decoding process; and restoring the three-dimensional points using the first decoded data and the second decoded data.

The present disclosure can provide a three-dimensional data encoding method, a three-dimensional data decoding method, a three-dimensional data encoding device, or a three-dimensional data decoding device that makes it possible to improve the coding efficiency.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

FIG. 3 is a block diagram of a three-dimensional data encoding device according to Embodiment 1;

FIG. 9 is a flowchart of decoding processes according to Embodiment 1;

FIG. 10 is a diagram showing an example of meta information according to Embodiment 1;

FIG. 41 is a diagram showing an example of bit sequences of the volume according to Embodiment 7;

FIG. 46 is a diagram showing an example syntax of an RT flag and RT information according to Embodiment 7;

FIG. 56 is a diagram showing an example syntax of a submap according to Embodiment 8;

FIG. 58 is a diagram showing an example syntax of a submap according to Embodiment 8;

FIG. 68 is a diagram showing an example syntax of a volume according to Embodiment 8;

FIG. 83 is a diagram showing an example syntax according to Embodiment 9;

FIG. 101 is a diagram illustrating an example of a syntax according to Embodiment 10;

FIG. 102 is a diagram illustrating an example of a dense branch according to Embodiment 10;

FIG. 103 is a diagram illustrating an example of a sparse branch according to Embodiment 10;

FIG. 107 is a diagram illustrating an example of a syntax according to the variation of Embodiment 10;

DETAILED DESCRIPTION OF THE EMBODIMENTS

Figure 1:
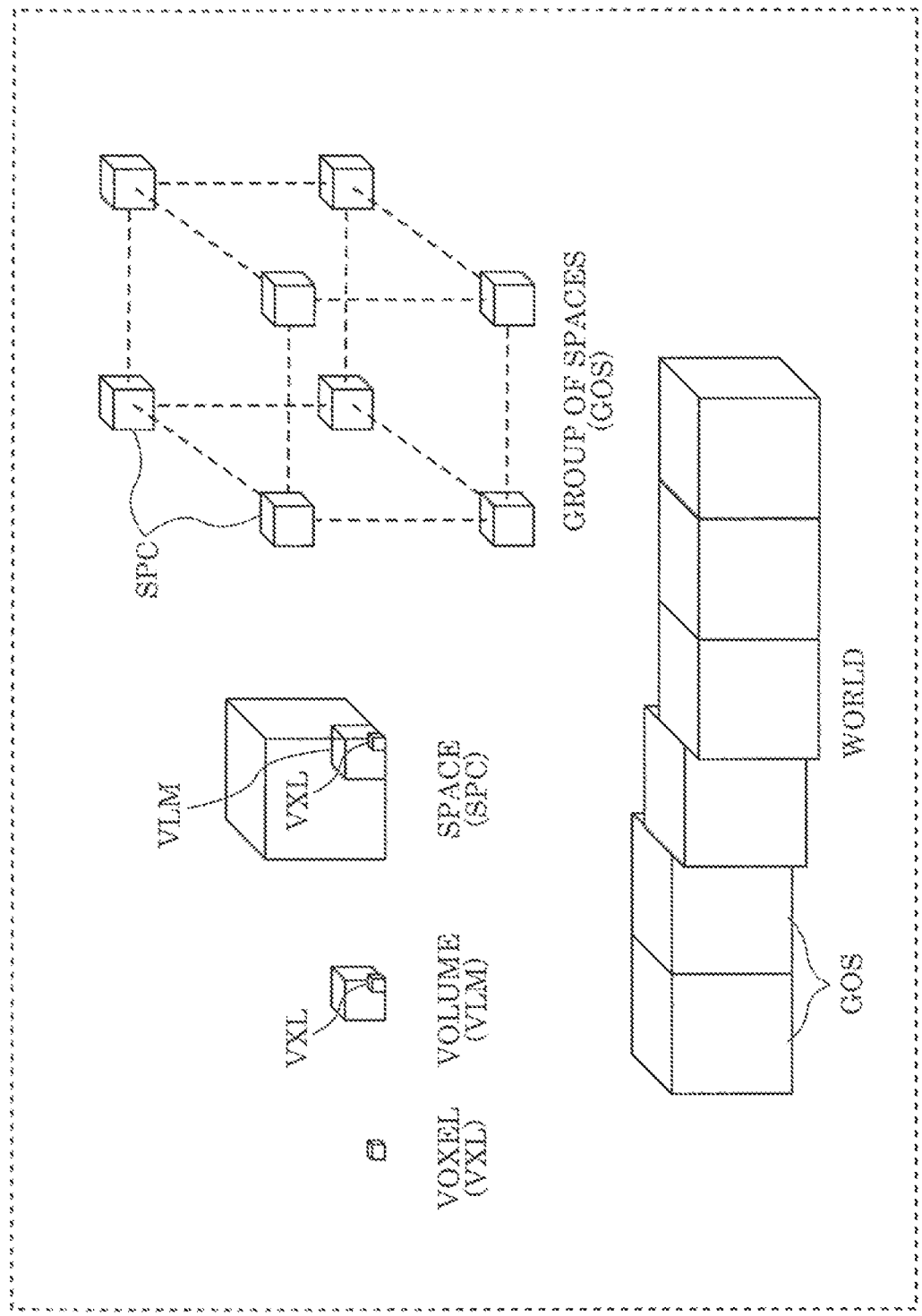
FIG. 1 is a diagram showing the structure of encoded three-dimensional data according to Embodiment 1.

A three-dimensional data encoding method according to one aspect of the present disclosure includes: generating an N-ary tree structure of three-dimensional points included in three-dimensional data, where N is an integer greater than or equal to 2; generating first encoded data by encoding a first branch using a first encoding process, the first branch having, as a root, a first node included in a first layer that is one of layers included in the N-ary tree structure; generating second encoded data by encoding a second branch using a second encoding process different from the first encoding process, the second branch having, as a root, a second node included in the first layer and different from the first node; and generating a bitstream including the first encoded data and the second encoded data.

With this, since the three-dimensional data encoding method enables application of an encoding process suitable for each branch included in the N-ary tree structure, the three-dimensional data encoding method makes it possible to improve coding efficiency.

For example, a total number of three-dimensional points included in the first branch may be less than a predetermined threshold value, and a total number of three-dimensional points included in the second branch may be greater than the predetermined threshold value.

For example, the first encoded data may include first information in which a first N-ary tree structure of first three-dimensional points included in the first branch is expressed using a first formula, and the second encoded data may include second information in which a second N-ary tree structure of second three-dimensional points included in the second branch is expressed using a second formula.

With this, since the three-dimensional data encoding method enables application of an encoding scheme suitable for each branch included in the N-ary tree structure, the three-dimensional data encoding method makes it possible to improve coding efficiency.

For example, the first information may include pieces of three-dimensional information each associated with a corresponding one of the first three-dimensional points. Each of the pieces of three-dimensional information may include indexes each associated with a corresponding one of layers in the first N-ary tree structure. Each of the indexes may indicate, among N sub-blocks belonging to the corresponding one of the layers in the first N-ary tree structure, a sub-block to which the corresponding one of the first three-dimensional points belongs. The second information may include pieces of 1-bit information each of which (i) is associated with a corresponding one of sub-blocks belonging to layers in the second N-ary tree structure, and (ii) indicates whether a three-dimensional point is present in the corresponding one of the sub-blocks.

For example, a quantization parameter used in the second encoding process may be different from a quantization parameter used in the first encoding process.

For example, in the encoding of the first branch, a tree structure including (i) a tree structure from a root of the N-ary tree structure to the first node and (ii) the first branch may be encoded using the first encoding process, and in the encoding of the second branch, a tree structure including (i) a tree structure from the root of the N-ary tree structure to the second node and (ii) the second branch may be encoded using the second encoding process.

For example, the first encoded data may include encoded data of the first branch, and third information indicating a position of the first node in the N-ary tree structure, and the second encoded data may include encoded data of the second branch, and fourth information indicating a position of the second node in the N-ary tree structure.

For example, the third information may include information indicating the first layer, and information indicating which node included in the first layer the first node is, and the fourth information may include the information indicating the first layer, and information indicating which node included in the first layer the second node is.

For example, the first encoded data may include information indicating a total number of three-dimensional points included in the first branch, and the second encoded data may include information indicating a total number of three-dimensional points included in the second branch.

A three-dimensional data decoding method according to one aspect of the present disclosure includes: obtaining, from a bitstream, first encoded data and second encoded data, the first encoded data being generated by encoding a first branch having, as a root, a first node included in a first layer that is one of layers included in an N-ary tree structure of three-dimensional points, where N is an integer greater than or equal to 2, the second encoded data being generated by encoding a second branch having, as a root, a second node included in the first layer and different from the first node; generating first decoded data of the first branch by decoding the first encoded data using a first decoding process; generating second decoded data of the second branch by decoding the second encoded data using a second decoding process different from the first decoding process; and restoring the three-dimensional points using the first decoded data and the second decoded data.

With this, the three-dimensional data decoding method makes it possible to decode the bitstream for which coding efficiency has been improved.

For example, a total number of three-dimensional points included in the first branch may be less than a predetermined threshold value, and a total number of three-dimensional points included in the second branch may be greater than the predetermined threshold value.

For example, the first encoded data may include first information in which a first N-ary tree structure of first three-dimensional points included in the first branch is expressed using a first formula, and the second encoded data may include second information in which a second N-ary tree structure of second three-dimensional points included in the second branch is expressed using a second formula.

For example, the first information may include pieces of three-dimensional information each associated with a corresponding one of the first three-dimensional points. Each of the pieces of three-dimensional information may include indexes each associated with a corresponding one of layers in the first N-ary tree structure. Each of the indexes may indicate, among N sub-blocks belonging to the corresponding one of the layers in the first N-ary tree structure, a sub-block to which the corresponding one of the first three-dimensional points belongs. The second information may include pieces of 1-bit information each of which (i) is associated with a corresponding one of sub-blocks belonging to layers in the second N-ary tree structure, and (ii) indicates whether a three-dimensional point is present in the corresponding one of the sub-blocks.

For example, a quantization parameter used in the second decoding process may be different from a quantization parameter used in the first decoding process.

For example, in the decoding of the first branch, a tree structure including (i) a tree structure from a root of the N-ary tree structure to the first node and (ii) the first branch may be decoded using the first decoding process, and in the decoding of the second branch, a tree structure including (i) a tree structure from the root of the N-ary tree structure to the second node and (ii) the second branch may be decoded using the second decoding process.

For example, the first encoded data may include encoded data of the first branch, and third information indicating a position of the first node in the N-ary tree structure, and the second encoded data may include encoded data of the second branch, and fourth information indicating a position of the second node in the N-ary tree structure.

For example, the third information may include information indicating the first layer, and information indicating which node included in the first layer the first node is, and the fourth information may include the information indicating the first layer, and information indicating which node included in the first layer the second node is.

For example, the first encoded data may include information indicating a total number of three-dimensional points included in the first branch, and the second encoded data may include information indicating a total number of three-dimensional points included in the second branch.

A three-dimensional data encoding device according to one aspect of the present disclosure includes a processor and memory. Using the memory, the processor: generates an N-ary tree structure of three-dimensional points included in three-dimensional data, where N is an integer greater than or equal to 2; generates first encoded data by encoding a first branch using a first encoding process, the first branch having, as a root, a first node included in a first layer that is one of layers included in the N-ary tree structure; generates second encoded data by encoding a second branch using a second encoding process different from the first encoding process, the second branch having, as a root, a second node included in the first layer and different from the first node; and generates a bitstream including the first encoded data and the second encoded data.

With this, since the three-dimensional data encoding device enables application of an encoding process suitable for each branch included in the N-ary tree structure, the three-dimensional data encoding device can improve coding efficiency.

A three-dimensional data decoding device according to one aspect of the present disclosure includes a processor and memory. Using the memory, the processor: obtains, from a bitstream, first encoded data and second encoded data, the first encoded data being generated by encoding a first branch having, as a root, a first node included in a first layer that is one of layers included in an N-ary tree structure of three-dimensional points, where N is an integer greater than or equal to 2, the second encoded data being generated by encoding a second branch having, as a root, a second node included in the first layer and different from the first node; generates first decoded data of the first branch by decoding the first encoded data using a first decoding process; generates second decoded data of the second branch by decoding the second encoded data using a second decoding process different from the first decoding process; and restores the three-dimensional points using the first decoded data and the second decoded data.

With this, the three-dimensional data decoding device can decode the bitstream for which coding efficiency has been improved.

Note that these general or specific aspects may be implemented as a system, a method, an integrated circuit, a computer program, or a computer-readable recording medium such as a CD-ROM, or may be implemented as any combination of a system, a method, an integrated circuit, a computer program, and a recording medium.

The following describes embodiments with reference to the drawings. Note that the following embodiments show exemplary embodiments of the present disclosure. The numerical values, shapes, materials, structural components, the arrangement and connection of the structural components, steps, the processing order of the steps, etc. shown in the following embodiments are mere examples, and thus are not intended to limit the present disclosure. Of the structural components described in the following embodiments, structural components not recited in any one of the independent claims that indicate the broadest concepts will be described as optional structural components.

Embodiment 1

First, the data structure of encoded three-dimensional data (hereinafter also referred to as encoded data) according to the present embodiment will be described. FIG. 1 is a diagram showing the structure of encoded three-dimensional data according to the present embodiment.

In the present embodiment, a three-dimensional space is divided into spaces (SPCs), which correspond to pictures in moving picture encoding, and the three-dimensional data is encoded on a SPC-by-SPC basis. Each SPC is further divided into volumes (VLMs), which correspond to macroblocks, etc. in moving picture encoding, and predictions and transforms are performed on a VLM-by-VLM basis. Each volume includes a plurality of voxels (VXLs), each being a minimum unit in which position coordinates are associated. Note that prediction is a process of generating predictive three-dimensional data analogous to a current processing unit by referring to another processing unit, and encoding a differential between the predictive three-dimensional data and the current processing unit, as in the case of predictions performed on two-dimensional images. Such prediction includes not only spatial prediction in which another prediction unit corresponding to the same time is referred to, but also temporal prediction in which a prediction unit corresponding to a different time is referred to.

When encoding a three-dimensional space represented by point group data such as a point cloud, for example, the three-dimensional data encoding device (hereinafter also referred to as the encoding device) encodes the points in the point group or points included in the respective voxels in a collective manner, in accordance with a voxel size. Finer voxels enable a highly-precise representation of the three-dimensional shape of a point group, while larger voxels enable a rough representation of the three-dimensional shape of a point group.

Note that the following describes the case where three-dimensional data is a point cloud, but three-dimensional data is not limited to a point cloud, and thus three-dimensional data of any format may be employed.

Also note that voxels with a hierarchical structure may be used. In such a case, when the hierarchy includes n levels, whether a sampling point is included in the n-1th level or its lower levels (the lower levels of the n-th level) may be sequentially indicated. For example, when only the n-th level is decoded, and the n-1th level or its lower levels include a sampling point, the n-th level can be decoded on the assumption that a sampling point is included at the center of a voxel in the n-th level.

Also, the encoding device obtains point group data, using, for example, a distance sensor, a stereo camera, a monocular camera, a gyroscope sensor, or an inertial sensor.

As in the case of moving picture encoding, each SPC is classified into one of at least the three prediction structures that include: intra SPC (I-SPC), which is individually decodable; predictive SPC (P-SPC) capable of only a unidirectional reference; and bidirectional SPC (B-SPC) capable of bidirectional references. Each SPC includes two types of time information: decoding time and display time.

Furthermore, as shown in FIG. 1, a processing unit that includes a plurality of SPCs is a group of spaces (GOS), which is a random access unit. Also, a processing unit that includes a plurality of GOSs is a world (WLD).

The spatial region occupied by each world is associated with an absolute position on earth, by use of, for example, GPS, or latitude and longitude information. Such position information is stored as meta-information. Note that meta-information may be included in encoded data, or may be transmitted separately from the encoded data.

Also, inside a GOS, all SPCs may be three-dimensionally adjacent to one another, or there may be a SPC that is not three-dimensionally adjacent to another SPC.

Note that the following also describes processes such as encoding, decoding, and reference to be performed on three-dimensional data included in processing units such as GOS, SPC, and VLM, simply as performing encoding/to encode, decoding/to decode, referring to, etc. on a processing unit. Also note that three-dimensional data included in a processing unit includes, for example, at least one pair of a spatial position such as three-dimensional coordinates and an attribute value such as color information.

Next, the prediction structures among SPCs in a GOS will be described. A plurality of SPCs in the same GOS or a plurality of VLMs in the same SPC occupy mutually different spaces, while having the same time information (the decoding time and the display time).

A SPC in a GOS that comes first in the decoding order is an I-SPC. GOSs come in two types: closed GOS and open GOS. A closed GOS is a GOS in which all SPCs in the GOS are decodable when decoding starts from the first I-SPC. Meanwhile, an open GOS is a GOS in which a different GOS is referred to in one or more SPCs preceding the first I-SPC in the GOS in the display time, and thus cannot be singly decoded.

Note that in the case of encoded data of map information, for example, a WLD is sometimes decoded in the backward direction, which is opposite to the encoding order, and thus backward reproduction is difficult when GOSs are interdependent. In such a case, a closed GOS is basically used.

Each GOS has a layer structure in height direction, and SPCs are sequentially encoded or decoded from SPCs in the bottom layer.

Figure 2:
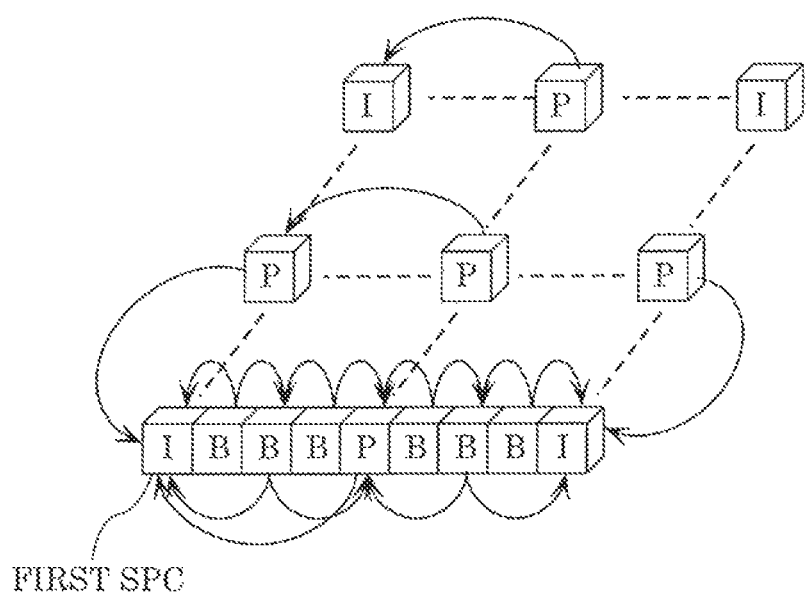
FIG. 2 is a diagram showing an example of prediction structures among SPCs that belong to the lowermost layer in a GOS according to Embodiment 1.
Figure 3:
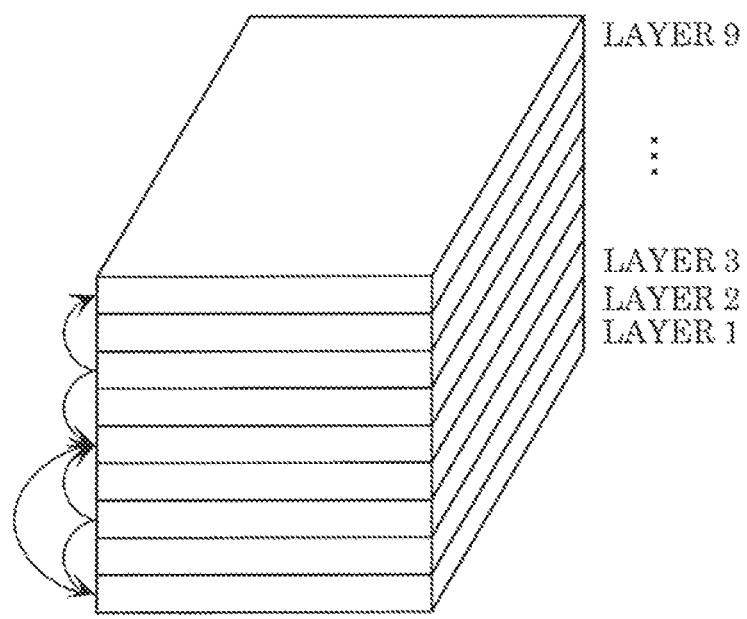
FIG. 3 is a diagram showing an example of prediction structures among layers according to Embodiment 1.

FIG. 2 is a diagram showing an example of prediction structures among SPCs that belong to the lowermost layer in a GOS. FIG. 3 is a diagram showing an example of prediction structures among layers.

A GOS includes at least one I-SPC. Of the objects in a three-dimensional space, such as a person, an animal, a car, a bicycle, a signal, and a building serving as a landmark, a small-sized object is especially effective when encoded as an I-SPC. When decoding a GOS at a low throughput or at a high speed, for example, the three-dimensional data decoding device (hereinafter also referred to as the decoding device) decodes only I-SPC(s) in the GOS.

The encoding device may also change the encoding interval or the appearance frequency of I-SPCs, depending on the degree of sparseness and denseness of the objects in a WLD.

In the structure shown in FIG. 3, the encoding device or the decoding device encodes or decodes a plurality of layers sequentially from the bottom layer (layer 1). This increases the priority of data on the ground and its vicinity, which involve a larger amount of information, when, for example, a self-driving car is concerned.

Regarding encoded data used for a drone, for example, encoding or decoding may be performed sequentially from SPCs in the top layer in a GOS in height direction.

The encoding device or the decoding device may also encode or decode a plurality of layers in a manner that the decoding device can have a rough grasp of a GOS first, and then the resolution is gradually increased. The encoding device or the decoding device may perform encoding or decoding in the order of layers 3, 8, 1, 9 . . . , for example.

Next, the handling of static objects and dynamic objects will be described.

A three-dimensional space includes scenes or still objects such as a building and a road (hereinafter collectively referred to as static objects), and objects with motion such as a car and a person (hereinafter collectively referred to as dynamic objects). Object detection is separately performed by, for example, extracting keypoints from point cloud data, or from video of a camera such as a stereo camera. In this description, an example method of encoding a dynamic object will be described.

A first method is a method in which a static object and a dynamic object are encoded without distinction. A second method is a method in which a distinction is made between a static object and a dynamic object on the basis of identification information.

For example, a GOS is used as an identification unit. In such a case, a distinction is made between a GOS that includes SPCs constituting a static object and a GOS that includes SPCs constituting a dynamic object, on the basis of identification information stored in the encoded data or stored separately from the encoded data.

Alternatively, a SPC may be used as an identification unit. In such a case, a distinction is made between a SPC that includes VLMs constituting a static object and a SPC that includes VLMs constituting a dynamic object, on the basis of the identification information thus described.

Alternatively, a VLM or a VXL may be used as an identification unit. In such a case, a distinction is made between a VLM or a VXL that includes a static object and a VLM or a VXL that includes a dynamic object, on the basis of the identification information thus described.

The encoding device may also encode a dynamic object as at least one VLM or SPC, and may encode a VLM or a SPC including a static object and a SPC including a dynamic object as mutually different GOSs. When the GOS size is variable depending on the size of a dynamic object, the encoding device separately stores the GOS size as meta-information.

The encoding device may also encode a static object and a dynamic object separately from each other, and may superimpose the dynamic object onto a world constituted by static objects. In such a case, the dynamic object is constituted by at least one SPC, and each SPC is associated with at least one SPC constituting the static object onto which the each SPC is to be superimposed. Note that a dynamic object may be represented not by SPC(s) but by at least one VLM or VXL.

The encoding device may also encode a static object and a dynamic object as mutually different streams.

The encoding device may also generate a GOS that includes at least one SPC constituting a dynamic object. The encoding device may further set the size of a GOS including a dynamic object (GOS_M) and the size of a GOS including a static object corresponding to the spatial region of GOS_M at the same size (such that the same spatial region is occupied). This enables superimposition to be performed on a GOS-by-GOS basis.

SPC(s) included in another encoded GOS may be referred to in a P-SPC or a B-SPC constituting a dynamic object. In the case where the position of a dynamic object temporally changes, and the same dynamic object is encoded as an object in a GOS corresponding to a different time, referring to SPC(s) across GOSs is effective in terms of compression rate.

The first method and the second method may be selected in accordance with the intended use of encoded data. When encoded three-dimensional data is used as a map, for example, a dynamic object is desired to be separated, and thus the encoding device uses the second method. Meanwhile, the encoding device uses the first method when the separation of a dynamic object is not required such as in the case where three-dimensional data of an event such as a concert and a sports event is encoded.

The decoding time and the display time of a GOS or a SPC are storable in encoded data or as meta-information. All static objects may have the same time information. In such a case, the decoding device may determine the actual decoding time and display time. Alternatively, a different value may be assigned to each GOS or SPC as the decoding time, and the same value may be assigned as the display time. Furthermore, as in the case of the decoder model in moving picture encoding such as Hypothetical Reference Decoder (HRD) compliant with HEVC, a model may be employed that ensures that a decoder can perform decoding without fail by having a buffer of a predetermined size and by reading a bitstream at a predetermined bit rate in accordance with the decoding times.

Figure 4:
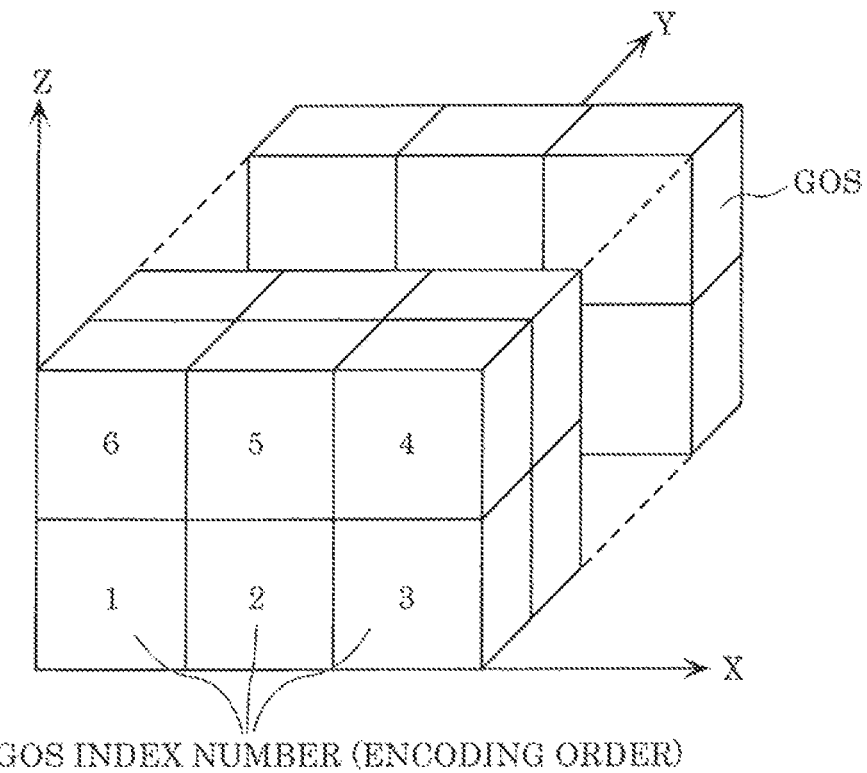
FIG. 4 is a diagram showing an example order of encoding GOSs according to Embodiment 1.

Next, the topology of GOSs in a world will be described. The coordinates of the three-dimensional space in a world are represented by the three coordinate axes (x axis, y axis, and z axis) that are orthogonal to one another. A predetermined rule set for the encoding order of GOSs enables encoding to be performed such that spatially adjacent GOSs are contiguous in the encoded data. In an example shown in FIG. 4, for example, GOSs in the x and z planes are successively encoded. After the completion of encoding all GOSs in certain x and z planes, the value of the y axis is updated. Stated differently, the world expands in the y axis direction as the encoding progresses. The GOS index numbers are set in accordance with the encoding order.

Here, the three-dimensional spaces in the respective worlds are previously associated one-to-one with absolute geographical coordinates such as GPS coordinates or latitude/longitude coordinates. Alternatively, each three-dimensional space may be represented as a position relative to a previously set reference position. The directions of the x axis, the y axis, and the z axis in the three-dimensional space are represented by directional vectors that are determined on the basis of the latitudes and the longitudes, etc. Such directional vectors are stored together with the encoded data as meta-information.

GOSs have a fixed size, and the encoding device stores such size as meta-information. The GOS size may be changed depending on, for example, whether it is an urban area or not, or whether it is inside or outside of a room. Stated differently, the GOS size may be changed in accordance with the amount or the attributes of objects with information values. Alternatively, in the same world, the encoding device may adaptively change the GOS size or the interval between I-SPCs in GOSs in accordance with the object density, etc. For example, the encoding device sets the GOS size to smaller and the interval between I-SPCs in GOSs to shorter, as the object density is higher.

Figure 5:
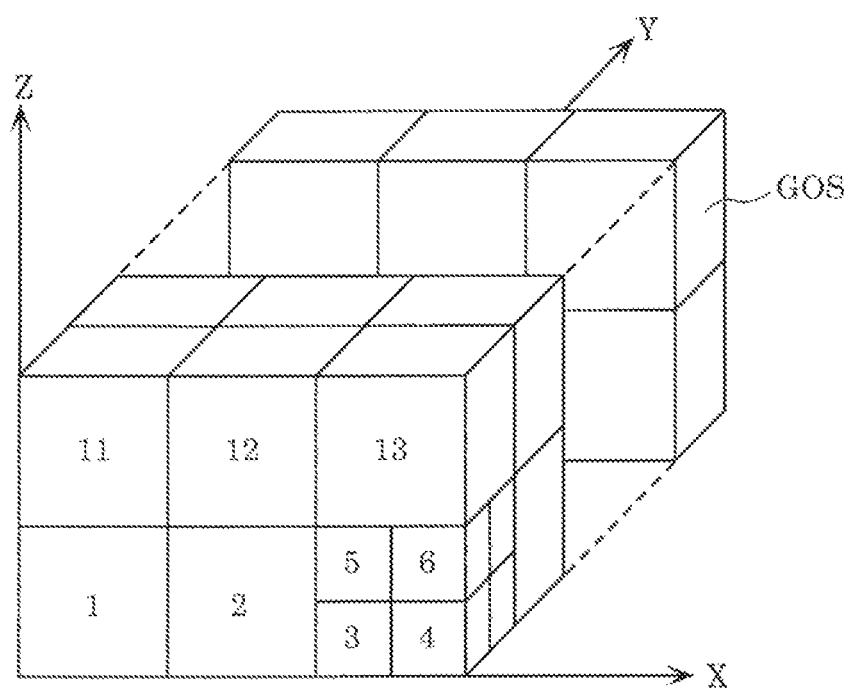
FIG. 5 is a diagram showing an example order of encoding GOSs according to Embodiment 1.

In an example shown in FIG. 5, to enable random access with a finer granularity, a GOS with a high object density is partitioned into the regions of the third to tenth GOSs. Note that the seventh to tenth GOSs are located behind the third to sixth GOSs.

Figure 6:
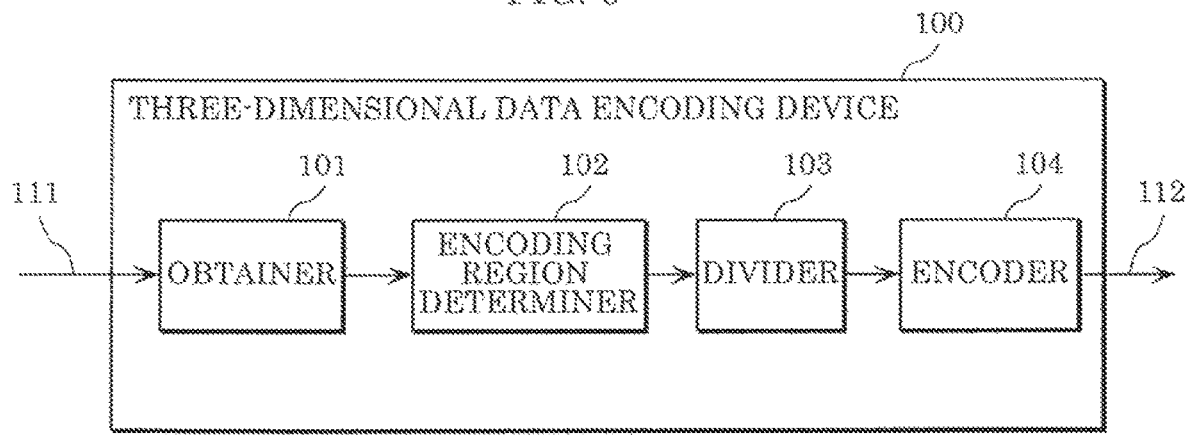
Figure 7:
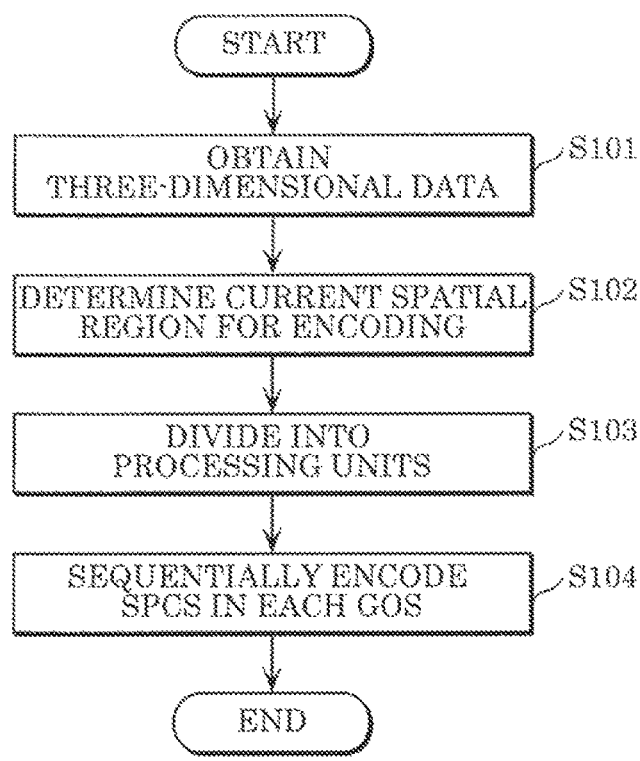
FIG. 7 is a flowchart of encoding processes according to Embodiment 1.

Next, the structure and the operation flow of the three-dimensional data encoding device according to the present embodiment will be described. FIG. 6 is a block diagram of three-dimensional data encoding device 100 according to the present embodiment. FIG. 7 is a flowchart of an example operation performed by three-dimensional data encoding device 100.

Three-dimensional data encoding device 100 shown in FIG. 6 encodes three-dimensional data 111, thereby generating encoded three-dimensional data 112. Such three-dimensional data encoding device 100 includes obtainer 101, encoding region determiner 102, divider 103, and encoder 104.

As shown in FIG. 7, first, obtainer 101 obtains three-dimensional data 111, which is point group data (S101).

Next, encoding region determiner 102 determines a current region for encoding from among spatial regions corresponding to the obtained point group data (S102). For example, in accordance with the position of a user or a vehicle, encoding region determiner 102 determines, as the current region, a spatial region around such position.

Next, divider 103 divides the point group data included in the current region into processing units. The processing units here means units such as GOSs and SPCs described above. The current region here corresponds to, for example, a world described above. More specifically, divider 103 divides the point group data into processing units on the basis of a predetermined GOS size, or the presence/absence/size of a dynamic object (S103). Divider 103 further determines the starting position of the SPC that comes first in the encoding order in each GOS.

Next, encoder 104 sequentially encodes a plurality of SPCs in each GOS, thereby generating encoded three-dimensional data 112 (S104).

Note that although an example is described here in which the current region is divided into GOSs and SPCs, after which each GOS is encoded, the processing steps are not limited to this order. For example, steps may be employed in which the structure of a single GOS is determined, which is followed by the encoding of such GOS, and then the structure of the subsequent GOS is determined.

As thus described, three-dimensional data encoding device 100 encodes three-dimensional data 111, thereby generating encoded three-dimensional data 112. More specifically, three-dimensional data encoding device 100 divides three-dimensional data into first processing units (GOSs), each being a random access unit and being associated with three-dimensional coordinates, divides each of the first processing units (GOSs) into second processing units (SPCs), and divides each of the second processing units (SPCs) into third processing units (VLMs). Each of the third processing units (VLMs) includes at least one voxel (VXL), which is the minimum unit in which position information is associated.

Next, three-dimensional data encoding device 100 encodes each of the first processing units (GOSs), thereby generating encoded three-dimensional data 112. More specifically, three-dimensional data encoding device 100 encodes each of the second processing units (SPCs) in each of the first processing units (GOSs). Three-dimensional data encoding device 100 further encodes each of the third processing units (VLMs) in each of the second processing units (SPCs).

When a current first processing unit (GOS) is a closed GOS, for example, three-dimensional data encoding device 100 encodes a current second processing unit (SPC) included in such current first processing unit (GOS) by referring to another second processing unit (SPC) included in the current first processing unit (GOS). Stated differently, three-dimensional data encoding device 100 refers to no second processing unit (SPC) included in a first processing unit (GOS) that is different from the current first processing unit (GOS).

Meanwhile, when a current first processing unit (GOS) is an open GOS, three-dimensional data encoding device 100 encodes a current second processing unit (SPC) included in such current first processing unit (GOS) by referring to another second processing unit (SPC) included in the current first processing unit (GOS) or a second processing unit (SPC) included in a first processing unit (GOS) that is different from the current first processing unit (GOS).

Also, three-dimensional data encoding device 100 selects, as the type of a current second processing unit (SPC), one of the following: a first type (I-SPC) in which another second processing unit (SPC) is not referred to; a second type (P-SPC) in which another single second processing unit (SPC) is referred to; and a third type in which other two second processing units (SPC) are referred to. Three-dimensional data encoding device 100 encodes the current second processing unit (SPC) in accordance with the selected type.

Figure 8:
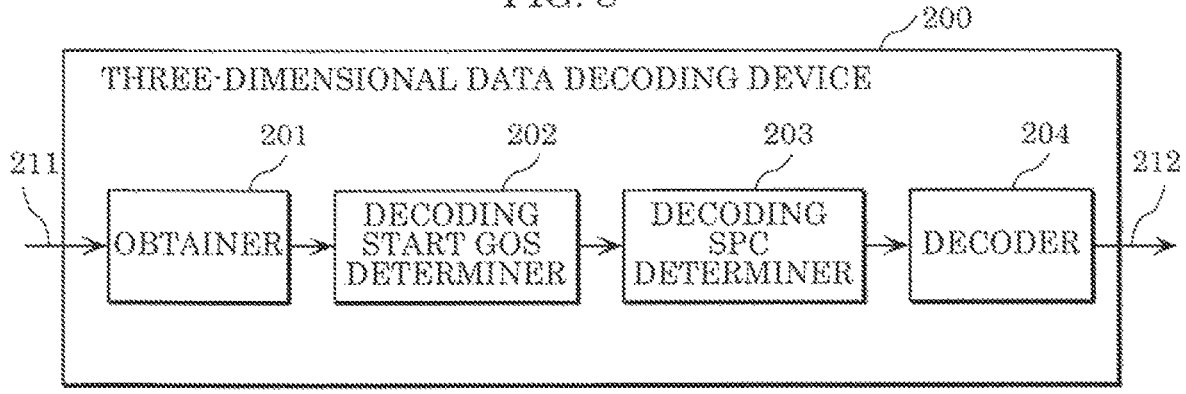
FIG. 8 is a block diagram of a three-dimensional data decoding device according to Embodiment 1.

Next, the structure and the operation flow of the three-dimensional data decoding device according to the present embodiment will be described. FIG. 8 is a block diagram of three-dimensional data decoding device 200 according to the present embodiment. FIG. 9 is a flowchart of an example operation performed by three-dimensional data decoding device 200.

Three-dimensional data decoding device 200 shown in FIG. 8 decodes encoded three-dimensional data 211, thereby generating decoded three-dimensional data 212. Encoded three-dimensional data 211 here is, for example, encoded three-dimensional data 112 generated by three-dimensional data encoding device 100. Such three-dimensional data decoding device 200 includes obtainer 201, decoding start GOS determiner 202, decoding SPC determiner 203, and decoder 204.

First, obtainer 201 obtains encoded three-dimensional data 211 (S201). Next, decoding start GOS determiner 202 determines a current GOS for decoding (S202). More specifically, decoding start GOS determiner 202 refers to meta-information stored in encoded three-dimensional data 211 or stored separately from the encoded three-dimensional data to determine, as the current GOS, a GOS that includes a SPC corresponding to the spatial position, the object, or the time from which decoding is to start.

Next, decoding SPC determiner 203 determines the type (s) (I, P, and/or B) of SPCs to be decoded in the GOS (S203). For example, decoding SPC determiner 203 determines whether to (1) decode only I-SPC(s), (2) to decode I-SPC(s) and P-SPCs, or (3) to decode SPCs of all types. Note that the present step may not be performed, when the type(s) of SPCs to be decoded are previously determined such as when all SPCs are previously determined to be decoded.

Next, decoder 204 obtains an address location within encoded three-dimensional data 211 from which a SPC that comes first in the GOS in the decoding order (the same as the encoding order) starts. Decoder 204 obtains the encoded data of the first SPC from the address location, and sequentially decodes the SPCs from such first SPC (S204). Note that the address location is stored in the meta-information, etc.

Three-dimensional data decoding device 200 decodes decoded three-dimensional data 212 as thus described. More specifically, three-dimensional data decoding device 200 decodes each encoded three-dimensional data 211 of the first processing units (GOSs), each being a random access unit and being associated with three-dimensional coordinates, thereby generating decoded three-dimensional data 212 of the first processing units (GOSs). Even more specifically, three-dimensional data decoding device 200 decodes each of the second processing units (SPCs) in each of the first processing units (GOSs). Three-dimensional data decoding device 200 further decodes each of the third processing units (VLMs) in each of the second processing units (SPCs).

The following describes meta-information for random access. Such metainformation is generated by three-dimensional data encoding device 100, and included in encoded three-dimensional data 112 (211).

In the conventional random access for a two-dimensional moving picture, decoding starts from the first frame in a random access unit that is close to a specified time. Meanwhile, in addition to times, random access to spaces (coordinates, objects, etc.) is assumed to be performed in a world.

To enable random access to at least three elements of coordinates, objects, and times, tables are prepared that associate the respective elements with the GOS index numbers. Furthermore, the GOS index numbers are associated with the addresses of the respective first I-SPCs in the GOSs. FIG. 10 is a diagram showing example tables included in the meta-information. Note that not all the tables shown in FIG. 10 are required to be used, and thus at least one of the tables is used.

The following describes an example in which random access is performed from coordinates as a starting point. To access the coordinates (x2, y2, and z2), the coordinates-GOS table is first referred to, which indicates that the point corresponding to the coordinates (x2, y2, and z2) is included in the second GOS. Next, the GOS-address table is referred to, which indicates that the address of the first I-SPC in the second GOS is addr(2). As such, decoder 204 obtains data from this address to start decoding.

Note that the addresses may either be logical addresses or physical addresses of an HDD or a memory. Alternatively, information that identifies file segments may be used instead of addresses. File segments are, for example, units obtained by segmenting at least one GOS, etc.

When an object spans across a plurality of GOSs, the object-GOS table may show a plurality of GOSs to which such object belongs. When such plurality of GOSs are closed GOSs, the encoding device and the decoding device can perform encoding or decoding in parallel. Meanwhile, when such plurality of GOSs are open GOSs, a higher compression efficiency is achieved by the plurality of GOSs referring to each other.

Example objects include a person, an animal, a car, a bicycle, a signal, and a building serving as a landmark. For example, three-dimensional data encoding device 100 extracts keypoints specific to an object from a three-dimensional point cloud, etc., when encoding a world, and detects the object on the basis of such keypoints to set the detected object as a random access point.

As thus described, three-dimensional data encoding device 100 generates first information indicating a plurality of first processing units (GOSs) and the three-dimensional coordinates associated with the respective first processing units (GOSs). Encoded three-dimensional data 112 (211) includes such first information. The first information further indicates at least one of objects, times, and data storage locations that are associated with the respective first processing units (GOSs).

Three-dimensional data decoding device 200 obtains the first information from encoded three-dimensional data 211. Using such first information, three-dimensional data decoding device 200 identifies encoded three-dimensional data 211 of the first processing unit that corresponds to the specified three-dimensional coordinates, object, or time, and decodes encoded three-dimensional data 211.

The following describes an example of other meta-information. In addition to the meta-information for random access, three-dimensional data encoding device 100 may also generate and store meta-information as described below, and three-dimensional data decoding device 200 may use such meta-information at the time of decoding.

When three-dimensional data is used as map information, for example, a profile is defined in accordance with the intended use, and information indicating such profile may be included in meta-information. For example, a profile is defined for an urban or a suburban area, or for a flying object, and the maximum or minimum size, etc. of a world, a SPC or a VLM, etc. is defined in each profile. For example, more detailed information is required for an urban area than for a suburban area, and thus the minimum VLM size is set to small.

The meta-information may include tag values indicating object types. Each of such tag values is associated with VLMs, SPCs, or GOSs that constitute an object. For example, a tag value may be set for each object type in a manner, for example, that the tag value "0" indicates "person," the tag value "1" indicates "car," and the tag value "2" indicates "signal." Alternatively, when an object type is hard to judge, or such judgment is not required, a tag value may be used that indicates the size or the attribute indicating, for example, whether an object is a dynamic object or a static object.

The meta-information may also include information indicating a range of the spatial region occupied by a world.

The meta-information may also store the SPC or VXL size as header information common to the whole stream of the encoded data or to a plurality of SPCs, such as SPCs in a GOS.

The meta-information may also include identification information on a distance sensor or a camera that has been used to generate a point cloud, or information indicating the positional accuracy of a point group in the point cloud.

The metainformation may also include information indicating whether a world is made only of static objects or includes a dynamic object.

The following describes variations of the present embodiment.

The encoding device or the decoding device may encode or decode two or more mutually different SPCs or GOSs in parallel. GOSs to be encoded or decoded in parallel can be determined on the basis of meta-information, etc. indicating the spatial positions of the GOSs.

When three-dimensional data is used as a spatial map for use by a car or a flying object, etc. in traveling, or for creation of such a spatial map, for example, the encoding device or the decoding device may encode or decode GOSs or SPCs included in a space that is identified on the basis of GPS information, the route information, the zoom magnification, etc.

The decoding device may also start decoding sequentially from a space that is close to the self-location or the traveling route. The encoding device or the decoding device may give a lower priority to a space distant from the self-location or the traveling route than the priority of a nearby space to encode or decode such distant place. To "give a lower priority" means here, for example, to lower the priority in the processing sequence, to decrease the resolution (to apply decimation in the processing), or to lower the image quality (to increase the encoding efficiency by, for example, setting the quantization step to larger).

When decoding encoded data that is hierarchically encoded in a space, the decoding device may decode only the bottom level in the hierarchy.

The decoding device may also start decoding preferentially from the bottom level of the hierarchy in accordance with the zoom magnification or the intended use of the map.

For self-location estimation or object recognition, etc. involved in the self-driving of a car or a robot, the encoding device or the decoding device may encode or decode regions at a lower resolution, except for a region that is lower than or at a specified height from the ground (the region to be recognized).

The encoding device may also encode point clouds representing the spatial shapes of a room interior and a room exterior separately. For example, the separation of a GOS representing a room interior (interior GOS) and a GOS representing a room exterior (exterior GOS) enables the decoding device to select a GOS to be decoded in accordance with a viewpoint location, when using the encoded data.

The encoding device may also encode an interior GOS and an exterior GOS having close coordinates so that such GOSs come adjacent to each other in an encoded stream. For example, the encoding device associates the identifiers of such GOSs with each other, and stores information indicating the associated identifiers into the meta-information that is stored in the encoded stream or stored separately. This enables the decoding device to refer to the information in the meta-information to identify an interior GOS and an exterior GOS having close coordinates.

The encoding device may also change the GOS size or the SPC size depending on whether a GOS is an interior GOS or an exterior GOS. For example, the encoding device sets the size of an interior GOS to smaller than the size of an exterior GOS. The encoding device may also change the accuracy of extracting keypoints from a point cloud, or the accuracy of detecting objects, for example, depending on whether a GOS is an interior GOS or an exterior GOS.

The encoding device may also add, to encoded data, information by which the decoding device displays objects with a distinction between a dynamic object and a static object. This enables the decoding device to display a dynamic object together with, for example, a red box or letters for explanation. Note that the decoding device may display only a red box or letters for explanation, instead of a dynamic object. The decoding device may also display more particular object types. For example, a red box may be used for a car, and a yellow box may be used for a person.

The encoding device or the decoding device may also determine whether to encode or decode a dynamic object and a static object as a different SPC or GOS, in accordance with, for example, the appearance frequency of dynamic objects or a ratio between static objects and dynamic objects. For example, when the appearance frequency or the ratio of dynamic objects exceeds a threshold, a SPC or a GOS including a mixture of a dynamic object and a static object is accepted, while when the appearance frequency or the ratio of dynamic objects is below a threshold, a SPC or GOS including a mixture of a dynamic object and a static object is unaccepted.

When detecting a dynamic object not from a point cloud but from two-dimensional image information of a camera, the encoding device may separately obtain information for identifying a detection result (box or letters) and the object position, and encode these items of information as part of the encoded three-dimensional data. In such a case, the decoding device superimposes auxiliary information (box or letters) indicating the dynamic object onto a resultant of decoding a static object to display it.

The encoding device may also change the sparseness and denseness of VXLs or VLMs in a SPC in accordance with the degree of complexity of the shape of a static object. For example, the encoding device sets VXLs or VLMs at a higher density as the shape of a static object is more complex. The encoding device may further determine a quantization step, etc. for quantizing spatial positions or color information in accordance with the sparseness and denseness of VXLs or VLMs. For example, the encoding device sets the quantization step to smaller as the density of VXLs or VLMs is higher.

As described above, the encoding device or the decoding device according to the present embodiment encodes or decodes a space on a SPC-by-SPC basis that includes coordinate information.

Furthermore, the encoding device and the decoding device perform encoding or decoding on a volume-by-volume basis in a SPC. Each volume includes a voxel, which is the minimum unit in which position information is associated.

Also, using a table that associates the respective elements of spatial information including coordinates, objects, and times with GOSs or using a table that associates these elements with each other, the encoding device and the decoding device associate any ones of the elements with each other to perform encoding or decoding. The decoding device uses the values of the selected elements to determine the coordinates, and identifies a volume, a voxel, or a SPC from such coordinates to decode a SPC including such volume or voxel, or the identified SPC.

Furthermore, the encoding device determines a volume, a voxel, or a SPC that is selectable in accordance with the elements, through extraction of keypoints and object recognition, and encodes the determined volume, voxel, or SPC, as a volume, a voxel, or a SPC to which random access is possible.

SPCs are classified into three types: I-SPC that is singly encodable or decodable; P-SPC that is encoded or decoded by referring to any one of the processed SPCs; and B-SPC that is encoded or decoded by referring to any two of the processed SPCs.

At least one volume corresponds to a static object or a dynamic object. A SPC including a static object and a SPC including a dynamic object are encoded or decoded as mutually different GOSs. Stated differently, a SPC including a static object and a SPC including a dynamic object are assigned to different GOSs.

Dynamic objects are encoded or decoded on an object-by-object basis, and are associated with at least one SPC including a static object. Stated differently, a plurality of dynamic objects are individually encoded, and the obtained encoded data of the dynamic objects is associated with a SPC including a static object.

The encoding device and the decoding device give an increased priority to I-SPC(s) in a GOS to perform encoding or decoding. For example, the encoding device performs encoding in a manner that prevents the degradation of I-SPCs (in a manner that enables the original three-dimensional data to be reproduced with a higher fidelity after decoded). The decoding device decodes, for example, only I-SPCs.

The encoding device may change the frequency of using I-SPCs depending on the sparseness and denseness or the number (amount) of the objects in a world to perform encoding. Stated differently, the encoding device changes the frequency of selecting I-SPCs depending on the number or the sparseness and denseness of the objects included in the three-dimensional data. For example, the encoding device uses I-SPCs at a higher frequency as the density of the objects in a world is higher.

The encoding device also sets random access points on a GOS-by-GOS basis, and stores information indicating the spatial regions corresponding to the GOSs into the header information.

The encoding device uses, for example, a default value as the spatial size of a GOS. Note that the encoding device may change the GOS size depending on the number (amount) or the sparseness and denseness of objects or dynamic objects. For example, the encoding device sets the spatial size of a GOS to smaller as the density of objects or dynamic objects is higher or the number of objects or dynamic objects is greater.

Also, each SPC or volume includes a keypoint group that is derived by use of information obtained by a sensor such as a depth sensor, a gyroscope sensor, or a camera sensor. The coordinates of the keypoints are set at the central positions of the respective voxels. Furthermore, finer voxels enable highly accurate position information.

The keypoint group is derived by use of a plurality of pictures. A plurality of pictures include at least two types of time information: the actual time information and the same time information common to a plurality of pictures that are associated with SPCs (for example, the encoding time used for rate control, etc).

Also, encoding or decoding is performed on a GOS-by-GOS basis that includes at least one SPC.

The encoding device and the decoding device predict P-SPCs or B-SPCs in a current GOS by referring to SPCs in a processed GOS.

Alternatively, the encoding device and the decoding device predict P-SPCs or B-SPCs in a current GOS, using the processed SPCs in the current GOS, without referring to a different GOS.

Furthermore, the encoding device and the decoding device transmit or receive an encoded stream on a world-by-world basis that includes at least one GOS.

Also, a GOS has a layer structure in one direction at least in a world, and the encoding device and the decoding device start encoding or decoding from the bottom layer. For example, a random accessible SOS belongs to the lowermost layer. A SOS that belongs to the same layer or a lower layer is referred to in a SOS that belongs to an upper layer. Stated differently, a GOS is spatially divided in a predetermined direction in advance to have a plurality of layers, each including at least one SPC. The encoding device and the decoding device encode or decode each SPC by referring to a SPC included in the same layer as the each SPC or a SPC included in a layer lower than that of the each SPC.

Also, the encoding device and the decoding device successively encode or decode GOSs on a world-by-world basis that includes such GOSs. In so doing, the encoding device and the decoding device write or read out information indicating the order (direction) of encoding or decoding as metadata. Stated differently, the encoded data includes information indicating the order of encoding a plurality of GOSs.

The encoding device and the decoding device also encode or decode mutually different two or more SPCs or SOSs in parallel.

Furthermore, the encoding device and the decoding device encode or decode the spatial information (coordinates, size, etc.) on a SPC or a SOS.

The encoding device and the decoding device encode or decode SPCs or GOSs included in an identified space that is identified on the basis of external information on the self-location or/and region size, such as GPS information, route information, or magnification.

The encoding device or the decoding device gives a lower priority to a space distant from the self-location than the priority of a nearby space to perform encoding or decoding.

The encoding device sets a direction at one of the directions in a world, in accordance with the magnification or the intended use, to encode a GOS having a layer structure in such direction. Also, the decoding device decodes a GOS having a layer structure in one of the directions in a world that has been set in accordance with the magnification or the intended use, preferentially from the bottom layer.

The encoding device changes the accuracy of extracting keypoints, the accuracy of recognizing objects, or the size of spatial regions, etc. included in a SPC, depending on whether an object is an interior object or an exterior object. Note that the encoding device and the decoding device encode or decode an interior GOS and an exterior GOS having close coordinates in a manner that these GOSs come adjacent to each other in a world, and associates their identifiers with each other for encoding and decoding.

Embodiment 2

When using encoded data of a point cloud in an actual device or service, it is desirable that necessary information be transmitted/received in accordance with the intended use to reduce the network bandwidth. However, there has been no such functionality in the structure of encoding three-dimensional data, nor an encoding method therefor.

The present embodiment describes a three-dimensional data encoding method and a three-dimensional data encoding device for providing the functionality of transmitting/receiving only necessary information in encoded data of a three-dimensional point cloud in accordance with the intended use, as well as a three-dimensional data decoding method and a three-dimensional data decoding device for decoding such encoded data.

Figure 11:
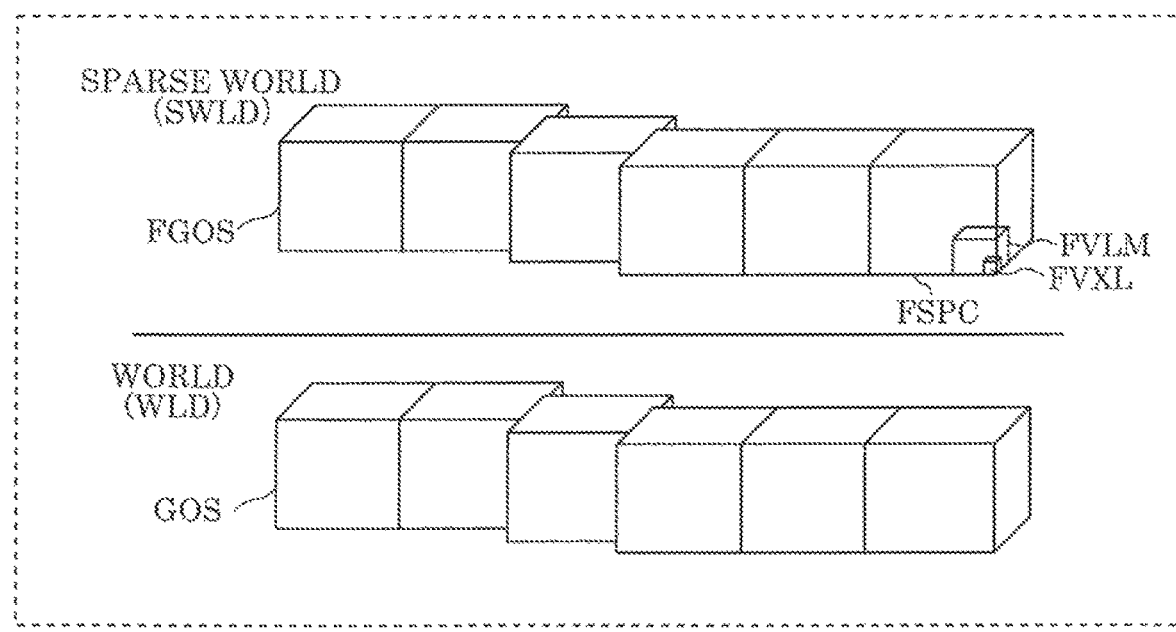
FIG. 11 is a diagram showing an example structure of a SWLD according to Embodiment 2.

A voxel (VXL) with a feature greater than or equal to a given amount is defined as a feature voxel (FVXL), and a world (WLD) constituted by FVXLs is defined as a sparse world (SWLD). FIG. 11 is a diagram showing example structures of a sparse world and a world. A SWLD includes: FGOSs, each being a GOS constituted by FVXLs; FSPCs, each being a SPC constituted by FVXLs; and FVLMs, each being a VLM constituted by FVXLs. The data structure and prediction structure of a FGOS, a FSPC, and a FVLM may be the same as those of a GOS, a SPC, and a VLM.

A feature represents the three-dimensional position information on a VXL or the visible-light information on the position of a VXL. A large number of features are detected especially at a corner, an edge, etc. of a three-dimensional object. More specifically, such a feature is a three-dimensional feature or a visible-light feature as described below, but may be any feature that represents the position, luminance, or color information, etc. on a VXL.

Used as three-dimensional features are signature of histograms of orientations (SHOT) features, point feature histograms (PFH) features, or point pair feature (PPF) features.

SHOT features are obtained by dividing the periphery of a VXL, and calculating an inner product of the reference point and the normal vector of each divided region to represent the calculation result as a histogram. SHOT features are characterized by a large number of dimensions and high-level feature representation.

PFH features are obtained by selecting a large number of two point pairs in the vicinity of a VXL, and calculating the normal vector, etc. from each two point pair to represent the calculation result as a histogram, PFH features are histogram features, and thus are characterized by robustness against a certain extent of disturbance and also high-level feature representation.

PPF features are obtained by using a normal vector, etc. for each two points of VXLs, PPF features, for which all VXLs are used, has robustness against occlusion.

Used as visible-light features are scale-invariant feature transform (SIFT), speeded up robust features (SURF), or histogram of oriented gradients (HOG), etc. that use information on an image such as luminance gradient information.

A SWLD is generated by calculating the above-described features of the respective VXLs in a WLD to extract FVXLs. Here, the SWLD may be updated every time the WLD is updated, or may be regularly updated after the elapse of a certain period of time, regardless of the timing at which the WLD is updated.

A SWLD may be generated for each type of features. For example, different SWLDs may be generated for the respective types of features, such as SWLD1 based on SHOT features and SWLD2 based on SIFT features so that SWLDs are selectively used in accordance with the intended use. Also, the calculated feature of each FVXL may be held in each FVXL as feature information.

Next, the usage of a sparse world (SWLD) will be described. A SWLD includes only feature voxels (FVXLs), and thus its data size is smaller in general than that of a WLD that includes all VXLs.

In an application that utilizes features for a certain purpose, the use of information on a SWLD instead of a WLD reduces the time required to read data from a hard disk, as well as the bandwidth and the time required for data transfer over a network. For example, a WLD and a SWLD are held in a server as map information so that map information to be sent is selected between the WLD and the SWLD in accordance with a request from a client. This reduces the network bandwidth and the time required for data transfer. More specific examples will be described below.

Figure 12:
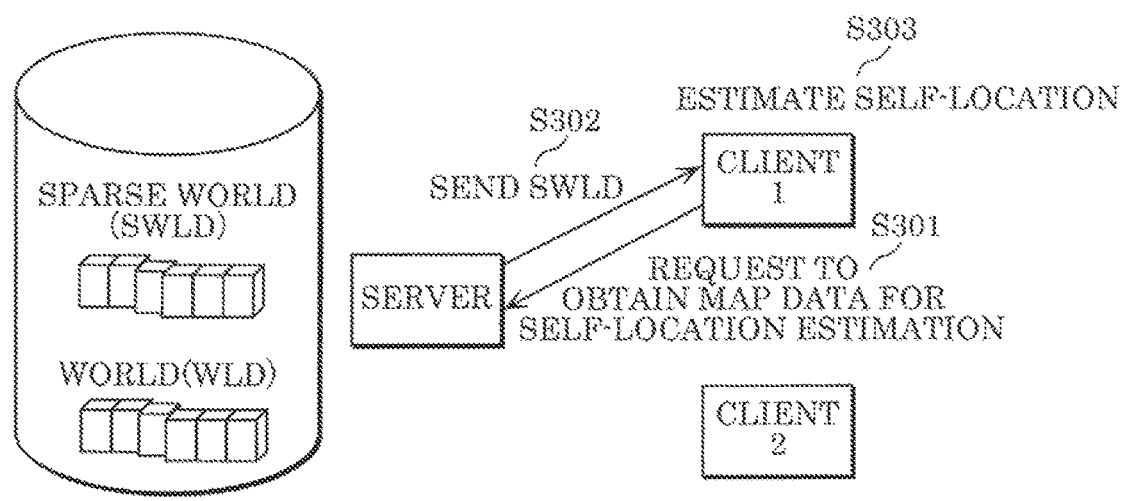
FIG. 12 is a diagram showing example operations performed by a server and a client according to Embodiment 2.
Figure 13:
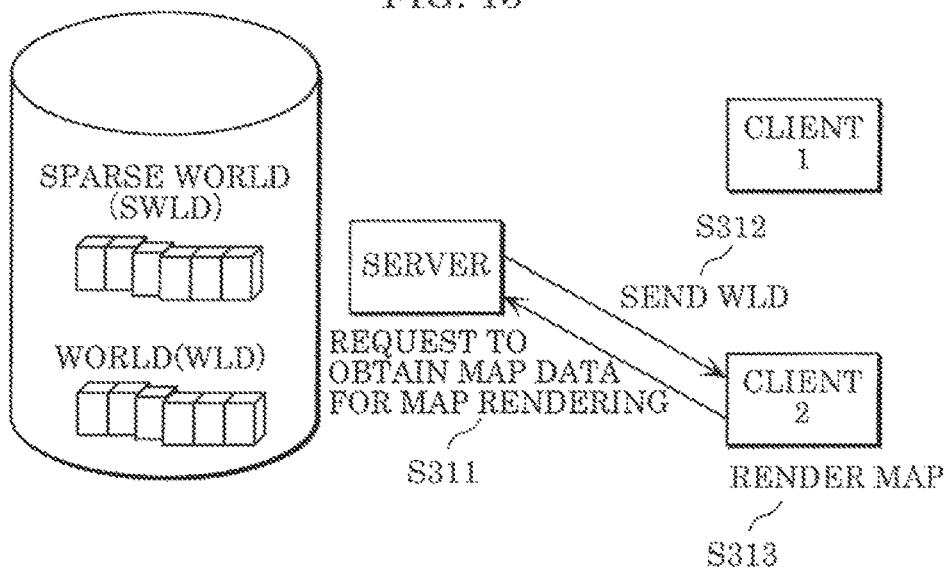
FIG. 13 is a diagram showing example operations performed by the server and a client according to Embodiment 2.

FIG. 12 and FIG. 13 are diagrams showing usage examples of a SWLD and a WLD. As FIG. 12 shows, when client 1, which is a vehicle-mounted device, requires map information to use it for self-location determination, client 1 sends to a server a request for obtaining map data for self-location estimation (S301). The server sends to client 1 the SWLD in response to the obtainment request (S302). Client 1 uses the received SWLD to determine the self-location (S303). In so doing, client 1 obtains VXL information on the periphery of client 1 through various means including a distance sensor such as a rangefinder, as well as a stereo camera and a combination of a plurality of monocular cameras. Client 1 then estimates the self-location information from the obtained VXL information and the SWLD. Here, the self-location information includes three-dimensional position information, orientation, etc. of client 1.

As FIG. 13 shows, when client 2, which is a vehicle-mounted device, requires map information to use it for rendering a map such as a three-dimensional map, client 2 sends to the server a request for obtaining map data for map rendering (S311). The server sends to client 2 the WLD in response to the obtainment request (S312). Client 2 uses the received WLD to render a map (S313). In so doing, client 2 uses, for example, an image client 2 has captured by a visible-light camera, etc. and the WLD obtained from the server to create a rendering image, and renders such created image onto a screen of a car navigation system, etc.

As described above, the server sends to a client a SWLD when the features of the respective VXLs are mainly required such as in the case of self-location estimation, and sends to a client a WLD when detailed VXL information is required such as in the case of map rendering. This allows for an efficient sending/receiving of map data.

Note that a client may self-judge which one of a SWLD and a WLD is necessary, and request the server to send a SWLD or a WLD. Also, the server may judge which one of a SWLD and a WLD to send in accordance with the status of the client or a network.

Next, a method will be described of switching the sending/receiving between a sparse world (SWLD) and a world (WLD).

Figure 14:
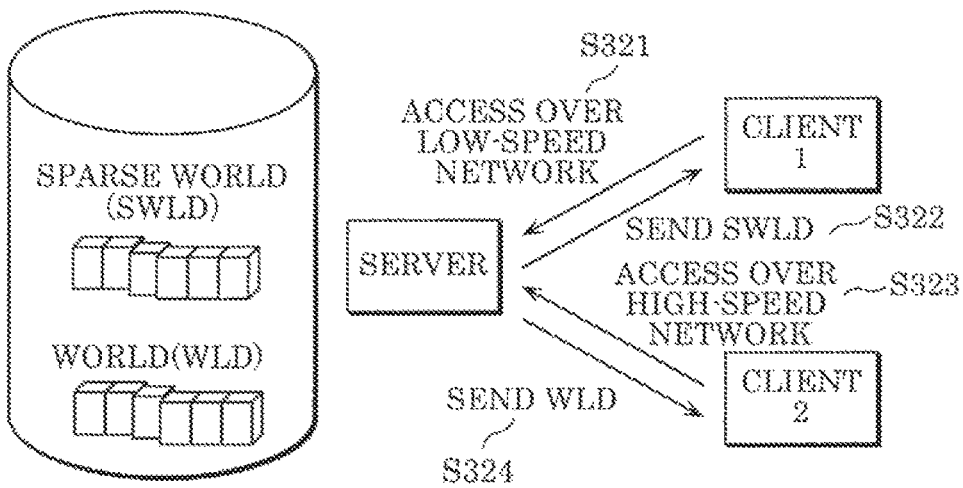
FIG. 14 is a diagram showing example operations performed by the server and the clients according to Embodiment 2.

Whether to receive a WLD or a SWLD may be switched in accordance with the network bandwidth. FIG. 14 is a diagram showing an example operation in such case. For example, when a low-speed network is used that limits the usable network bandwidth, such as in a Long-Term Evolution (LTE) environment, a client accesses the server over a low-speed network S321), and obtains the SWLD from the server as map information (S322). Meanwhile, when a high-speed network is used that has an adequately broad network bandwidth, such as in a WiFi environment, a client accesses the server over a high-speed network (S323), and obtains the WLD from the server (S324). This enables the client to obtain appropriate map information in accordance with the network bandwidth such client is using.

More specifically, a client receives the SWLD over an LTE network when in outdoors, and obtains the WLD over a WiFi network when in indoors such as in a facility. This enables the client to obtain more detailed map information on indoor environment.

As described above, a client may request for a WLD or a SWLD in accordance with the bandwidth of a network such client is using. Alternatively, the client may send to the server information indicating the bandwidth of a network such client is using, and the server may send to the client data (the WLD or the SWLD) suitable for such client in accordance with the information. Alternatively, the server may identify the network bandwidth the client is using, and send to the client data (the WLD or the SWLD) suitable for such client.

Figure 15:
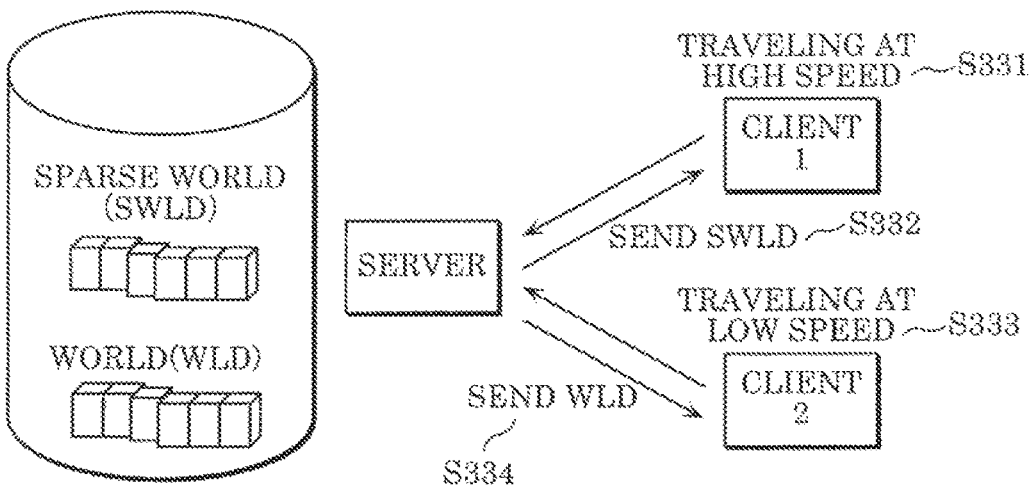
FIG. 15 is a diagram showing example operations performed by the server and the clients according to Embodiment 2.

Also, whether to receive a WLD or a SWLD may be switched in accordance with the speed of traveling. FIG. 15 is a diagram showing an example operation in such case. For example, when traveling at a high speed (S331), a client receives the SWLD from the server (S332). Meanwhile, when traveling at a low speed (S333), the client receives the WLD from the server (S334). This enables the client to obtain map information suitable to the speed, while reducing the network bandwidth. More specifically, when traveling on an expressway, the client receives the SWLD with a small data amount, which enables the update of rough map information at an appropriate speed. Meanwhile, when traveling on a general road, the client receives the WLD, which enables the obtainment of more detailed map information.

As described above, the client may request the server for a WLD or a SWLD in accordance with the traveling speed of such client. Alternatively, the client may send to the server information indicating the traveling speed of such client, and the server may send to the client data (the WLD or the SWLD) suitable to such client in accordance with the information. Alternatively, the server may identify the traveling speed of the client to send data (the WLD or the SWLD) suitable to such client.

Also, the client may obtain, from the server, a SWLD first, from which the client may obtain a WLD of an important region. For example, when obtaining map information, the client first obtains a SWLD for rough map information, from which the client narrows to a region in which features such as buildings, signals, or persons appear at high frequency so that the client can later obtain a WLD of such narrowed region. This enables the client to obtain detailed information on a necessary region, while reducing the amount of data received from the server.

The server may also create from a WLD different SWLDs for the respective objects, and the client may receive SWLDs in accordance with the intended use. This reduces the network bandwidth. For example, the server recognizes persons or cars in a WLD in advance, and creates a SWLD of persons and a SWLD of cars. The client, when wishing to obtain information on persons around the client, receives the SWLD of persons, and when wising to obtain information on cars, receives the SWLD of cars. Such types of SWLDs may be distinguished by information (flag, or type, etc.) added to the header, etc.

Figure 16:
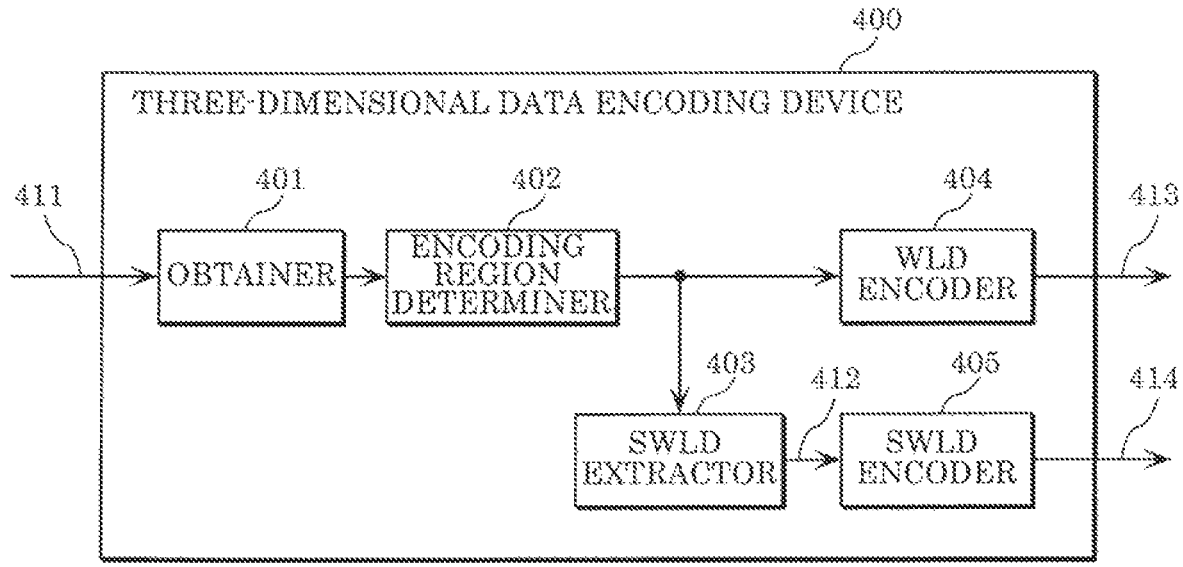
FIG. 16 is a block diagram of a three-dimensional data encoding device according to Embodiment 2.
Figure 17:
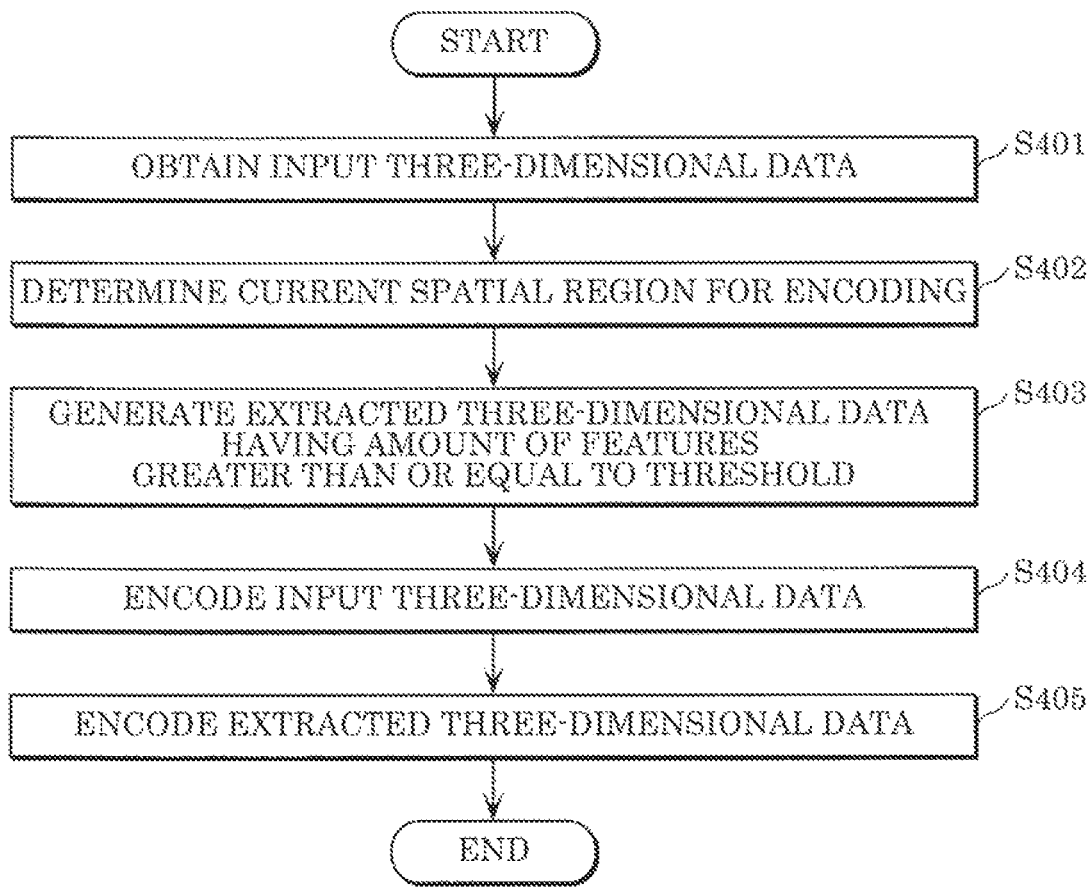
FIG. 17 is a flowchart of encoding processes according to Embodiment 2.

Next, the structure and the operation flow of the three-dimensional data encoding device (e.g., a server) according to the present embodiment will be described. FIG. 16 is a block diagram of three-dimensional data encoding device 400 according to the present embodiment. FIG. 17 is a flowchart of three-dimensional data encoding processes performed by three-dimensional data encoding device 400.

Three-dimensional data encoding device 400 shown in FIG. 16 encodes input three-dimensional data 411, thereby generating encoded three-dimensional data 413 and encoded three-dimensional data 414, each being an encoded stream. Here, encoded three-dimensional data 413 is encoded three-dimensional data corresponding to a WLD, and encoded three-dimensional data 414 is encoded three-dimensional data corresponding to a SWLD. Such three-dimensional data encoding device 400 includes, obtainer 401, encoding region determiner 402, SWLD extractor 403, WLD encoder 404, and SWLD encoder 405.

First, as FIG. 17 shows, obtainer 401 obtains input three-dimensional data 411, which is point group data in a three-dimensional space (S401).

Next, encoding region determiner 402 determines a current spatial region for encoding on the basis of a spatial region in which the point cloud data is present (S402).

Next, SWLD extractor 403 defines the current spatial region as a WLD, and calculates the feature from each VXL included in the WLD. Then, SWLD extractor 403 extracts VXLs having an amount of features greater than or equal to a predetermined threshold, defines the extracted VXLs as FVXLs, and adds such FVXLs to a SWLD, thereby generating extracted three-dimensional data 412 (S403). Stated differently, extracted three-dimensional data 412 having an amount of features greater than or equal to the threshold is extracted from input three-dimensional data 411.

Next, WLD encoder 404 encodes input three-dimensional data 411 corresponding to the WLD, thereby generating encoded three-dimensional data 413 corresponding to the WLD (S404). In so doing, WLD encoder 404 adds to the header of encoded three-dimensional data 413 information that distinguishes that such encoded three-dimensional data 413 is a stream including a WLD.

SWLD encoder 405 encodes extracted three-dimensional data 412 corresponding to the SWLD, thereby generating encoded three-dimensional data 414 corresponding to the SWLD (S405). In so doing, SWLD encoder 405 adds to the header of encoded three-dimensional data 414 information that distinguishes that such encoded three-dimensional data 414 is a stream including a SWLD.

Note that the process of generating encoded three-dimensional data 413 and the process of generating encoded three-dimensional data 414 may be performed in the reverse order. Also note that a part or all of these processes may be performed in parallel.

A parameter "world_type" is defined, for example, as information added to each header of encoded three-dimensional data 413 and encoded three-dimensional data 414. world_type=0 indicates that a stream includes a WLD, and world_type=1 indicates that a stream includes a SWLD. An increased number of values may be further assigned to define a larger number of types, e.g., world_type=2. Also, one of encoded three-dimensional data 413 and encoded three-dimensional data 414 may include a specified flag. For example, encoded three-dimensional data 414 may be assigned with a flag indicating that such stream includes a SWLD. In such a case, the decoding device can distinguish whether such stream is a stream including a WLD or a stream including a SWLD in accordance with the presence/absence of the flag.

Also, an encoding method used by WLD encoder 404 to encode a WLD may be different from an encoding method used by SWLD encoder 405 to encode a SWLD.

For example, data of a SWLD is decimated, and thus can have a lower correlation with the neighboring data than that of a WLD. For this reason, of intra prediction and inter prediction, inter prediction may be more preferentially performed in an encoding method used for a SWLD than in an encoding method used for a WLD.

Also, an encoding method used for a SWLD and an encoding method used for a WLD may represent three-dimensional positions differently. For example, three-dimensional coordinates may be used to represent the three-dimensional positions of FVXLs in a SWLD and an octree described below may be used to represent three-dimensional positions in a WLD, and vice versa.

Also, SWLD encoder 405 performs encoding in a manner that encoded three-dimensional data 414 of a SWLD has a smaller data size than the data size of encoded three-dimensional data 413 of a WLD. A SWLD can have a lower inter-data correlation, for example, than that of a WLD as described above. This can lead to a decreased encoding efficiency, and thus to encoded three-dimensional data 414 having a larger data size than the data size of encoded three-dimensional data 413 of a WLD. When the data size of the resulting encoded three-dimensional data 414 is larger than the data size of encoded three-dimensional data 413 of a WLD, SWLD encoder 405 performs encoding again to re-generate encoded three-dimensional data 414 having a reduced data size.

For example, SWLD extractor 403 re-generates extracted three-dimensional data 412 having a reduced number of keypoints to be extracted, and SWLD encoder 405 encodes such extracted three-dimensional data 412. Alternatively, SWLD encoder 405 may perform more coarse quantization. More coarse quantization is achieved, for example, by rounding the data in the lowermost level in an octree structure described below.

When failing to decrease the data size of encoded three-dimensional data 414 of the SWLD to smaller than the data size of encoded three-dimensional data 413 of the WLD, SWLD encoder 405 may not generate encoded three-dimensional data 414 of the SWLD. Alternatively, encoded three-dimensional data 413 of the WLD may be copied as encoded three-dimensional data 414 of the SWLD. Stated differently, encoded three-dimensional data 413 of the WLD may be used as it is as encoded three-dimensional data 414 of the SWLD.

Figure 18:
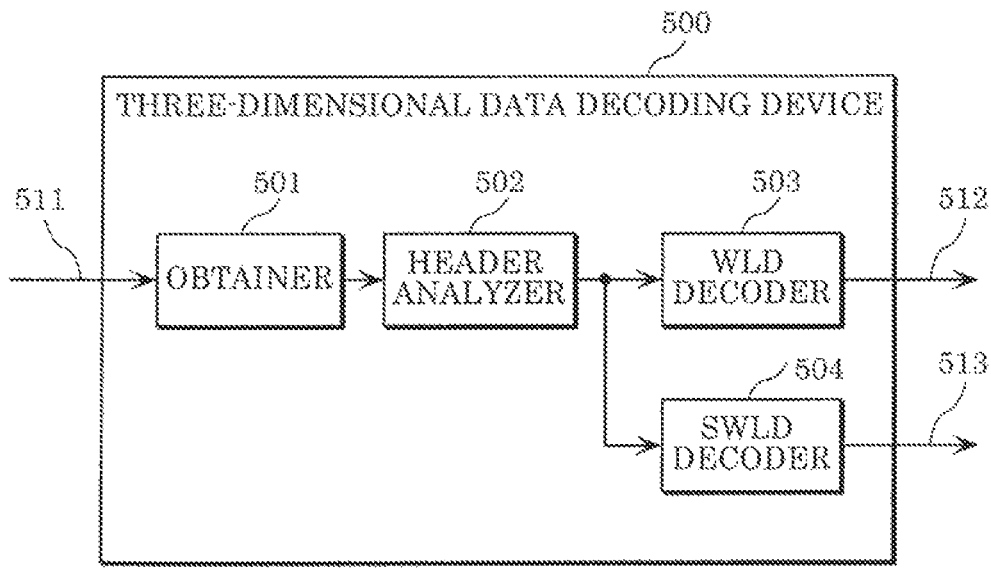
FIG. 18 is a block diagram of a three-dimensional data decoding device according to Embodiment 2.
Figure 19:
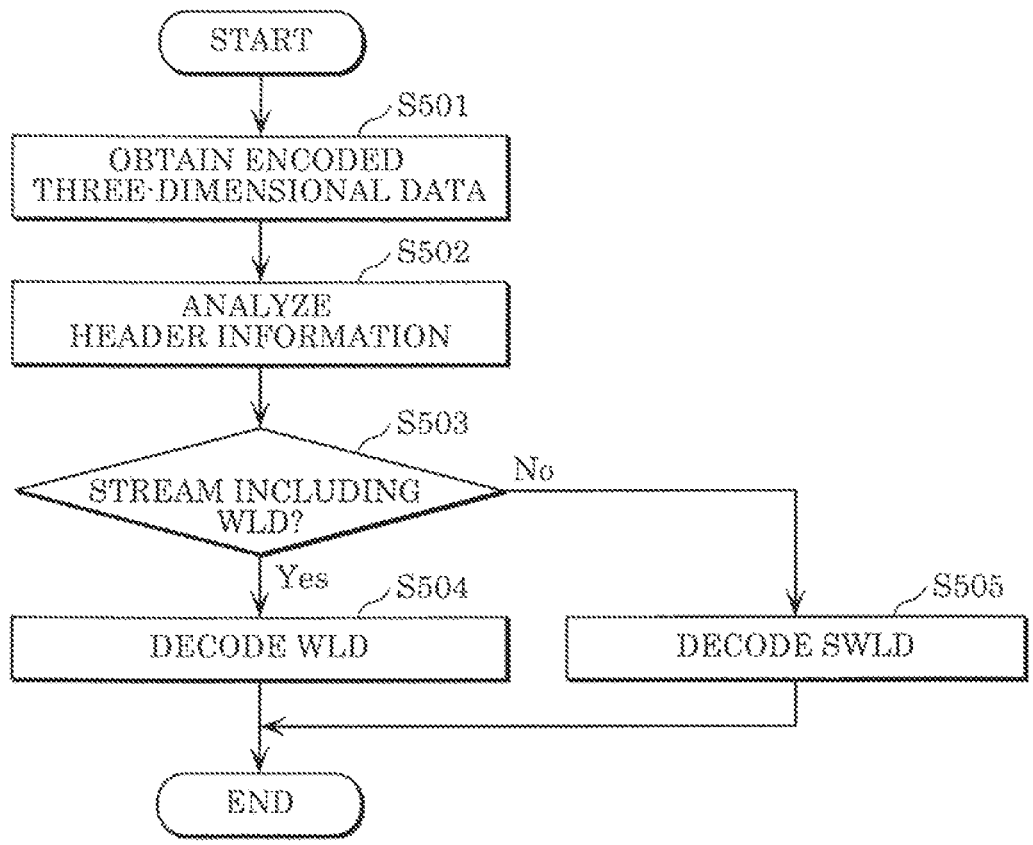
FIG. 19 is a flowchart of decoding processes according to Embodiment 2.

Next, the structure and the operation flow of the three-dimensional data decoding device (e.g., a client) according to the present embodiment will be described. FIG. 18 is a block diagram of three-dimensional data decoding device 500 according to the present embodiment. FIG. 19 is a flowchart of three-dimensional data decoding processes performed by three-dimensional data decoding device 500.

Three-dimensional data decoding device 500 shown in FIG. 18 decodes encoded three-dimensional data 511, thereby generating decoded three-dimensional data 512 or decoded three-dimensional data 513. Encoded three-dimensional data 511 here is, for example, encoded three-dimensional data 413 or encoded three-dimensional data 414 generated by three-dimensional data encoding device 400.

Such three-dimensional data decoding device 500 includes obtainer 501, header analyzer 502, WLD decoder 503, and SWLD decoder 504.

First, as FIG. 19 shows, obtainer 501 obtains encoded three-dimensional data 511 (S501). Next, header analyzer 502 analyzes the header of encoded three-dimensional data 511 to identify whether encoded three-dimensional data 511 is a stream including a WLD or a stream including a SWLD (S502). For example, the above-described parameter world type is referred to in making such identification.

When encoded three-dimensional data 511 is a stream including a WLD (Yes in S503), WLD decoder 503 decodes encoded three-dimensional data 511, thereby generating decoded three-dimensional data 512 of the WLD (S504). Meanwhile, when encoded three-dimensional data 511 is a stream including a SWLD (No in S503), SWLD decoder 504 decodes encoded three-dimensional data 511, thereby generating decoded three-dimensional data 513 of the SWLD (S505).

Also, as in the case of the encoding device, a decoding method used by WLD decoder 503 to decode a WLD may be different from a decoding method used by SWLD decoder 504 to decode a SWLD. For example, of intra prediction and inter prediction, inter prediction may be more preferentially performed in a decoding method used for a SWLD than in a decoding method used for a WLD.

Also, a decoding method used for a SWLD and a decoding method used for a WLD may represent three-dimensional positions differently. For example, three-dimensional coordinates may be used to represent the three-dimensional positions of FVXLs in a SWLD and an octree described below may be used to represent three-dimensional positions in a WLD, and vice versa.

Figure 20:
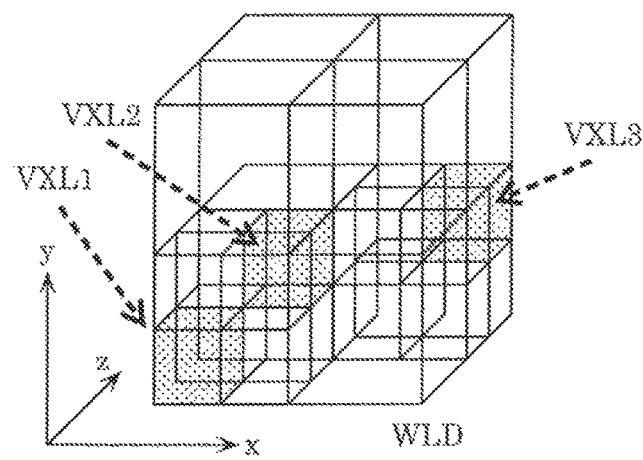
FIG. 20 is a diagram showing an example structure of a WLD according to Embodiment 2.
Figure 21:
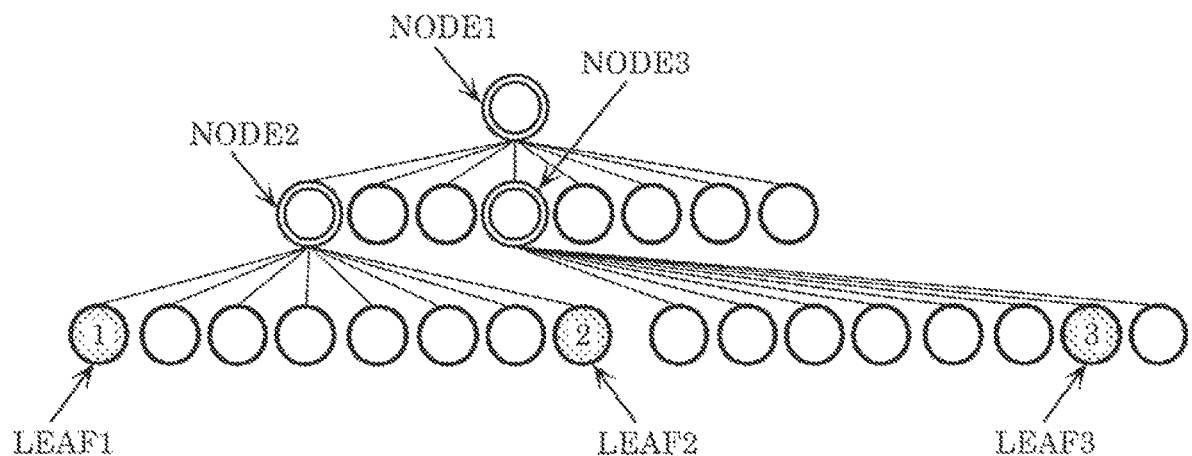
FIG. 21 is a diagram showing an example octree structure of the WLD according to Embodiment 2.

Next, an octree representation will be described, which is a method of representing three-dimensional positions. VXL data included in three-dimensional data is converted into an octree structure before encoded. FIG. 20 is a diagram showing example VXLs in a WLD. FIG. 21 is a diagram showing an octree structure of the WLD shown in FIG. 20. An example shown in FIG. 20 illustrates three VXLs 1 to 3 that include point groups (hereinafter referred to as effective VXLs). As FIG. 21 shows, the octree structure is made of nodes and leaves. Each node has a maximum of eight nodes or leaves. Each leaf has VXL information. Here, of the leaves shown in FIG. 21, leaf 1, leaf 2, and leaf 3 represent VXL1, VXL2, and VXL3 shown in FIG. 20, respectively.

More specifically, each node and each leaf correspond to a three-dimensional position. Node 1 corresponds to the entire block shown in FIG. 20. The block that corresponds to node 1 is divided into eight blocks. Of these eight blocks, blocks including effective VXLs are set as nodes, while the other blocks are set as leaves. Each block that corresponds to a node is further divided into eight nodes or leaves. These processes are repeated by the number of times that is equal to the number of levels in the octree structure. All blocks in the lowermost level are set as leaves.

Figure 22:
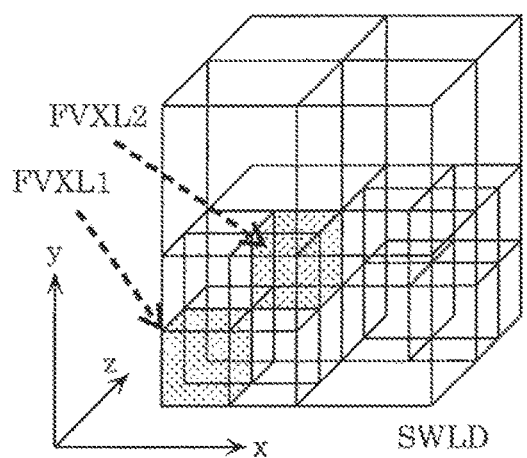
FIG. 22 is a diagram showing an example structure of a SWLD according to Embodiment 2.
Figure 23:
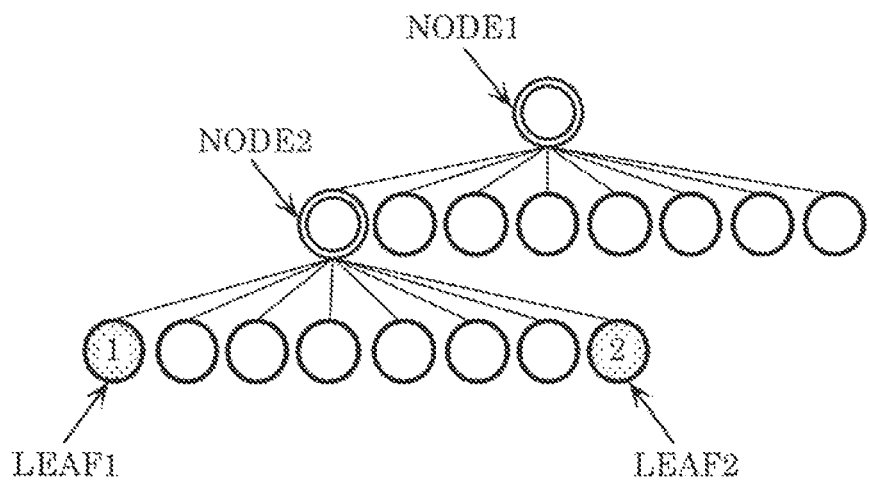
FIG. 23 is a diagram showing an example octree structure of the SWLD according to Embodiment 2.

FIG. 22 is a diagram showing an example SWLD generated from the WLD shown in FIG. 20. VXL1 and VXL2 shown in FIG. 20 are judged as FVXL1 and FVXL2 as a result of feature extraction, and thus are added to the SWLD. Meanwhile, VXL3 is not judged as a FVXL, and thus is not added to the SWLD. FIG. 23 is a diagram showing an octree structure of the SWLD shown in FIG. 22. In the octree structure shown in FIG. 23, leaf 3 corresponding to VXL3 shown in FIG. 21 is deleted. Consequently, node 3 shown in FIG. 21 has lost an effective VXL, and has changed to a leaf. As described above, a SWLD has a smaller number of leaves in general than a WLD does, and thus the encoded three-dimensional data of the SWLD is smaller than the encoded three-dimensional data of the WLD.

The following describes variations of the present embodiment.

For self-location estimation, for example, a client, being a vehicle-mounted device, etc., may receive a SWLD from the server to use such SWLD to estimate the self-location.

Meanwhile, for obstacle detection, the client may detect obstacles by use of three-dimensional information on the periphery obtained by such client through various means including a distance sensor such as a rangefinder, as well as a stereo camera and a combination of a plurality of monocular cameras.

In general, a SWLD is less likely to include VXL data on a flat region. As such, the server may hold a subsample world (subWLD) obtained by subsampling a WLD for detection of static obstacles, and send to the client the SWLD and the subWLD. This enables the client to perform self-location estimation and obstacle detection on the client's part, while reducing the network bandwidth.

When the client renders three-dimensional map data at a high speed, map information having a mesh structure is more useful in some cases. As such, the server may generate a mesh from a WLD to hold it beforehand as a mesh world (MWLD). For example, when wishing to perform coarse three-dimensional rendering, the client receives a MWLD, and when wishing to perform detailed three-dimensional rendering, the client receives a WLD. This reduces the network bandwidth.

In the above description, the server sets, as FVXLs, VXLs having an amount of features greater than or equal to the threshold, but the server may calculate FVXLs by a different method. For example, the server may judge that a VXL, a VLM, a SPC, or a GOS that constitutes a signal, or an intersection, etc. as necessary for self-location estimation, driving assist, or self-driving, etc., and incorporate such VXL, VLM, SPC, or GOS into a SWLD as a FVXL, a FVLM, a FSPC, or a FGOS. Such judgment may be made manually. Also, FVXLs, etc. that have been set on the basis of an amount of features may be added to FVXLs, etc. obtained by the above method. Stated differently, SWLD extractor 403 may further extract, from input three-dimensional data 411, data corresponding to an object having a predetermined attribute as extracted three-dimensional data 412.

Also, that a VXL, a VLM, a SPC, or a GOS is necessary for such intended usage may be labeled separately from the features. The server may separately hold, as an upper layer of a SWLD (e.g., a lane world), FVXLs of a signal or an intersection, etc. necessary for self-location estimation, driving assist, or self-driving, etc.

The server may also add an attribute to VXLs in a WLD on a random access basis or on a predetermined unit basis. An attribute, for example, includes information indicating whether VXLs are necessary for self-location estimation, or information indicating whether VXLs are important as traffic information such as a signal, or an intersection, etc. An attribute may also include a correspondence between VXLs and features (intersection, or road, etc.) in lane information (geographic data files (GDF), etc.).

A method as described below may he used to update a WLD or a SWLD.

Update information indicating changes, etc. in a person, a roadwork, or a tree line (for trucks) is uploaded to the server as point groups or meta data. The server updates a WLD on the basis of such uploaded information, and then updates a SWLD by use of the updated WLD.

The client, when detecting a mismatch between the three-dimensional information such client has generated at the time of self-location estimation and the three-dimensional information received from the server, may send to the server the three-dimensional information such client has generated, together with an update notification. In such a case, the server updates the SWLD by use of the WLD. When the SWLD is not to be updated, the server judges that the WLD itself is old.

In the above description, information that distinguishes whether an encoded stream is that of a WLD or a SWLD is added as header information of the encoded stream. However, when there are many types of worlds such as a mesh world and a lane world, information that distinguishes these types of the worlds may be added to header information. Also, when there are many SWLDs with different amounts of features, information that distinguishes the respective SWLDs may be added to header information.

In the above description, a SWLD is constituted by FVXLs, but a SWLD may include VXLs that have not been judged as FVXLs. For example, a SWLD may include an adjacent VXL used to calculate the feature of a FVXL. This enables the client to calculate the feature of a FVXL when receiving a SWLD, even in the case where feature information is not added to each FVXL of the SWLD. In such a case, the SWLD may include information that distinguishes whether each VXL is a FVXL or a VXL.

As described above, three-dimensional data encoding device 400 extracts, from input three-dimensional data 411 (first three-dimensional data), extracted three-dimensional data 412 (second three-dimensional data) having an amount of a feature greater than or equal to a threshold, and encodes extracted three-dimensional data 412 to generate encoded three-dimensional data 414 (first encoded three-dimensional data).

This three-dimensional data encoding device 400 generates encoded three-dimensional data 414 that is obtained by encoding data having an amount of a feature greater than or equal to the threshold. This reduces the amount of data compared to the case where input three-dimensional data 411 is encoded as it is. Three-dimensional data encoding device 400 is thus capable of reducing the amount of data to be transmitted.

Three-dimensional data encoding device 400 further encodes input three-dimensional data 411 to generate encoded three-dimensional data 413 (second encoded three-dimensional data).

This three-dimensional data encoding device 400 enables selective transmission of encoded three-dimensional data 413 and encoded three-dimensional data 414, in accordance, for example, with the intended use, etc.

Also, extracted three-dimensional data 412 is encoded by a first encoding method, and input three-dimensional data 411 is encoded by a second encoding method different from the first encoding method.

This three-dimensional data encoding device 400 enables the use of an encoding method suitable for each of input three-dimensional data 411 and extracted three-dimensional data 412.

Also, of intra prediction and inter prediction, the inter prediction is more preferentially performed in the first encoding method than in the second encoding method.

This three-dimensional data encoding device 400 enables inter prediction to be more preferentially performed on extracted three-dimensional data 412 in which adjacent data items are likely to have low correlation.

Also, the first encoding method and the second encoding method represent three-dimensional positions differently. For example, the second encoding method represents three-dimensional positions by octree, and the first encoding method represents three-dimensional positions by three-dimensional coordinates.

This three-dimensional data encoding device 400 enables the use of a more suitable method to represent the three-dimensional positions of three-dimensional data in consideration of the difference in the number of data items (the number of VXLs or FVXLs) included.

Also, at least one of encoded three-dimensional data 413 and encoded three-dimensional data 414 includes an identifier indicating whether the encoded three-dimensional data is encoded three-dimensional data obtained by encoding input three-dimensional data 411 or encoded three-dimensional data obtained by encoding part of input three-dimensional data 411. Stated differently, such identifier indicates whether the encoded three-dimensional data is encoded three-dimensional data 413 of a WLD or encoded three-dimensional data 414 of a SWLD.

This enables the decoding device to readily judge whether the obtained encoded three-dimensional data is encoded three-dimensional data 413 or encoded three-dimensional data 414.

Also, three-dimensional data encoding device 400 encodes extracted three-dimensional data 412 in a manner that encoded three-dimensional data 414 has a smaller data amount than a data amount of encoded three-dimensional data 413.

This three-dimensional data encoding device 400 enables encoded three-dimensional data 414 to have a smaller data amount than the data amount of encoded three-dimensional data 413.

Also, three-dimensional data encoding device 400 further extracts data corresponding to an object having a predetermined attribute from input three-dimensional data 411 as extracted three-dimensional data 412. The object having a predetermined attribute is, for example, an object necessary for self-location estimation, driving assist, or self-driving, etc., or more specifically, a signal, an intersection, etc.

This three-dimensional data encoding device 400 is capable of generating encoded three-dimensional data 414 that includes data required by the decoding device.

Also, three-dimensional data encoding device 400 (server) further sends, to a client, one of encoded three-dimensional data 413 and encoded three-dimensional data 414 in accordance with a status of the client.

This three-dimensional data encoding device 400 is capable of sending appropriate data in accordance with the status of the client.

Also, the status of the client includes one of a communication condition (e.g., network bandwidth) of the client and a traveling speed of the client.

Also, three-dimensional data encoding device 400 further sends, to a client, one of encoded three-dimensional data 413 and encoded three-dimensional data 414 in accordance with a request from the client.

This three-dimensional data encoding device 400 is capable of sending appropriate data in accordance with the request from the client.

Also, three-dimensional data decoding device 500 according to the present embodiment decodes encoded three-dimensional data 413 or encoded three-dimensional data 414 generated by three-dimensional data encoding device 400 described above.

Stated differently, three-dimensional data decoding device 500 decodes, by a first decoding method, encoded three-dimensional data 414 obtained by encoding extracted three-dimensional data 412 having an amount of a feature greater than or equal to a threshold, extracted three-dimensional data 412 having been extracted from input three-dimensional data 411. Three-dimensional data decoding device 500 also decodes, by a second decoding method, encoded three-dimensional data 413 obtained by encoding input three-dimensional data 411, the second decoding method being different from the first decoding method.

This three-dimensional data decoding device 500 enables selective reception of encoded three-dimensional data 414 obtained by encoding data having an amount of a feature greater than or equal to the threshold and encoded three-dimensional data 413, in accordance, for example, with the intended use, etc. Three-dimensional data decoding device 500 is thus capable of reducing the amount of data to be transmitted. Such three-dimensional data decoding device 500 further enables the use of a decoding method suitable for each of input three-dimensional data 411 and extracted three-dimensional data 412.

Also, of intra prediction and inter prediction, the inter prediction is more preferentially performed in the first decoding method than in the second decoding method.

This three-dimensional data decoding device 500 enables inter prediction to be more preferentially performed on the extracted three-dimensional data in which adjacent data items are likely to have low correlation.

Also, the first decoding method and the second decoding method represent three-dimensional positions differently. For example, the second decoding method represents three-dimensional positions by octree, and the first decoding method represents three-dimensional positions by three-dimensional coordinates.

This three-dimensional data decoding device 500 enables the use of a more suitable method to represent the three-dimensional positions of three-dimensional data in consideration of the difference in the number of data items (the number of VXLs or FVXLs) included.

Also, at least one of encoded three-dimensional data 413 and encoded three-dimensional data 414 includes an identifier indicating whether the encoded three-dimensional data is encoded three-dimensional data obtained by encoding input three-dimensional data 411 or encoded three-dimensional data obtained by encoding part of input three-dimensional data 411. Three-dimensional data decoding device 500 refers to such identifier in identifying between encoded three-dimensional data 413 and encoded three-dimensional data 414.

This three-dimensional data decoding device 500 is capable of readily judging whether the obtained encoded three-dimensional data is encoded three-dimensional data 413 or encoded three-dimensional data 414.

Three-dimensional data decoding device 500 further notifies a server of a status of the client (three-dimensional data decoding device 500). Three-dimensional data decoding device 500 receives one of encoded three-dimensional data 413 and encoded three-dimensional data 414 from the server, in accordance with the status of the client.

This three-dimensional data decoding device 500 is capable of receiving appropriate data in accordance with the status of the client.

Also, the status of the client includes one of a communication condition e.g., network bandwidth) of the client and a traveling speed of the client.

Three-dimensional data decoding device 500 further makes a request of the server for one of encoded three-dimensional data 413 and encoded three-dimensional data 414, and receives one of encoded three-dimensional data 413 and encoded three-dimensional data 414 from the server, in accordance with the request.

This three-dimensional data decoding device 500 is capable of receiving appropriate data in accordance with the intended use.

Embodiment 3

The present embodiment will describe a method of transmitting/receiving three-dimensional data between vehicles. For example, the three-dimensional data is transmitted/received between the own vehicle and the nearby vehicle.

Figure 24:
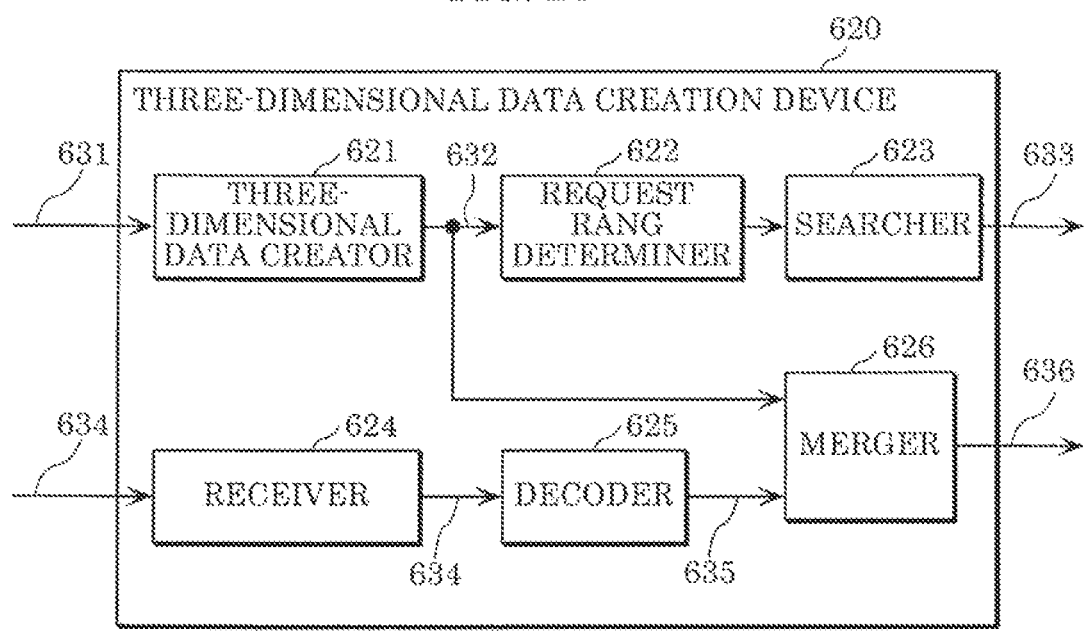
FIG. 24 is a block diagram of a three-dimensional data creation device according to Embodiment 3.

FIG. 24 is a block diagram of three-dimensional data creation device 620 according to the present embodiment. Such three-dimensional data creation device 620, which is included, for example, in the own vehicle, mergers first three-dimensional data 632 created by three-dimensional data creation device 620 with the received second three-dimensional data 635, thereby creating third three-dimensional data 636 having a higher density.

Such three-dimensional data creation device 620 includes three-dimensional data creator 621, request range determiner 622, searcher 623, receiver 624, decoder 625, and merger 626.

First, three-dimensional data creator 621 creates first three-dimensional data 632 by use of sensor information 631 detected by the sensor included in the own vehicle. Next, request range determiner 622 determines a request range, which is the range of a three-dimensional space, the data on which is insufficient in the created first three-dimensional data 632.

Next, searcher 623 searches for the nearby vehicle having the three-dimensional data of the request range, and sends request range information 633 indicating the request range to nearby vehicle 601 having been searched out (S623). Next, receiver 624 receives encoded three-dimensional data 634, which is an encoded stream of the request range, from nearby vehicle 601 (S624). Note that searcher 623 may indiscriminately send requests to all vehicles included in a specified range to receive encoded three-dimensional data 634 from a vehicle that has responded to the request. Searcher 623 may send a request not only to vehicles but also to an object such as a signal and a sign, and receive encoded three-dimensional data 634 from the object.

Next, decoder 625 decodes the received encoded three-dimensional data 634, thereby obtaining second three-dimensional data 635. Next, merger 626 merges first three-dimensional data 632 with second three-dimensional data 635, thereby creating three-dimensional data 636 having a higher density.

Figure 25:
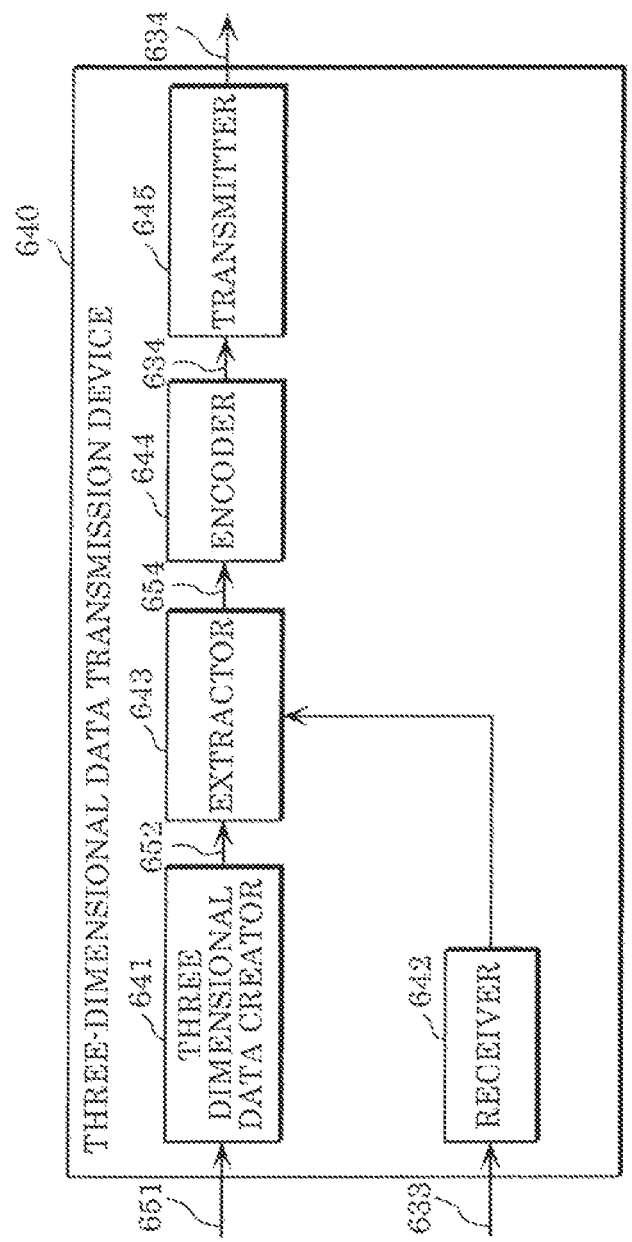
FIG. 25 is a block diagram of a three-dimensional data transmission device according to Embodiment 3.

Next, the structure and operations of three-dimensional data transmission device 640 according to the present embodiment will be described. FIG. 25 is a block diagram of three-dimensional data transmission device 640.

Three-dimensional data transmission device 640 is included, for example, in the above-described nearby vehicle. Three-dimensional data transmission device 640 processes fifth three-dimensional data 652 created by the nearby vehicle into sixth three-dimensional data 654 requested by the own vehicle, encodes sixth three-dimensional data 654 to generate encoded three-dimensional data 634, and sends encoded three-dimensional data 634 to the own vehicle.

Three-dimensional data transmission device 640 includes three-dimensional data creator 641, receiver 642, extractor 643, encoder 644, and transmitter 645.

First, three-dimensional data creator 641 creates fifth three-dimensional data 652 by use of sensor information 651 detected by the sensor included in the nearby vehicle. Next, receiver 642 receives request range information 633 from the own vehicle.

Next, extractor 643 extracts from fifth three-dimensional data 652 the three-dimensional data of the request range indicated by request range information 633, thereby processing fifth three-dimensional data 652 into sixth three-dimensional data 654. Next, encoder 644 encodes sixth three-dimensional data 654 to generate encoded three-dimensional data 643, which is an encoded stream. Then, transmitter 645 sends encoded three-dimensional data 634 to the own vehicle.

Note that although an example case is described here in which the own vehicle includes three-dimensional data creation device 620 and the nearby vehicle includes three-dimensional data transmission device 640, each of the vehicles may include the functionality of both three-dimensional data creation device 620 and three-dimensional data transmission device 640.

Embodiment 4

The present embodiment describes operations performed in abnormal cases when self-location estimation is performed on the basis of a three-dimensional map.

A three-dimensional map is expected to find its expanded use in self-driving of a vehicle and autonomous movement, etc. of a mobile object such as a robot and a flying object (e.g., a drone). Example means for enabling such autonomous movement include a method in which a mobile object travels in accordance with a three-dimensional map, while estimating its self-location on the map (self-location estimation).

The self-location estimation is enabled by matching a three-dimensional map with three-dimensional information on the surrounding of the own vehicle (hereinafter referred to as self-detected three-dimensional data) obtained by a sensor equipped in the own vehicle, such as a rangefinder (e.g., a LiDAR) and a stereo camera to estimate the location of the own vehicle on the three-dimensional map.

As in the case of an HD map suggested by HERE Technologies, for example, a three-dimensional map may include not only a three-dimensional point cloud, but also two-dimensional map data such as information on the shapes of roads and intersections, or information that changes in real-time such as information on a traffic jam and an accident. A three-dimensional map includes a plurality of layers such as layers of three-dimensional data, two-dimensional data, and meta-data that changes in real-time, from among which the device can obtain or refer to only necessary data.

Point cloud data may be a SWLD as described above, or may include point group data that is different from keypoints. The transmission/reception of point cloud data is basically carried out in one or more random access units.

A method described below is used as a method of matching a three-dimensional map with self-detected three-dimensional data. For example, the device compares the shapes of the point groups in each other's point clouds, and determines that portions having a high degree of similarity among keypoints correspond to the same position. When the three-dimensional map is formed by a SWLD, the device also performs matching by comparing the keypoints that form the SWLD with three-dimensional keypoints extracted from the self-detected three-dimensional data.

Here, to enable highly accurate self-location estimation, the following needs to be satisfied: (A) the three-dimensional map and the self-detected three-dimensional data have been already obtained; and (B) their accuracies satisfy a predetermined requirement. However, one of (A) and (B) cannot be satisfied in abnormal cases such as ones described below.

1. A three-dimensional map is unobtainable over communication.
2. A three-dimensional map is not present, or a three-dimensional map having been obtained is corrupt.
3. A sensor of the own vehicle has trouble, or the accuracy of the generated self-detected three-dimensional data is inadequate due to bad weather.

The following describes operations to cope with such abnormal cases. The following description illustrates an example case of a vehicle, but the method described below is applicable to mobile objects on the whole that are capable of autonomous movement, such as a robot and a drone.

Figure 26:
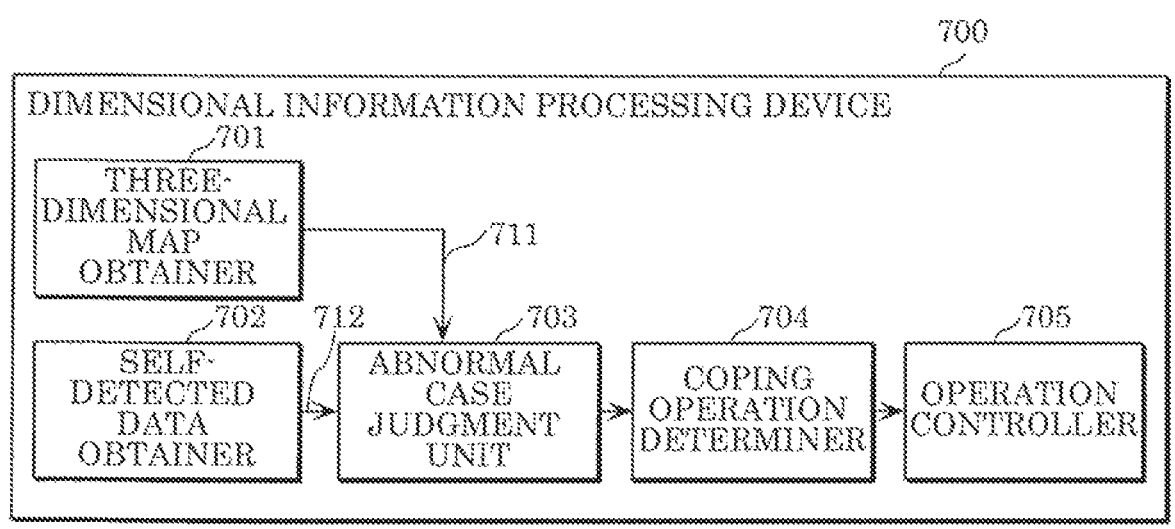
FIG. 26 is a block diagram of a three-dimensional information processing device according to Embodiment 4.

The following describes the structure of the three-dimensional information processing device and its operation according to the present embodiment capable of coping with abnormal cases regarding a three-dimensional map or self-detected three-dimensional data. FIG. 26 is a block diagram of an example structure of three-dimensional information processing device 700 according to the present embodiment.

Three-dimensional information processing device 700 is equipped, for example, in a mobile object such as a car. As shown in FIG. 26, three-dimensional information processing device 700 includes three-dimensional map obtainer 701, self-detected data obtainer 702, abnormal case judgment unit 703, coping operation determiner 704, and operation controller 705.

Note that three-dimensional information processing device 700 may include a non-illustrated two-dimensional or one-dimensional sensor that detects a structural object or a mobile object around the own vehicle, such as a camera capable of obtaining two-dimensional images and a sensor for one-dimensional data utilizing ultrasonic or laser. Three-dimensional information processing device 700 may also include a non-illustrated communication unit that obtains a three-dimensional map over a mobile communication network, such as 4G and 5G, or via inter-vehicle communication or road-to-vehicle communication.

Three-dimensional map obtainer 701 obtains three-dimensional map 711 of the surroundings of the traveling route. For example, three-dimensional map obtainer 701 obtains three-dimensional map 711 over a mobile communication network, or via inter-vehicle communication or road-to-vehicle communication.

Next, self-detected data obtainer 702 obtains self-detected three-dimensional data 712 on the basis of sensor information. For example, self-detected data obtainer 702 generates self-detected three-dimensional data 712 on the basis of the sensor information obtained by a sensor equipped in the own vehicle.

Next, abnormal case judgment unit 703 conducts a predetermined check of at least one of obtained three-dimensional map 711 and self-detected three-dimensional data 712 to detect an abnormal case. Stated differently, abnormal case judgment unit 703 judges whether at least one of obtained three-dimensional map 711 and self-detected three-dimensional data 712 is abnormal.

When the abnormal case is detected, coping operation determiner 704 determines a coping operation to cope with such abnormal case. Next, operation controller 705 controls the operation of each of the processing units necessary to perform the coping operation.

Meanwhile, when no abnormal case is detected, three-dimensional information processing device 700 terminates the process.

Also, three-dimensional information processing device 700 estimates the location of the vehicle equipped with three-dimensional information processing device 700, using three-dimensional map 711 and self-detected three-dimensional data 712. Next, three-dimensional information processing device 700 performs the automatic operation of the vehicle by use of the estimated location of the vehicle.

As described above, three-dimensional information processing device 700 obtains, via a communication channel, map data (three-dimensional map 711) that includes first three-dimensional position information. The first three-dimensional position information includes, for example, a plurality of random access units, each of which is an assembly of at least one subspace and is individually decodable, the at least one subspace having three-dimensional coordinates information and serving as a unit in which each of the plurality of random access units is encoded. The first three-dimensional position information is, for example, data (SWLD) obtained by encoding keypoints, each of which has an amount of a three-dimensional feature greater than or equal to a predetermined threshold.

Three-dimensional information processing device 700 also generates second three-dimensional position information (self-detected three-dimensional data 71) from information detected by a sensor. Three-dimensional information processing device 700 then judges whether one of the first three-dimensional position information and the second three-dimensional position information is abnormal by performing, on one of the first three-dimensional position information and the second three-dimensional position information, a process of judging whether an abnormality is present.

Three-dimensional information processing device 700 determines a coping operation to cope with the abnormality when one of the first three-dimensional position information and the second three-dimensional position information is judged to be abnormal. Three-dimensional information processing device 700 then executes a control that is required to perform the coping operation.

This structure enables three-dimensional information processing device 700 to detect an abnormality regarding one of the first three-dimensional position information and the second three-dimensional position information, and to perform a coping operation therefor.

Embodiment 5

The present embodiment describes a method, etc. of transmitting three-dimensional data to a following vehicle.

Figure 27:
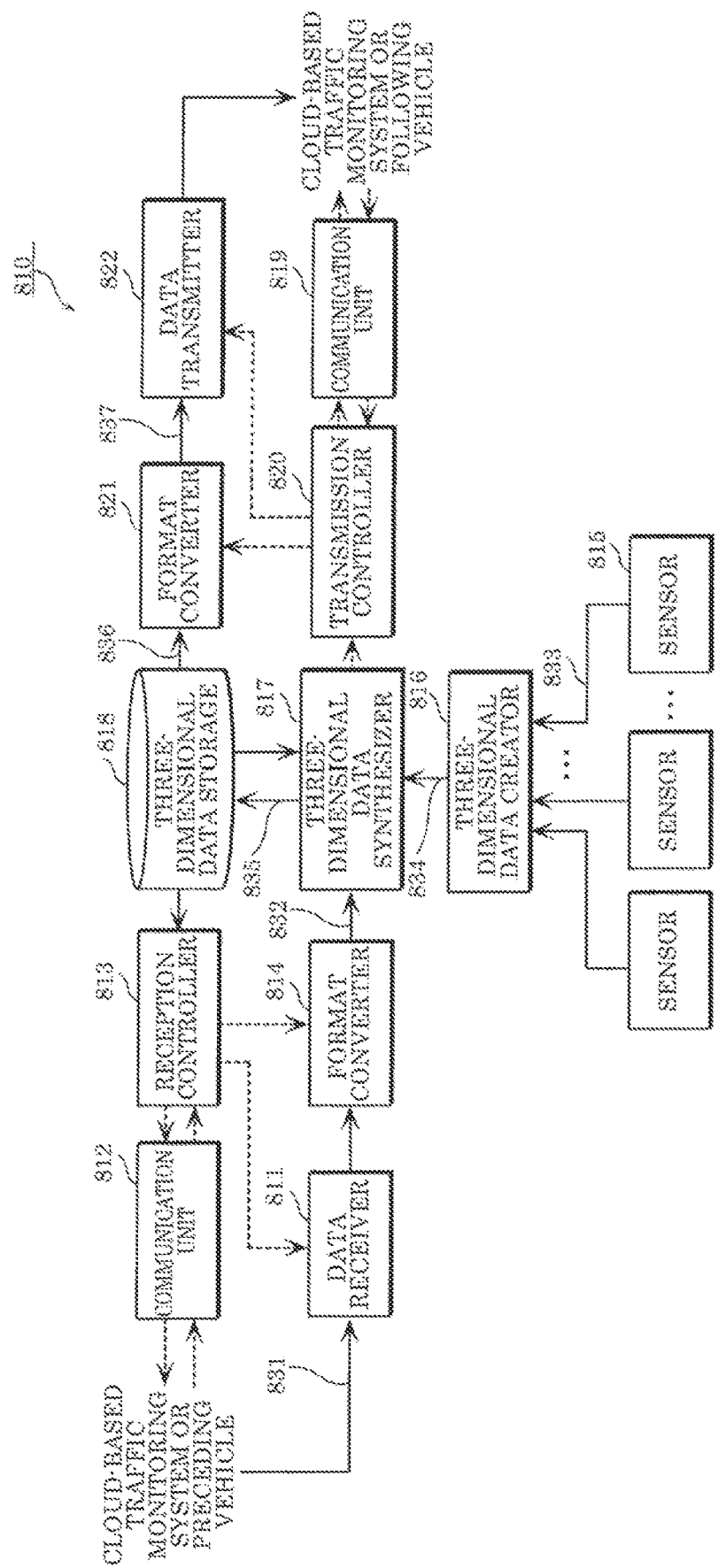
FIG. 27 is a block diagram of a three-dimensional data creation device according to Embodiment 5.

FIG. 27 is a block diagram of an exemplary structure of three-dimensional data creation device 810 according to the present embodiment. Such three-dimensional data creation device 810 is equipped, for example, in a vehicle. Three-dimensional data creation device 810 transmits and receives three-dimensional data to and from an external cloud-based traffic monitoring system, a preceding vehicle, or a following vehicle, and creates and stores three-dimensional data.

Three-dimensional data creation device 810 includes data receiver 811, communication unit 812, reception controller 813, format converter 814, a plurality of sensors 815, three-dimensional data creator 816, three-dimensional data synthesizer 817, three-dimensional data storage 818, communication unit 819, transmission controller 820, format converter 821, and data transmitter 822.

Data receiver 811 receives three-dimensional data 831 from a cloud-based traffic monitoring system or a preceding vehicle. Three-dimensional data 831 includes, for example, information on a region undetectable by sensors 815 of the own vehicle, such as a point cloud, visible light video, depth information, sensor position information, and speed information.

Communication unit 812 communicates with the cloud-based traffic monitoring system or the preceding vehicle to transmit a data transmission request, etc. to the cloud-based traffic monitoring system or the preceding vehicle.

Reception controller 813 exchanges information, such as information on supported formats, with a communications partner via communication unit 812 to establish communication with the communications partner.

Format converter 814 applies format conversion, etc. on three-dimensional data 831 received by data receiver 811 to generate three-dimensional data 832. Format converter 814 also decompresses or decodes three-dimensional data 831 when three-dimensional data 831 is compressed or encoded.

A plurality of sensors 815 are a group of sensors, such as visible light cameras and infrared cameras, that obtain information on the outside of the vehicle and generate sensor information 833. Sensor information 833 is, for example, three-dimensional data such as a point cloud (point group data), when sensors 815 are laser sensors such as LIDARs. Note that a single sensor may serve as a plurality of sensors 815.

Three-dimensional data creator 816 generates three-dimensional data 834 from sensor information 833. Three-dimensional data 834 includes, for example, information such as a point cloud, visible light video, depth information, sensor position information, and speed information.

Three-dimensional data synthesizer 817 synthesizes three-dimensional data 834 created on the basis of sensor information 833 of the own vehicle with three-dimensional data 832 created by the cloud-based traffic monitoring system or the preceding vehicle, etc., thereby forming three-dimensional data 835 of a space that includes the space ahead of the preceding vehicle undetectable by sensors 815 of the own vehicle.

Three-dimensional data storage 818 stores generated three-dimensional data 835, etc.

Communication unit 819 communicates with the cloud-based traffic monitoring system or the following vehicle to transmit a data transmission request, etc. to the cloud-based traffic monitoring system or the following vehicle.

Transmission controller 820 exchanges information such as information on supported formats with a communications partner via communication unit 819 to establish communication with the communications partner. Transmission controller 820 also determines a transmission region, which is a space of the three-dimensional data to be transmitted, on the basis of three-dimensional data formation information on three-dimensional data 832 generated by three-dimensional data synthesizer 817 and the data transmission request from the communications partner.

More specifically, transmission controller 820 determines a transmission region that includes the space ahead of the own vehicle undetectable by a sensor of the following vehicle, in response to the data transmission request from the cloud-based traffic monitoring system or the following vehicle. Transmission controller 820 judges, for example, whether a space is transmittable or whether the already transmitted space includes an update, on the basis of the three-dimensional data formation information to determine a transmission region. For example, transmission controller 820 determines, as a transmission region, a region that is: a region specified by the data transmission request; and a region, corresponding three-dimensional data 835 of which is present. Transmission controller 820 then notifies format converter 821 of the format supported by the communications partner and the transmission region.

Of three-dimensional data 835 stored in three-dimensional data storage 818, format converter 821 converts three-dimensional data 836 of the transmission region into the format supported by the receiver end to generate three-dimensional data 837. Note that format converter 821 may compress or encode three-dimensional data 837 to reduce the data amount.

Data transmitter 822 transmits three-dimensional data 837 to the cloud-based traffic monitoring system or the following vehicle. Such three-dimensional data 837 includes, for example, information on a blind spot, which is a region hidden from view of the following vehicle, such as a point cloud ahead of the own vehicle, visible light video, depth information, and sensor position information.

Note that an example has been described in which format converter 814 and format converter 821 perform format conversion, etc., but format conversion may not be performed.

With the above structure, three-dimensional data creation device 810 obtains, from an external device, three-dimensional data 831 of a region undetectable by sensors 815 of the own vehicle, and synthesizes three-dimensional data 831 with three-dimensional data 834 that is based on sensor information 833 detected by sensors 815 of the own vehicle, thereby generating three-dimensional data 835. Three-dimensional data creation device 810 is thus capable of generating three-dimensional data of a range undetectable by sensors 815 of the own vehicle.

Three-dimensional data creation device 810 is also capable of transmitting, to the cloud-based traffic monitoring system or the following vehicle, etc., three-dimensional data of a space that includes the space ahead of the own vehicle undetectable by a sensor of the following vehicle, in response to the data transmission request from the cloud-based traffic monitoring system or the following vehicle.

Embodiment 6

In embodiment 5, an example is described in which a client device of a vehicle or the like transmits three-dimensional data to another vehicle or a server such as a cloud-based traffic monitoring system. In the present embodiment, a client device transmits sensor information obtained through a sensor to a server or a client device.

Figure 28:
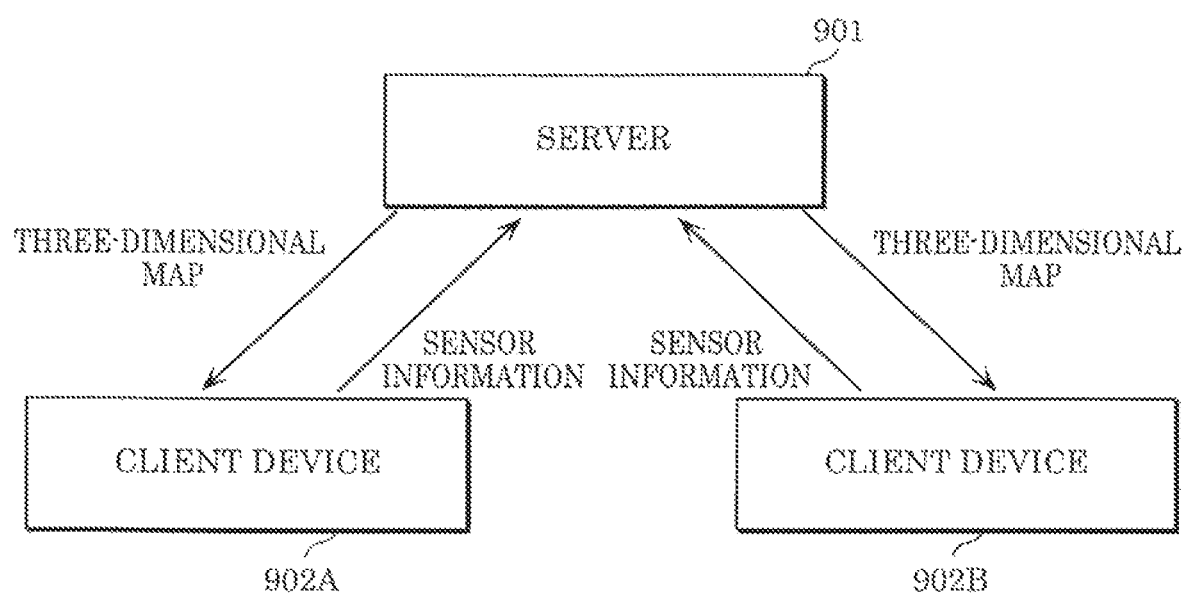
FIG. 28 is a diagram showing a structure of a system according to Embodiment 6.

A structure of a system according to the present embodiment will first be described. FIG. 28 is a diagram showing the structure of a transmission/reception system of a three-dimensional map and sensor information according to the present embodiment. This system includes server 901, and client devices 902A and 902B. Note that client devices 902A and 902B are also referred to as client device 902 when no particular distinction is made therebetween.

Client device 902 is, for example, a vehicle-mounted device equipped in a mobile object such as a vehicle. Server 901 is, for example, a cloud-based traffic monitoring system, and is capable of communicating with the plurality of client devices 902.

Server 901 transmits the three-dimensional map formed by a point cloud to client device 902. Note that a structure of the three-dimensional map is not limited to a point cloud, and may also be another structure expressing three-dimensional data such as a mesh structure.

Client device 902 transmits the sensor information obtained by client device 902 to server 901. The sensor information includes, for example, at least one of information obtained by LIDAR, a visible light image, an infrared image, a depth image, sensor position information, or sensor speed information.

The data to be transmitted and received between server 901 and client device 902 may be compressed in order to reduce data volume, and may also be transmitted uncompressed in order to maintain data precision. When compressing the data, it is possible to use a three-dimensional compression method on the point cloud based on, for example, an octree structure. It is possible to use a two-dimensional image compression method on the visible light image, the infrared image, and the depth image. The two-dimensional image compression method is, for example, MPEG-4 AVC or HEVC standardized by MPEG.

Server 901 transmits the three-dimensional map managed by server 901 to client device 902 in response to a transmission request for the three-dimensional map from client device 902. Note that server 901 may also transmit the three-dimensional map without waiting for the transmission request for the three-dimensional map from client device 902. For example, server 901 may broadcast the three-dimensional map to at least one client device 902 located in a predetermined space. Server 901 may also transmit the three-dimensional map suited to a position of client device 902 at fixed time intervals to client device 902 that has received the transmission request once. Server 901 may also transmit the three-dimensional map managed by server 901 to client device 902 every time the three-dimensional map is updated.

Client device 902 sends the transmission request for the three-dimensional map to server 901. For example, when client device 902 wants to perform the self-location estimation during traveling, client device 902 transmits the transmission request for the three-dimensional map to server 901.

Note that in the following cases, client device 902 may send the transmission request for the three-dimensional map to server 901. Client device 902 may send the transmission request for the three-dimensional map to server 901 when the three-dimensional map stored by client device 902 is old. For example, client device 902 may send the transmission request for the three-dimensional map to server 901 when a fixed period has passed since the three-dimensional map is obtained by client device 902.

Client device 902 may also send the transmission request for the three-dimensional map to server 901 before a fixed time when client device 902 exits a space shown in the three-dimensional map stored by client device 902. For example, client device 902 may send the transmission request for the three-dimensional map to server 901 when client device 902 is located within a predetermined distance from a boundary of the space shown in the three-dimensional map stored by client device 902. When a movement path and a movement speed of client device 902 are understood, a time when client device 902 exits the space shown in the three-dimensional map stored by client device 902 may be predicted based on the movement path and the movement speed of client device 902.

Client device 902 may also send the transmission request for the three-dimensional map to server 901 when an error during alignment of the three-dimensional data and the three-dimensional map created from the sensor information by client device 902 is at least at a fixed level.

Client device 902 transmits the sensor information to server 901 in response to a transmission request for the sensor information from server 901. Note that client device 902 may transmit the sensor information to server 901 without waiting for the transmission request for the sensor information from server 901. For example, client device 902 may periodically transmit the sensor information during a fixed period when client device 902 has received the transmission request for the sensor information from server 901 once. Client device 902 may determine that there is a possibility of a change in the three-dimensional map of a surrounding area of client device 902 having occurred, and transmit this information and the sensor information to server 901, when the error during alignment of the three-dimensional data created by client device 902 based on the sensor information and the three-dimensional map obtained from server 901 is at least at the fixed level.

Server 901 sends a transmission request for the sensor information to client device 902. For example, server 901 receives position information, such as GPS information, about client device 902 from client device 902. Server 901 sends the transmission request for the sensor information to client device 902 in order to generate a new three-dimensional map, when it is determined that client device 902 is approaching a space in which the three-dimensional map managed by server 901 contains little information, based on the position information about client device 902. Server 901 may also send the transmission request for the sensor information, when wanting to (i) update the three-dimensional map, (ii) check road conditions during snowfall, a disaster, or the like, or (iii) check traffic congestion conditions, accident/incident conditions, or the like.

Client device 902 may set an amount of data of the sensor information to be transmitted to server 901 in accordance with communication conditions or bandwidth during reception of the transmission request for the sensor information to be received from server 901. Setting the amount of data of the sensor information to be transmitted to server 901 is, for example, increasing/reducing the data itself or appropriately selecting a compression method.

Figure 29:
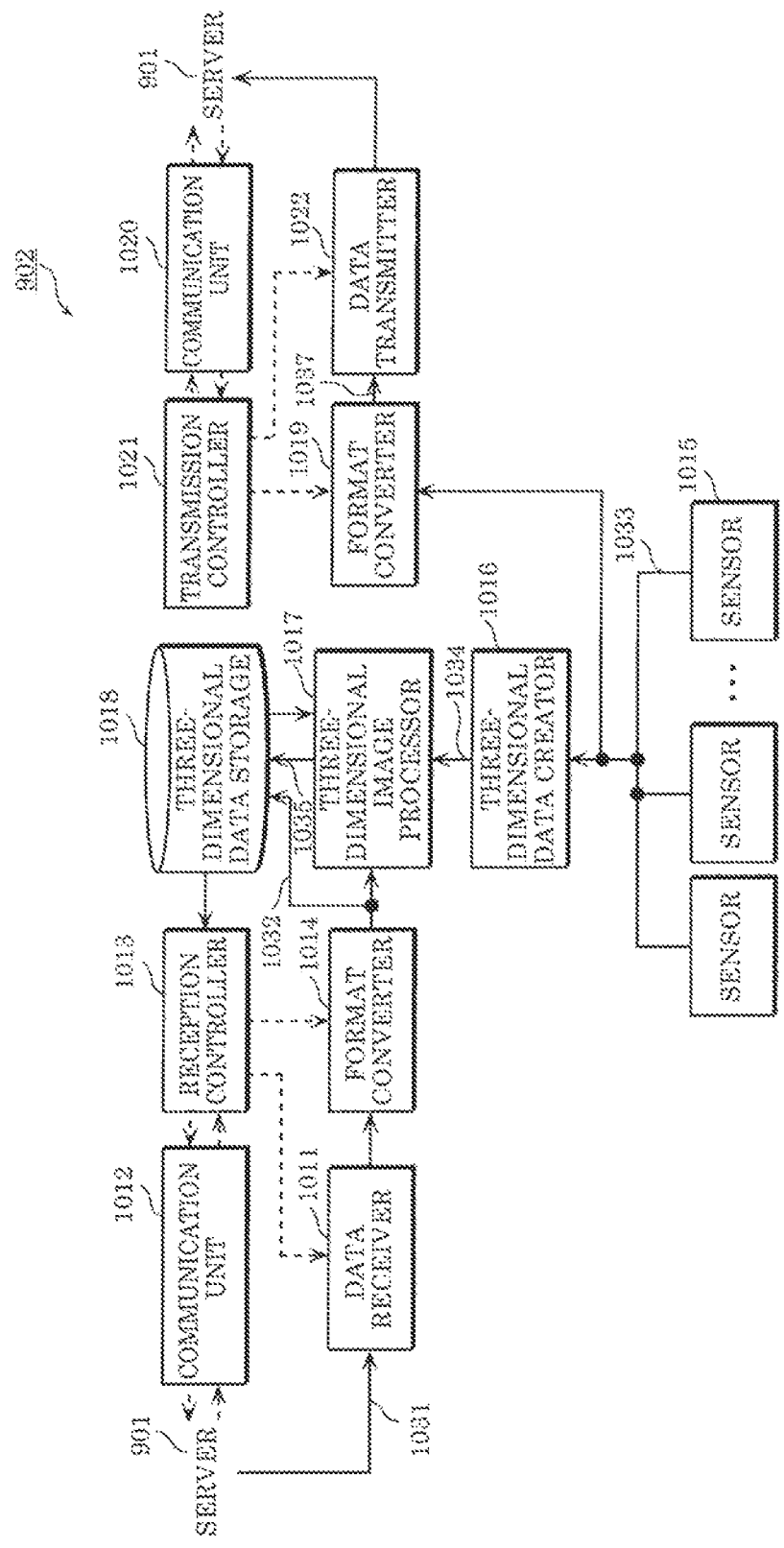
FIG. 29 is a block diagram of a client device according to Embodiment 6.

FIG. 29 is a block diagram showing an example structure of client device 902. Client device 902 receives the three-dimensional map formed by a point cloud and the like from server 901, and estimates a self-location of client device 902 using the three-dimensional map created based on the sensor information of client device 902. Client device 902 transmits the obtained sensor information to server 901.

Client device 902 includes data receiver 1011, communication unit 1012, reception controller 1013, format converter 1014, sensors 1015, three-dimensional data creator 1016, three-dimensional image processor 1017, three-dimensional data storage 1018, format converter 1019, communication unit 1020, transmission controller 1021, and data transmitter 1022.

Data receiver 1011 receives three-dimensional map 1031 from server 901. Three-dimensional map 1031 is data that includes a point cloud such as a WLD or a SWLD. Three-dimensional map 1031 may include compressed data or uncompressed data.

Communication unit 1012 communicates with server 901 and transmits a data transmission request (e.g. transmission request for three-dimensional map) to server 901.

Reception controller 1013 exchanges information, such as information on supported formats, with a communications partner via communication unit 1012 to establish communication with the communications partner.

Format converter 1014 performs a format conversion and the like on three-dimensional map 1031 received by data receiver 1011 to generate three-dimensional map 1032. Format converter 1014 also performs a decompression or decoding process when three-dimensional map 1031 is compressed or encoded. Note that format converter 1014 does not perform the decompression or decoding process when three-dimensional map 1031 is uncompressed data.

Sensors 815 are a group of sensors, such as LIDARs, visible light cameras, infrared cameras, or depth sensors that obtain information about the outside of a vehicle equipped with client device 902, and generate sensor information 1033. Sensor information 1033 is, for example, three-dimensional data such as a point cloud (point group data) when sensors 1015 are laser sensors such as LIDARs. Note that a single sensor may serve as sensors 1015.

Three-dimensional data creator 1016 generates three-dimensional data 1034 of a surrounding area of the own vehicle based on sensor information 1033. For example, three-dimensional data creator 1016 generates point cloud data with color information on the surrounding area of the own vehicle using information obtained by LIDAR and visible light video obtained by a visible light camera.

Three-dimensional image processor 1017 performs a self-location estimation process and the like of the own vehicle, using (i) the received three-dimensional map 1032 such as a point cloud, and (ii) three-dimensional data 1034 of the surrounding area of the own vehicle generated using sensor information 1033. Note that three-dimensional image processor 1017 may generate three-dimensional data 1035 about the surroundings of the own vehicle by merging three-dimensional map 1032 and three-dimensional data 1034, and may perform the self-location estimation process using the created three-dimensional data 1035.

Three-dimensional data storage 1018 stores three-dimensional map 1032, three-dimensional data 1034, three-dimensional data 1035, and the like.

Format converter 1019 generates sensor information 1037 by converting sensor information 1033 to a format supported by a receiver end. Note that format converter 1019 may reduce the amount of data by compressing or encoding sensor information 1037. Format converter 1019 may omit this process when format conversion is not necessary. Format converter 1019 may also control the amount of data to be transmitted in accordance with a specified transmission range.

Communication unit 1020 communicates with server 901 and receives a data transmission request (transmission request for sensor information) and the like from server 901.

Transmission controller 1021 exchanges information, such as information on supported formats, with a communications partner via communication unit 1020 to establish communication with the communications partner.

Data transmitter 1022 transmits sensor information 1037 to server 901. Sensor information 1037 includes, for example, information obtained through sensors 1015, such as information obtained by LIDAR, a luminance image obtained by a visible light camera, an infrared image obtained by an infrared camera, a depth image obtained by a depth sensor, sensor position information, and sensor speed information.

Figure 30:
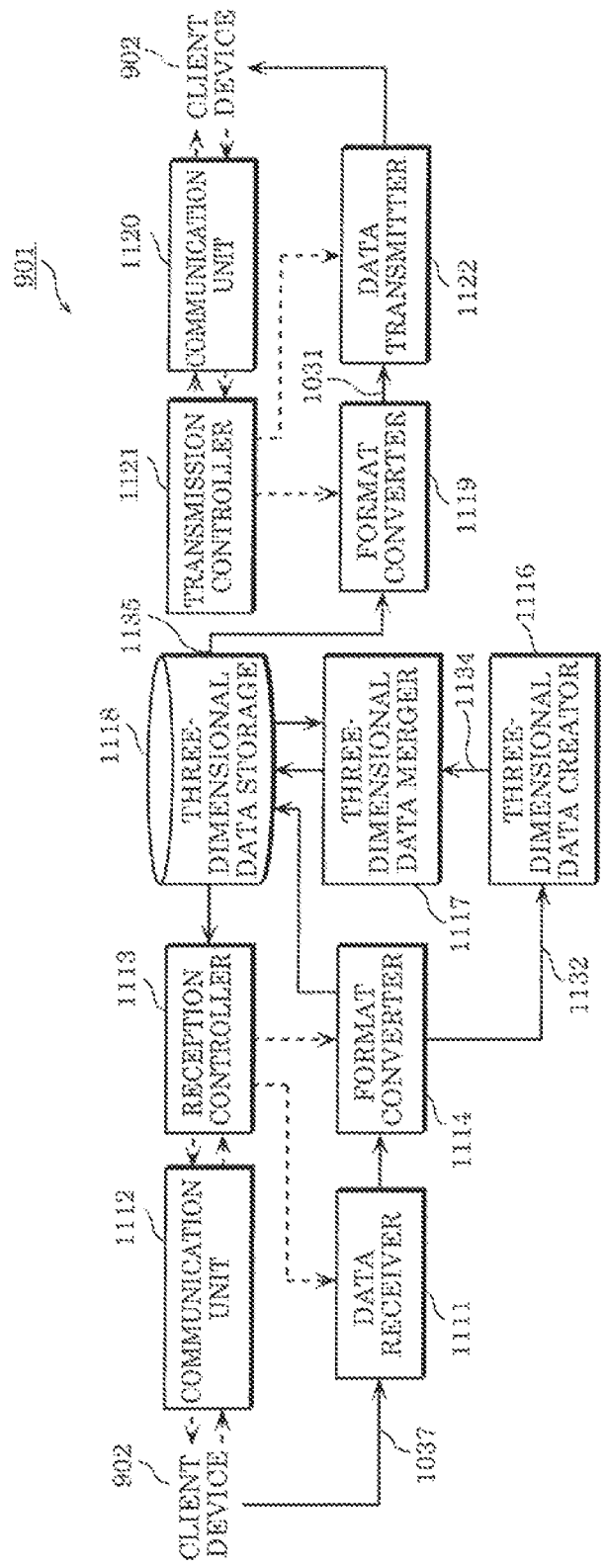
FIG. 30 is a block diagram of a server according to Embodiment 6.

A structure of server 901 will be described next. FIG. 30 is a block diagram showing an example structure of server 901. Server 901 transmits sensor information from client device 902 and creates three-dimensional data based on the received sensor information. Server 901 updates the three-dimensional map managed by server 901 using the created three-dimensional data. Server 901 transmits the updated three-dimensional map to client device 902 in response to a transmission request for the three-dimensional map from client device 902.

Server 901 includes data receiver 1111, communication unit 1112, reception controller 1113, format converter 1114, three-dimensional data creator 1116, three-dimensional data merger 1117, three-dimensional data storage 1118, format converter 1119, communication unit 1120, transmission controller 1121, and data transmitter 1122.

Data receiver 1111 receives sensor information 1037 from client device 902. Sensor information 1037 includes, for example, information obtained by LIDAR, a luminance image obtained by a visible light camera, an infrared image obtained by an infrared camera, a depth image obtained by a depth sensor, sensor position information, sensor speed information, and the like.

Communication unit 1112 communicates with client device 902 and transmits a data transmission request (e.g. transmission request for sensor information) and the like to client device 902.

Reception controller 1113 exchanges information, such as information on supported formats, with a communications partner via communication unit 1112 to establish communication with the communications partner.

Format converter 1114 generates sensor information 1132 by performing a decompression or decoding process when the received sensor information 1037 is compressed or encoded. Note that format converter 1114 does not perform the decompression or decoding process when sensor information 1037 is uncompressed data.

Three-dimensional data creator 1116 generates three-dimensional data 1134 of a surrounding area of client device 902 based on sensor information 1132. For example, three-dimensional data creator 1116 generates point cloud data with color information on the surrounding area of client device 902 using information obtained by LIDAR and visible light video obtained by a visible light camera.

Three-dimensional data merger 1117 updates three-dimensional map 1135 by merging three-dimensional data 1134 created based on sensor information 1132 with three-dimensional map 1135 managed by server 901.

Three-dimensional data storage 1118 stores three-dimensional map 1135 and the like.

Format converter 1119 generates three-dimensional map 1031 by converting three-dimensional map 1135 to a format supported by the receiver end. Note that format converter 1119 may reduce the amount of data by compressing or encoding three-dimensional map 1135. Format converter 1119 may omit this process when format conversion is not necessary. Format converter 1119 may also control the amount of data to be transmitted in accordance with a specified transmission range.

Communication unit 1120 communicates with client device 902 and receives a data transmission request (transmission request for three-dimensional map) and the like from client device 902.

Transmission controller 1121 exchanges information, such as information on supported formats, with a communications partner via communication unit 1120 to establish communication with the communications partner.

Data transmitter 1122 transmits three-dimensional map 1031 to client device 902. Three-dimensional map 1031 is data that includes a point cloud such as a WLD or a SWLD. Three-dimensional map 1031 may include one of compressed data and uncompressed data.

Figure 31:
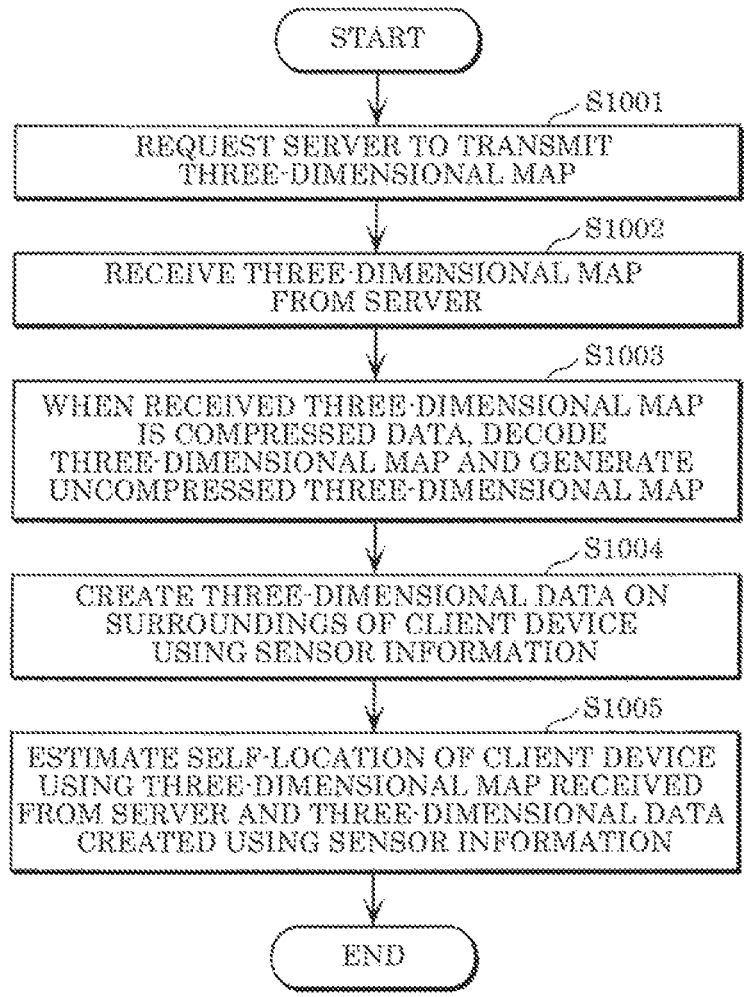
FIG. 31 is a flowchart of a three-dimensional data creation process performed by the client device according to Embodiment 6.

An operational flow of client device 902 will be described next. FIG. 31 is a flowchart of an operation when client device 902 obtains the three-dimensional map.

Client device 902 first requests server 901 to transmit the three-dimensional map (point cloud, etc.) (S1001). At this point, by also transmitting the position information about client device 902 obtained through GPS and the like, client device 902 may also request server 901 to transmit a three-dimensional map relating to this position information.

Client device 902 next receives the three-dimensional map from server 901 (S1002). When the received three-dimensional map is compressed data, client device 902 decodes the received three-dimensional map and generates an uncompressed three-dimensional map (S1003).

Client device 902 next creates three-dimensional data 1034 of the surrounding area of client device 902 using sensor information 1033 obtained by sensors 1015 (S1004). Client device 902 next estimates the self-location of client device 902 using three-dimensional map 1032 received from server 901 and three-dimensional data 1034 created using sensor information 1033 (S1005).

Figure 32:
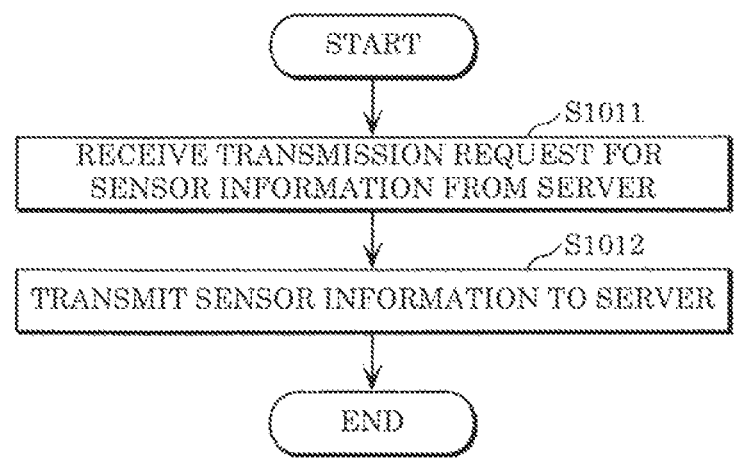
FIG. 32 is a flowchart of a sensor information transmission process performed by the client device according to Embodiment 6.

FIG. 32 is a flowchart of an operation when client device 902 transmits the sensor information. Client device 902 first receives a transmission request for the sensor information from server 901 (S1011). Client device 902 that has received the transmission request transmits sensor information 1037 to server 901 (S1012). Note that client device 902 may generate sensor information 1037 by compressing each piece of information using a compression method suited to each piece of information, when sensor information 1033 includes a plurality of pieces of information obtained by sensors 1015.

Figure 33:
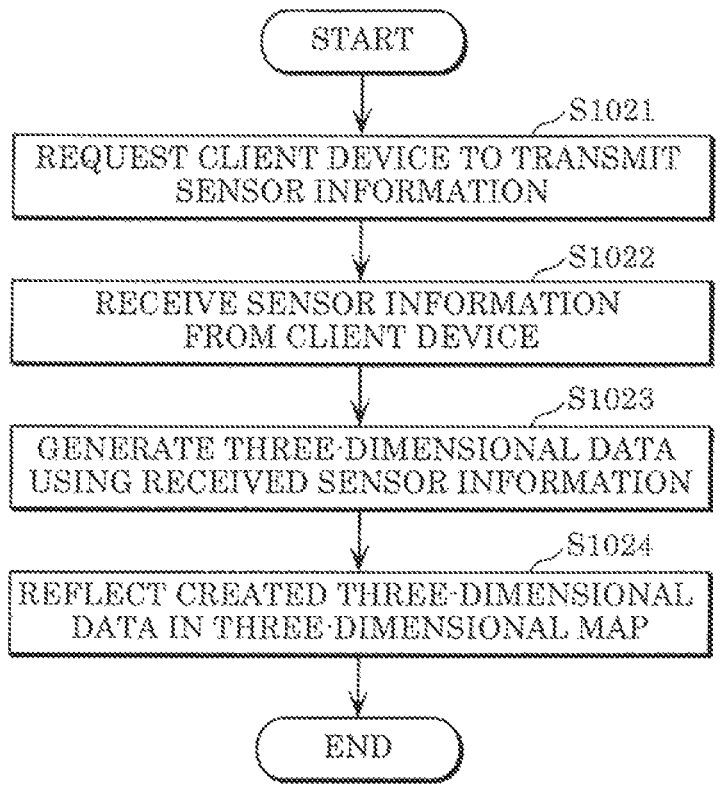
FIG. 33 is a flowchart of a three-dimensional data creation process performed by the server according to Embodiment 6.

An operational flow of server 901 will be described next. FIG. 33 is a flowchart of an operation when server 901 obtains the sensor information. Server 901 first requests client device 902 to transmit the sensor information (S1021). Server 901 next receives sensor information 1037 transmitted from client device 902 in accordance with the request (S1022). Server 901 next creates three-dimensional data 1134 using the received sensor information 1037 (S1023). Server 901 next reflects the created three-dimensional data 1134 in three-dimensional map 1135 (S1024).

Figure 34:
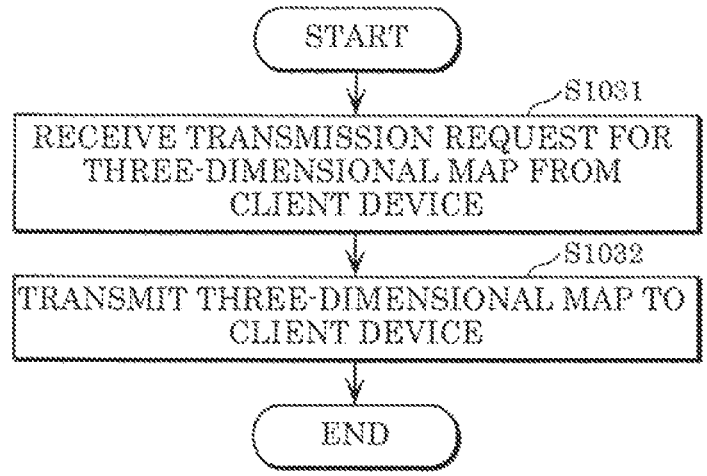
FIG. 34 is a flowchart of a three-dimensional map transmission process performed by the server according to Embodiment 6.

FIG. 34 is a flowchart of an operation when server 901 transmits the three-dimensional map. Server 901 first receives a transmission request for the three-dimensional map from client device 902 (S1031). Server 901 that has received the transmission request for the three-dimensional map transmits the three-dimensional map to client device 902 (S1032). At this point, server 901 may extract a three-dimensional map of a vicinity of client device 902 along with the position information about client device 902, and transmit the extracted three-dimensional map. Server 901 may compress the three-dimensional map formed by a point cloud using, for example, an octree structure compression method, and transmit the compressed three-dimensional map.

Hereinafter, variations of the present embodiment will be described.

Server 901 creates three-dimensional data 1134 of a vicinity of a position of client device 902 using sensor information 1037 received from client device 902. Server 901 next calculates a difference between three-dimensional data 1134 and three-dimensional map 1135, by matching the created three-dimensional data 1134 with three-dimensional map 1135 of the same area managed by server 901. Server 901 determines that a type of anomaly has occurred in the surrounding area of client device 902, when the difference is greater than or equal to a predetermined threshold. For example, it is conceivable that a large difference occurs between three-dimensional map 1135 managed by server 901 and three-dimensional data 1134 created based on sensor information 1037, when land subsidence and the like occurs due to a natural disaster such as an earthquake.

Sensor information 1037 may include information indicating at least one of a sensor type, a sensor performance, and a sensor model number. Sensor information 1037 may also be appended with a class ID and the like in accordance with the sensor performance. For example, when sensor information 1037 is obtained by LIDAR, it is conceivable to assign identifiers to the sensor performance. A sensor capable of obtaining information with precision in units of several millimeters is class 1, a sensor capable of obtaining information with precision in units of several centimeters is class 2, and a sensor capable of obtaining information with precision in units of several meters is class 3. Server 901 may estimate sensor performance information and the like from a model number of client device 902. For example, when client device 902 is equipped in a vehicle, server 901 may determine sensor specification information from a type of the vehicle. In this case, server 901 may obtain information on the type of the vehicle in advance, and the information may also be included in the sensor information. Server 901 may change a degree of correction with respect to three-dimensional data 1134 created using sensor information 1037, using the obtained sensor information 1037. For example, when the sensor performance is high in precision (class 1), server 901 does not correct three-dimensional data 1134. When the sensor performance is low in precision (class 3), server 901 corrects three-dimensional data 1134 in accordance with the precision of the sensor. For example, server 901 increases the degree (intensity) of correction with a decrease in the precision of the sensor.

Server 901 may simultaneously send the transmission request for the sensor information to the plurality of client devices 902 in a certain space. Server 901 does not need to use all of the sensor information for creating three-dimensional data 1134 and may, for example, select sensor information to be used in accordance with the sensor performance, when having received a plurality of pieces of sensor information from the plurality of client devices 902. For example, when updating three-dimensional map 1135, server 901 may select high-precision sensor information (class 1) from among the received plurality of pieces of sensor information, and create three-dimensional data 1134 using the selected sensor information.

Figure 35:
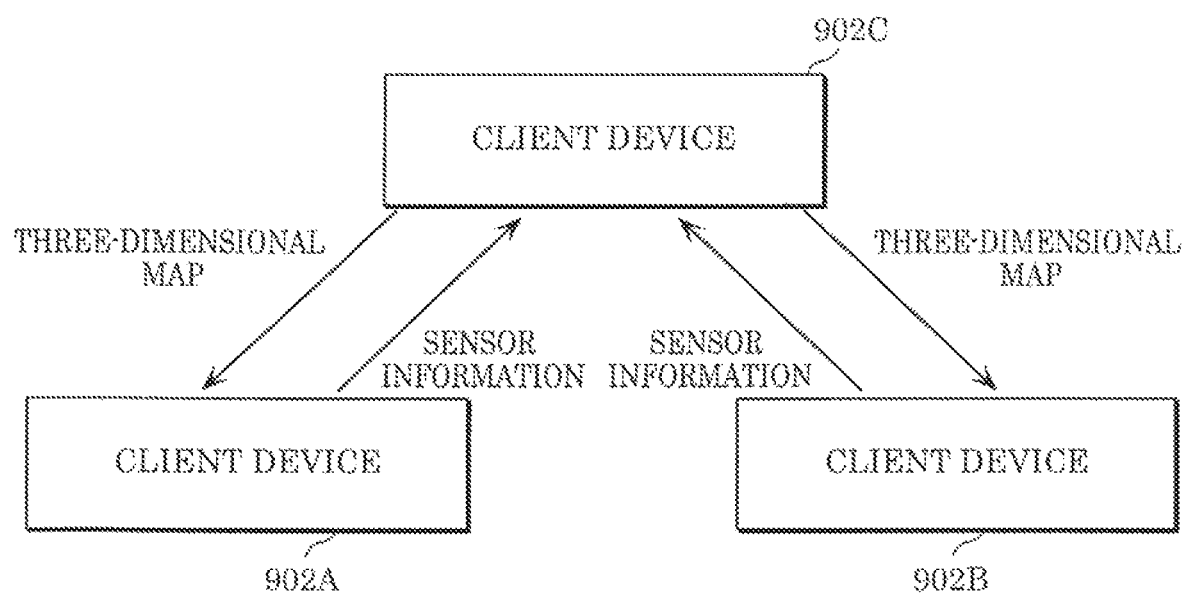
FIG. 35 is a diagram showing a structure of a variation of the system according to Embodiment 6.

Server 901 is not limited to only being a server such as a cloud-based traffic monitoring system, and may also be another (vehicle-mounted) client device. FIG. 35 is a diagram of a system structure in this case.

For example, client device 902C sends a transmission request for sensor information to client device 902A located nearby, and obtains the sensor information from client device 902A. Client device 902C then creates three-dimensional data using the obtained sensor information of client device 902A, and updates a three-dimensional map of client device 902C. This enables client device 902C to generate a three-dimensional map of a space that can be obtained from client device 902A, and fully utilize the performance of client device 902C. For example, such a case is conceivable when client device 902C has high performance.

In this case, client device 902A that has provided the sensor information is given rights to obtain the high-precision three-dimensional map generated by client device 902C. Client device 902A receives the high-precision three-dimensional map from client device 902C in accordance with these rights.

Server 901 may send the transmission request for the sensor information to the plurality of client devices 902 (client device 902A and client device 902B) located nearby client device 902C. When a sensor of client device 902A or client device 902B has high performance, client device 902C is capable of creating the three-dimensional data using the sensor information obtained by this high-performance sensor.

Figure 36:
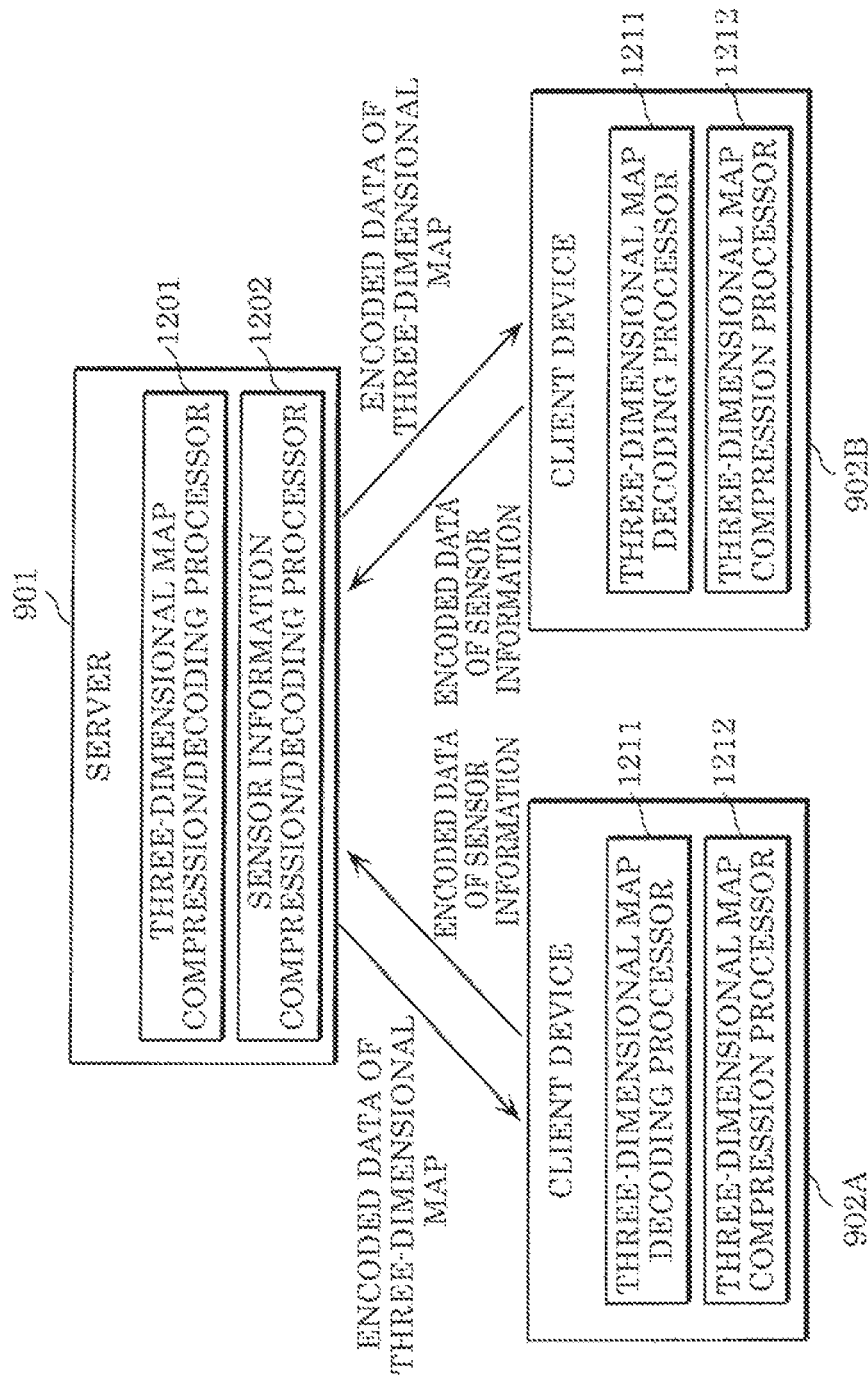
FIG. 36 is a diagram showing a structure of the server and client devices according to Embodiment 6.

FIG. 36 is a block diagram showing a functionality structure of server 901 and client device 902. Server 901 includes, for example, three-dimensional map compression/decoding processor 1201 that compresses and decodes the three-dimensional map and sensor information compression/decoding processor 1202 that compresses and decodes the sensor information.

Client device 902 includes three-dimensional map decoding processor 1211 and sensor information compression processor 1212. Three-dimensional map decoding processor 1211 receives encoded data of the compressed three-dimensional map, decodes the encoded data, and obtains the three-dimensional map. Sensor information compression processor 1212 compresses the sensor information itself instead of the three-dimensional data created using the obtained sensor information, and transmits the encoded data of the compressed sensor information to server 901. With this structure, client device 902 does not need to internally store a processor that performs a process for compressing the three-dimensional data of the three-dimensional map (point cloud, etc.), as long as client device 902 internally stores a processor that performs a process for decoding the three-dimensional map (point cloud, etc.). This makes it possible to limit costs, power consumption, and the like of client device 902.

As stated above, client device 902 according to the present embodiment is equipped in the mobile object, and creates three-dimensional data 1034 of a surrounding area of the mobile object using sensor information 1033 that is obtained through sensor 1015 equipped in the mobile object and indicates a surrounding condition of the mobile object. Client device 902 estimates a self-location of the mobile object using the created three-dimensional data 1034. Client device 902 transmits the obtained sensor information 1033 to server 901 or another mobile object.

This enables client device 902 to transmit sensor information 1033 to server 901 or the like. This makes it possible to further reduce the amount of transmission data compared to when transmitting the three-dimensional data. Since there is no need for client device 902 to perform processes such as compressing or encoding the three-dimensional data, it is possible to reduce the processing amount of client device 902. As such, client device 902 is capable of reducing the amount of data to be transmitted or simplifying the structure of the device.

Client device 902 further transmits the transmission request for the three-dimensional map to server 901 and receives three-dimensional map 1031 from server 901. In the estimating of the self-location, client device 902 estimates the self-location using three-dimensional data 1034 and three-dimensional map 1039.

Sensor information 1034 includes at least one of information obtained by a laser sensor, a luminance image, an infrared image, a depth image, sensor position information, or sensor speed information.

Sensor information 1033 includes information that indicates a performance of the sensor.

Client device 902 encodes or compresses sensor information 1033, and in the transmitting of the sensor information, transmits sensor information 1037 that has been encoded or compressed to server 901 or another mobile object 902. This enables client device 902 to reduce the amount of data to be transmitted.

For example, client device 902 includes a processor and memory. The processor performs the above processes using the memory.

Server 901 according to the present embodiment is capable of communicating with client device 902 equipped in the mobile object, and receives sensor information 1037 that is obtained through sensor 1015 equipped in the mobile object and indicates a surrounding condition of the mobile object. Server 901 creates three-dimensional data 1134 of a surrounding area of the mobile object using the received sensor information 1037.

With this, server 901 creates three-dimensional data 1134 using sensor information 1037 transmitted from client device 902. This makes it possible to further reduce the amount of transmission data compared to when client device 902 transmits the three-dimensional data. Since there is no need for client device 902 to perform processes such as compressing or encoding the three-dimensional data, it is possible to reduce the processing amount of client device 902. As such, server 901 is capable of reducing the amount of data to be transmitted or simplifying the structure of the device.

Server 901 further transmits a transmission request for the sensor information to client device 902.

Server 901 further updates three-dimensional map 1135 using the created three-dimensional data 1134, and transmits three-dimensional map 1135 to client device 902 in response to the transmission request for three-dimensional map 1135 from client device 902.

Sensor information 1037 includes at least one of information obtained by a laser sensor, a luminance image, an infrared image, a depth image, sensor position information, or sensor speed information.

Sensor information 1037 includes information that indicates a performance of the sensor.

Server 901 further corrects the three-dimensional data in accordance with the performance of the sensor. This enables the three-dimensional data creation method to improve the quality of the three-dimensional data.

In the receiving of the sensor information, server 901 receives a plurality of pieces of sensor information 1037 received from a plurality of client devices 902, and selects sensor information 1037 to be used in the creating of three-dimensional data 1134, based on a plurality of pieces of information that each indicates the performance of the sensor included in the plurality of pieces of sensor information 1037. This enables server 901 to improve the quality of three-dimensional data 1134.

Server 901 decodes or decompresses the received sensor information 1037, and creates three-dimensional data 1134 using sensor information 1132 that has been decoded or decompressed. This enables server 901 to reduce the amount of data to be transmitted.

For example, server 901 includes a processor and memory. The processor performs the above processes using the memory.

Embodiment 7

In the present embodiment, three-dimensional data encoding and decoding methods using an inter prediction process will be described.

Figure 37:
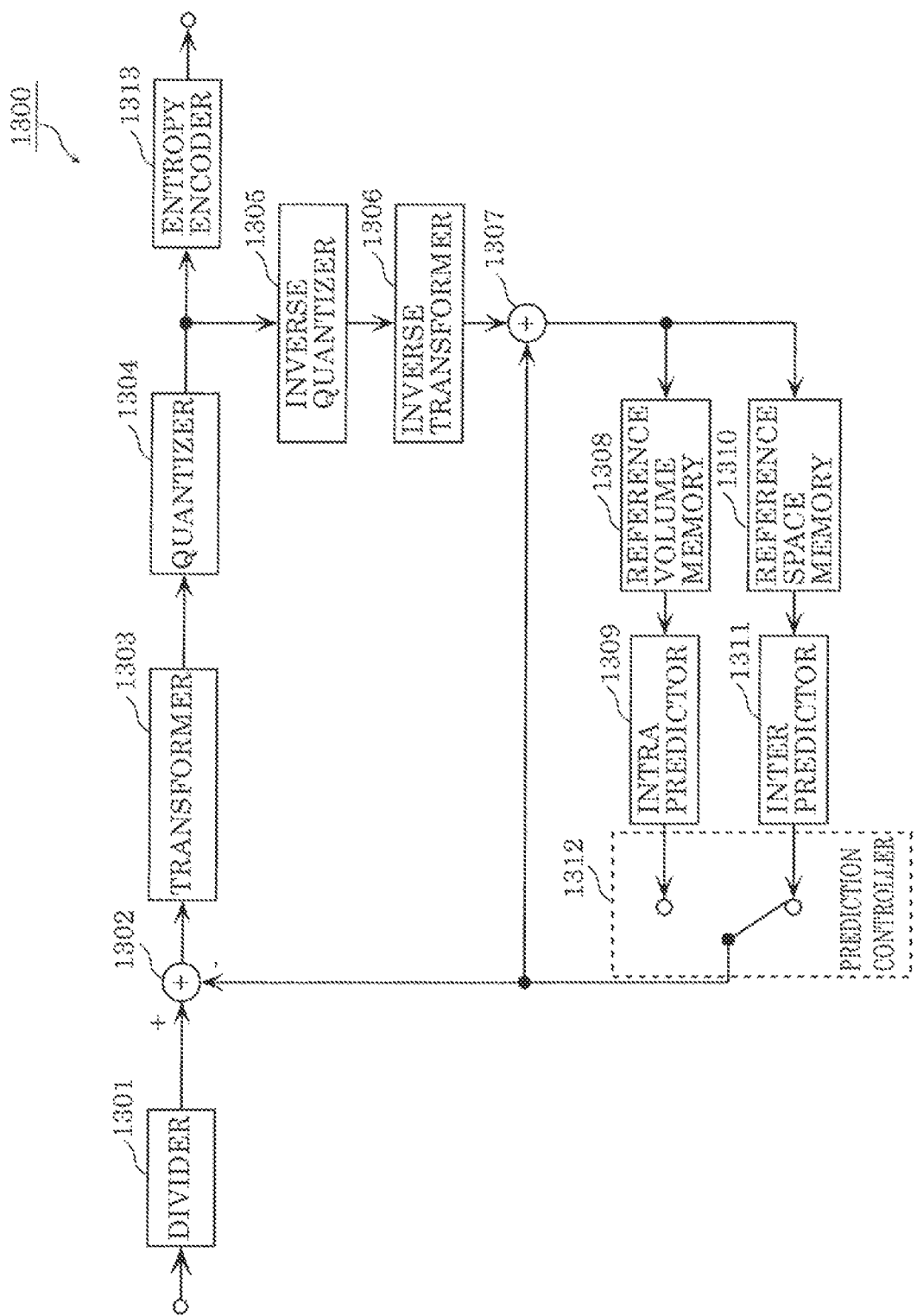
FIG. 37 is a block diagram of a three-dimensional data encoding device according to Embodiment 7.

FIG. 37 is a block diagram of three-dimensional data encoding device 1300 according to the present embodiment. This three-dimensional data encoding device 1300 generates an encoded bitstream (hereinafter, also simply referred to as bitstream) that is an encoded signal, by encoding three-dimensional data. As illustrated in FIG. 37, three-dimensional data encoding device 1300 includes divider 1301, subtractor 1302, transformer 1303, quantizer 1304, inverse quantizer 1305, inverse transformer 1306, adder 1307, reference volume memory 1308, intra predictor 1309, reference space memory 1310, inter predictor 1311, prediction controller 1312, and entropy encoder 1313.

Divider 1301 divides a plurality of volumes (VLMs) that are encoding units of each space (SPC) included in the three-dimensional data. Divider 1301 makes an octree representation (make into an octree) of voxels in each volume. Note that divider 1301 may make the spaces into an octree representation with the spaces having the same size as the volumes. Divider 1301 may also append information (depth information, etc.) necessary for making the octree representation to a header and the like of a bitstream.

Figure 38:
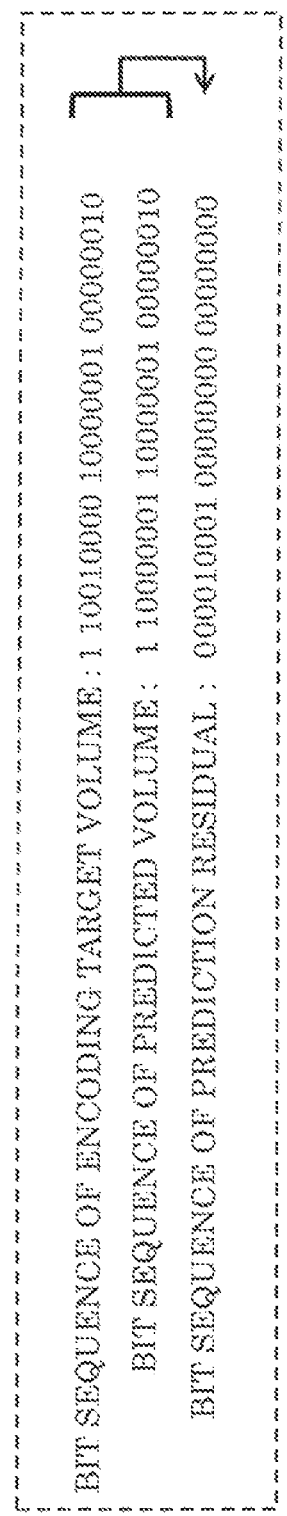
FIG. 38 is a diagram showing an example of a prediction residual according to Embodiment 7.

Subtractor 1302 calculates a difference between a volume (encoding target volume) outputted by divider 1301 and a predicted volume generated through intra prediction or inter prediction, which will be described later, and outputs the calculated difference to transformer 1303 as a prediction residual. FIG. 38 is a diagram showing an example calculation of the prediction residual. Note that bit sequences of the encoding target volume and the predicted volume shown here are, for example, position information indicating positions of three-dimensional points included in the volumes.

Figure 39:
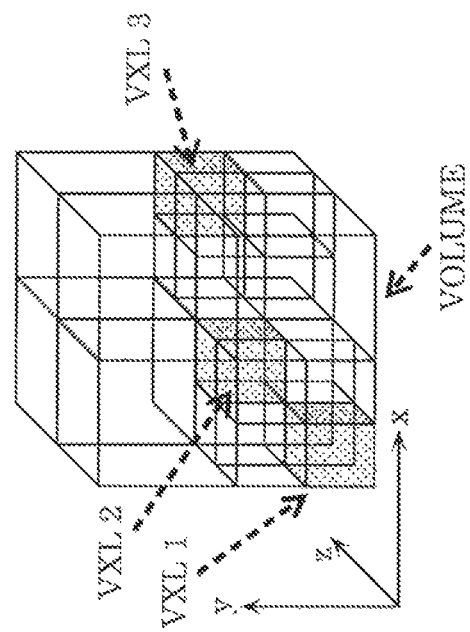
FIG. 39 is a diagram showing an example of a volume according to Embodiment 7.
Figure 40:
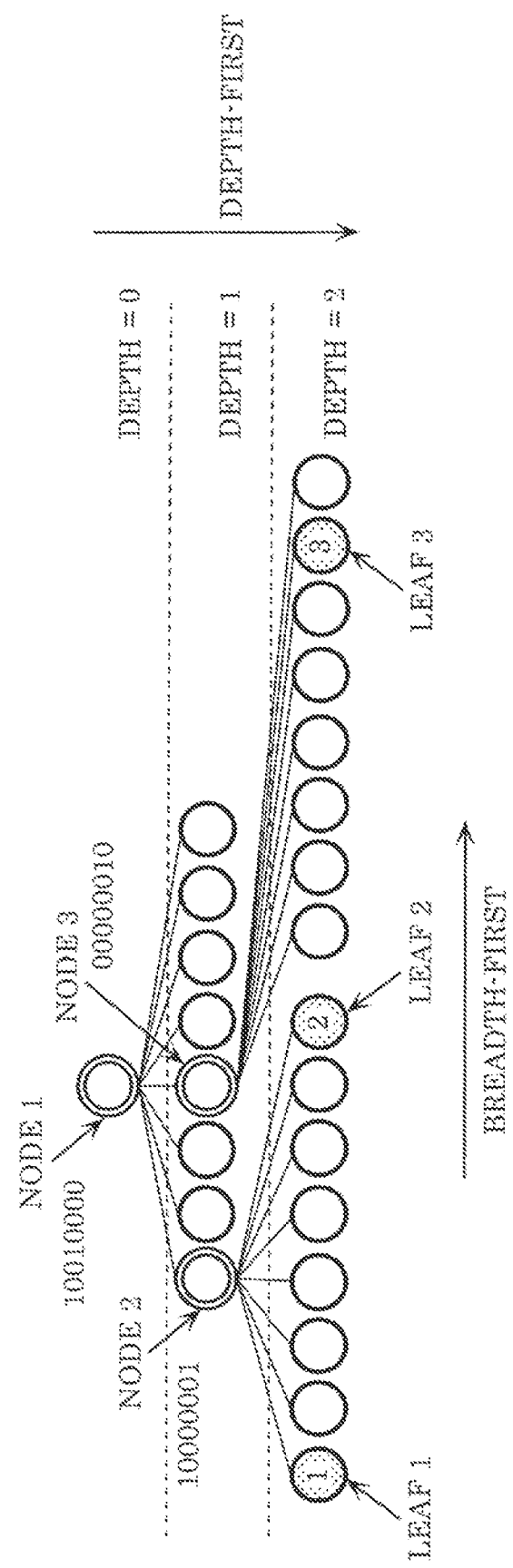
FIG. 40 is a diagram showing an example of an octree representation of the volume according to Embodiment 7.

Hereinafter, a scan order of an octree representation and voxels will be described. A volume is encoded after being converted into an octree structure (made into an octree). The octree structure includes nodes and leaves. Each node has eight nodes or leaves, and each leaf has voxel (VXL) information. FIG. 39 is a diagram showing an example structure of a volume including voxels. FIG. 40 is a diagram showing an example of the volume shown in FIG. 39 having been converted into the octree structure. Among the leaves shown in FIG. 40, leaves 1, 2, and 3 respectively represent VXL 1, VXL 2, and VXL 3, and represent VXLs including a point group (hereinafter, active VXLs).

An octree is represented by, for example, binary sequences of 1s and 0s. For example, when giving the nodes or the active VXLs a value of 1 and everything else a value of 0, each node and leaf is assigned with the binary sequence shown in FIG. 40. Thus, this binary sequence is scanned in accordance with a breadth-first or a depth-first scan order. For example, when scanning breadth-first, the binary sequence shown in A of FIG. 41 is obtained. When scanning depth-first, the binary sequence shown in B of FIG. 41 is obtained. The binary sequences obtained through this scanning are encoded through entropy encoding, which reduces an amount of information.

Depth information in the octree representation will be described next. Depth in the octree representation is used in order to control up to how fine a granularity point cloud information included in a volume is stored. Upon setting a great depth, it is possible to reproduce the point cloud information to a more precise level, but an amount of data for representing the nodes and leaves increases. Upon setting a small depth, however, the amount of data decreases, but some information that the point cloud information originally held is lost, since pieces of point cloud information including different positions and different colors are now considered as pieces of point cloud information including the same position and the same color.

Figure 42:
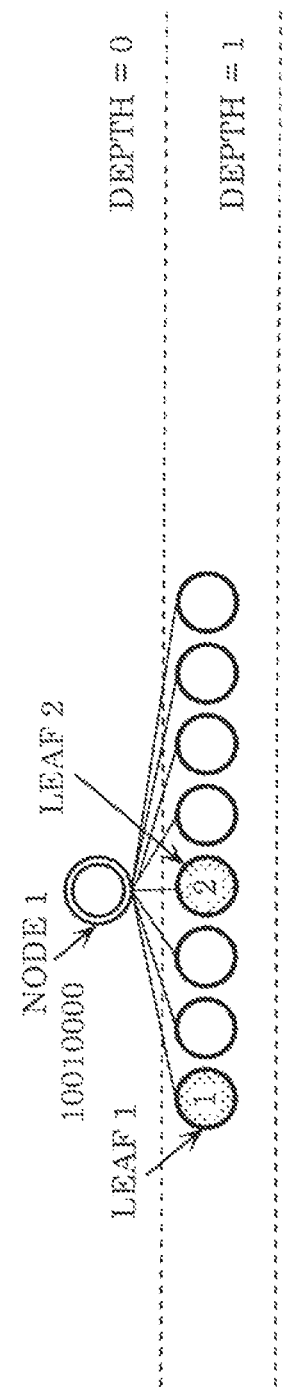
FIG. 42 is a diagram showing an example of an octree representation of a volume according to Embodiment 7.

For example, FIG. 42 is a diagram showing an example in which the octree with a depth of 2 shown in FIG. 40 is represented with a depth of 1. The octree shown in FIG. 42 has a lower amount of data than the octree shown in FIG. 40. In other words, the binarized octree shown in FIG. 42 has a lower bit count than the octree shown in FIG. 40. Leaf 1 and leaf 2 shown in FIG. 40 are represented by leaf 1 shown in FIG. 41. In other words, the information on leaf 1 and leaf 2 being in different positions is lost.

Figure 43:
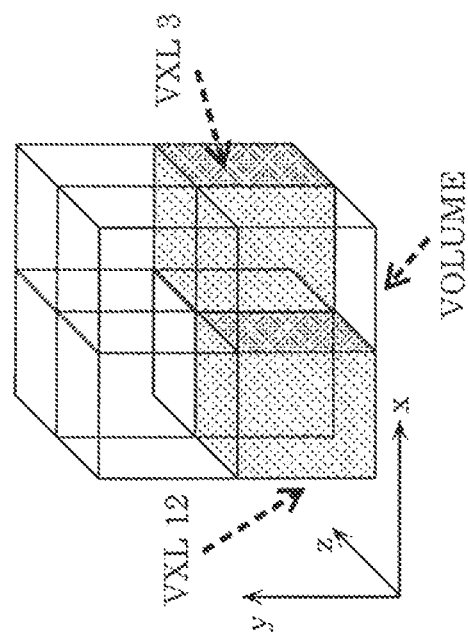
FIG. 43 is a diagram showing an example of the volume according to Embodiment 7.

FIG. 43 is a diagram showing a volume corresponding to the octree shown in FIG. 42. VXL 1 and VXL 2 shown in FIG. 39 correspond to VXL 12 shown in FIG. 43. In this case, three-dimensional data encoding device 1300 generates color information of VXL 12 shown in FIG. 43 using color information of VXL 1 and VXL 2 shown in FIG. 39. For example, three-dimensional data encoding device 1300 calculates an average value, a median, a weighted average value, or the like of the color information of VXL 1 and VXL 2 as the color information of VXL 12. In this manner, three-dimensional data encoding device 1300 may control a reduction of the amount of data by changing the depth of the octree.

Three-dimensional data encoding device 1300 may set the depth information of the octree to units of worlds, units of spaces, or units of volumes. In this case, three-dimensional data encoding device 1300 may append the depth information to header information of the world, header information of the space, or header information of the volume. In all worlds, spaces, and volumes associated with different times, the same value may be used as the depth information. In this case, three-dimensional data encoding device 1300 may append the depth information to header information managing the worlds associated with all times.

When the color information is included in the voxels, transformer 1303 applies frequency transformation, e.g. orthogonal transformation, to a prediction residual of the color information of the voxels in the volume. For example, transformer 1303 creates a one-dimensional array by scanning the prediction residual in a certain scan order. Subsequently, transformer 1303 transforms the one-dimensional array to a frequency domain by applying one-dimensional orthogonal transformation to the created one-dimensional array. With this, when a value of the prediction residual in the volume is similar, a value of a low-frequency component increases and a value of a high-frequency component decreases. As such, it is possible to more efficiently reduce an encoding amount in quantizer 1304.

Transformer 1303 does not need to use orthogonal transformation in one dimension, but may also use orthogonal transformation in two or more dimensions. For example, transformer 1303 maps the prediction residual to a two-dimensional array in a certain scan order, and applies two-dimensional orthogonal transformation to the obtained two-dimensional array. Transformer 1303 may select an orthogonal transformation method to be used from a plurality of orthogonal transformation methods. In this case, three-dimensional data encoding device 1300 appends, to the bitstream, information indicating which orthogonal transformation method is used. Transformer 1303 may select an orthogonal transformation method to be used from a plurality of orthogonal transformation methods in different dimensions. In this case, three-dimensional data encoding device 1300 appends, to the bitstream, in how many dimensions the orthogonal transformation method is used.

For example, transformer 1303 matches the scan order of the prediction residual to a scan order (breadth-first, depth-first, or the like) in the octree in the volume. This makes it possible to reduce overhead, since information indicating the scan order of the prediction residual does not need to be appended to the bitstream. Transformer 1303 may apply a scan order different from the scan order of the octree. In this case, three-dimensional data encoding device 1300 appends, to the bitstream, information indicating the scan order of the prediction residual. This enables three-dimensional data encoding device 1300 to efficiently encode the prediction residual. Three-dimensional data encoding device 1300 may append, to the bitstream, information (flag, etc.) indicating whether to apply the scan order of the octree, and may also append, to the bitstream, information indicating the scan order of the prediction residual when the scan order of the octree is not applied.

Transformer 1303 does not only transform the prediction residual of the color information, and may also transform other attribute information included in the voxels. For example, transformer 1303 may transform and encode information, such as reflectance information, obtained when obtaining a point cloud through LIDAR and the like.

Transformer 1303 may skip these processes when the spaces do not include attribute information such as color information. Three-dimensional data encoding device 1300 may append, to the bitstream, information (flag) indicating whether to skip the processes of transformer 1303.

Quantizer 1304 generates a quantized coefficient by performing quantization using a quantization control parameter on a frequency component of the prediction residual generated by transformer 1303. With this, the amount of information is further reduced. The generated quantized coefficient is outputted to entropy encoder 1313. Quantizer 1304 may control the quantization control parameter in units of worlds, units of spaces, or units of volumes. In this case, three-dimensional data encoding device 1300 appends the quantization control parameter to each header information and the like. Quantizer 1304 may perform quantization control by changing a weight per frequency component of the prediction residual. For example, quantizer 1304 may precisely quantize a low-frequency component and roughly quantize a high-frequency component. In this case, three-dimensional data encoding device 1300 may append, to a header, a parameter expressing a weight of each frequency component.

Quantizer 1304 may skip these processes when the spaces do not include attribute information such as color information. Three-dimensional data encoding device 1300 may append, to the bitstream, information (flag) indicating whether to skip the processes of quantizer 1304.

Inverse quantizer 1305 generates an inverse quantized coefficient of the prediction residual by performing inverse quantization on the quantized coefficient generated by quantizer 1304 using the quantization control parameter, and outputs the generated inverse quantized coefficient to inverse transformer 1306.

Inverse transformer 1306 generates an inverse transformation-applied prediction residual by applying inverse transformation on the inverse quantized coefficient generated by inverse quantizer 1305. This inverse transformation-applied prediction residual does not need to completely coincide with the prediction residual outputted by transformer 1303, since the inverse transformation-applied prediction residual is a prediction residual that is generated after the quantization.

Adder 1307 adds, to generate a reconstructed volume, (i) the inverse transformation-applied prediction residual generated by inverse transformer 1306 to (ii) a predicted volume that is generated through intra prediction or intra prediction, which will be described later, and is used to generate a pre-quantized prediction residual. This reconstructed volume is stored in reference volume memory 1308 or reference space memory 1310.

Intra predictor 1309 generates a predicted volume of an encoding target volume using attribute information of a neighboring volume stored in reference volume memory 1308. The attribute information includes color information or a reflectance of the voxels. Intra predictor 1309 generates a predicted value of color information or a reflectance of the encoding target volume.

Figure 44:
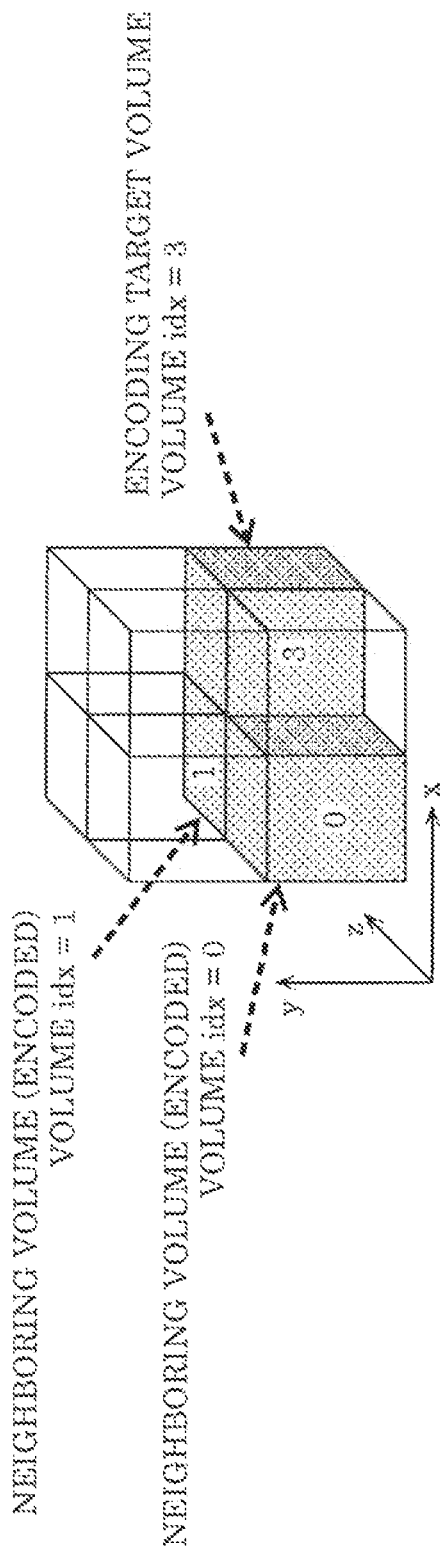
FIG. 44 is a diagram for describing an intra prediction process according to Embodiment 7.

FIG. 44 is a diagram for describing an operation of intra predictor 1309. For example, intra predictor 1309 generates the predicted volume of the encoding target volume (volume idx=3) shown in FIG. 44, using a neighboring volume (volume idx=0). Volume idx here is identifier information that is appended to a volume in a space, and a different value is assigned to each volume. An order of assigning volume idx may be the same as an encoding order, and may also be different from the encoding order. For example, intra predictor 1309 uses an average value of color information of voxels included in volume idx=0, which is a neighboring volume, as the predicted value of the color information of the encoding target volume shown in FIG. 44. In this case, a prediction residual is generated by deducting the predicted value of the color information from the color information of each voxel included in the encoding target volume. The following processes are performed by transformer 1303 and subsequent processors with respect to this prediction residual. In this case, three-dimensional data encoding device 1300 appends, to the bitstream, neighboring volume information and prediction mode information. The neighboring volume information here is information indicating a neighboring volume used in the prediction, and indicates, for example, volume idx of the neighboring volume used in the prediction. The prediction mode information here indicates a mode used to generate the predicted volume. The mode is, for example, an average value mode in which the predicted value is generated using an average value of the voxels in the neighboring volume, or a median mode in which the predicted value is generated using the median of the voxels in the neighboring volume.

Infra predictor 1309 may generate the predicted volume using a plurality of neighboring volumes. For example, in the structure shown in FIG. 44, intra predictor 1309 generates predicted volume 0 using a volume with volume idx=0, and generates predicted volume 1 using a volume with volume idx=1. Intra predictor 1309 then generates an average of predicted volume 0 and predicted volume 1 as a final predicted volume. In this case, three-dimensional data encoding device 1300 may append, to the bitstream, a plurality of volumes idx of a plurality of volumes used to generate the predicted volume.

Figure 45:
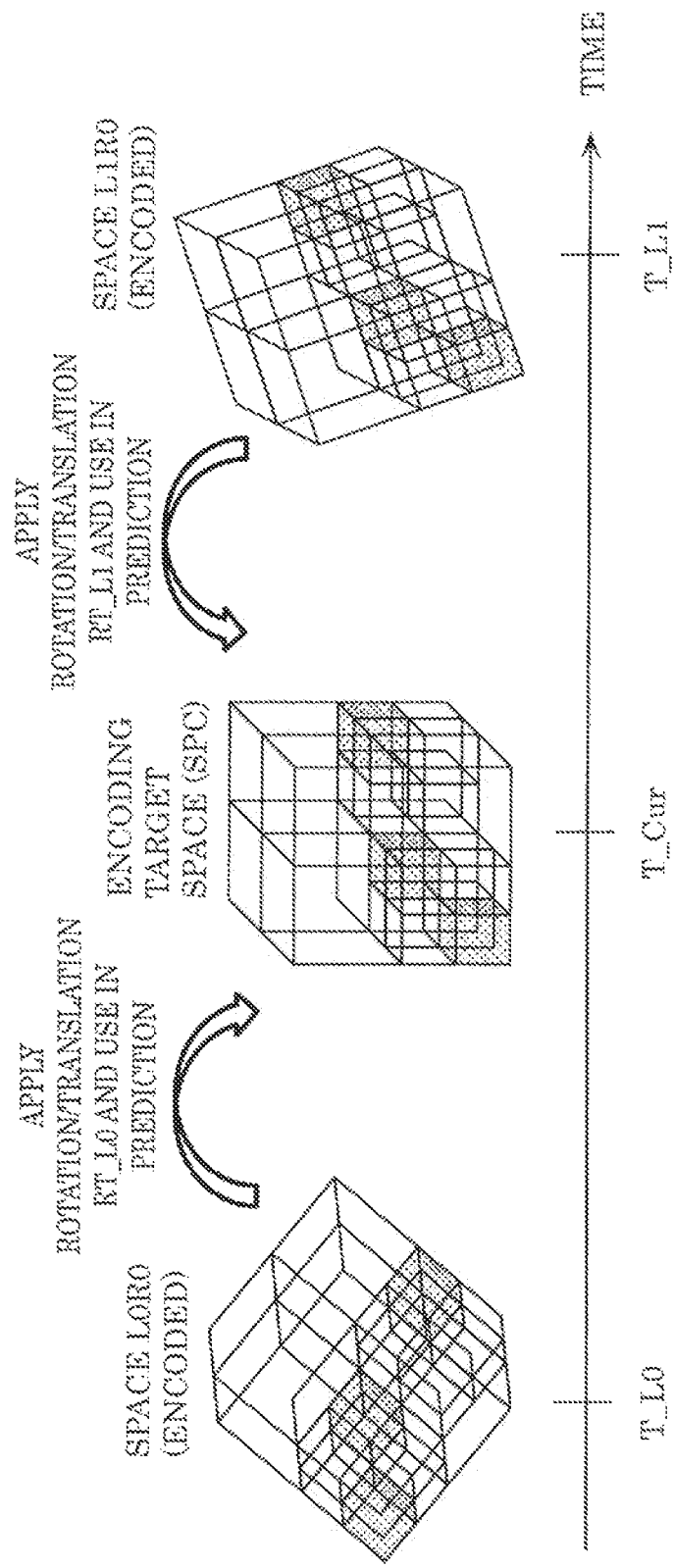
FIG. 45 is a diagram for describing a rotation and translation process according to Embodiment 7.

FIG. 45 is a diagram schematically showing the inter prediction process according to the present embodiment. Inter predictor 1311 encodes (inter predicts) a space (SPC) associated with certain time T_Cur using an encoded space associated with different time T_LX. In this case, inter predictor 1311 performs an encoding process by applying a rotation and translation process to the encoded space associated with different time T_LX.

Three-dimensional data encoding device 1300 appends, to the bitstream, RT information relating to a rotation and translation process suited to the space associated with different time T_LX. Different time T_LX is, for example, time T_L0 before certain time T_Cur. At this point, three-dimensional data encoding device 1300 may append, to the bitstream, RT information RT_L0 relating to a rotation and translation process suited to a space associated with time T_L0.

Alternatively, different time T_LX is, for example, time T_L1 after certain time T_Cur. At this point, three-dimensional data encoding device 1300 may append, to the bitstream, RT information RT_L1 relating to a rotation and translation process suited to a space associated with time T_L1.

Alternatively, inter predictor 1311 encodes (bidirectional prediction) with reference to the spaces associated with time T_L0 and time T_L1 that differ from each other. In this case, three-dimensional data encoding device 1300 may append, to the bitstream, both RT information RT_L0 and RT information RT_L1 relating to the rotation and translation process suited to the spaces thereof.

Note that T_L0 has been described as being before T_Cur and T_L1 as being after T_Cur, but are not necessarily limited thereto. For example, T_L0 and T_L1 may both be before T_Cur. T_L0 and T_L1 may also both be after T_Cur.

Three-dimensional data encoding device 1300 may append, to the bitstream, RT information relating to a rotation and translation process suited to spaces associated with different times, when encoding with reference to each of the spaces. For example, three-dimensional data encoding device 1300 manages a plurality of encoded spaces to be referred to, using two reference lists (list L0 and list L1). When a first reference space in list L0 is L0R0, a second reference space in list L0 is L0R1, a first reference space in list L1 is L1R0, and a second reference space in list L1 is L1R1, three-dimensional data encoding device 1300 appends, to the bitstream, RT information RT_L0R0 of L0R0, RT information RT_L0R1 of L0R1, RT information RT_L1R0 of L1R0, and RT information RT_L1R1 of L1R1. For example, three-dimensional data encoding device 1300 appends these pieces of RT information to a header and the like of the bitstream.

Three-dimensional data encoding device 1300 determines whether to apply rotation and translation per reference space, when encoding with reference to reference spaces associated with different times. In this case, three-dimensional data encoding device 1300 may append, to header information and the like of the bitstream, information (RT flag, etc.) indicating whether rotation and translation are applied per reference space. For example, three-dimensional data encoding device 1300 calculates the RT information and an Iterative Closest Point (ICP) error value, using an ICP algorithm per reference space to be referred to from the encoding target space. Three-dimensional data encoding device 1300 determines that rotation and translation do not need to be performed and sets the RT flag to OFF, when the ICP error value is lower than or equal to a predetermined fixed value. In contrast, three-dimensional data encoding device 1300 sets the RT flag to ON and appends the RT information to the bitstream, when the ICP error value exceeds the above fixed value.

FIG. 46 is a diagram showing an example syntax to be appended to a header of the RT information and the RT flag. Note that a bit count assigned to each syntax may be decided based on a range of this syntax. For example, when eight reference spaces are included in reference list L0, 3 bits may be assigned to MaxRefSpc_l0. The bit count to be assigned may be variable in accordance with a value each syntax can be, and may also be fixed regardless of the value each syntax can be. When the bit count to be assigned is fixed, three-dimensional data encoding device 1300 may append this fixed bit count to other header information.

MaxRefSpc_l0 shown in FIG. 46 indicates a number of reference spaces included in reference list L0, RT_flag_l0[i] is an RT flag of reference space i in reference list L0. When RT_flag_l0[i] is 1, rotation and translation are applied to reference space i. When RT_flag_l0[i] is 0, rotation and translation are not applied to reference space i.

R_l0[i] and T_l0[i] are RT information of reference space i in reference list L0. R_l0[i] is rotation information of reference space i in reference list L0. The rotation information indicates contents of the applied rotation process, and is, for example, a rotation matrix or a quaternion. T_l0[i] is translation information of reference space i in reference list L0. The translation information indicates contents of the applied translation process, and is, for example, a translation vector.

MaxRefSpc_l1 indicates a number of reference spaces included in reference list L1. RT_flag_l1[i] is an RT flag of reference space i in reference list L1. When RT_flag_l1[i] is 1, rotation and translation are applied to reference space i. When RT_flag_l1[i] is 0, rotation and translation are not applied to reference space i.

R_l1[i] and T_l1[i] are RT information of reference space i in reference list L1. R_l1[i] is rotation information of reference space i in reference list L1. The rotation information indicates contents of the applied rotation process, and is, for example, a rotation matrix or a quaternion. T_l1[i] is translation information of reference space i in reference list L1. The translation information indicates contents of the applied translation process, and is, for example, a translation vector.

Inter predictor 1311 generates the predicted volume of the encoding target volume using information on an encoded reference space stored in reference space memory 1310. As stated above, before generating the predicted volume of the encoding target volume, inter predictor 1311 calculates RT information at an encoding target space and a reference space using an ICP algorithm, in order to approach an overall positional relationship between the encoding target space and the reference space. Inter predictor 1311 then obtains reference space B by applying a rotation and translation process to the reference space using the calculated RT information. Subsequently, inter predictor 1311 generates the predicted volume of the encoding target volume in the encoding target space using information in reference space B. Three-dimensional data encoding device 1300 appends, to header information and the like of the encoding target space, the RT information used to obtain reference space B.

In this manner, inter predictor 1311 is capable of improving precision of the predicted volume by generating the predicted volume using the information of the reference space, after approaching the overall positional relationship between the encoding target space and the reference space, by applying a rotation and translation process to the reference space. It is possible to reduce the encoding amount since it is possible to limit the prediction residual. Note that an example has been described in which ICP is performed using the encoding target space and the reference space, but is not necessarily limited thereto. For example, inter predictor 1311 may calculate the RT information by performing ICP using at least one of (i) an encoding target space in which a voxel or point cloud count is pruned, or (ii) a reference space in which a voxel or point cloud count is pruned, in order to reduce the processing amount.

When the ICP error value obtained as a result of the ICP is smaller than a predetermined first threshold, i.e., when for example the positional relationship between the encoding target space and the reference space is similar, inter predictor 1311 determines that a rotation and translation process is not necessary, and the rotation and translation process does not need to be performed. In this case, three-dimensional data encoding device 1300 may control the overhead by not appending the RT information to the bitstream.

When the ICP error value is greater than a predetermined second threshold, inter predictor 1311 determines that a shape change between the spaces is large, and intra prediction may be applied on all volumes of the encoding target space. Hereinafter, spaces to which intra prediction is applied will be referred to as intra spaces. The second threshold is greater than the above first threshold. The present embodiment is not limited to ICP, and any type of method may be used as long as the method calculates the RT information using two voxel sets or two point cloud sets.

Figure 47:
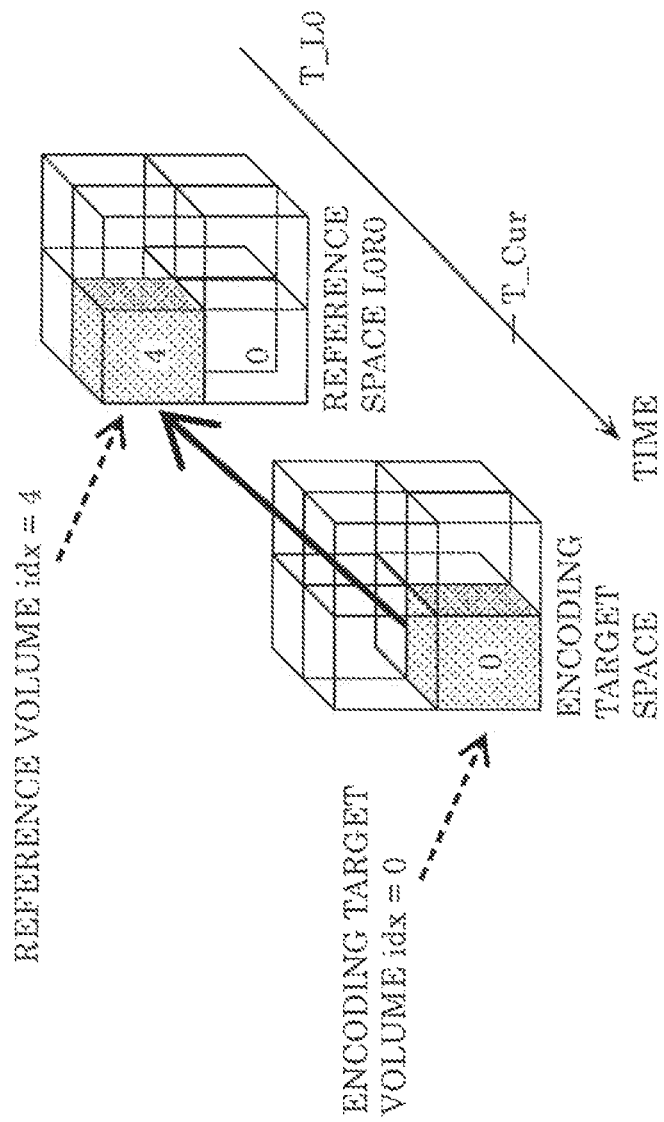
FIG. 47 is a diagram for describing an inter prediction process according to Embodiment 7.

When attribute information, e.g. shape or color information, is included in the three-dimensional data, inter predictor 1311 searches, for example, a volume whose attribute information, e.g. shape or color information, is the most similar to the encoding target volume in the reference space, as the predicted volume of the encoding target volume in the encoding target space. This reference space is, for example, a reference space on which the above rotation and translation process has been performed. Inter predictor 1311 generates the predicted volume using the volume (reference volume) obtained through the search. FIG. 47 is a diagram for describing a generating operation of the predicted volume. When encoding the encoding target volume (volume idx=0) shown in FIG. 47 using inter prediction, inter predictor 1311 searches a volume with a smallest prediction residual, which is the difference between the encoding target volume and the reference volume, while sequentially scanning the reference volume in the reference space. Inter predictor 1311 selects the volume with the smallest prediction residual as the predicted volume. The prediction residuals of the encoding target volume and the predicted volume are encoded through the processes performed by transformer 1303 and subsequent processors. The prediction residual here is a difference between the attribute information of the encoding target volume and the attribute information of the predicted volume. Three-dimensional data encoding device 1300 appends, to the header and the like of the bitstream, volume idx of the reference volume in the reference space, as the predicted volume.

In the example shown in FIG. 47, the reference volume with volume idx=4 of reference space L0R0 is selected as the predicted volume of the encoding target volume. The prediction residuals of the encoding target volume and the reference volume, and reference volume idx=4 are then encoded and appended to the bitstream.

Note that an example has been described in which the predicted volume of the attribute information is generated, but the same process may be applied to the predicted volume of the position information.

Prediction controller 1312 controls whether to encode the encoding target volume using intra prediction or inter prediction. A mode including intra prediction and inter prediction is referred to here as a prediction mode. For example, prediction controller 1312 calculates the prediction residual when the encoding target volume is predicted using intra prediction and the prediction residual when the encoding target volume is predicted using inter prediction as evaluation values, and selects the prediction mode whose evaluation value is smaller. Note that prediction controller 1312 may calculate an actual encoding amount by applying orthogonal transformation, quantization, and entropy encoding to the prediction residual of the intra prediction and the prediction residual of the inter prediction, and select a prediction mode using the calculated encoding amount as the evaluation value. Overhead information (reference volume idx information, etc.) aside from the prediction residual may be added to the evaluation value. Prediction controller 1312 may continuously select intra prediction when it has been decided in advance to encode the encoding target space using intra space.

Entropy encoder 1313 generates an encoded signal (encoded bitstream) by variable-length encoding the quantized coefficient, which is an input from quantizer 1304. To be specific, entropy encoder 1313, for example, binarizes the quantized coefficient and arithmetically encodes the obtained binary signal.

Figure 48:
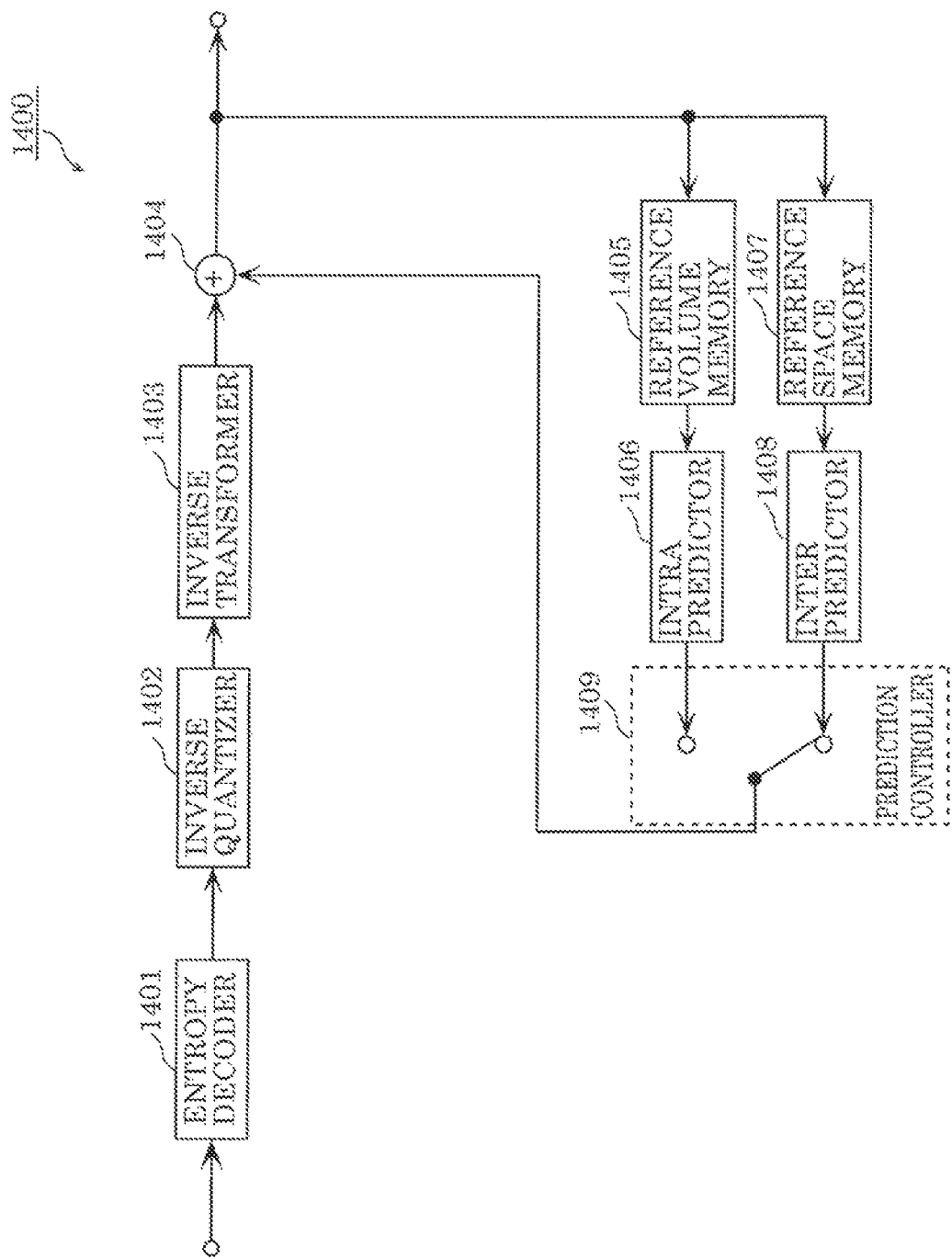
FIG. 48 is a block diagram of a three-dimensional data decoding device according to Embodiment 7.

A three-dimensional data decoding device that decodes the encoded signal generated by three-dimensional data encoding device 1300 will be described next. FIG. 48 is a block diagram of three-dimensional data decoding device 1400 according to the present embodiment. This three-dimensional data decoding device 1400 includes entropy decoder 1401, inverse quantizer 1402, inverse transformer 1403, adder 1404, reference volume memory 1405, intra predictor 1406, reference space memory 1407, inter predictor 1408, and prediction controller 1409.

Entropy decoder 1401 variable-length decodes the encoded signal (encoded bitstream). For example, entropy decoder 1401 generates a binary signal by arithmetically decoding the encoded signal, and generates a quantized coefficient using the generated binary signal.

Inverse quantizer 1402 generates an inverse quantized coefficient by inverse quantizing the quantized coefficient inputted from entropy decoder 1401, using a quantization parameter appended to the bitstream and the like.

Inverse transformer 1403 generates a prediction residual by inverse transforming the inverse quantized coefficient inputted from inverse quantizer 1402. For example, inverse transformer 1403 generates the prediction residual by inverse orthogonally transforming the inverse quantized coefficient, based on information appended to the bitstream.

Adder 1404 adds, to generate a reconstructed volume, (i) the prediction residual generated by inverse transformer 1403 to (ii) a predicted volume generated through intra prediction or intra prediction. This reconstructed volume is outputted as decoded three-dimensional data and is stored in reference volume memory 1405 or reference space memory 1407.

Intra predictor 1406 generates a predicted volume through intra prediction using a reference volume in reference volume memory 1405 and information appended to the bitstream. To be specific, intra predictor 1406 obtains neighboring volume information (e.g. volume idx) appended to the bitstream and prediction mode information, and generates the predicted volume through a mode indicated by the prediction mode information, using a neighboring volume indicated in the neighboring volume information. Note that the specifics of these processes are the same as the above-mentioned processes performed by intra predictor 1309, except for which information appended to the bitstream is used.

Inter predictor 1408 generates a predicted volume through inter prediction using a reference space in reference space memory 1407 and information appended to the bitstream. To be specific, inter predictor 1408 applies a rotation and translation process to the reference space using the RT information per reference space appended to the bitstream, and generates the predicted volume using the rotated and translated reference space. Note that when an RT flag is present in the bitstream per reference space, inter predictor 1408 applies a rotation and translation process to the reference space in accordance with the RT flag. Note that the specifics of these processes are the same as the above-mentioned processes performed by inter predictor 1311, except for which information appended to the bitstream is used.

Prediction controller 1409 controls whether to decode a decoding target volume using intra prediction or inter prediction. For example, prediction controller 1409 selects intra prediction or inter prediction in accordance with information that is appended to the bitstream and indicates the prediction mode to be used. Note that prediction controller 1409 may continuously select intra prediction when it has been decided in advance to decode the decoding target space using intra space.

Hereinafter, variations of the present embodiment will be described. In the present embodiment, an example has been described in which rotation and translation is applied in units of spaces, but rotation and translation may also be applied in smaller units. For example, three-dimensional data encoding device 1300 may divide a space into subspaces, and apply rotation and translation in units of subspaces. In this case, three-dimensional data encoding device 1300 generates RT information per subspace, and appends the generated RT information to a header and the like of the bitstream. Three-dimensional data encoding device 1300 may apply rotation and translation in units of volumes, which is an encoding unit. In this case, three-dimensional data encoding device 1300 generates RT information in units of encoded volumes, and appends the generated RT information to a header and the like of the bitstream. The above may also be combined. In other words, three-dimensional data encoding device 1300 may apply rotation and translation in large units and subsequently apply rotation and translation in small units. For example, three-dimensional data encoding device 1300 may apply rotation and translation in units of spaces, and may also apply different rotations and translations to each of a plurality of volumes included in the obtained spaces.

In the present embodiment, an example has been described in which rotation and translation is applied to the reference space, but is not necessarily limited thereto. For example, three-dimensional data encoding device 1300 may apply a scaling process and change a size of the three-dimensional data. Three-dimensional data encoding device 1300 may also apply one or two of the rotation, translation, and scaling. When applying the processes in multiple stages and different units as stated above, a type of the processes applied in each unit may differ. For example, rotation and translation may be applied in units of spaces, and translation may be applied in units of volumes.

Note that these variations are also applicable to three-dimensional data decoding device 1400.

As stated above, three-dimensional data encoding device 1300 according to the present embodiment performs the following processes. FIG. 48 is a flowchart of the inter prediction process performed by three-dimensional data encoding device 1300.

Three-dimensional data encoding device 1300 generates predicted position information (e.g. predicted volume) using position information on three-dimensional points included in three-dimensional reference data (e.g. reference space) associated with a time different from a time associated with current three-dimensional data (e.g. encoding target space) (S1301). To be specific, three-dimensional data encoding device 1300 generates the predicted position information by applying a rotation and translation process to the position information on the three-dimensional points included in the three-dimensional reference data.

Note that three-dimensional data encoding device 1300 may perform a rotation and translation process using a first unit (e.g. spaces), and may perform the generating of the predicted position information using a second unit (e.g. volumes) that is smaller than the first unit. For example, three-dimensional data encoding device 1300 searches a volume among a plurality of volumes included in the rotated and translated reference space, whose position information differs the least from the position information of the encoding target volume included in the encoding target space. Note that three-dimensional data encoding device 1300 may perform the rotation and translation process, and the generating of the predicted position information in the same unit.

Three-dimensional data encoding device 1300 may generate the predicted position information by applying (i) a first rotation and translation process to the position information on the three-dimensional points included in the three-dimensional reference data, and (ii) a second rotation and translation process to the position information on the three-dimensional points obtained through the first rotation and translation process, the first rotation and translation process using a first unit (e.g. spaces) and the second rotation and translation process using a second unit (e.g. volumes) that is smaller than the first unit.

For example, as illustrated in FIG. 41, the position information on the three-dimensional points and the predicted position information is represented using an octree structure. For example, the position information on the three-dimensional points and the predicted position information is expressed in a scan order that prioritizes a breadth over a depth in the octree structure. For example, the position information on the three-dimensional points and the predicted position information is expressed in a scan order that prioritizes a depth over a breadth in the octree structure.

As illustrated in FIG. 46, three-dimensional data encoding device 1300 encodes an RT flag that indicates whether to apply the rotation and translation process to the position information on the three-dimensional points included in the three-dimensional reference data. In other words, three-dimensional data encoding device 1300 generates the encoded signal (encoded bitstream) including the RT flag. Three-dimensional data encoding device 1300 encodes RT information that indicates contents of the rotation and translation process. In other words, three-dimensional data encoding device 1300 generates the encoded signal (encoded bitstream) including the RT information. Note that three-dimensional data encoding device 1300 may encode the RT information when the RT flag indicates to apply the rotation and translation process, and does not need to encode the RT information when the RT flag indicates not to apply the rotation and translation process.

The three-dimensional data includes, for example, the position information on the three-dimensional points and the attribute information (color information, etc.) of each three-dimensional point. Three-dimensional data encoding device 1300 generates predicted attribute information using the attribute information of the three-dimensional points included in the three-dimensional reference data (S1302).

Three-dimensional data encoding device 1300 next encodes the position information on the three-dimensional points included in the current three-dimensional data, using the predicted position information. For example, as illustrated in FIG. 38, three-dimensional data encoding device 1300 calculates differential position information, the differential position information being a difference between the predicted position information and the position information on the three-dimensional points included in the current three-dimensional data (S1303).

Three-dimensional data encoding device 1300 encodes the attribute information of the three-dimensional points included in the current three-dimensional data, using the predicted attribute information. For example, three-dimensional data encoding device 1300 calculates differential attribute information, the differential attribute information being a difference between the predicted attribute information and the attribute information on the three-dimensional points included in the current three-dimensional data (S1304). Three-dimensional data encoding device 1300 next performs transformation and quantization on the calculated differential attribute information (S1305).

Lastly, three-dimensional data encoding device 1300 encodes (e.g. entropy encodes, the differential position information and the quantized differential attribute information (S1036). In other words, three-dimensional data encoding device 1300 generates the encoded signal (encoded bitstream) including the differential position information and the differential attribute information.

Note that when the attribute information is not included in the three-dimensional data, three-dimensional data encoding device 1300 does not need to perform steps S1302, S1304, and S1305. Three-dimensional data encoding device 1300 may also perform only one of the encoding of the position information on the three-dimensional points and the encoding of the attribute information of the three-dimensional points.

Figure 49:
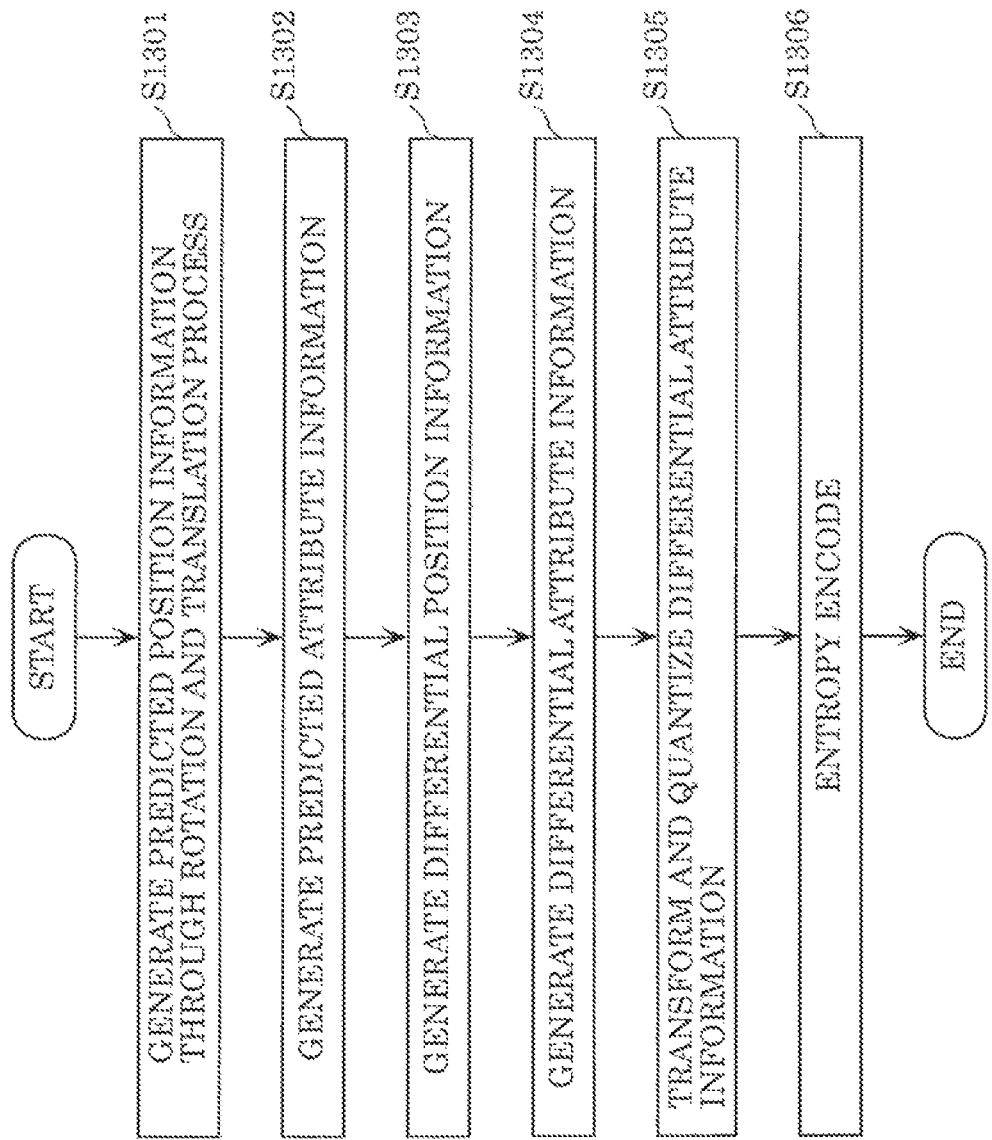
FIG. 49 is a flowchart of a three-dimensional data encoding process performed by the three-dimensional data encoding device according to Embodiment 7.

An order of the processes shown in FIG. 49 is merely an example and is not limited thereto. For example, since the processes with respect to the position information (S1301 and S1303) and the processes with respect to the attribute information (S1302, S1304, and S130) are separate from one another, they may be performed in an order of choice, and a portion thereof may also be performed in parallel.

With the above, three-dimensional data encoding device 1300 according to the present embodiment generates predicted position information using position information on three-dimensional points included in three-dimensional reference data associated with a time different, from a time associated with current three-dimensional data; and encodes differential position information, which is a difference between the predicted position information and the position information on the three-dimensional points included in the current three-dimensional data. This makes it possible to improve encoding efficiency since it is possible to reduce the amount of data of the encoded signal.

Three-dimensional data encoding device 1300 according to the present embodiment generates predicted attribute information using attribute information on three-dimensional points included in three-dimensional reference data; and encodes differential attribute information, which is a difference between the predicted attribute information and the attribute information on the three-dimensional points included in the current three-dimensional data. This makes it possible to improve encoding efficiency since it is possible to reduce the amount of data of the encoded signal.

For example, three-dimensional data encoding device 1300 includes a processor and memory. The processor uses the memory to perform the above processes.

FIG. 48 is a flowchart of the inter prediction process performed by three-dimensional data decoding device 1400.

Three-dimensional data decoding device 1400 decodes (e.g. entropy decodes) the differential position information and the differential attribute information from the encoded signal (encoded bitstream) (S1401).

Three-dimensional data decoding device 1400 decodes, from the encoded signal, an RT flag that indicates whether to apply the rotation and translation process to the position information on the three-dimensional points included in the three-dimensional reference data. Three-dimensional data decoding device 1400 encodes RT information that indicates contents of the rotation and translation process. Note that three-dimensional data decoding device 1400 may decode the RT information when the RT flag indicates to apply the rotation and translation process, and does not need to decode the RT information when the RT flag indicates not to apply the rotation and translation process.

Three-dimensional data decoding device 1400 next performs inverse transformation and inverse quantization on the decoded differential attribute information (S1402).

Three-dimensional data decoding device 1400 next generates predicted position information (e.g. predicted volume) using the position information on the three-dimensional points included in the three-dimensional reference data (e.g. reference space) associated with a time different from a time associated with the current three-dimensional data (e.g. decoding target space) (S1403). To be specific, three-dimensional data decoding device 1400 generates the predicted position information by applying a rotation and translation process to the position information on the three-dimensional points included in the three-dimensional reference data.

More specifically, when the RT flag indicates to apply the rotation and translation process, three-dimensional data decoding device 1400 applies the rotation and translation process on the position information on the three-dimensional points included in the three-dimensional reference data indicated in the RT information. In contrast, when the RT flag indicates not to apply the rotation and translation process, three-dimensional data decoding device 1400 does not apply the rotation and translation process on the position information on the three-dimensional points included in the three-dimensional reference data.

Note that three-dimensional data decoding device 1400 may perform the rotation and translation process using a first unit (e.g. spaces), and may perform the generating of the predicted position information using a second unit (e.g. volumes) that is smaller than the first unit. Note that three-dimensional data decoding device 1400 may perform the rotation and translation process, and the generating of the predicted position information the same unit.

Three-dimensional data decoding device 1400 may generate the predicted position information by applying (i) a first rotation and translation process to the position information on the three-dimensional points included in the three-dimensional reference data, and (ii) a second rotation and translation process to the position information on the three-dimensional points obtained through the first rotation and translation process, the first rotation and translation process using a first unit (e.g. spaces) and the second rotation and translation process using a second unit (e.g. volumes) that is smaller than the first unit.

For example, as illustrated in FIG. 41, the position information on the three-dimensional points and the predicted position information is represented using an octree structure. For example, the position information on the three-dimensional points and the predicted position information is expressed in a scan order that prioritizes a breadth over a depth in the octree structure. For example, the position information on the three-dimensional points and the predicted position information is expressed in a scan order that prioritizes a depth over a breadth in the octree structure.

Three-dimensional data decoding device 1400 generates predicted attribute information using the attribute information of the three-dimensional points included in the three-dimensional reference data (S1404).

Three-dimensional data decoding device 1400 next restores the position information on the three-dimensional points included in the current three-dimensional data, by decoding encoded position information included in an encoded signal, using the predicted position information. The encoded position information here is the differential position information. Three-dimensional data decoding device 1400 restores the position information on the three-dimensional points included in the current three-dimensional data, by adding the differential position information to the predicted position information (S1405).

Three-dimensional data decoding device 1400 restores the attribute information of the three-dimensional points included in the current three-dimensional data, by decoding encoded attribute information included in an encoded signal, using the predicted attribute information. The encoded attribute information here is the differential position information. Three-dimensional data decoding device 1400 restores the attribute information on the three-dimensional points included in the current three-dimensional data, by adding the differential attribute information to the predicted attribute information (S1406).

Note that when the attribute information is not included in the three-dimensional data, three-dimensional data decoding device 1400 does not need to perform steps S1402, S1404, and S1406. Three-dimensional data decoding device 1400 may also perform only one of the decoding of the position information on the three-dimensional points and the decoding of the attribute information of the three-dimensional points.

Figure 50:
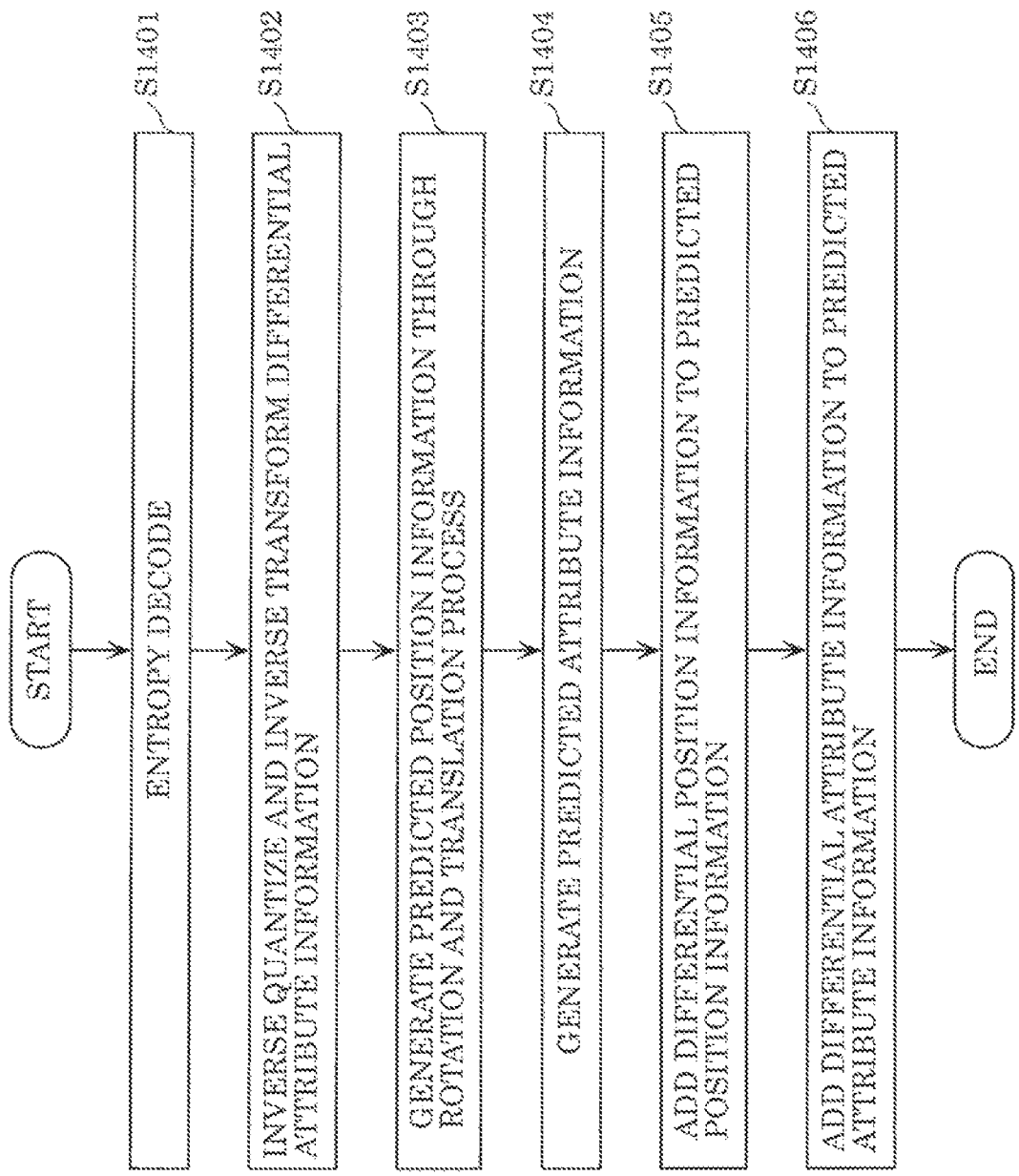
FIG. 50 is a flowchart of a three-dimensional data decoding process performed by the three-dimensional data decoding device according to Embodiment 7.

An order of the processes shown in FIG. 50 is merely an example and is not limited thereto. For example, since the processes with respect to the position information (S1403 and S1405) and the processes with respect to the attribute information (S1402, S1404, and S1406) are separate from one another, they may be performed in an order of choice, and a portion thereof may also be performed in parallel.

Embodiment 8

In the present embodiment, a representation means of three-dimensional points (point cloud) in encoding of three-dimensional data will be described.

Figure 51:
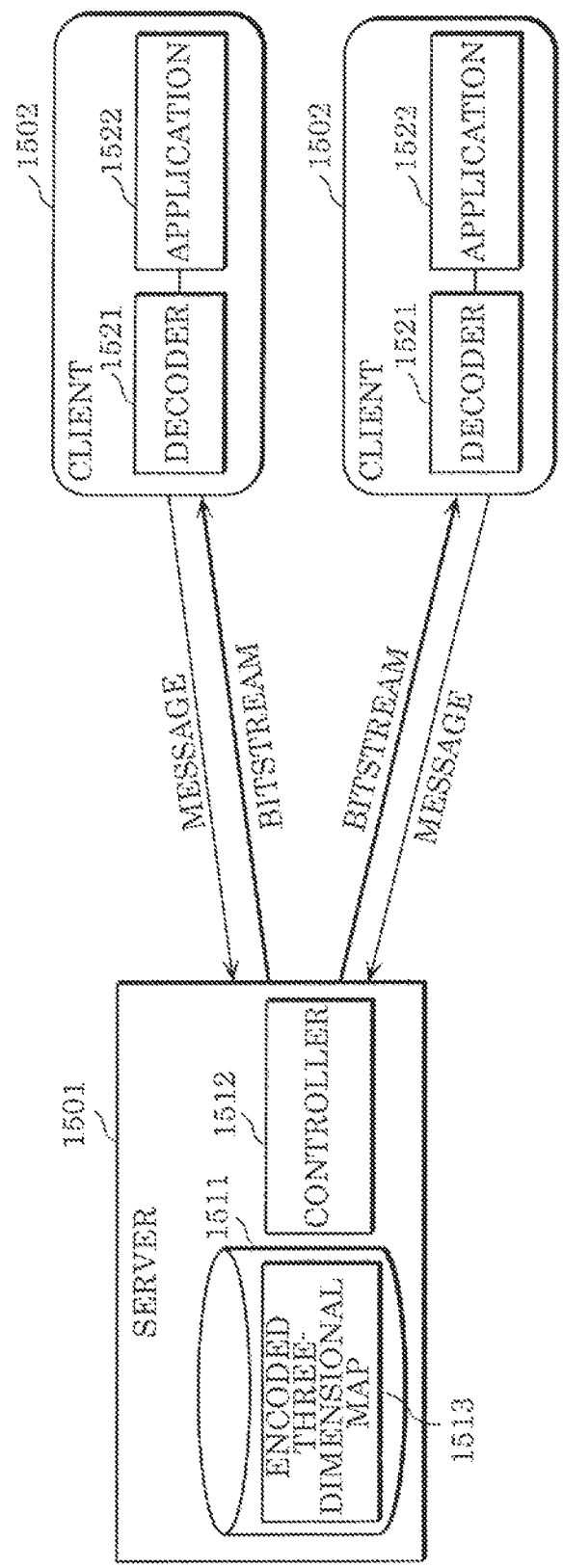
FIG. 51 is a diagram showing a structure of a distribution system according to Embodiment 8.

FIG. 51 is a block diagram showing a structure of a distribution system of three-dimensional data according to the present embodiment. The distribution system shown in FIG. 51 includes server 1501 and a plurality of clients 1502.

Server 1501 includes storage 1511 and controller 1512. Storage 1511 stores encoded three-dimensional map 1513 that is encoded three-dimensional data.

Figure 52:
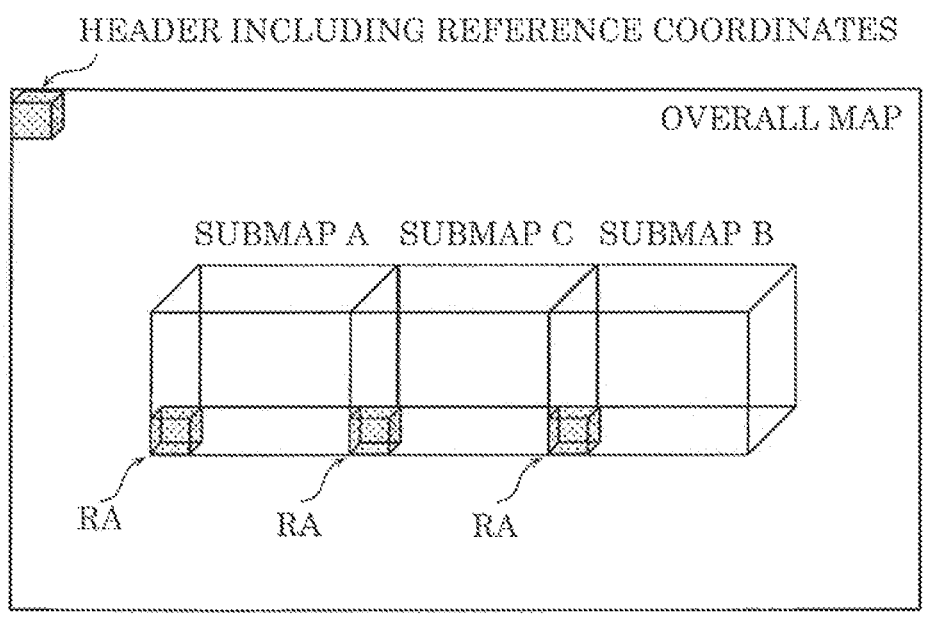
FIG. 52 is a diagram showing an example structure of a bitstream of an encoded three-dimensional map according to Embodiment 8.

FIG. 52 is a diagram showing an example structure of a bitstream of encoded three-dimensional map 1513. The three-dimensional map is divided into a plurality of submaps and each submap is encoded. Each submap is app ended with a random-access (RA) header including subcoordinate information. The subcoordinate information is used for improving encoding efficiency of the submap. This subcoordinate information indicates subcoordinates of the submap. The subcoordinates are coordinates of the submap having reference coordinates as reference. Note that the three-dimensional map including the plurality of submaps is referred to as an overall map. Coordinates that are a reference in the overall map (e.g. origin) are referred to as the reference coordinates. In other words, the subcoordinates are the coordinates of the submap in a coordinate system of the overall map. In other words, the subcoordinates indicate an offset between the coordinate system of the overall map and a coordinate system of the submap. Coordinates in the coordinate system of the overall map having the reference coordinates as reference are referred to as overall coordinates. Coordinates in the coordinate system of the submap having the subcoordinates as reference are referred to as differential coordinates.

Client 1502 transmits a message to server 1501. This message includes position information on client 1502. Controller 1512 included in server 1501 obtains a bitstream of a submap located closest to client 1502, based on the position information included in the received message. The bitstream of the submap includes the subcoordinate information and is transmitted to client 1502. Decoder 1521 included in client 1502 obtains overall coordinates of the submap having the reference coordinates as reference, using this subcoordinate information. Application 1522 included in client 1502 executes an application relating to a self-location, using the obtained overall coordinates of the submap.

The submap indicates a partial area of the overall map. The subcoordinates are the coordinates in which the submap is located in a reference coordinate space of the overall map. For example, in an overall map called A, there is submap A called AA and submap B called AB. When a vehicle wants to consult a map of AA, decoding begins from submap A, and when the vehicle wants to consult a map of AB, decoding begins from submap B. The submap here is a random-access point. To be specific, A is Osaka Prefecture, AA is Osaka City, and AB is Takatsuki City.

Each submap is transmitted along with the subcoordinate information to the client. The subcoordinate information is included in header information of each submap, a transmission packet, or the like.

The reference coordinates, which serve as a reference for the subcoordinate information of each submap, may be appended to header information of a space at a higher level than the submap, such as header information of the overall map.

The submap may be formed by one space (SPC). The submap may also be formed by a plurality of SPCs.

The submap may include a Group of Spaces (GOS). The submap may be formed by a world. For example, in a case where there are a plurality of objects in the submap, the submap is formed by a plurality of SPCs when assigning the plurality of objects to separate SPCs. The submap is formed by one SPC when assigning the plurality of objects to one SPC.

Figure 53:
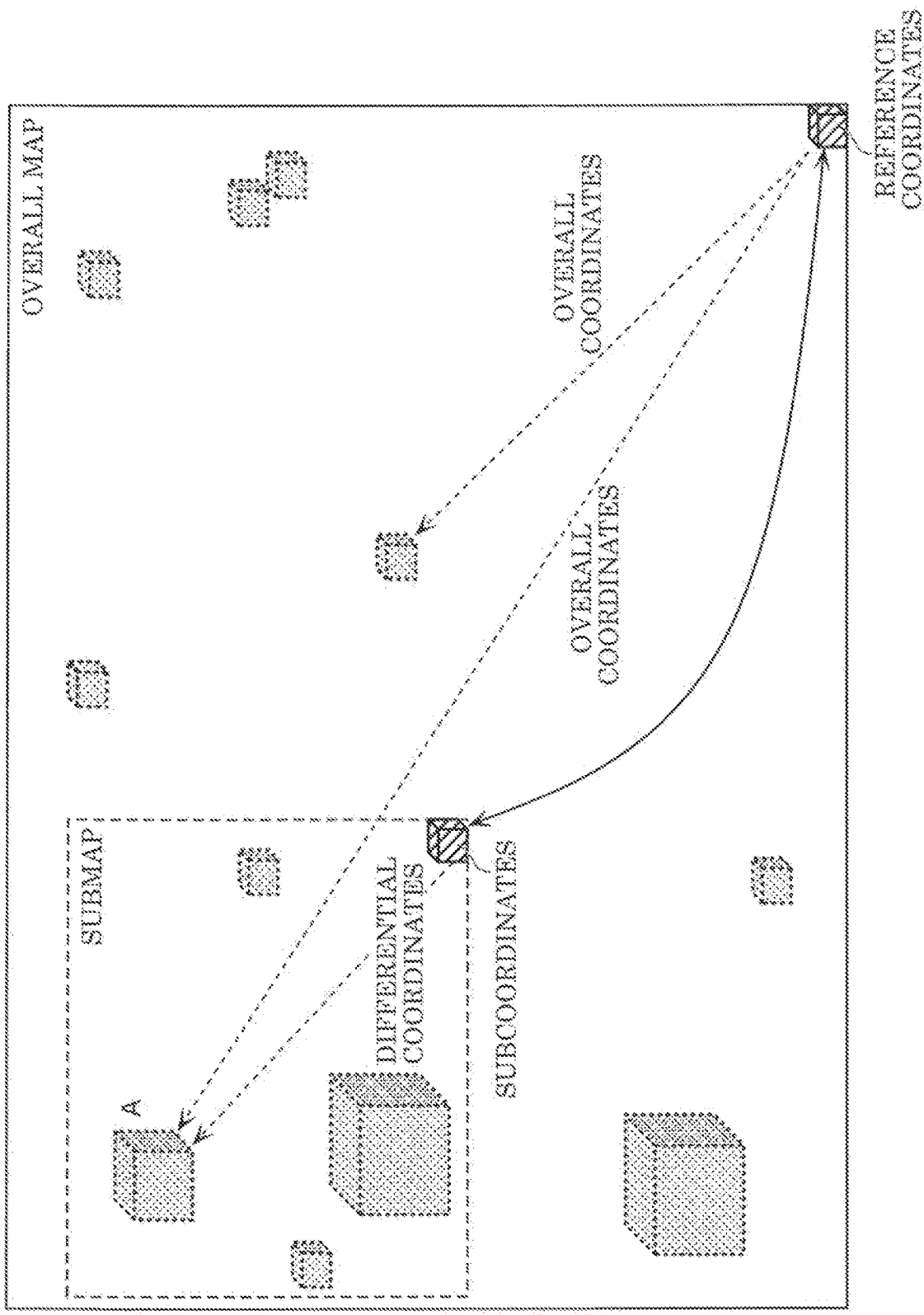
FIG. 53 is a diagram for describing an advantageous effect on encoding efficiency according to Embodiment 8.

An advantageous effect on encoding efficiency when using the subcoordinate information will be described next. FIG. 53 is a diagram for describing this advantageous effect. For example, a high bit count is necessary in order to encode three-dimensional point A, which is located far from the reference coordinates, shown in FIG. 53. A distance between the subcoordinates and three-dimensional point A is shorter than a distance between the reference coordinates and three-dimensional point A. As such, it is possible to improve encoding efficiency by encoding coordinates of three-dimensional point A having the subcoordinates as reference more than when encoding the coordinates of three-dimensional point A having the reference coordinates as reference. The bitstream of the submap includes the subcoordinate information. By transmitting the bitstream of the submap and the reference coordinates to a decoding end (client), it is possible to restore the overall coordinates of the submap in the decoder end.

Figure 54:
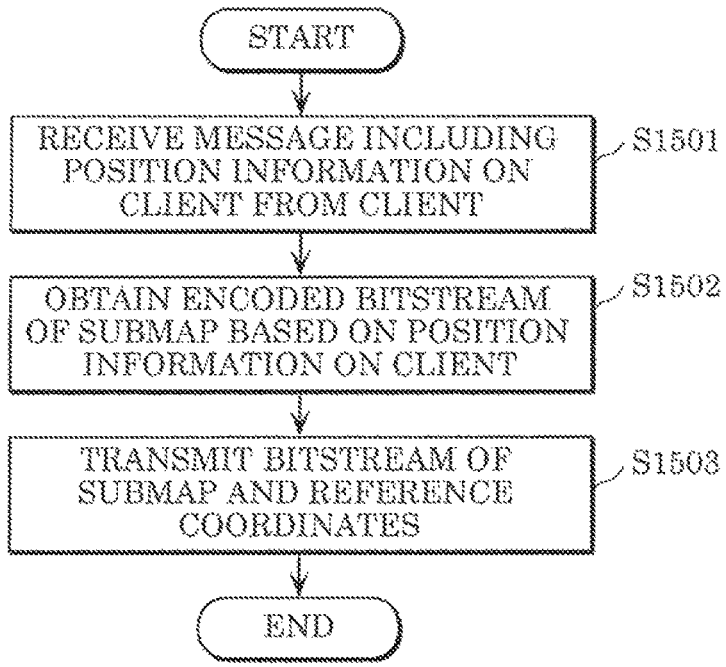
FIG. 54 is a flowchart of processes performed by a server according to Embodiment 8.

FIG. 54 is a flowchart of processes performed by server 1501, which is a transmission end of the submap.

Server 1501 first receives a message including position information on client 1502 from client 1502 (S1501). Controller 1512 obtains an encoded bitstream of the submap based on the position information on the client from storage 1511 (S1502). Server 1501 then transmits the encoded bitstream of the submap and the reference coordinates to client 1502 (S1503).

Figure 55:
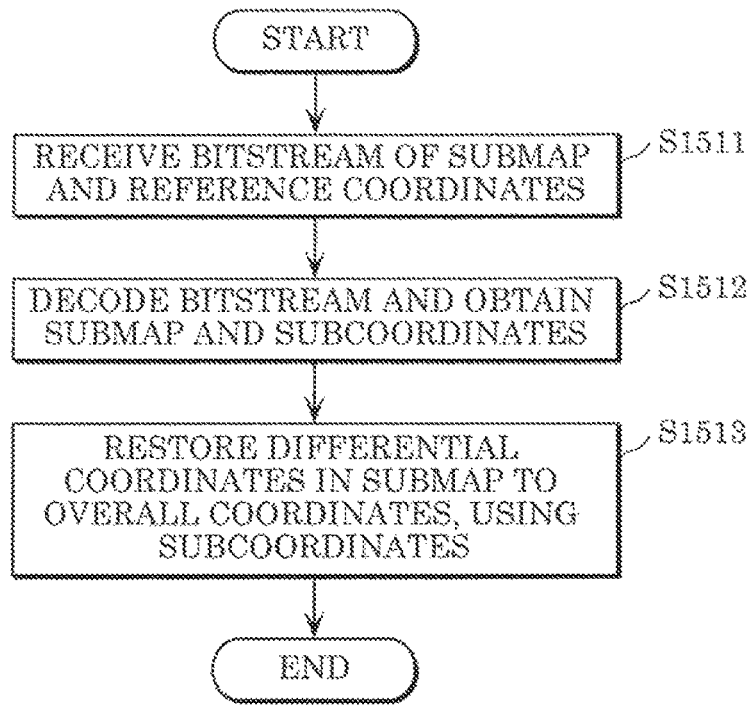
FIG. 55 is a flowchart of processes performed by a client according to Embodiment 8.

FIG. 55 is a flowchart of processes performed by client 1502, which is a receiver end of the submap.

Client 1502 first receives the encoded bitstream of the submap and the reference coordinates transmitted from server 1501 (S1511). Client 1502 next obtains the subcoordinate information of the submap by decoding the encoded bitstream (S1512). Client 1502 next restores the differential coordinates in the submap to the overall coordinates, using the reference coordinates and the subcoordinates (S1513).

An example syntax of information relating to the submap will be described next. In the encoding of the submap, the three-dimensional data encoding device calculates the differential coordinates by subtracting the subcoordinates from the coordinates of each point cloud (three-dimensional points). The three-dimensional data encoding device then encodes the differential coordinates into the bitstream as a value of each point cloud. The encoding device encodes the subcoordinate information indicating the subcoordinates as the header information of the bitstream. This enables the three-dimensional data decoding device to obtain overall coordinates of each point cloud. For example, the three-dimensional data encoding device is included in server 1501 and the three-dimensional data decoding device is included in client 1502.

FIG. 56 is a diagram showing an example syntax of the submap. NumOfPoint shown in FIG. 56 indicates a total number of point clouds included in the submap. sub_coordinate_x, sub_coordinate_y, and sub_coordinate_z are the subcoordinate information, sub_coordinate_x indicates an x-coordinate of the subcoordinates. sub_coordinate_y indicates a y-coordinate of the subcoordinates. sub_coordinate_z indicates a z-coordinate of the subcoordinates.

diff_x[i], diff_y[i], and diff_z[i] are differential coordinates of an i-th point cloud in the submap. diff_x[i] is a differential value between an x-coordinate of the i-th point cloud and the x-coordinate of the subcoordinates in the submap, diff_y[i] is a differential value between a y-coordinate of the i-th point cloud and the y-coordinate of the subcoordinates in the submap. diff_z[i] is a differential value between a z-coordinate of the i-th point cloud and the z-coordinate of the subcoordinates in the submap.

The three-dimensional data decoding device decodes point_cloud[i]_x, point_cloud[i]_y, and point_cloud[i]_z, which are overall coordinates of the i-th point cloud, using the expression below. point_cloud[i]_x is an x-coordinate of the overall coordinates of the i-th point cloud. point_cloud[i]_y is a y-coordinate of the overall coordinates of the i-th point cloud. point_cloud[i]_z is a z-coordinate of the overall coordinates of the i-th point cloud.

point_cloud[i]_x=sub_coordinate_x+diff_x[i]

point_cloud[i]_y=sub_coordinate_y+diff_y[i]

point_cloud[i]_z=sub_coordinate_z+diff_z[i]

Figure 57:
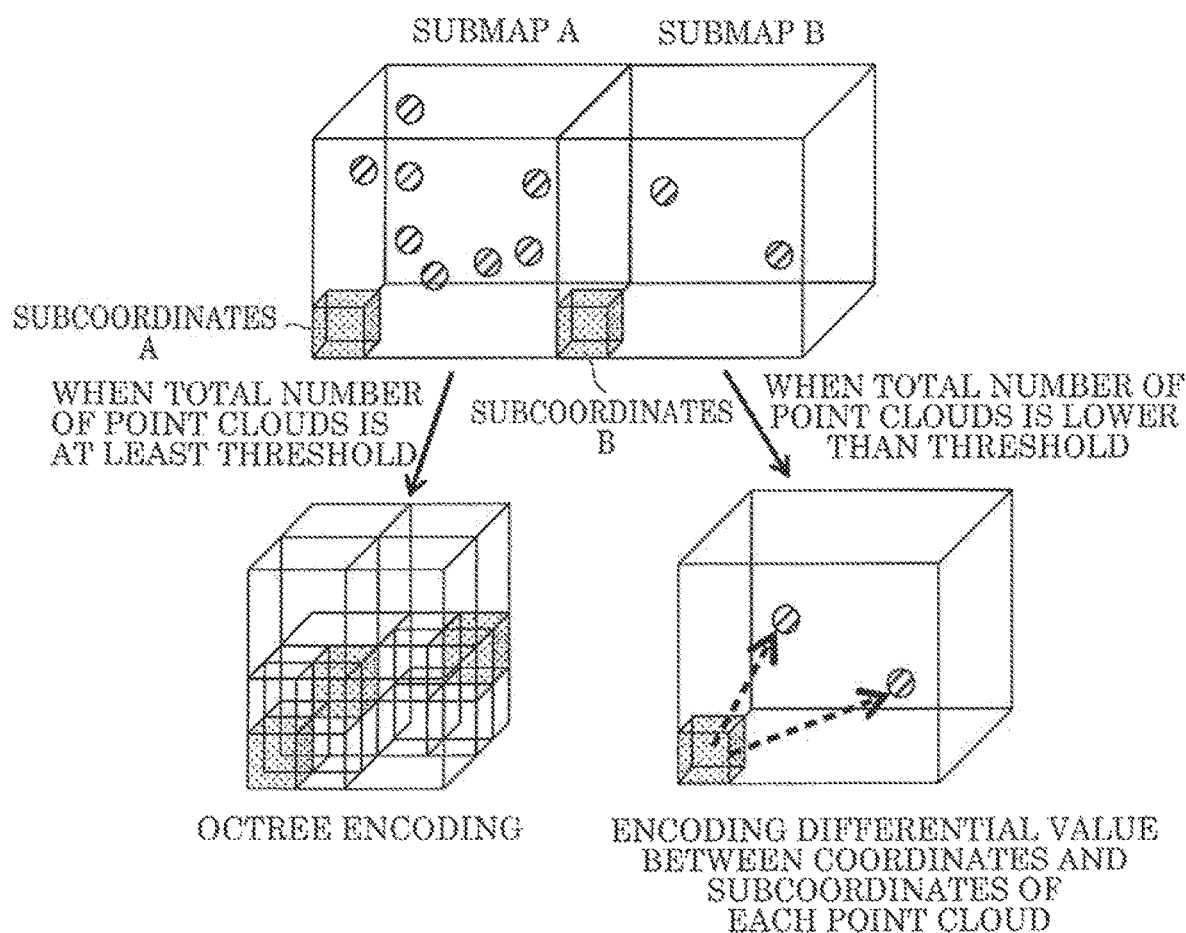
FIG. 57 is a diagram schematically showing a switching process of an encoding type according to Embodiment 8.

A switching process for applying octree encoding will be described next. The three-dimensional data encoding device selects, when encoding the submap, whether to encode each point cloud using an octree representation (hereinafter, referred to as octree encoding) or to encode the differential values from the subcoordinates (hereinafter, referred to as non-octree encoding). FIG. 57 is a diagram schematically showing this operation. For example, the three-dimensional data encoding device applies octree encoding to the submap, when the total number of point clouds in the submap is at least a predetermined threshold. The three-dimensional data encoding device applies non-octree encoding to the submap, when the total number of point clouds in the submap is lower than the predetermined threshold. This enables the three-dimensional data encoding device to improve encoding efficiency, since it is possible to appropriately select whether to use octree encoding or non-octree encoding, in accordance with a shape and density of objects included in the submap.

The three-dimensional data encoding device appends, to a header and the like of the submap, information indicating whether octree encoding or non-octree encoding has been applied to the submap (hereinafter, referred to as octree encoding application information). This enables the three-dimensional data decoding device to identify whether the bitstream is obtained by octree encoding the submap or non-octree encoding the submap.

The three-dimensional data encoding device may calculate encoding efficiency when applying octree encoding and encoding efficiency when applying non-octree encoding to the same point cloud, and apply an encoding method whose encoding efficiency is better to the submap.

FIG. 58 is a diagram showing an example syntax of the submap when performing this switching. coding_type shown in FIG. 58 is information indicating the encoding type and is the above octree encoding application information, coding_type=00 indicates that octree encoding has been applied. coding_type=01 indicates that non-octree encoding has been applied. coding_type=10 or 11 indicates that an encoding method and the like other than the above encoding methods has been applied.

When the encoding type is non-octree encoding (non_octree), the submap includes NumOfPoint and the subcoordinate information (sub_coordinate_x, sub_coordinate_y, and sub_coordinate_z).

When the encoding type is octree encoding (octree), the submap includes octree_info. octree_info is information necessary to the octree encoding and includes, for example, depth information.

When the encoding type is non-octree encoding (non_octree), the submap includes the differential coordinates (diff_x[i], diff_y[i], and diff_z[i]).

When the encoding type is octree encoding (octree), the submap includes octree_data, which is encoded data relating to the octree encoding.

Note that an example has been described here in which an xyz coordinate system is used as the coordinate system of the point cloud, but a polar coordinate system may also be used.

Figure 59:
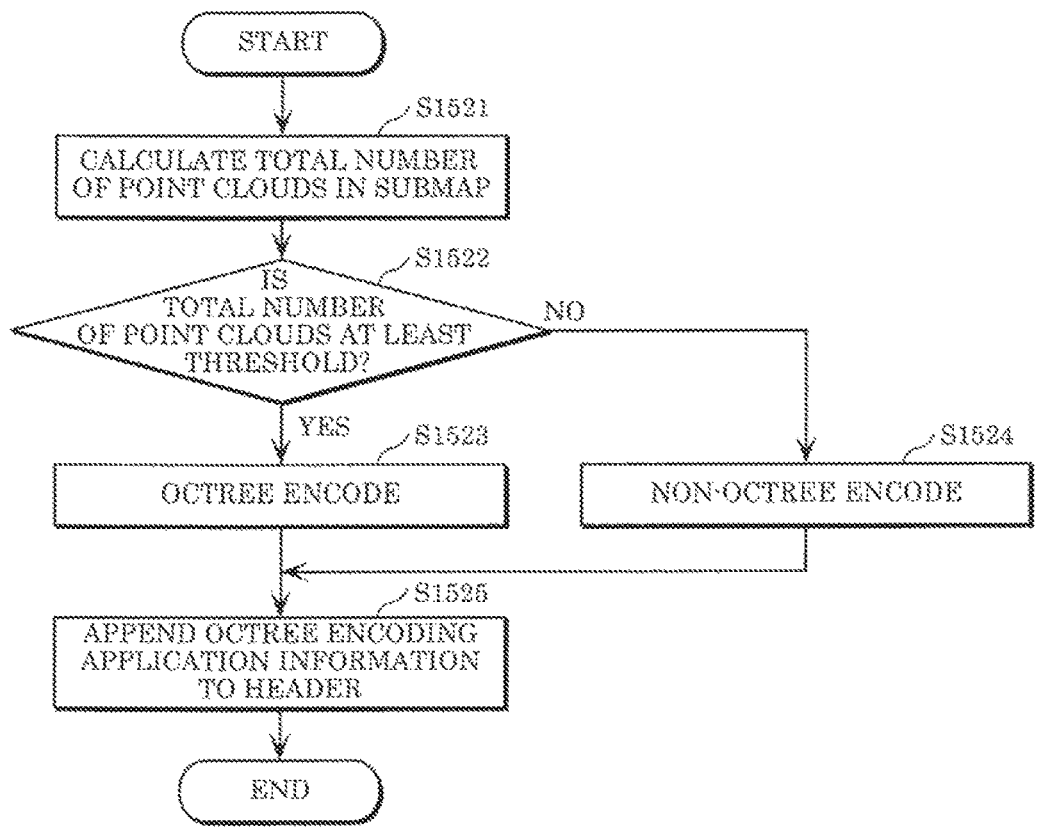
FIG. 59 is a flowchart of a three-dimensional data encoding process according to Embodiment 8.

FIG. 59 is a flowchart of a three-dimensional data encoding process performed by the three-dimensional data encoding device. Three-dimensional data encoding device first calculates a total number of point clouds in a current submap, which is the submap to he processed (S1521). The three-dimensional data encoding device next determines whether when the calculated total number of point clouds is at least a predetermined threshold (S1522).

When the total number of point clouds is at least the predetermined threshold (YES in S1522), the three-dimensional data encoding device applies octree encoding to the current submap (S1523). The three-dimensional data encoding device appends, to a header of the bitstream, octree encoding application information indicating that octree encoding has been applied to the current submap (S1525).

In contrast, when the total number of point clouds is lower than the predetermined threshold (NO in S1522), the three-dimensional data encoding device applies non-octree encoding to the current submap (S1524). The three-dimensional data encoding device appends, to the header of the bitstream, octree encoding application information indicating that non-octree encoding has been applied to the current submap (S1525).

Figure 60:
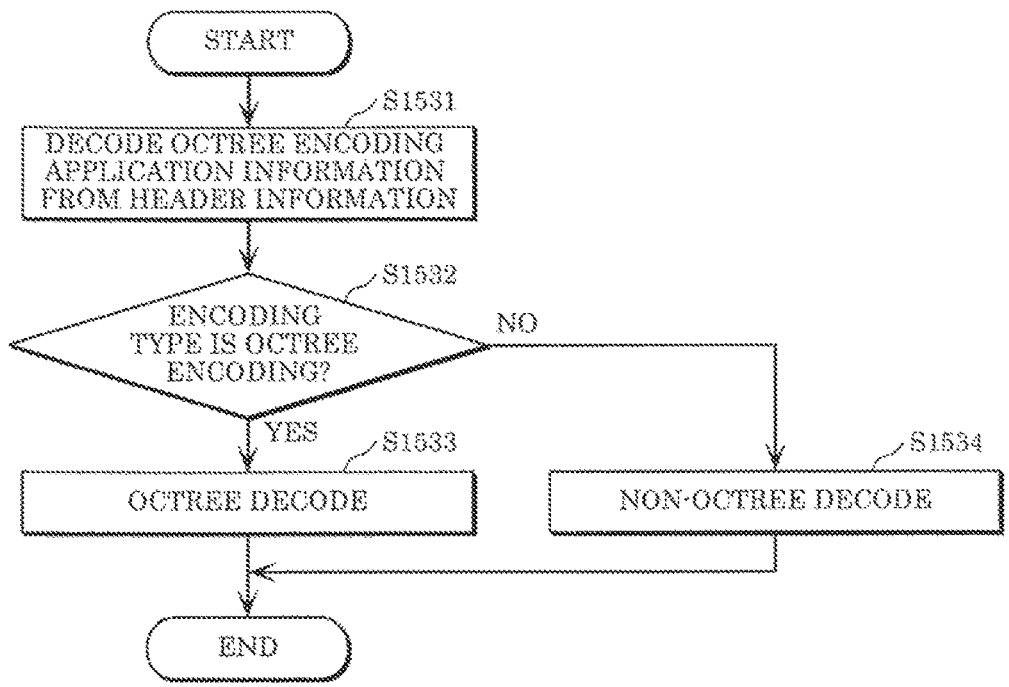
FIG. 60 is a flowchart of a three-dimensional data decoding process according to Embodiment 8.

FIG. 60 is a flowchart of a three-dimensional data decoding process performed by the three-dimensional data decoding device. The three-dimensional data decoding device first decodes the octree encoding application information from the header of the bitstream (S1531). The three-dimensional data decoding device next determines whether the encoding type applied to the current submap is octree encoding, based on the decoded octree encoding application information (S1532).

When the octree encoding application information indicates that the encoding type is octree encoding (YES in S1532), the three-dimensional data decoding device decodes the current submap through octree decoding (S1533). In contrast, when the octree encoding application information indicates that the encoding type is non-octree encoding (NO in S1532), the three-dimensional data decoding device decodes the current submap through non-octree decoding (S1534).

Figure 61:
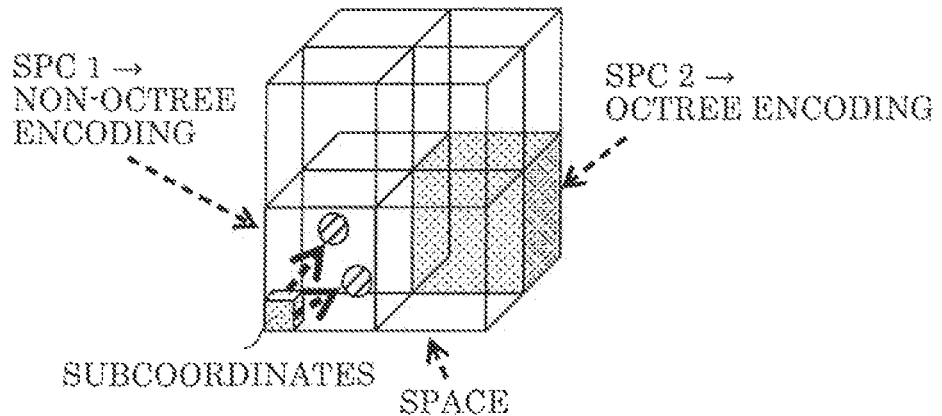
FIG. 61 is a diagram schematically showing an operation of a variation of the switching process of the encoding type according to Embodiment 8.
Figure 62:
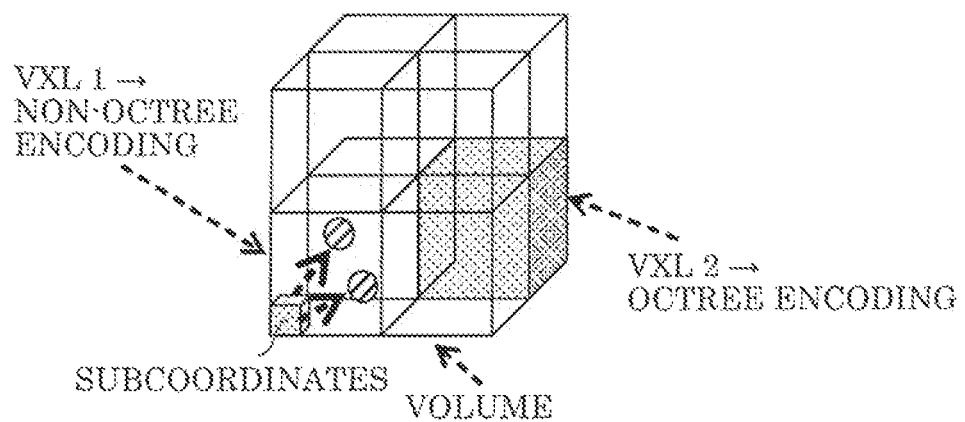
FIG. 62 is a diagram schematically showing an operation of a variation of the switching process of the encoding type according to Embodiment 8.
Figure 63:
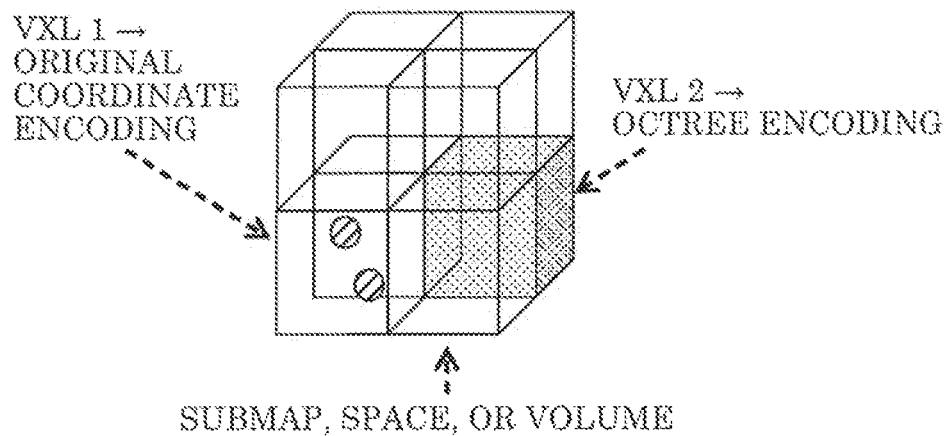
FIG. 63 is a diagram schematically showing an operation of a variation of the switching process of the encoding type according to Embodiment 8.

Hereinafter, variations of the present embodiment will be described. FIG. 61 to FIG. 63 are diagrams schematically showing operations of variations of the switching process of the encoding type.

As illustrated in FIG. 61, the three-dimensional data encoding device may select whether to apply octree encoding or non-octree encoding per space. In this case, the three-dimensional data encoding device appends the octree encoding application information to a header of the space. This enables the three-dimensional data decoding device to determine whether octree encoding has been applied per space. In this case, the three-dimensional data encoding device sets subcoordinates per space, and encodes a differential value, which is a value of the subcoordinates subtracted from coordinates of each point cloud in the space.

This enables the three-dimensional data encoding device to improve encoding efficiency, since it is possible to appropriately select whether to apply octree encoding, in accordance with a shape of objects or the total number of point clouds in the space.

As illustrated in FIG. 62, the three-dimensional data encoding device may select whether to apply octree encoding or non-octree encoding per volume. In this case, the three-dimensional data encoding device appends the octree encoding application information to a header of the volume. This enables the three-dimensional data decoding device to determine whether octree encoding has been applied per volume. In this case, the three-dimensional data encoding device sets subcoordinates per volume, and encodes a differential value, which is a value of the subcoordinates subtracted from coordinates of each point cloud in the volume.

This enables the three-dimensional data encoding device to improve encoding efficiency, since it is possible to appropriately select whether to apply octree encoding, in accordance with a shape of objects or the total number of point clouds in the volume.

In the above description, an example has been shown in which the difference, which is the subcoordinates of each point cloud subtracted from the coordinates of each point cloud, is encoded as the non-octree encoding, but is not limited thereto, and any other type of encoding method other than the octree encoding may be used. For example, as illustrated in FIG. 63, the three-dimensional data encoding device may not only encode the difference from the subcoordinates as the non-octree encoding, but also use a method in which a value of the point cloud in the submap, the space, or the volume itself is encoded (hereinafter, referred to as original coordinate encoding).

In this case, the three-dimensional data encoding device stores, in the header, information indicating that original coordinate encoding has been applied to a current space (submap, space, or volume). This enables the three-dimensional data decoding device to determine whether original coordinate encoding has been applied to the current space.

When applying original coordinate encoding, the three-dimensional data encoding device may perform the encoding without applying quantization and arithmetic encoding to original coordinates. The three-dimensional data encoding device may encode the original coordinates using a predetermined fixed bit length. This enables three-dimensional data encoding device to generate a stream with a fixed bit length at a certain time.

In the above description, an example has been shown in which the difference, which is the subcoordinates of each point cloud subtracted from the coordinates of each point cloud, is encoded as the non-octree encoding, but is not limited thereto.

Figure 64:
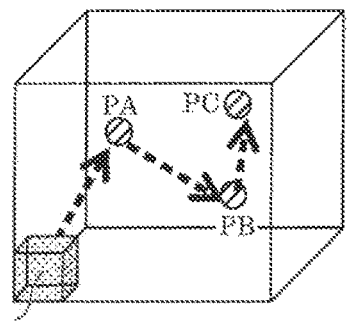
FIG. 64 is a diagram schematically showing an operation of a variation of a calculation process of a differential value according to Embodiment 8.

For example, the three-dimensional data encoding device may sequentially encode a differential value between the coordinates of each point cloud. FIG. 64 is a diagram for describing an operation in this case. For example, in the example shown in FIG. 64, the three-dimensional data encoding device encodes a differential value between coordinates of point cloud PA and predicted coordinates, using the subcoordinates as the predicted coordinates, when encoding point cloud PA. The three-dimensional data encoding device encodes a differential value between point cloud PB and predicted coordinates, using the coordinates of point cloud PA as the predicted coordinates, when encoding point cloud PB. The three-dimensional data encoding device encodes a differential value between point cloud PC and predicted coordinates, using the coordinates of point cloud PB as the predicted coordinates, when encoding point cloud PC. In this manner, the three-dimensional data encoding device may set a scan order to a plurality of point clouds, and encode a differential value between coordinates of a current point cloud to be processed and coordinates of a point cloud immediately before the current point cloud in the scan order.

Figure 65:
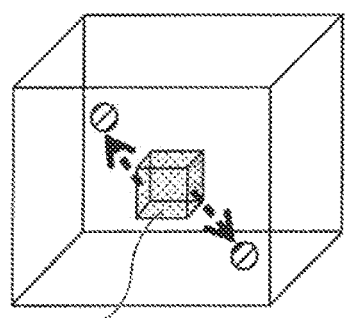
FIG. 65 is a diagram schematically showing an operation of a variation of the calculation process of the differential value according to Embodiment 8.
Figure 66:
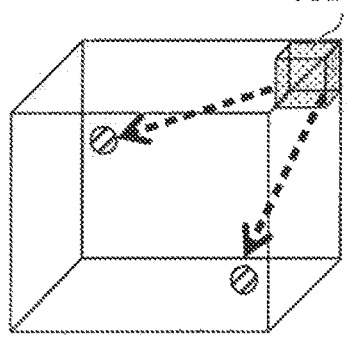
FIG. 66 is a diagram schematically showing an operation of a variation of the calculation process of the differential value according to Embodiment 8.
Figure 67:
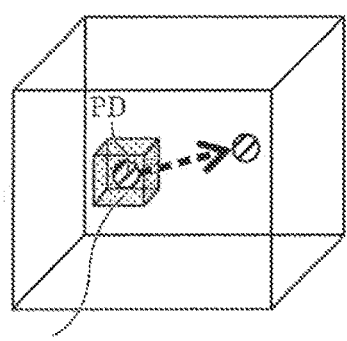
FIG. 67 is a diagram schematically showing an operation of a variation of the calculation process of the differential value according to Embodiment 8.

In the above description, the subcoordinates are coordinates in the lower left front corner of the submap, but a location of the subcoordinates is not limited thereto. FIG. 65 to FIG. 67 are diagrams showing other examples of the location of the subcoordinates. The location of the subcoordinates may be set to any coordinates in the current space (submap, space, or volume). In other words, the subcoordinates may be, as stated above, coordinates in the lower left front corner of the current space. As illustrated in FIG. 65, the subcoordinates may be coordinates in a center of the current space. As illustrated in FIG. 66, the subcoordinates may be coordinates in an upper right rear corner of the current space. The subcoordinates are not limited to being coordinates in the lower left front corner or the upper right rear corner of the current space, but may also he coordinates in any corner of the current space.

The location of the subcoordinates may be the same as coordinates of a certain point cloud in the current space (submap, space, or volume). For example, in the example shown in FIG. 67, the coordinates of the subcoordinates coincide with coordinates of point cloud PD.

In the present embodiment, an example has been shown that switches between applying octree encoding or non-octree encoding, but is not necessarily limited thereto. For example, the three-dimensional data encoding device may switch between applying a tree structure other than an octree or a non-tree structure other than the tree-structure. For example, the other tree structure is a k-d tree in which splitting is performed using perpendicular planes on one coordinate axis. Note that any other method may be used as the other tree structure.

In the present embodiment, an example has been shown in which coordinate information included in a point cloud is encoded, but is not necessarily limited thereto. The three-dimensional data encoding device may encode, for example, color information, a three-dimensional feature quantity, or a feature quantity of visible light using the same method as for the coordinate information. For example, the three-dimensional data encoding device may set an average value of the color information included in each point cloud in the submap to subcolor information, and encode a difference between the color information and the subcolor information of each point cloud.

In the present embodiment, an example has been shown in which an encoding method (octree encoding or non-octree encoding) with good encoding efficiency is selected in accordance with a total number of point clouds and the like, but is not necessarily limited thereto. For example, the three-dimensional data encoding device, which is a server end, may store a bitstream of a point cloud encoded through octree encoding, a bitstream of a point cloud encoded through non-octree encoding, and a bitstream of a point cloud encoded through both methods, and switch the bitstream to be transmitted to the three-dimensional data decoding device, in accordance with a transmission environment or a processing power of the three-dimensional data decoding device.

FIG. 68 is a diagram showing an example syntax of a volume when applying octree encoding. The syntax shown in FIG. 68 is basically the same as the syntax shown in FIG. 58, but differs in that each piece of information is information in units of volumes. To be specific, NumOfPoint indicates a total number of point clouds included in the volume. sub_coordinate_x, sub_coordinate_y, and sub_coordinate_z are the subcoordinate information of the volume.

diff_x[i], diff_y[i], and diff_z[i] are differential coordinates of an i-th point cloud in the volume. diff_x[i] is a differential value between an x-coordinate of the i-th point cloud and the x-coordinate of the subcoordinates in the volume. diff_y[i] is a differential value between a y-coordinate of the i-th point cloud and the y-coordinate of the subcoordinates in the volume. diff_z[i] is a differential value between a z-coordinate of the i-th point cloud and the z-coordinate of the subcoordinates in the volume.

Note that when it is possible to calculate a relative position of the volume in the space, the three-dimensional data encoding device does not need to include the subcoordinate information in a header of the volume. In other words, the three-dimensional data encoding device may calculate the relative position of the volume in the space without including the subcoordinate information in the header, and use the calculated position as the subcoordinates of each volume.

As stated above, the three-dimensional data encoding device according to the present embodiment determines whether to encode, using an octree structure, a current space unit among a plurality of space units (e.g. submaps, spaces, or volumes) included in three-dimensional data (e.g. S1522 in FIG. 59). For example, the three-dimensional data encoding device determines that the current space unit is to be encoded using the octree structure, when a total number of the three-dimensional points included in the current space unit is higher than a predetermined threshold. The three-dimensional data encoding device determines that the current space unit is not to be encoded using the octree structure, when the total number of the three-dimensional points included in the current space unit is lower than or equal to the predetermined threshold.

When it is determined that the current space unit is to be encoded using the octree structure (YES in S1522), the three-dimensional data encoding device encodes the current space unit using the octree structure (S1523). When it is determined that the current space unit is not to be encoded using the octree structure (NO in S1522), the three-dimensional data encoding device encodes the current space unit using a different method that is not the octree structure (S152). For example, in the different method, the three-dimensional data encoding device encodes coordinates of three-dimensional points included in the current space unit. To be specific, in the different method, the three-dimensional data encoding device encodes a difference between reference coordinates of the current space unit and the coordinates of the three-dimensional points included in the current space unit.

The three-dimensional data encoding device next appends, to a bitstream, information that indicates whether the current space unit has been encoded using the octree structure (S1525).

This enables the three-dimensional data encoding device to improve encoding efficiency since it is possible to reduce the amount of data of the encoded.

For example, the three-dimensional data encoding device includes a processor and memory, the processor using the memory to perform the above processes.

The three-dimensional data decoding device according to the present embodiment decodes, from a bitstream, information that indicates whether to decode, using an octree structure, a current space unit among a plurality of space units (e.g. submaps, spaces, or volumes) included in three-dimensional data (e.g. S1531 in FIG. 60). When the information indicates that the current space unit is to be decoded using the octree structure (YES in S1532), the three-dimensional data decoding device decodes the current space unit using the octree structure (S1533).

When the information indicates not to decode the current space unit using the octree structure (NO in S1532), the three-dimensional data decoding device decodes the current space unit using a different method that is not the octree structure (S1534). For example, in the different method, the three-dimensional data decoding device decodes coordinates of three-dimensional points included in the current space unit. To be specific, in the different method, the three-dimensional data decoding device decodes a difference between reference coordinates of the current space unit and the coordinates of the three-dimensional points included in the current space unit.

This enables the three-dimensional data decoding device to improve encoding efficiency since it is possible to reduce the amount of data of the encoded signal.

For example, three-dimensional data decoding device includes a processor and memory. The processor uses the memory to perform the above processes.

Embodiment 9

In the present embodiment, a method for encoding a tree structure such as an octree structure will be described.

It is possible to improve efficiency by identifying an important area and preferentially decoding three-dimensional data of the important area.

Figure 69:
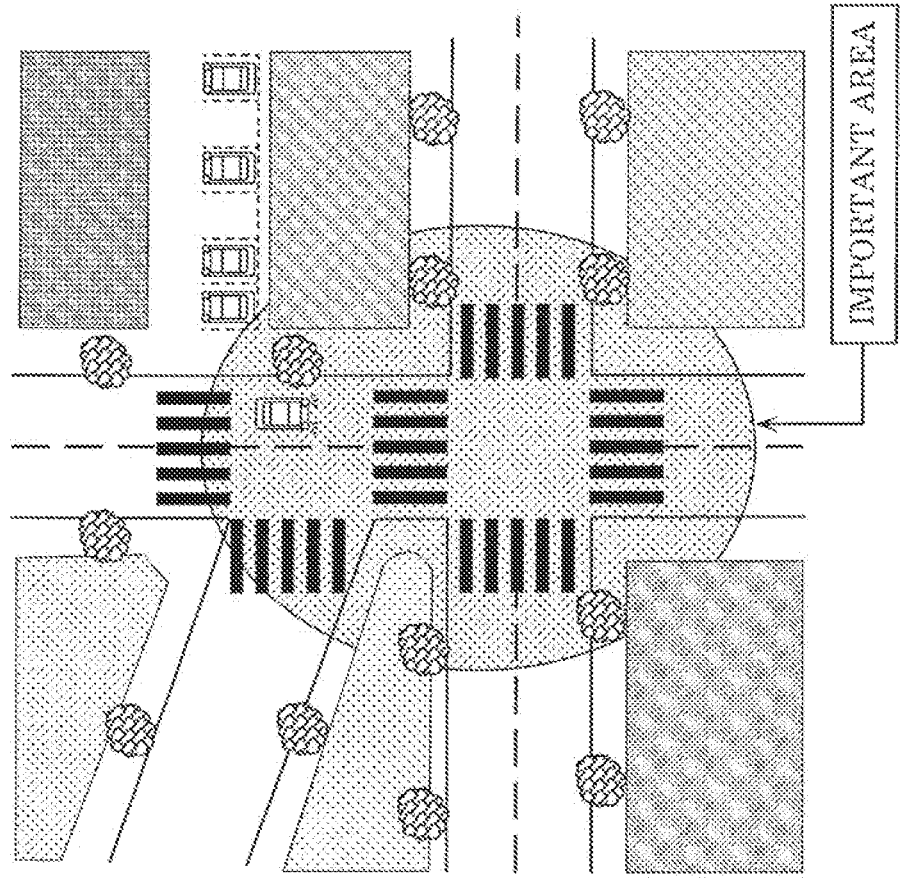
FIG. 69 is a diagram showing an example of an important area according to Embodiment 9.

FIG. 69 is a diagram showing an example of an important area in a three-dimensional map. The important area includes, for example, at least a fixed number of three-dimensional points, among three-dimensional points in the three-dimensional map, having a high feature quantity. The important area may also include, for example, a fixed number of three-dimensional points necessary when, for example, a vehicle-mounted client performs self-location estimation. Alternatively, the important area may also be a face in a three-dimensional model of a person. Such an important area can be defined per application type, and may be switched in accordance therewith.

In the present embodiment, occupancy encoding and location encoding are used as a method for representing an octree structure and the like. A bit sequence obtained through occupancy encoding is referred to as occupancy code. A bit sequence obtained through location encoding is referred to as location code.

Figure 70:
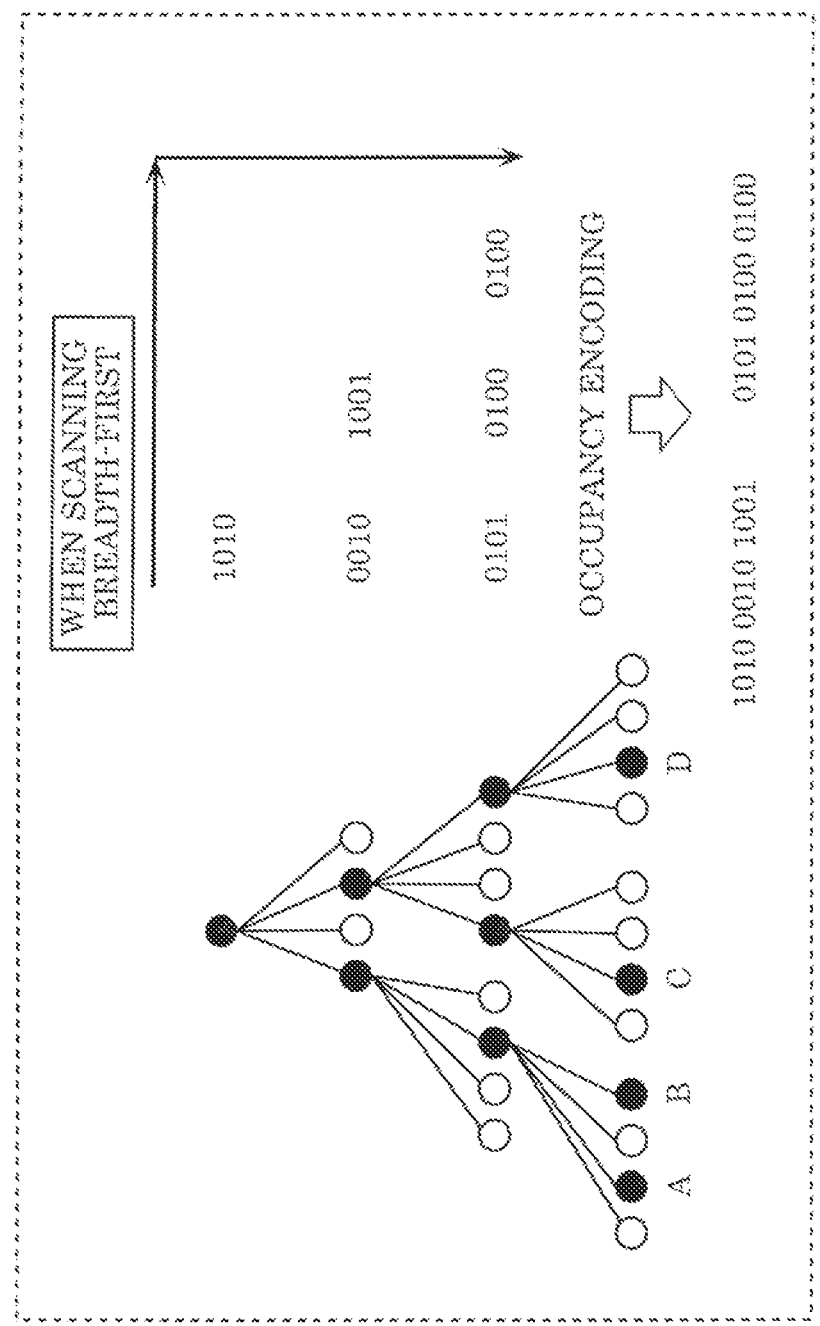
FIG. 70 is a diagram showing an example of an occupancy code according to Embodiment 9.

FIG. 70 is a diagram showing an example of an occupancy code. FIG. 70 shows an example of the occupancy code of a quadtree structure. In FIG. 70, occupancy code is assigned to each node. Each piece of occupancy code indicates whether a three-dimensional point is included in a child node or a leaf of a node. In the case of a quadtree, for example, information, which indicates whether four child nodes or leaves included in each node include three-dimensional points, is expressed with a 4-bit occupancy code. In the case of an octree, information, which indicates whether eight child nodes or leaves included in each node include three-dimensional points, is expressed with an 8-bit occupancy code. Note that an example of a quadtree structure is described here in order to simplify the description, but the same is applicable to an octree structure. As illustrated in FIG. 70, for example, the occupancy code is a bit sequence in which the nodes and leaves have been scanned breadth-first, as described in FIG. 40, etc. In the occupancy code, since a plurality of pieces of three-dimensional point information are decoded in a fixed order, it is not possible to preferentially decode a piece of three-dimensional point information of choice. Note that the occupancy code may also be a bit sequence in which the nodes and leaves have been scanned depth-first, as described in FIG. 40, etc.

Hereinafter, location encoding will be described. It is possible to directly decode important portions in the octree structure by using the location code. It is also possible to efficiently encode the important three-dimensional points in deeper levels.

Figure 71:
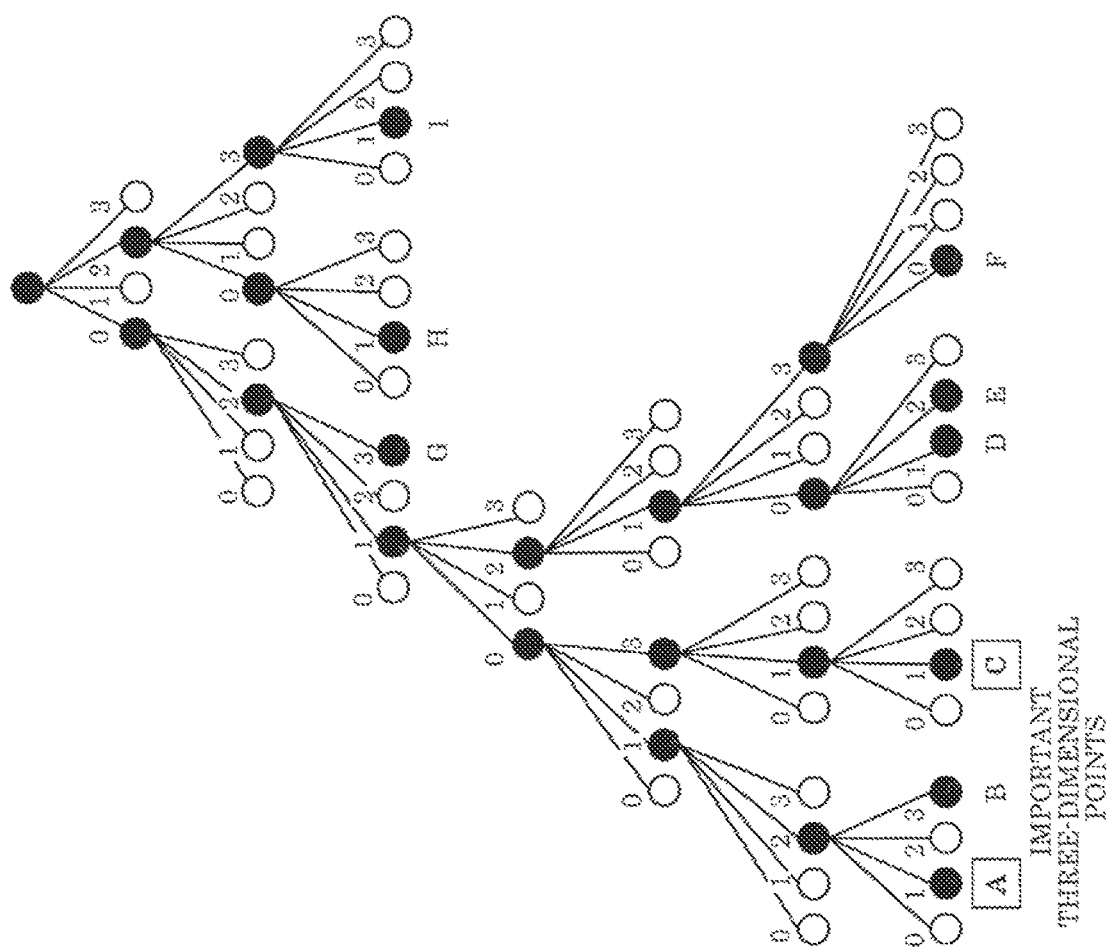
FIG. 71 is a diagram showing an example of a quadtree structure according to Embodiment 9.

FIG. 71 is a diagram for describing location encoding and shows an example of a quadtree structure. In the example shown in FIG. 71, three-dimensional points are represented with a quadtree structure. Three-dimensional points A and C are important three-dimensional points included in the important area.

Figure 72:
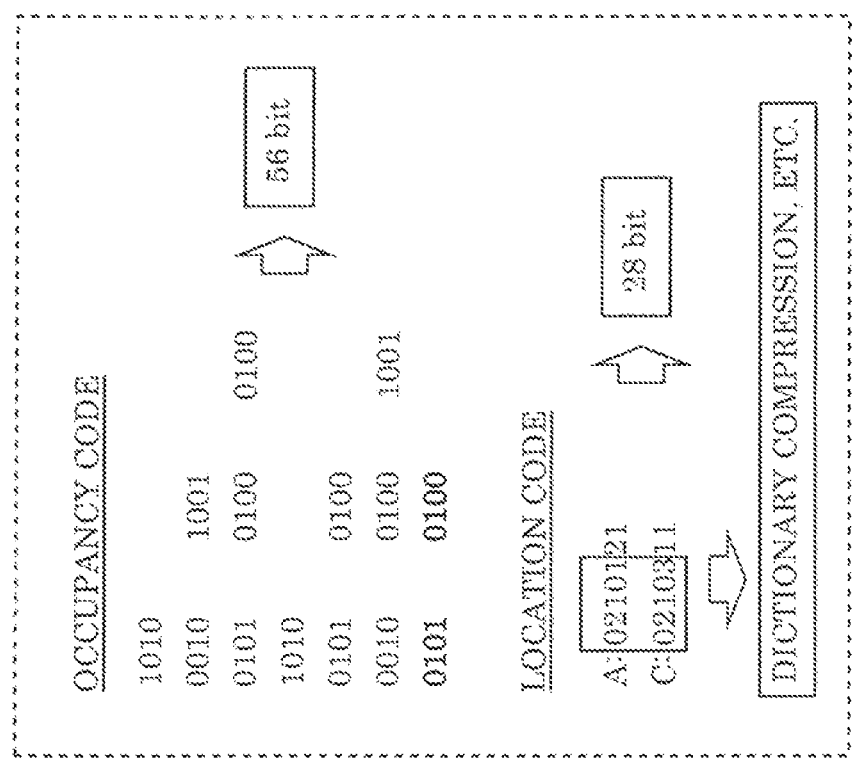
FIG. 72 is a diagram showing an example of an occupancy code and a location code according to Embodiment 9.

FIG. 72 is a diagram showing occupancy codes and location codes expressing important three-dimensional points A and C in the quadtree structure shown in FIG. 71.

In the location encoding, an index of each node present on a path up until a leaf to which a current three-dimensional point belongs that is an encoding target three-dimensional point, and an index of each leaf in the tree structure are encoded. The index here is a numerical value assigned to each node and each leaf. In other words, the index is an identifier for identifying child nodes of a current node. In the case of the quadtree as shown in FIG. 71, indexes between 0 and 3 are shown.

In the quadtree structure shown in FIG. 71, for example, leaf A is represented as 0→2→1→0→1→2→1 when leaf A is the current three-dimensional point. Since a maximum value of each index in the case of FIG. 71 is 4 (representable as 2-bit value), a hit count necessary for the location code of leaf A is 7×2 bits=14 bits. Similarly, a bit count necessary when leaf C is the encoding target is 14 bits. Note that in the case of an octree, it is possible to calculate a hit count necessary for 3 bits×leaf depth, since the maximum value of each index is 8 (representable as 3-bit value). Note that the three-dimensional data encoding device may reduce a data amount through entropy encoding after binarizing each index.

As illustrated in FIG. 72, in the occupancy code, it is necessary to decode all nodes of upper levels of leaves A and C in order to decode leaves A and C. On the other hand, it is possible to only decode data of leaves A and C in the location code. As illustrated in FIG. 72, this makes it possible to reduce bit count more than with the occupancy code by using the location code.

As illustrated in FIG. 72, it is possible to further reduce a code amount by performing dictionary compression such as LZ77 on a portion or all of the location code.

Figure 73:
FIG. 73 is a diagram showing an example of three-dimensional points obtained through LiDAR according to Embodiment 9.

An example in which location encoding is applied to three-dimensional points (point cloud) obtained through LiDAR will be described next. FIG. 73 is a diagram showing the example of the three-dimensional points obtained through LiDAR. The three-dimensional points obtained through LiDAR are sparsely disposed. In other words, when expressing these three-dimensional points with an occupancy code, a number of zero values is high. High three-dimensional precision is required for these three-dimensional points. In other words, the hierarchy of the octree structure becomes deeper.

Figure 74:
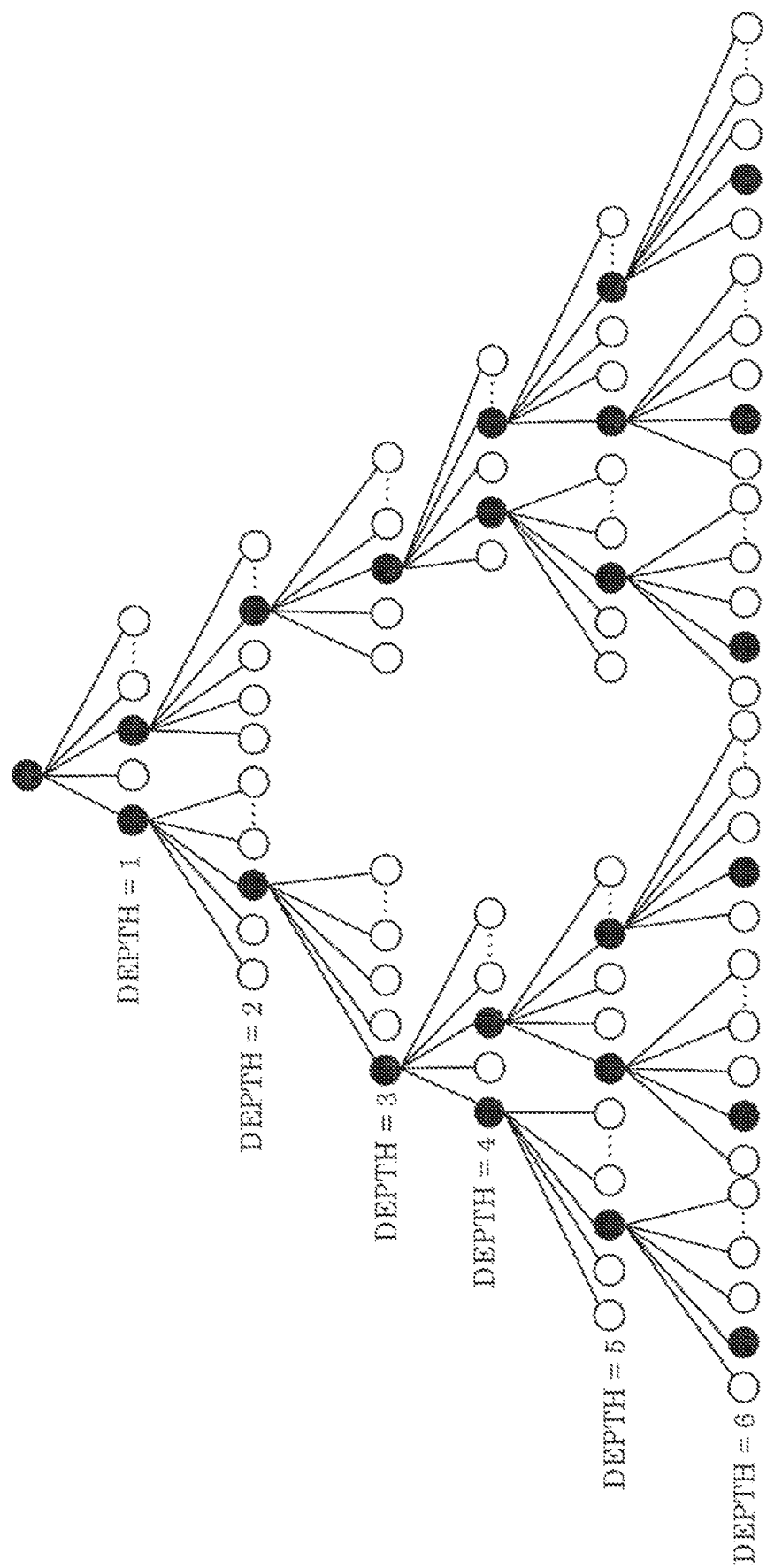
FIG. 74 is a diagram showing an example of an octree structure according to Embodiment 9.

FIG. 74 is a diagram showing an example of such a sparse and deep octree structure. An occupancy code of the octree structure shown in FIG. 74 is a 136-bit value (=8 bits×17 nodes). Since the octree structure has a depth of 6 and six three-dimensional points, the location code is 3 bits×6× 6=108 bits. In other words, the location code is capable of reducing 20% of a code amount of the occupancy code. In this manner, it is possible to reduce the code amount by applying location encoding to the sparse and deep octree structure.

Hereinafter, the code amounts of the occupancy code and the location code will be described. When the octree structure has a depth of 10, a maximum number of three-dimensional points is 8¹⁰=1,073,741,824. Bit count $L_o$ of the occupancy code of the octree structure is expressed below.

$$Lo=8+8^2+\ldots+8^{10}=127{,}133{,}512 \text{ bits}$$

As such, a bit count of one three-dimensional point is 1.143 bits. Note that in the occupancy code, this bit count does not change even if the total number of three-dimensional points included in the octree structure changes.

On the other hand, in the location code, a bit count of one three-dimensional point is directly influenced by the depth of the octree structure. To be specific, a bit count of the location code of one three-dimensional point is 3 bits×depth of 10=30 bits.

As such, bit count $L_l$ of the location code of the octree structure is expressed below.

$$Ll=30 \times N$$

N here is the total number of three-dimensional points included in the octree structure.

As such, in the case of N<Lo/30=40,904,450.4, i.e., when the total number of three-dimensional points is lower than 40,904,450, the code amount of the location code is smaller than the code amount of the occupancy code (Ll<Lo).

In this manner, the code amount of the location code is lower than the code amount of the occupancy code in the case of a low number of three-dimensional points, and the code amount of the location code is higher than the code amount of the occupancy code in the case of a high number of three-dimensional points.

As such, the three-dimensional data encoding device may switch between using location encoding or occupancy encoding in accordance with the total number of inputted three-dimensional points. In this case, the three-dimensional data encoding device may append, to header information and the like of the bitstream, information indicating whether the location encoding or the occupancy encoding has been performed.

Figure 75:
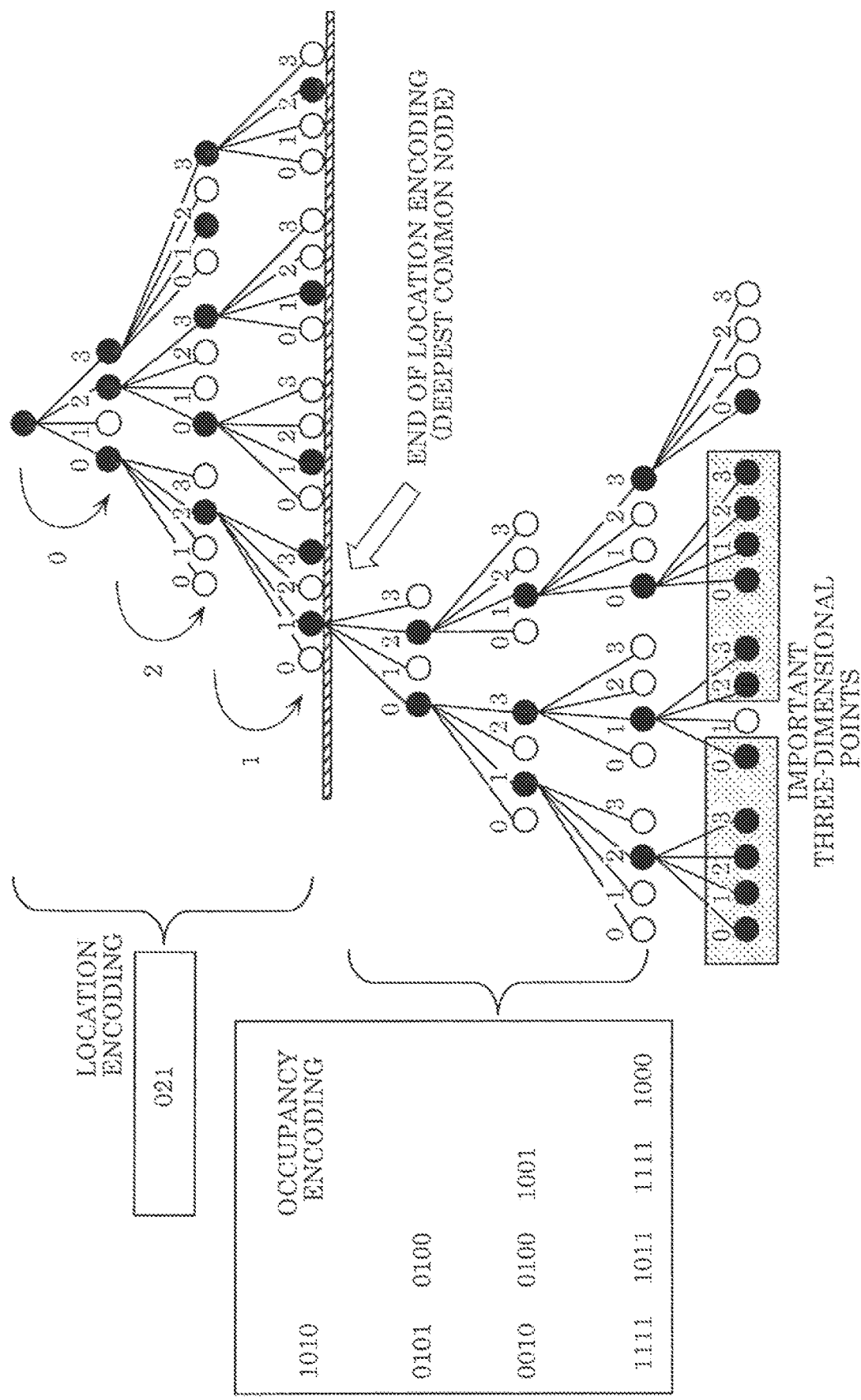
FIG. 75 is a diagram showing an example of hybrid encoding according to Embodiment 9.

Hereinafter, hybrid encoding, which is a combination of the location encoding and the occupancy encoding, will be described. When encoding a dense important area, hybrid encoding, which is a combination of the location encoding and the occupancy encoding, is effective. FIG. 75 is a diagram showing this example. In the example shown in FIG. 75, the important three-dimensional points are disposed densely. In this case, the three-dimensional data encoding device performs location encoding on the upper levels at a shallow depth and uses occupancy encoding for the lower levels. To be specific, location encoding is used up until a deepest common node and occupancy encoding is used from the deepest common node up until the deepest level. The deepest common node here is the deepest node among nodes that are the common ancestors of the plurality of important three-dimensional points.

Hybrid encoding that prioritizes compression efficiency will be described next. The three-dimensional data encoding device may switch between location encoding or occupancy encoding in accordance with a predetermined rule during encoding of the octree.

Figure 76:
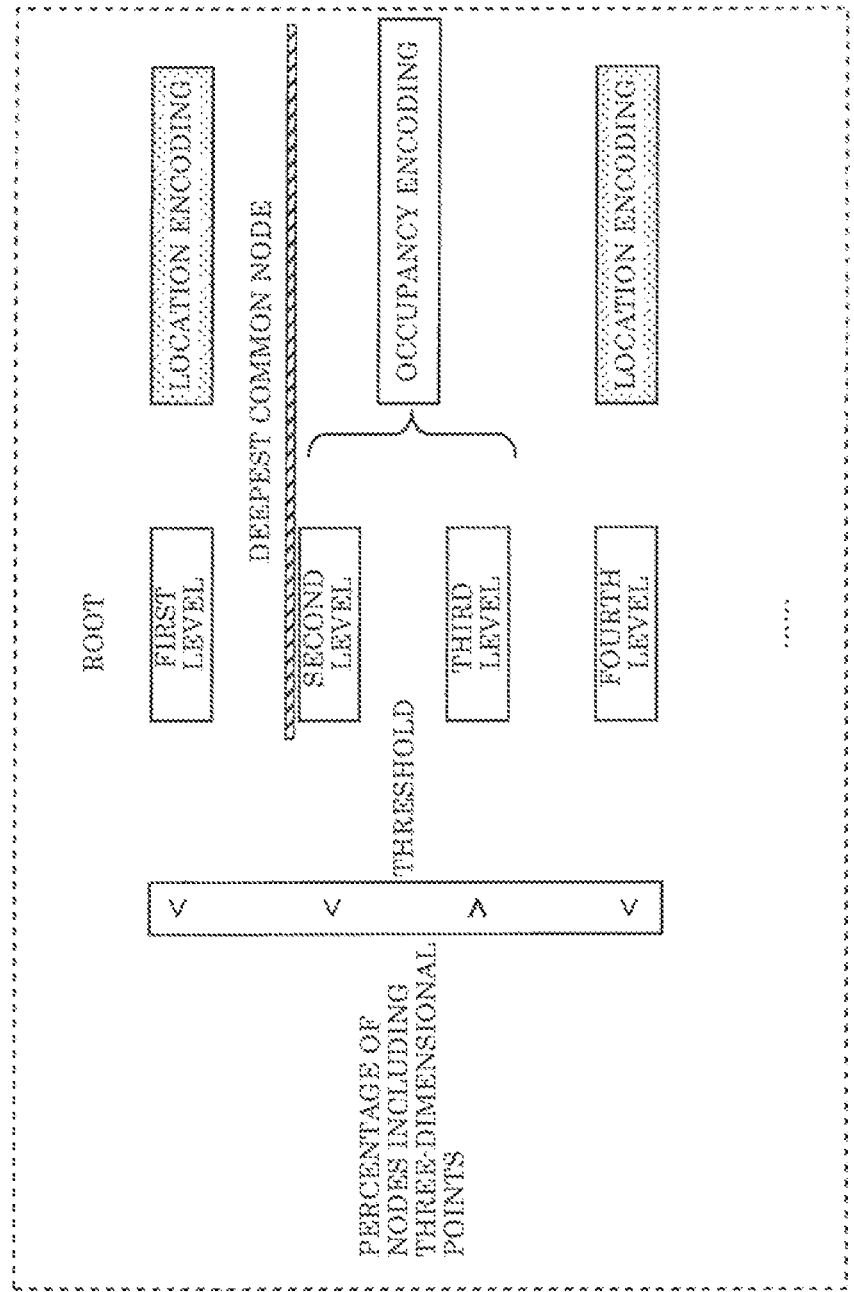
FIG. 76 is a diagram for describing a method for switching between location encoding and occupancy encoding according to Embodiment 9.

FIG. 76 is a diagram showing an example of this rule. The three-dimensional data encoding device first checks a percentage of nodes including three-dimensional points at each level (depth). When the percentage is higher than a predetermined threshold value, the three-dimensional data encoding device occupancy encodes several nodes of upper levels of the current level. For example, the three-dimensional data encoding device applies occupancy encoding from the current level to levels up until the deepest common node.

For example, in the example of FIG. 76, the percentage of nodes including three-dimensional points in a third level is higher than the predetermined threshold value. As such, the three-dimensional data encoding device applies occupancy encoding from the third level up until the second level including the deepest common node, and applies location encoding to the other levels, i.e., the first level and the fourth level.

A method for calculating the above threshold value will be described. One level of the octree structure includes one root node and eight child nodes. As such, in the occupancy encoding, 8 bits are necessary for encoding one level of the octree structure. On the other hand, in the location encoding, 3 bits are necessary per child node including a three-dimensional point. As such, when a total number of nodes including three-dimensional points is higher than 2, occupancy encoding is more effective than location encoding. In other words, in this case, the threshold value is 2.

Hereinafter, an example structure of a bitstream generated through the above-mentioned location encoding, occupancy encoding, or hybrid encoding will be described.

Figures 77, 78:
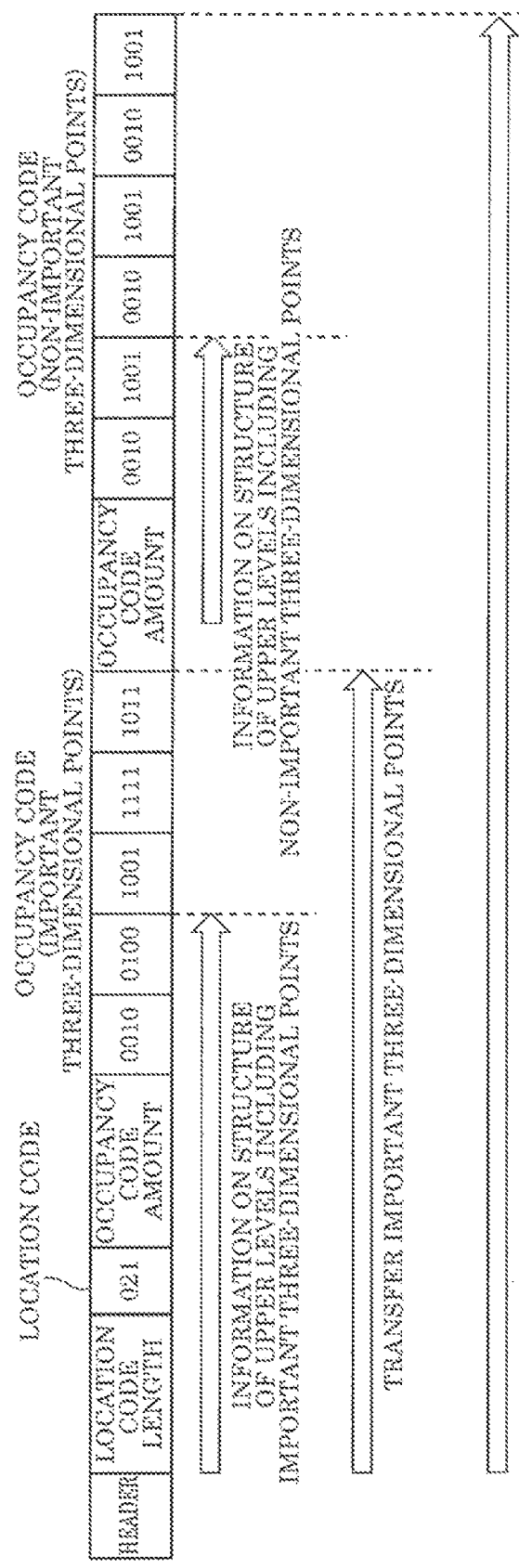
FIG. 77 is a diagram showing an example of a location encoded bitstream according to Embodiment 9.
FIG. 78 is a diagram showing an example of a hybrid encoded bitstream according to Embodiment 9.

FIG. 77 is a diagram showing an example of a bitstream generated through location encoding. As illustrated in FIG. 77, the bitstream generated through location encoding includes a header and pieces of location code. Each piece of location code corresponds to one three-dimensional point.

This structure enables the three-dimensional data decoding device to individually decode a plurality of three-dimensional points will high precision. Note that FIG. 77 shows an example of a bitstream in the case of a quadtree structure. In the case of an octree structure, each index can take a value between 0 and 7.

The three-dimensional data encoding device may entropy encode an index sequence expressing one three-dimensional point after binarizing the index sequence. For example, when the index sequence is 0121, the three-dimensional data encoding device may binarize 0121 into 00011001 and perform arithmetic encoding on this bit sequence.

FIG. 78 is a diagram showing an example of a bitstream generated through hybrid encoding when the bitstream includes important three-dimensional points. As illustrated in FIG. 78, location code of upper levels, occupancy code of important three-dimensional points of lower levels, and occupancy code of non-important three-dimensional points of lower levels are disposed in this order. Note that a location code length shown in FIG. 78 expresses a code amount of subsequent location code. An occupancy code amount expresses a code amount of subsequent occupancy code.

This structure enables the three-dimensional data decoding device to select a decoding plan in accordance with the type of application.

Encoded data of the important three-dimensional points is stored around a head of the bitstream, and encoded data of the non-important three-dimensional points not included in the important area is stored behind the encoded data of the important three-dimensional points.

Figure 79:
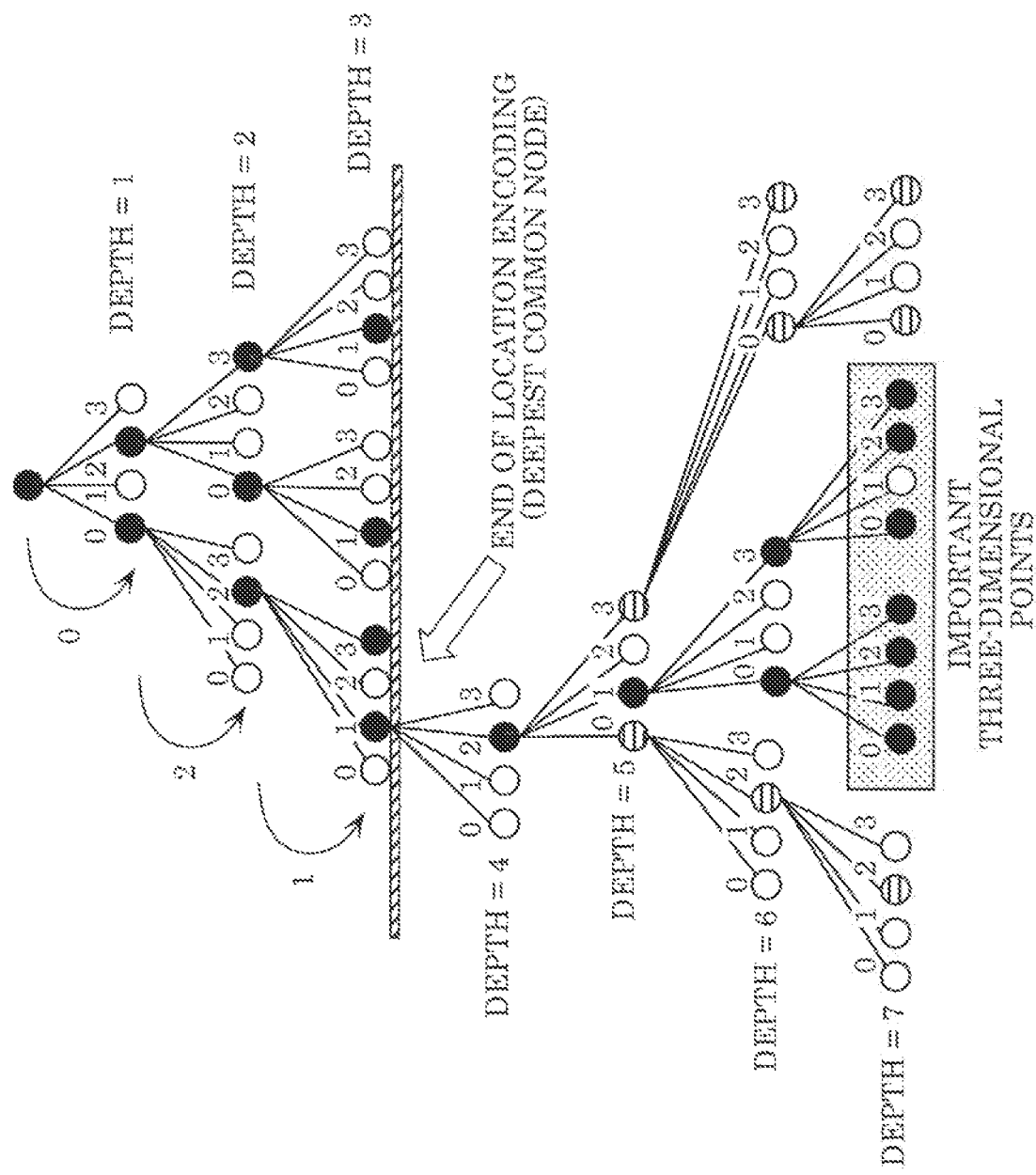
FIG. 79 is a diagram showing an occupancy code tree structure of important three-dimensional points according to Embodiment 9.
Figure 80:
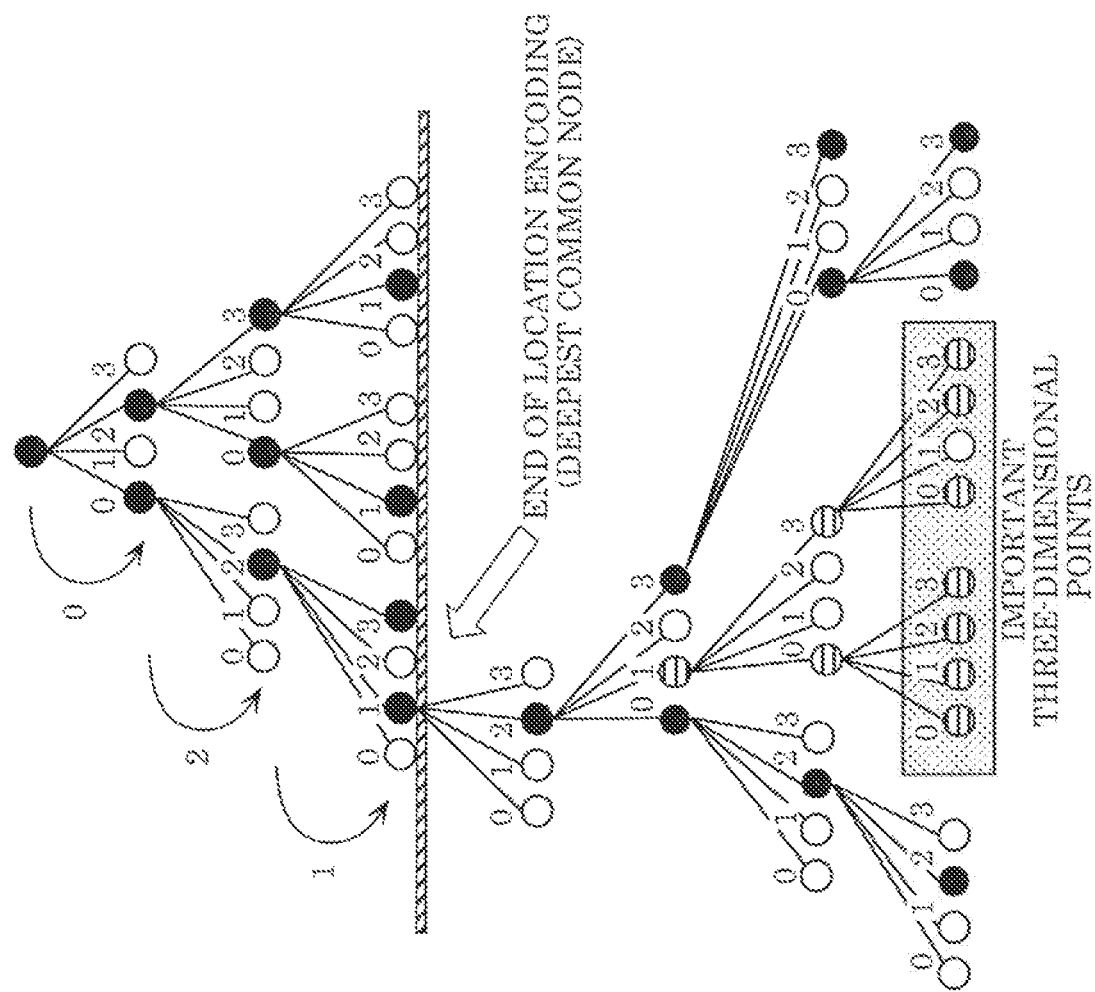
FIG. 80 is a diagram showing an occupancy code tree structure of non-important three-dimensional points according to Embodiment 9.

FIG. 79 is a diagram showing a tree structure expressed with the occupancy code of the important three-dimensional points shown in FIG. 78. FIG. 80 is a diagram showing a tree structure expressed with the occupancy code of the non-important three-dimensional points shown in FIG. 78. As illustrated in FIG. 79, information relating to the non-important three-dimensional points is excluded in the occupancy code of the important three-dimensional points. To be specific, since node 0 and node 3 at a depth of 5 do not include important three-dimensional points, value 0 is assigned indicating that node 0 and node 3 do not include three-dimensional points.

On the other hand, as illustrated in FIG. 80, information relating to the important three-dimensional points is excluded in the occupancy code of the non-important three-dimensional points. To be specific, since node 1 at a depth of 5 does not include non-important three-dimensional points, value 0 is assigned indicating that node 1 does not include a three-dimensional point.

In this manner, the three-dimensional data encoding device divides the original tree structure into a first tree structure including the important three-dimensional points and a second tree structure including the non-important three-dimensional points, and separately occupancy encodes the first tree structure and the second tree structure. This enables the three-dimensional data decoding device to preferentially decode the important three-dimensional points.

Figure 81:
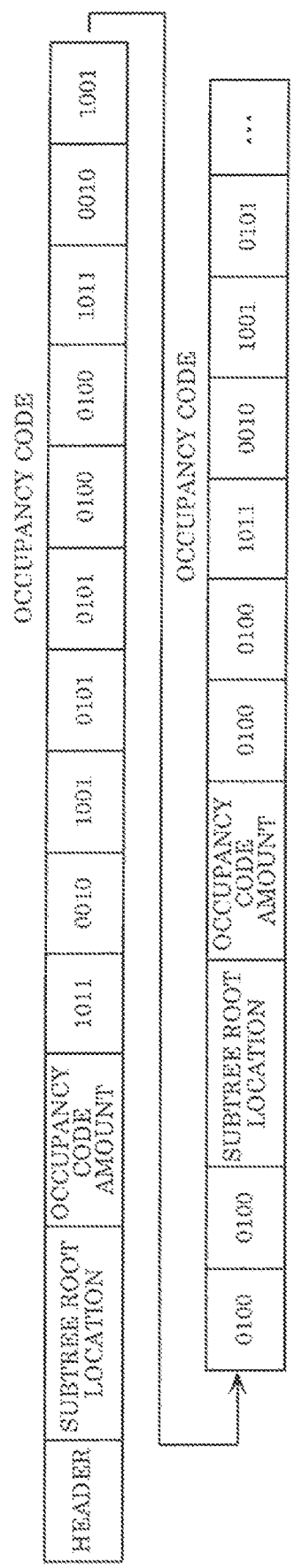
FIG. 81 is a diagram showing an example of a hybrid encoded bitstream according to Embodiment 9.

An example structure of a bitstream generated through hybrid encoding emphasizing efficiency will be described next. FIG. 81 is a diagram showing the example structure of the bitstream generated through hybrid encoding emphasizing efficiency. As illustrated in FIG. 81, a subtree root location, occupancy code amount, and occupancy code are disposed per subtree in this order. The subtree root location shown in FIG. 81 is the location code of the root of the subtree.

In the above structure, the following holds true when only one of location encoding or occupancy encoding is applied to the octree structure.

When the length of the location code of the root of the subtree is identical to the depth of the octree structure, the subtree does not include any child nodes. In other words, location encoding is applied to the entire tree structure.

When the root of the subtree is identical to the root of the octree structure, occupancy encoding is applied to the entire tree structure.

For example, the three-dimensional data decoding device is capable of discerning whether the bitstream includes location code or occupancy code, based on the above rule.

Figure 82:
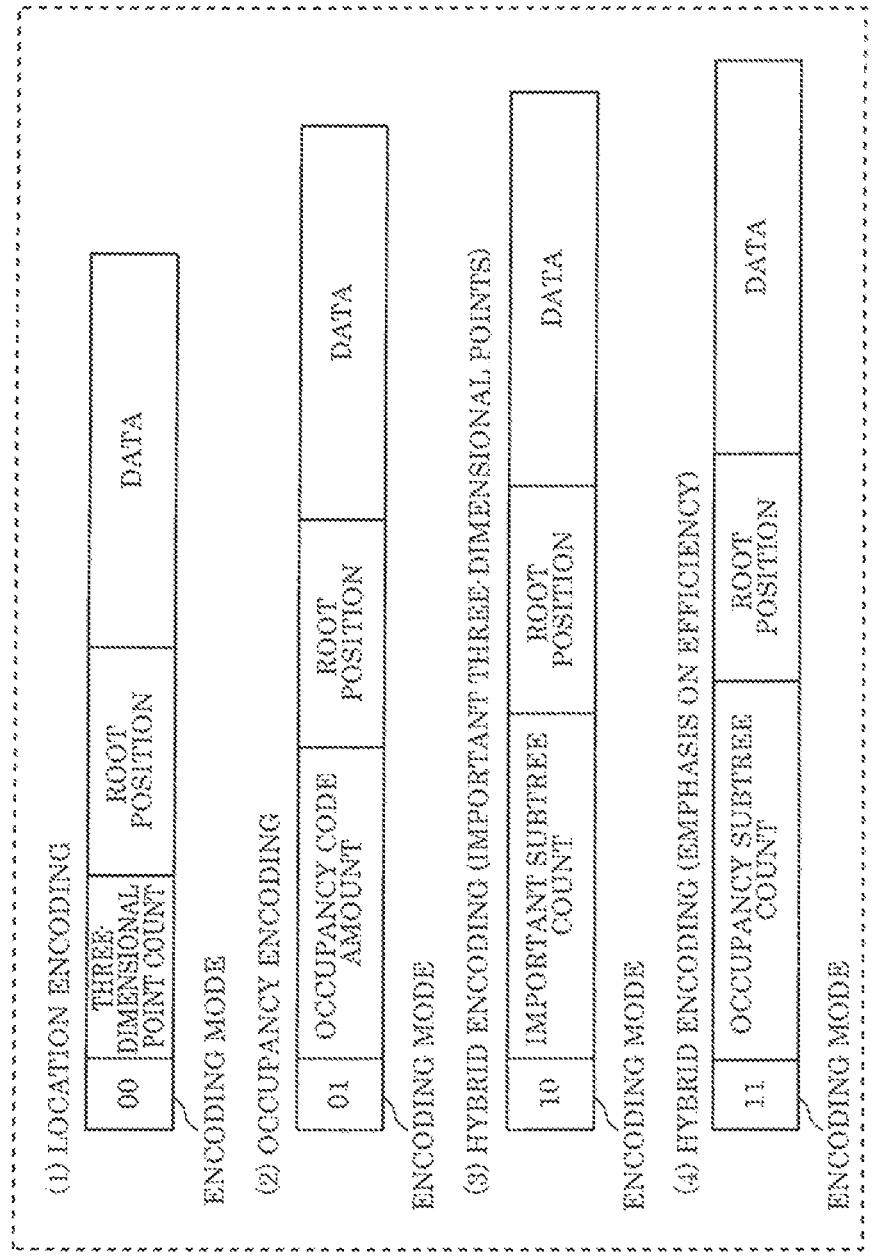
FIG. 82 is a diagram showing an example of a bitstream including encoding mode information according to Embodiment 9.

The bitstream may include encoding mode information indicating which of location encoding, occupancy encoding, and hybrid encoding is used. FIG. 82 is a diagram showing an example of a bitstream in this case. As illustrated in FIG. 82, for example, 2-bit encoding mode information indicating the encoding mode is appended to the bitstream.

(1) "THREE-DIMENSIONAL POINT COUNT" in the location encoding expresses a total number of subsequent three-dimensional points. (2) "OCCUPANCY CODE AMOUNT" in the occupancy encoding expresses a code amount of subsequent occupancy code. (3) "IMPORTANT SUBTREE COUNT" in the hybrid encoding (important three-dimensional points) expresses a total number of subtrees including important three-dimensional points. (4) "OCCUPANCY SUBTREE COUNT" in the hybrid encoding (emphasis on efficiency) expresses a total number of occupancy encoded subtrees.

An example syntax used for switching between applying occupancy encoding or location encoding will be described next. FIG. 83 is a diagram showing this example syntax.

isleaf shown in FIG. 83 is a flag indicating whether the current node is a leaf. isleaf=1 indicates that the current node is a leaf, and isleaf=0 indicates that the current node is not a leaf.

When the current node is a leaf, point_flag is appended to the bitstream. point_flag is a flag indicating whether the current node (leaf) includes a three-dimensional point. point_flag=1 indicates that the current node includes a three-dimensional point, and point_flag=0 indicates that the current node does not include a three-dimensional point.

When the current node is not a leaf, coding_type is appended to the bitstream. coding_type is encoding type information indicating which encoding type has been applied. coding_type=00 indicates that location encoding has been applied, coding_type=01 indicates that occupancy encoding has been applied, and coding_type=10 or 11 indicates that another encoding method has been applied.

When the encoding type is location encoding, numPoint, num_idx[i], and idx[i][j] are appended to the bitstream.

numPoint indicates a total number of three-dimensional points on which to perform location encoding. num_idx[i] indicates a total number (depth) of indexes from the current node up to three-dimensional point i. When the three-dimensional points on which location encoding is to be performed are at the same depth, each num_idx[i] has the same value. As such, num_idx may be defined as a common value before the for statement (for (i=0;i<numPoint;i++)}) shown in FIG. 83.

idx[i][j] indicates a value of a j-th index among indexes from the current node up to three-dimensional point i. In the case of an octree, a bit count of idx[i][j] is 3 bits.

Note that, as stated above, the index is an identifier for the identifying child nodes of the current node. In the case of an octree, idx[i][j] indicates a value between 0 and 7. In the case of an octree, there are eight child nodes which respectively correspond to eight subblocks obtained by spatially dividing a current block corresponding to the current node into eight. As such, idx[i][j] may be information indicating a three-dimensional position of the subblock corresponding to a child node. For example, idx[i][j] may be 3-bit information in total includes three pieces of 1-bit information each indicating a position of each of x, y, and z of the subblock.

When the encoding type is occupancy encoding, occupancy_code is appended to the bitstream. occupancy_code is the occupancy code of the current node. In the case of an octree, occupancy code is an 8-bit bit sequence such as bit sequence "00101000".

When a value of an (i+1)-th bit of occupancy code is 1, processing of the child node begins. In other words, the child node is set as the next current node, and a bit sequence is recursively generated.

In the present embodiment, an example is shown in which ends of the octree are expressed by appending leaf information (isleaf, point_flag) to the bitstream, but the present embodiment is not necessarily limited thereto. For example, the three-dimensional data encoding device may append, to a header portion of a start-node (root), a maximum depth from the start-node of the occupancy code up to ends (leaves) including three-dimensional points. The three-dimensional data encoding device may recursively convert information on the child nodes while increasing the depth from the start-node, and may determine as to having arrived at the leaves when the depth becomes the maximum depth. The three-dimensional data encoding device may also append information indicating the maxim depth to the first node where the coding type has become occupancy encoding, and may also append this information to the start-node (root) of the octree.

As stated above, the three-dimensional data encoding device may append, to the bitstream, information for switching between occupancy encoding and location encoding as header information of each node.

The three-dimensional data encoding device may entropy encode coding_type, numPoint, num_idx, idx, and occupancy_code of each node generated using the above method. For example, the three-dimensional data encoding device arithmetically encodes each value after binarizing each value.

In the above syntax, an example is shown of when a depth-first bit sequence of the octree structure is used as the occupancy code, but the present embodiment is not necessarily limited thereto. The three-dimensional data encoding device may use a breadth-first bit sequence of the octree structure as the occupancy code. The three-dimensional data encoding device may append, to the bitstream, information for switching between occupancy encoding and location encoding as header information of each node, also when using a breadth-first bit sequence.

In the present embodiment, an example has been shown of an octree structure, but the present embodiment is not necessarily limited thereto, and the above method may be applied to an N-ary (N is an integer of 2 or higher) structure such as a quadtree or a hextree, or another tree structure.

Figure 84:
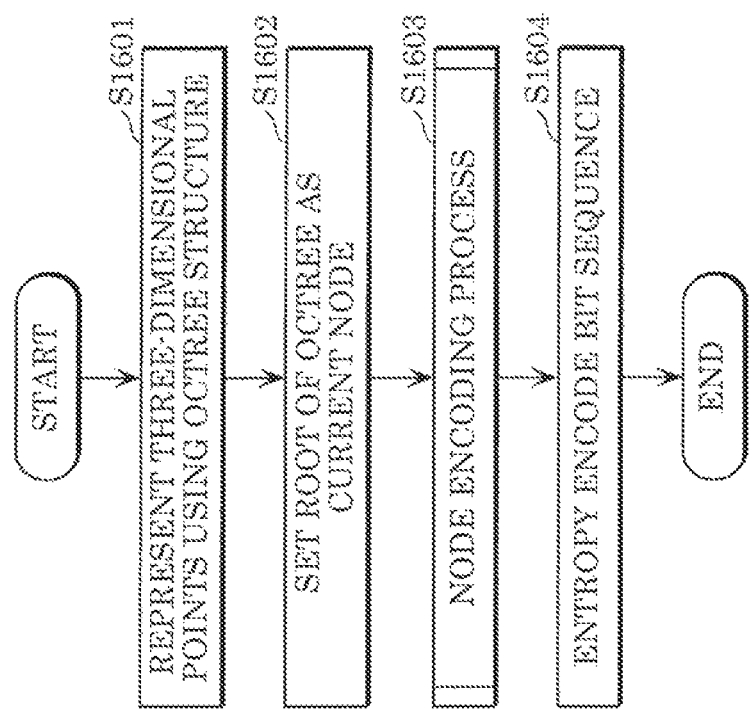
FIG. 84 is a flowchart of an encoding process according to Embodiment 9.

Hereinafter, a flow example of an encoding process for switching between applying occupancy encoding or location encoding will be described. FIG. 84 is a flowchart of the encoding process according to the present embodiment.

The three-dimensional data encoding device first represents a plurality of three-dimensional points included in three-dimensional data using an octree structure (S1601). The three-dimensional data encoding device next sets a root in the octree structure as a current node (S1602). The three-dimensional data encoding device next generates a bit sequence of the octree structure by performing a node encoding process on the current node (S1603). The three-dimensional data encoding device next generates a bit sequence by entropy encoding the generated bit sequence (S1604).

Figure 85:
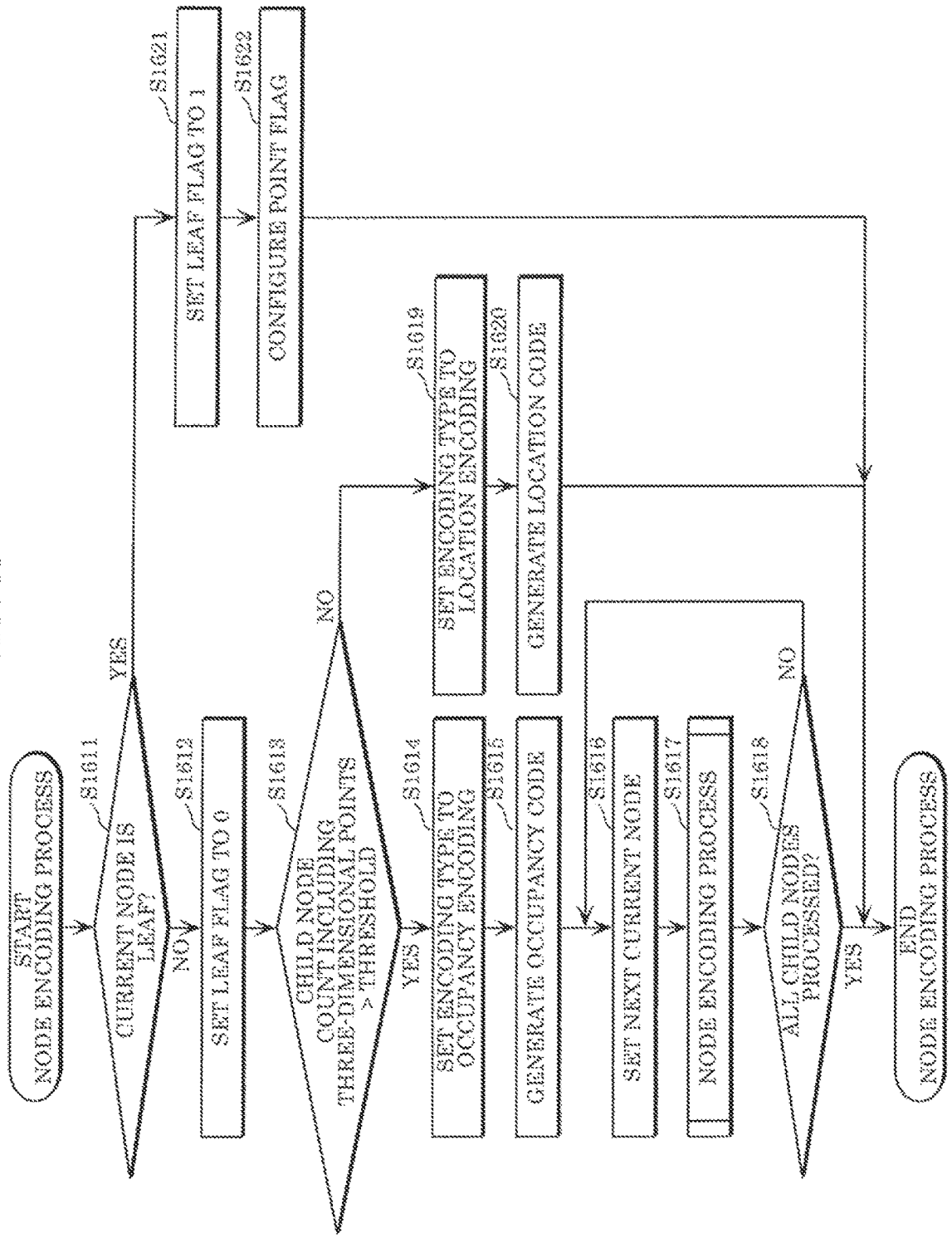
FIG. 85 is a flowchart of a node encoding process according to Embodiment 9.
Figure 86:
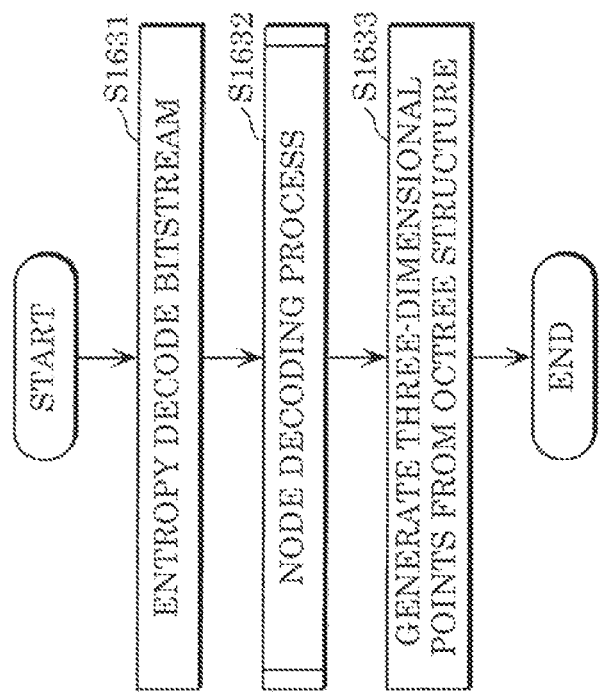
FIG. 86 is a flowchart of a decoding process according to Embodiment 9.

FIG. 85 is a flowchart of the node encoding process (S1603). The three-dimensional data encoding device first determines whether the current node is a leaf (S1611). When the current node is not a leaf (NO in S1611), the three-dimensional data encoding device sets a leaf flag (isleaf) to 0, and appends the leaf flag to the bit sequence (S1612).

The three-dimensional data encoding device next determines whether a total number of child nodes including three-dimensioned points is higher than a predetermined threshold value (S1613). Note that three-dimensional data encoding device may append this threshold value to the bit sequence.

When the total number of child nodes including three-dimensional points is higher than the predetermined threshold value (YES in S1613), the three-dimensional data encoding device sets the encoding type (coding_type) to occupancy encoding, and appends the encoding type to the bit sequence (S1614).

The three-dimensional data encoding device next configures occupancy encoding information, and appends the occupancy encoding information to the bit sequence. To be specific, the three-dimensional data encoding device generates an occupancy code of the current node, and appends the occupancy code to the bit sequence (S1615).

The three-dimensional data encoding device next sets the next current node based on the occupancy code (S1616). To be specific, the three-dimensional data encoding device sets the next current node from an unprocessed child node whose occupancy code is "1".

The three-dimensional data encoding device performs the node encoding process on the newly-set current node (S1617). In other words, the process shown in FIG. 85 is performed on the newly-set current node.

When child nodes have not been processed yet (NO in S1618), the processes from step S1616 are performed again. On the other hand, when all of the child nodes have been processed (YES in S1618), the three-dimensional data encoding device ends the node encoding process.

In step S1613, when the total number of child nodes including three-dimensional points is lower than or equal to the predetermined threshold value (NO in S1613), the three-dimensional data encoding device sets the encoding type to location encoding, and appends the encoding type to the bit sequence (S1619).

The three-dimensional data encoding device next configures location encoding information, and appends the location encoding information to the bit sequence. To be specific, the three-dimensional data encoding device next generates a location code, and appends the location code to the bit sequence (S1620). The location code includes numPoint, num_idx, and idx.

In step S1611, when the current node is a leaf (YES in S1611), the three-dimensional data encoding device sets the leaf flag to 1, and appends the leaf flag to the bit sequence (S1621). The three-dimensional data encoding device configures a point flag (point_flag) that is information indicating whether the leaf includes a three-dimensional point, and appends the point flag to the bit sequence (S1622).

A flow example of a decoding process for switching between applying occupancy encoding or location encoding will be described next. FIG. 85 is a flowchart of the decoding process according to the present embodiment.

The three-dimensional data encoding device generates a bit sequence by entropy decoding the bitstream (S1631). The three-dimensional data decoding device next restores the octree structure by performing a node decoding process on the obtained bit sequence (S1632). The three-dimensional data decoding device next generates the three-dimensional points from the restores octree structure (S1633).

Figure 87:
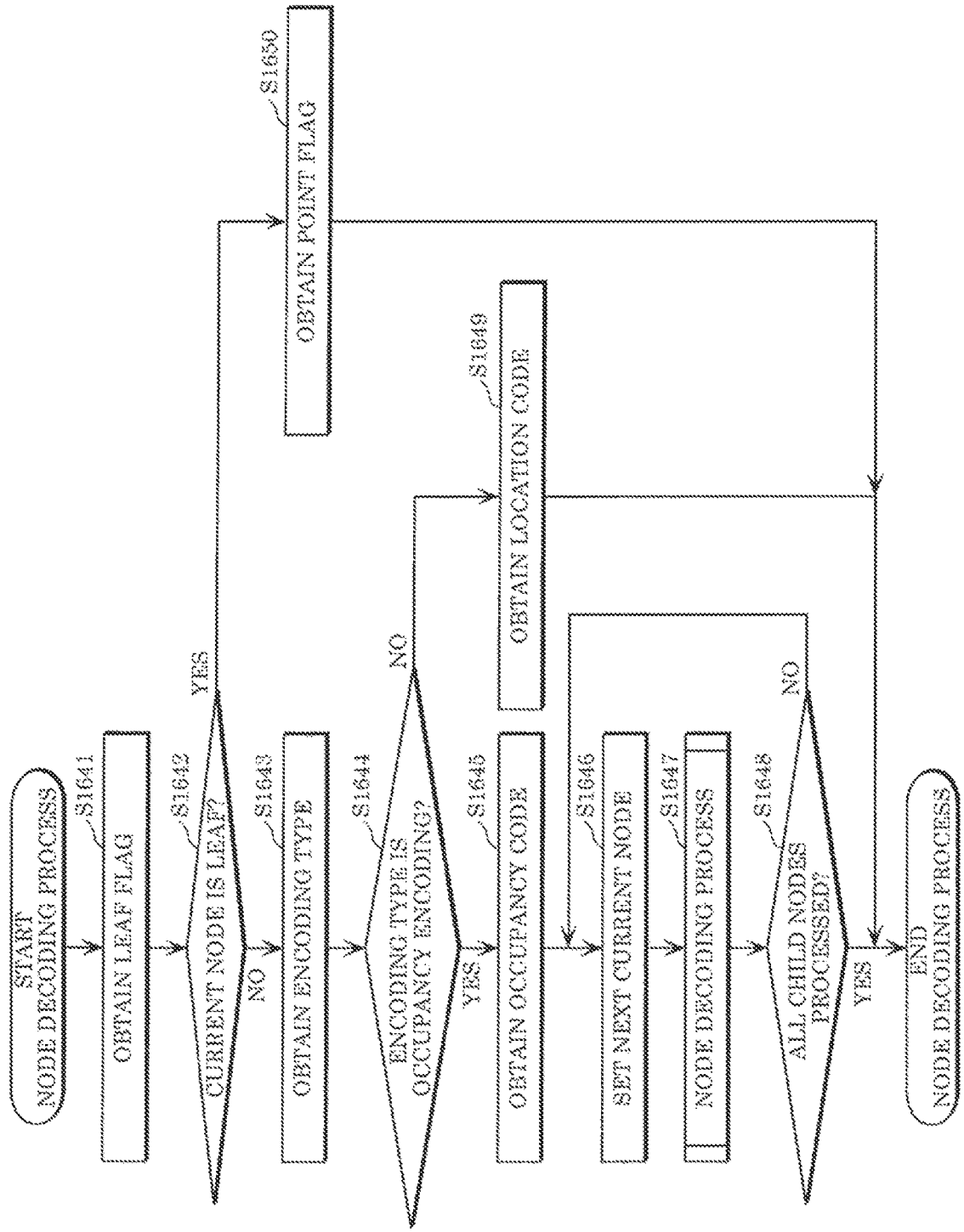
FIG. 87 is a flowchart of a node decoding process according to Embodiment 9.

FIG. 87 is a flowchart of the node decoding process (S1632). The three-dimensional data decoding device first obtains (decodes) the leaf flag (isleaf) from the bit sequence (S1641). The three-dimensional data decoding device next determines whether the current node is a leaf based on the leaf flag (S1642).

When the current node is not a leaf (NO in S1642), the three-dimensional data decoding device obtains the encoding type (coding_type) from the bit sequence (S1643). The three-dimensional data decoding device determines whether the encoding type is occupancy encoding (S1644).

When the encoding type is occupancy encoding (YES in S1644), the three-dimensional data decoding device obtains the occupancy encoding information from the bit sequence. To be specific, the three-dimensional data decoding device obtains the occupancy code from the bit sequence (S1645).

The three-dimensional data decoding device next sets the next current node based on the occupancy code (S1646). To be specific, the three-dimensional data decoding device sets the next current node from an unprocessed child node whose occupancy code is "1".

The three-dimensional data decoding device next performs the node decoding process on the newly-set current node (S1647). In other words, the process shown in FIG. 87 is performed on the newly-set current node.

When all child nodes have not been processed yet (NO in S1648), the processes from step S1646 are performed again. On the other hand, when all of the child nodes have been processed (YES in S1648), the three-dimensional data decoding device ends the node decoding process.

In step 1644, when the encoding type is location encoding (NO in S1644), the three-dimensional data decoding device obtains the location encoding information from the bit sequence. To be specific, the three-dimensional data decoding device obtains the location code from the bit sequence (S1649). The location code includes numPoint, num_idx, and idx.

In step S1642, when the current node is a leaf (YES in S1642), the three-dimensional data decoding device obtains, from the bit sequence, the point flag (point_flag) that is the information indicating whether the leaf includes a three-dimensional point (S1650).

Note that in the present embodiment, an example has been shown in which the encoding type is switched per node, but the present embodiment is not necessarily limited thereto. The encoding type may be fixed per volume, space, or world unit. In this case, the three-dimensional data encoding device may append encoding type information to header information of the volume, space, or world.

As stated above, the three-dimensional data encoding device according to the present embodiment: generates first information in which air N-ary (N is an integer of 2 or higher) tree structure of a plurality of three-dimensional points included in three-dimensional data is expressed using a first formula (location encoding); and generates a bitstream including the first information. The first information includes pieces of three-dimensional point information (location code) each associated with a corresponding one of the plurality of three-dimensional points. The pieces of three-dimensional point information each include indexes (idx) each associated with a corresponding one of a plurality of levels in the Nary tree structure. The indexes each indicate a subblock, among N subblocks belonging to a corresponding one of the plurality of levels, to which a corresponding one of the plurality of three-dimensional points belongs.

In other words, the pieces of three-dimensional point information each indicate a path until the corresponding one of the plurality of three-dimensional points in the N-ary tree structure. The indexes each indicate a child node, among N child nodes belonging to a corresponding layer (node), included on the path.

This enables the three-dimensional data encoding method to generate a bitstream from which the three-dimensional points can be selectively decoded.

For example, the pieces of three-dimensional point information (location code) each include information (num_idx) indicating a total number of the indexes included in the piece of three-dimensional point information. In other words, the information indicates a depth (layer count) until a corresponding three-dimensional point in the N-ary tree structure.

For example, the first information includes information (numPoint) indicating a total number of the pieces of three-dimensional point information included in the first information. In other words, the information indicates a total number of three-dimensional points included in the N-ary tree structure.

For example, N is 8, and the indexes are each a 3-bit value. For example, in the three-dimensional data encoding device, a first encoding mode is used for generating the first information, and a second encoding mode is used for (i) generating second information (occupancy code) in which the N-ary tree structure is expressed using a second formula (occupancy encoding) and (ii) generating a bitstream including the second information. The second information includes pieces of 1-bit information each of which (i) is associated with a corresponding one of a plurality of subblocks belonging to the plurality of levels in the N-ary tree structure and (ii) indicates whether a three-dimensional point is present in the corresponding one of the plurality of subblocks.

For example, the three-dimensional data encoding device uses the first encoding mode when a total number of the plurality of three-dimensional points is lower than or equal to a predetermined threshold value, and the second encoding mode may be used when the total number of the plurality of three-dimensional points is higher than the predetermined threshold value. This enables the three-dimensional data encoding method to reduce a code amount of the bitstream.

For example, the first information and the second information each include information (encoding mode information) indicating whether the N-ary tree structure is expressed using the first formula or the second formula.

For example, as illustrated in FIG. 75 and the like, the three-dimensional data encoding device uses the first encoding mode for one portion of the N-ary tree structure and the second encoding mode for another portion of the N-ary tree structure.

For example, the three-dimensional data encoding device includes a processor and memory, the processor using the memory to perform the above processes.

The three-dimensional data decoding device according to the present embodiment obtains, from a bitstream, first information (location code) in which an N-ary (N is an integer of 2 or higher) tree structure of a plurality of three-dimensional points included in three-dimensional data is expressed using a first formula (location encoding). The first information includes pieces of three-dimensional point information (location code) each associated with a corresponding one of the plurality of three-dimensional points. The pieces of three-dimensional point information each include indexes (idx) each associated with a corresponding one of a plurality of levels in the N-ary tree structure. The indexes each indicate a subblock, among N subblocks belonging to a corresponding one of the plurality of levels, to which a corresponding one of the plurality of three-dimensional points belongs.

In other words, the pieces of three-dimensional point information each indicate a path until the corresponding one of the plurality of three-dimensional points in the N-ary tree structure. The indexes each indicate a child node, among N child nodes belonging to a corresponding layer (node), included on the path.

The three-dimensional data decoding method further restores, using a corresponding one of the pieces of three-dimensional point information, a three-dimensional point associated with the corresponding one of the pieces of three-dimensional point information.

This enables the three-dimensional data decoding device to selectively generate the three-dimensional points from the bitstream.

For example, the pieces of three-dimensional point information (location code) each include information (num_idx) indicating a total number of the indexes included in the piece of three-dimensional point information. In other words, the information indicates a depth (layer count) until a corresponding three-dimensional point in the N-ary tree structure.

For example, the first information includes information (numPoint) indicating a total number of the pieces of three-dimensional point information included in the first information. In other words, the information indicates a total number of three-dimensional points included in the N-ary tree structure.

For example, N is 8, and the indexes are each a 3-bit value.

For example, the three-dimensional data decoding device further obtains, from a bitstream, second information (occupancy code) in which an N-ary tree structure is expressed using a second formula (occupancy encoding). The three-dimensional data decoding device restores the plurality of three-dimensional points using the second information. The second information includes pieces of 1-bit information each of which (i) is associated with a corresponding one of a plurality of subblocks belonging to the plurality of levels in the N-ary tree structure and (ii) indicates whether a three-dimensional point is present in the corresponding one of the plurality of subblocks.

For example, the first information and the second information each include information (encoding mode information) indicating whether the N-ary tree structure is expressed using the first formula or the second formula.

For example, as illustrated in FIG. 75 and the like, one portion of the N-ary tree structure is expressed using the first formula and another portion of the N-ary tree structure is expressed using the second formula.

For example, the three-dimensional data decoding device includes a processor and memory, the processor using the memory to perform the above processes.

Embodiment 10

Figure 88:
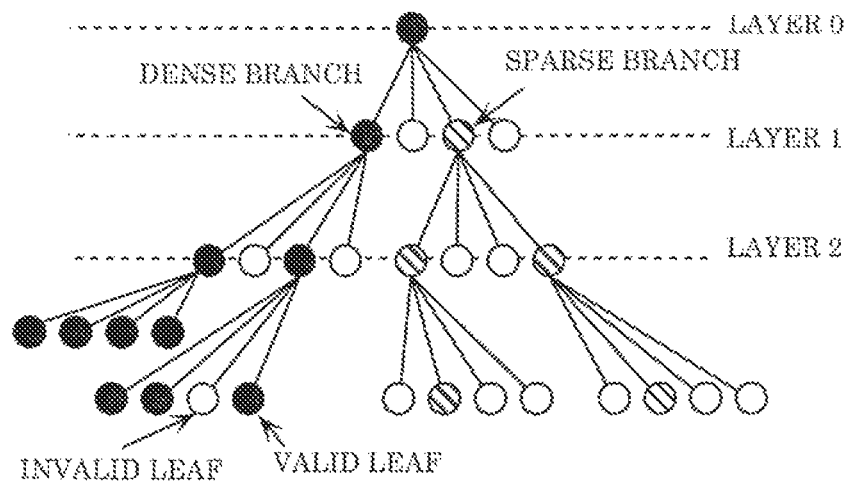
FIG. 88 is a diagram illustrating an example of a tree structure according to Embodiment 10.

In the present embodiment, another example of the method of encoding a tree structure such as an octree structure will be described. FIG. 88 is a diagram illustrating an example of a tree structure according to the present embodiment. Specifically, FIG. 88 shows an example of a quadtree structure.

A leaf including a three-dimensional point is referred to as a valid leaf, and a leaf including no three-dimensional point is referred to as an invalid leaf. A branch having the number of valid leaves greater than or equal to a threshold value is referred to as a dense branch. A branch having the number of valid leaves less than the threshold value is referred to as a sparse branch.

A three-dimensional data encoding device calculates the number of three-dimensional points (i.e., the number of valid leaves) included in each branch in a layer of a tree structure. FIG. 88 shows an example in which a threshold value is 5. In this example, two branches are present in layer 1. Since the left branch includes seven three-dimensional points, the left branch is determined as a dense branch. Since the right branch includes two three-dimensional points, the right branch is determined as a sparse branch.

Figure 89:
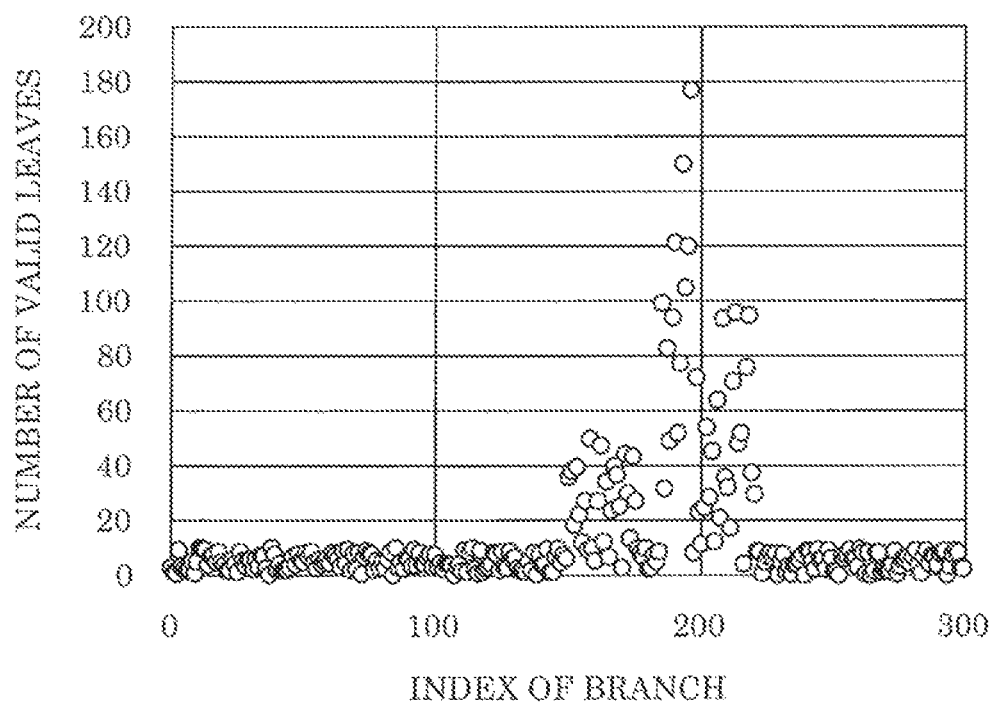
FIG. 89 is a graph showing an example of the number of valid leaves of each branch according to Embodiment 10.

FIG. 89 is a graph showing an example of the number of valid leaves (3D points) of each branch in layer 5. The horizontal axis of FIG. 89 indicates an index that is an identification number of the branch in layer 5. As clearly shown in FIG. 89, specific branches include many three-dimensional points, compared to other branches. Occupancy encoding is more effective for such dense branches than for sparse branches.

Figure 90:
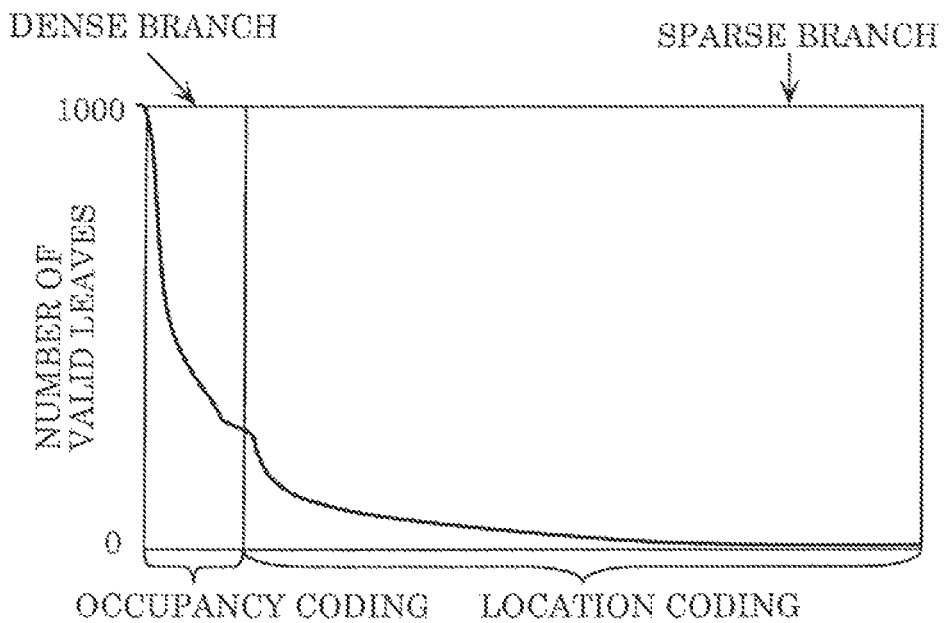
FIG. 90 is a diagram illustrating an application example of encoding schemes according to Embodiment 10.

The following describes how occupancy encoding and location encoding are applied. FIG. 90 is a diagram illustrating a relationship between encoding schemes to be applied and the number of three-dimensional points (the number of valid leaves) included in each branch in layer 5. As illustrated in FIG. 90, the three-dimensional data encoding device applies the occupancy encoding to dense branches, and applies the location encoding to sparse branches. As a result, it is possible to improve the coding efficiency.

Figure 91:
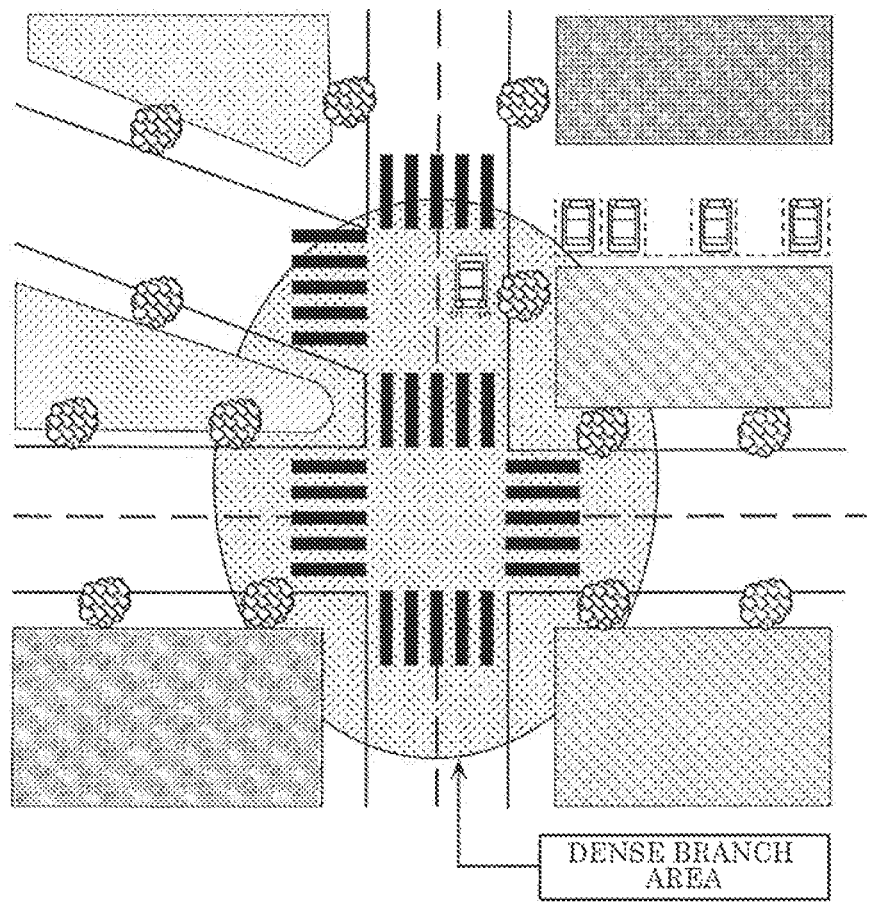
FIG. 91 is a diagram illustrating an example of a dense branch area according to Embodiment 10.

FIG. 91 is a diagram illustrating an example of a dense branch area in LiDAR data. As illustrated in FIG. 91, a three-dimensional point density calculated from the number of three-dimensional points included in each branch varies from area to area.

Separating dense three-dimensional points (branch) and sparse three-dimensional points (branch) brings the following advantage. A three-dimensional point density is higher with a decreasing distance to a LiDAR sensor. Consequently, separating branches in accordance with sparseness and denseness enables division in a distance direction. Such division is effective for specific applications. Using a method other than the occupancy encoding is effective for sparse branches.

In the present embodiment, the three-dimensional data encoding device separates an inputted three-dimensional point cloud into two or more three-dimensional point sub-clouds, and applies a different encoding method to each of the two or more three-dimensional point sub-clouds.

Figure 92:
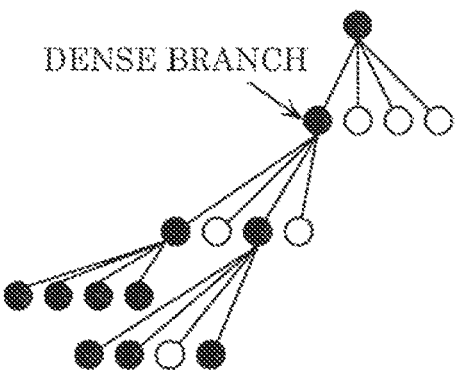
FIG. 92 is a diagram illustrating an example of a dense three-dimensional point cloud according to Embodiment 10.
Figure 93:
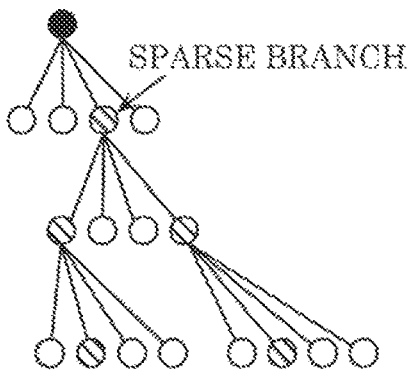
FIG. 93 is a diagram illustrating an example of a sparse three-dimensional point cloud according to Embodiment 10.

For example, the three-dimensional data encoding device separates an inputted three-dimensional point cloud into three-dimensional point sub-cloud A (dense three-dimensional point cloud: dense cloud) including a dense branch, and three-dimensional point sub-cloud B (sparse three-dimensional point cloud: sparse cloud). FIG. 92 is a diagram illustrating an example of three-dimensional point sub-cloud A (dense three-dimensional point cloud) including a dense branch which is separated from the tree structure illustrated in FIG. 88. FIG. 93 is a diagram illustrating an example of three-dimensional point sub-cloud B (sparse three-dimensional point cloud) including a sparse branch which is separated from the tree structure illustrated in FIG. 88.

Next, the three-dimensional data encoding device encodes three-dimensional point sub-cloud A using the occupancy encoding, and encodes three-dimensional point sub-cloud B using the location encoding.

It should be noted that although the example has been described above in which different encoding schemes (the occupancy encoding and the location encoding) are applied as different encoding methods, for example, the three-dimensional data encoding device may apply the same encoding scheme to three-dimensional point sub-cloud A and three-dimensional point sub-cloud B, and may use different parameters in encoding three-dimensional point sub-cloud A and three-dimensional point sub-cloud B.

Figure 94:
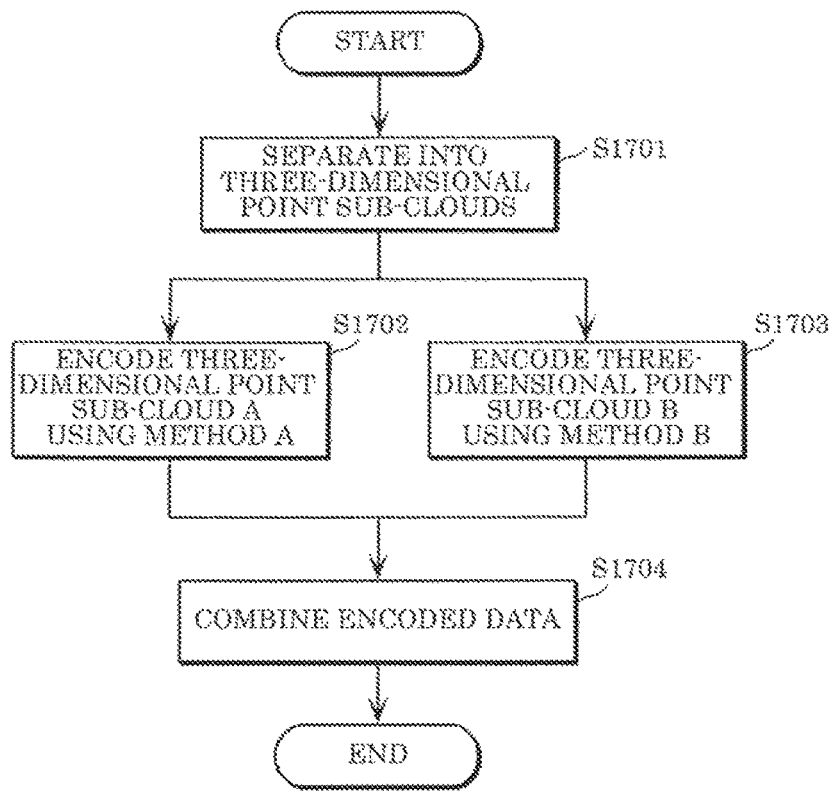
FIG. 94 is a flowchart of an encoding process according to Embodiment 10.

The following describes a procedure for a three-dimensional data encoding process performed by the three-dimensional data encoding device. FIG. 94 is a flowchart of a three-dimensional data encoding process performed by the three-dimensional data encoding device according to the present embodiment.

First, the three-dimensional data encoding device separates an inputted three-dimensional point cloud into three-dimensional point sub-clouds (S1701). The three-dimensional data encoding device may perform this separation automatically or based on information inputted by a user. For example, the user may specify a range of three-dimensional point sub-clouds. As for an example of automatic separation, for example, when input data is LiDAR data, the three-dimensional data encoding device performs the separation using distance information indicating a distance to each point cloud. Specifically, the three-dimensional data encoding device separates point clouds within a certain range from a measurement point, and point clouds outside the certain range. In addition, the three-dimensional data encoding device may perform the separation using information indicating, for example, important areas and unimportant areas.

Next, the three-dimensional data encoding device generates encoded data (encoded bitstream) by encoding three-dimensional point sub-cloud A using method A (S1702). Besides, the three-dimensional data encoding device generates encoded data by encoding three-dimensional point sub-cloud B using method B (S1703). It should be noted that the three-dimensional data encoding device may encode three-dimensional point sub-cloud B using method A. In this case, the three-dimensional data encoding device encodes three-dimensional point sub-cloud B using a parameter different from an encoding parameter used in encoding three-dimensional point sub-cloud A. For example, this parameter may be a quantization parameter. For example, the three-dimensional data encoding device encodes three-dimensional point sub-cloud B using a quantization parameter greater than a quantization parameter used in encoding three-dimensional point sub-cloud A. In this case, the three-dimensional data encoding device may append information indicating a quantization parameter used in encoding each of three-dimensional point sub-clouds, to a header of encoded data of the three-dimensional point sub-cloud.

Then, the three-dimensional data encoding device generates a bitstream by combining the encoded data obtained in step S1702 and the encoded data obtained in step S1703 (S1704).

Moreover, the three-dimensional data encoding device may encode, as header information of the bitstream, information for decoding each three-dimensional point sub-cloud. For example, the three-dimensional data encoding device may encode information as described below.

The header information may include information indicating the number of encoded three-dimensional sub-points. In this example, this information indicates 2.

The header information may include information indicating the number of three-dimensional points included in each three-dimensional point sub-cloud, and encoding methods. In this example, this information indicates the number of three-dimensional points included in three-dimensional point sub-cloud A, the encoding method (method A) applied to three-dimensional point sub-cloud A, the number of three-dimensional points included in three-dimensional point sub-cloud B, and the encoding method (method B) applied to three-dimensional point sub-cloud B.

The header information may include information for identifying the start position or end position of encoded data of each three-dimensional point sub-cloud.

Moreover, the three-dimensional data encoding device may encode three-dimensional point sub-cloud A and three-dimensional point sub-cloud B in parallel. Alternatively, the three-dimensional data encoding device may encode three-dimensional point sub-cloud A and three-dimensional point sub-cloud B in sequence.

A method of separation into three-dimensional point sub-clouds is not limited to the above method. For example, the three-dimensional data encoding device changes a separation method, performs encoding using each of separation methods, and calculates the coding efficiency of encoded data obtained using each separation method. Subsequently, the three-dimensional data encoding device selects a separation method having the highest coding efficiency from the separation methods. For example, the three-dimensional data encoding device may (i) separate three-dimensional point clouds in each of layers, (ii) calculate coding efficiency in each of the cases, (iii) select a separation method (i.e., a layer in which separation is performed) having the highest coding efficiency from separation methods, (iv) generate three-dimensional point sub-clouds using the selected separation method, and (v) perform encoding.

Moreover, when combining encoded data, the three-dimensional data encoding device may place encoding information of a more important three-dimensional point sub-cloud in a position closer to the head of a bitstream. Since this enables a three-dimensional data decoding device to obtain important information by only decoding the head of the bitstream, the three-dimensional data decoding device can obtain the important information quickly.

Figure 95:
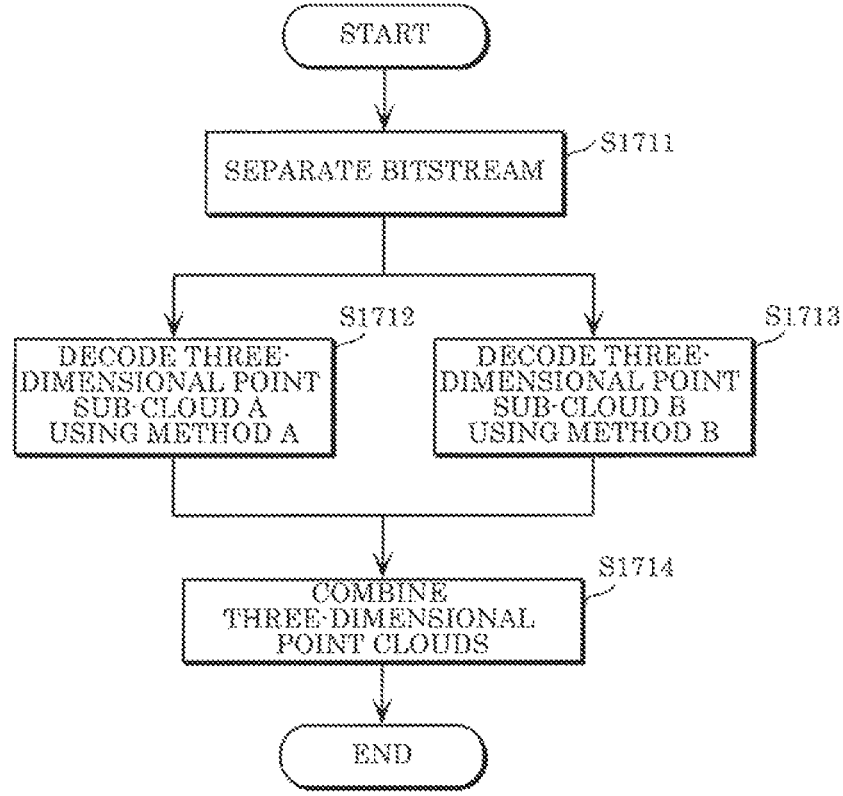
FIG. 95 is a flowchart of a decoding process according to Embodiment 10.

The following describes a procedure for a three-dimensional data decoding process performed by the three-dimensional data decoding device. FIG. 95 is a flowchart of a three-dimensional data decoding process performed by the three-dimensional data decoding device according to the present embodiment.

First, for example, the three-dimensional data decoding device obtains a bitstream generated by the above three-dimensional data encoding device. Next, the three-dimensional data decoding device separates, from the obtained bitstream, encoded data of three-dimensional point sub-cloud A and encoded data of three-dimensional point sub-cloud B (S1711). Specifically, the three-dimensional data decoding device decodes, from header information of the bitstream, information for decoding each three-dimensional point sub-cloud, and separates encoded data of each three-dimensional point sub-cloud using the information.

Then, the three-dimensional data decoding device obtains three-dimensional point sub-cloud A by decoding the encoded data of three-dimensional point sub-cloud A using method A (S1712). In addition, the three-dimensional data decoding device obtains three-dimensional point sub-cloud B by decoding the encoded data of three-dimensional point sub-cloud B using method B (S1713). After that, the three-dimensional data decoding device combines three-dimensional point sub-cloud A and three-dimensional point sub-cloud B (S1714).

It should be noted that the three-dimensional data decoding device may decode three-dimensional point sub-cloud A and three-dimensional point sub-cloud B in parallel. Alternatively, the three-dimensional data decoding device may decode three-dimensional point sub-cloud A and three-dimensional point sub-cloud B in sequence.

Moreover, the three-dimensional data decoding device may decode a necessary three-dimensional point sub-cloud. For example, the three-dimensional data decoding device may decode three-dimensional point sub-cloud A and need not decode three-dimensional point sub-cloud B. For example, when three-dimensional point sub-cloud A is a three-dimensional point cloud included in an important area of LiDAR data, the three-dimensional data decoding device decodes the three-dimensional point cloud included in the important area. Self-location estimation etc. in a vehicle or the like is performed using the three-dimensional point cloud included in the important area.

Figure 96:
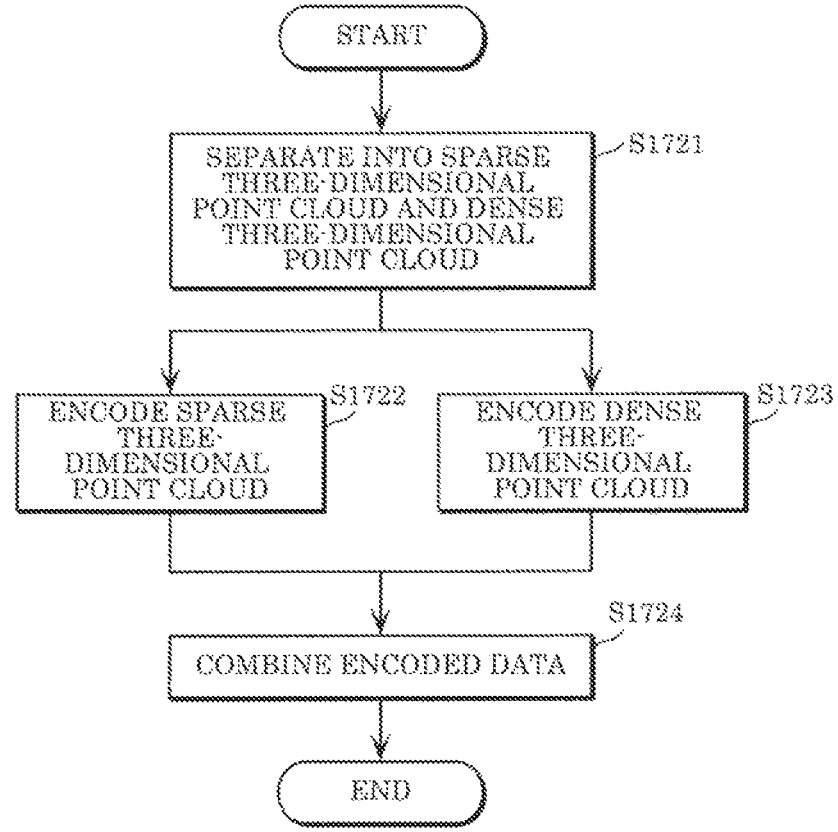
FIG. 96 is a flowchart of an encoding process according to Embodiment 10.

The following describes a specific example of an encoding process according to the present embodiment. FIG. 96 is a flowchart of a three-dimensional data encoding process performed by the three-dimensional data encoding device according to the present embodiment.

First, the three-dimensional data encoding device separates inputted three-dimensional points into a sparse three-dimensional point cloud and a dense three-dimensional point cloud (S1721). Specifically, the three-dimensional data encoding device counts the number of valid leaves of a branch in a layer of an octree structure. The three-dimensional data encoding device sets each branch as a dense branch or a sparse branch in accordance with the number of valid leaves of the branch. Subsequently, the three-dimensional data encoding device generates a three-dimensional point sub-cloud (a dense three-dimensional point cloud) obtained by gathering dense branches, and a three-dimensional point sub-cloud (a sparse three-dimensional point cloud) obtained by gathering sparse branches.

Next, the three-dimensional data encoding device generates encoded data by encoding the sparse three-dimensional point cloud (S1722). For example, the three-dimensional data encoding device encodes a sparse three-dimensional point cloud using the location encoding.

Furthermore, the three-dimensional data encoding device generates encoded data by encoding the dense three-dimensional point cloud (S1723). For example, the three-dimensional data encoding device encodes a dense three-dimensional point cloud using the occupancy encoding. Then, the three-dimensional data encoding device generates a bitstream by combining the encoded data of the sparse three-dimensional point cloud obtained in step S1722 and the encoded data of the dense three-dimensional point cloud obtained in step S1723 (S1724).

Moreover, the three-dimensional data encoding device may encode, as header information of the bitstream, information for decoding the sparse three-dimensional point cloud and the dense three-dimensional point cloud. For example, the three-dimensional data encoding device may encode information as described below.

The header information may include information indicating the number of encoded three-dimensional point sub-clouds. In this example, this information indicates 2.

The header information may include information indicating the number of three-dimensional points included in each three-dimensional point sub-cloud, and encoding methods. In this example, this information indicates the number of three-dimensional points included in the sparse three-dimensional point cloud, the encoding method (location encoding) applied to the sparse three-dimensional point cloud, the number of three-dimensional points included in the dense three-dimensional point cloud, and the encoding method (occupancy encoding) applied to the dense three-dimensional point cloud.

The header information may include information for identifying the start position or end position of encoded data of each three-dimensional point sub-cloud. In this example, this information indicates at least one of the start position and end position of the encoded data of the sparse three-dimensional point cloud or the start position and end position of the encoded data of the dense three-dimensional point cloud.

Moreover, the three-dimensional data encoding device may encode the sparse three-dimensional point cloud and the dense three-dimensional point cloud in parallel. Alternatively, the three-dimensional data encoding device may encode the sparse three-dimensional point cloud and the dense three-dimensional point cloud in sequence.

Figure 97:
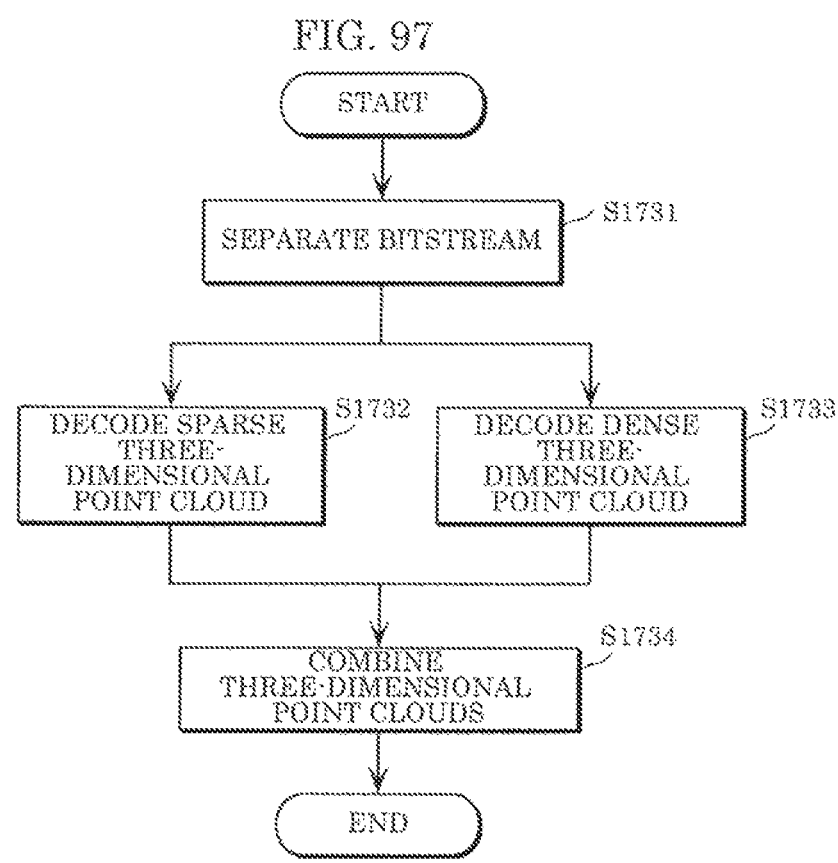
FIG. 97 is a flowchart of a decoding process according to Embodiment 10.

The following describes a specific example of a three-dimensional data decoding process. FIG. 97 is a flowchart of a three-dimensional data decoding process performed by the three-dimensional data decoding device according to the present embodiment.

First, for example, the three-dimensional data decoding device obtains a bitstream generated by the above three-dimensional data encoding device. Next, the three-dimensional data decoding device separates, from the obtained bitstream, encoded data of a sparse three-dimensional point cloud and encoded data of a dense three-dimensional point cloud (S1731). Specifically, the three-dimensional data decoding device decodes, from header information of the bitstream, information for decoding each three-dimensional point sub-cloud, and separates encoded data of each three-dimensional point sub-cloud using the information. In this example, the three-dimensional data decoding device separates, from the bitstream, the encoded data of the sparse three-dimensional point cloud and the encoded data of the dense three-dimensional point cloud using the header information.

Then, the three-dimensional data decoding device obtains the sparse three-dimensional point cloud by decoding the encoded data of the sparse three-dimensional point cloud (S1732). For example, the three-dimensional data decoding device decodes the sparse three-dimensional point cloud using location decoding for decoding encoded data obtained as a result of the location encoding.

In addition, the three-dimensional data decoding device obtains the dense three-dimensional point cloud by decoding the encoded data of the dense three-dimensional point cloud (S1733). For example, the three-dimensional data decoding device decodes the dense three-dimensional point cloud using occupancy decoding for decoding encoded data obtained as a result of the occupancy encoding.

After that, the three-dimensional data decoding device combines the sparse three-dimensional point cloud obtained in step S1732 and the dense three-dimensional point cloud obtained in step S1733 (S1734).

It should be noted that the three-dimensional data decoding device may decode the sparse three-dimensional point cloud and the dense three-dimensional point cloud in parallel. Alternatively, the three-dimensional data decoding device may decode the sparse three-dimensional point cloud and the dense three-dimensional point cloud in sequence.

Moreover, the three-dimensional data decoding device may decode part of necessary three-dimensional point sub-clouds. For example, the three-dimensional data decoding device may decode a dense three-dimensional point cloud and need not decode a sparse three-dimensional point cloud. For example, when a dense three-dimensional point cloud is a three-dimensional point cloud included in an important area of LiDAR data, the three-dimensional data decoding device decodes the three-dimensional point cloud included in the important area. Self-location estimation etc. in a vehicle or the like is performed using the three-dimensional point cloud included in the important area.

Figure 98:
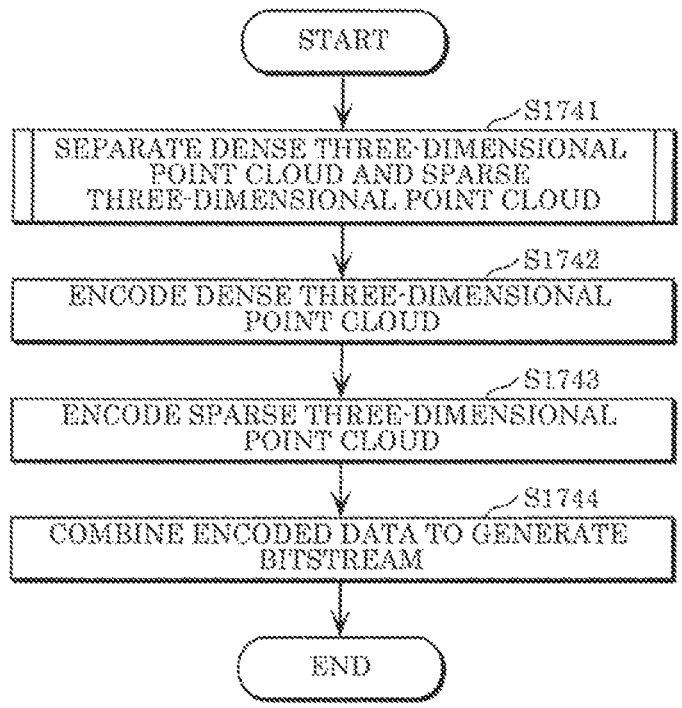
FIG. 98 is a flowchart of an encoding process according to Embodiment 10.

FIG. 98 is a flowchart of an encoding process according to the present embodiment. First, the three-dimensional data encoding separates an inputted three-dimensional point cloud into a sparse three-dimensional point cloud and a dense three-dimensional point cloud (S1741).

Next, the three-dimensional data encoding device generates encoded data by encoding the dense three-dimensional point cloud (S1742). Then, the three-dimensional data encoding device generates encoded data by encoding the sparse three-dimensional point cloud (S1743). Finally, the three-dimensional data encoding device generates a bitstream by combining the encoded data of the sparse three-dimensional point cloud obtained in step S1742 and the encoded data of the dense three-dimensional point cloud obtained in step S1743 (S1744).

Figure 99:
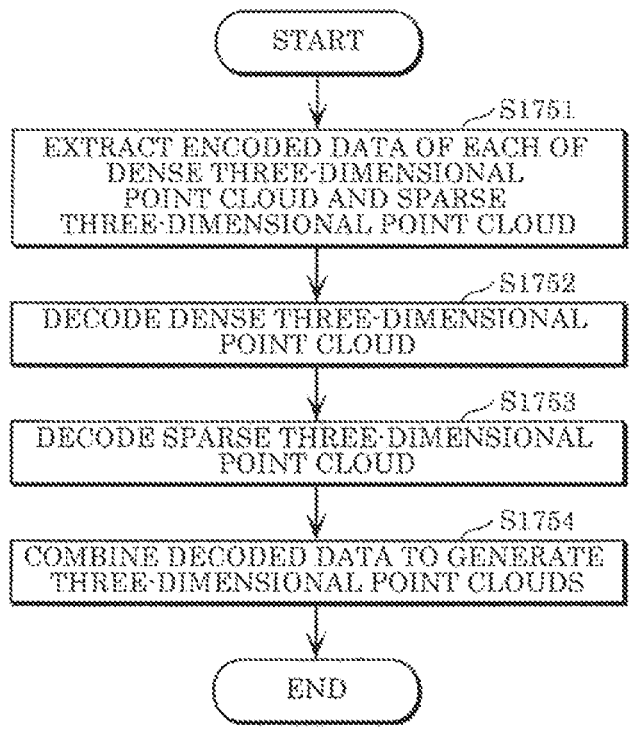
FIG. 99 is a flowchart of a decoding process according to Embodiment 10.

FIG. 99 is a flowchart of a decoding process according to the present embodiment. First, the three-dimensional data decoding device extracts, from a bitstream, encoded data of a sparse three-dimensional point cloud and encoded data of a dense three-dimensional (S1751). Next, the three-dimensional data decoding device obtains decoded data of the dense three-dimensional point cloud by decoding the encoded data of the dense three-dimensional point cloud (S1752). Then, the three-dimensional data decoding device obtains decoded data of the sparse three-dimensional point cloud by decoding the encoded data of the sparse three-dimensional point cloud (S1753). Finally, the three-dimensional data decoding device generates a three-dimensional point cloud by combining the decoded data of the dense three-dimensional point cloud obtained in step S1752 and the decoded data of the sparse three-dimensional point cloud obtained in step S1753 (S1754).

It should be noted that the three-dimensional data encoding device and the three-dimensional data decoding device may encode and decode any one of a dense three-dimensional point cloud and a sparse three-dimensional point cloud first. In addition, encoding processes or decoding processes may be performed in parallel using processors etc.

Moreover, the three-dimensional data encoding device may encode one of a dense three-dimensional point cloud and a sparse three-dimensional point cloud. For example, when a dense three-dimensional point cloud includes important information, the three-dimensional data encoding device extracts the dense three-dimensional point cloud and a sparse three-dimensional point cloud from an inputted three-dimensional point cloud, and encodes the dense three-dimensional point cloud but does not encode the sparse three-dimensional point cloud. This enables the three-dimensional data encoding device to append the important information to a stream while reducing an amount of bit. For example, when, between a server and a client, the client sends to the server a transmission request for three-dimensional point cloud information about the surroundings of the client, the server encodes important information about the surroundings of the client as a dense three-dimensional point cloud and transmits the encoded important information to the client. This enables the server to transmit the information requested by the client while reducing a network bandwidth.

Moreover, the three-dimensional data decoding device may decode one of a dense three-dimensional point cloud and a sparse three-dimensional point cloud. For example, when a dense three-dimensional point cloud includes important information, the three-dimensional data decoding device decodes the dense three-dimensional point cloud but does not decode a sparse three-dimensional point cloud. This enables the three-dimensional data decoding device to obtain necessary information while reducing a processing load of the decoding process.

Figure 100:
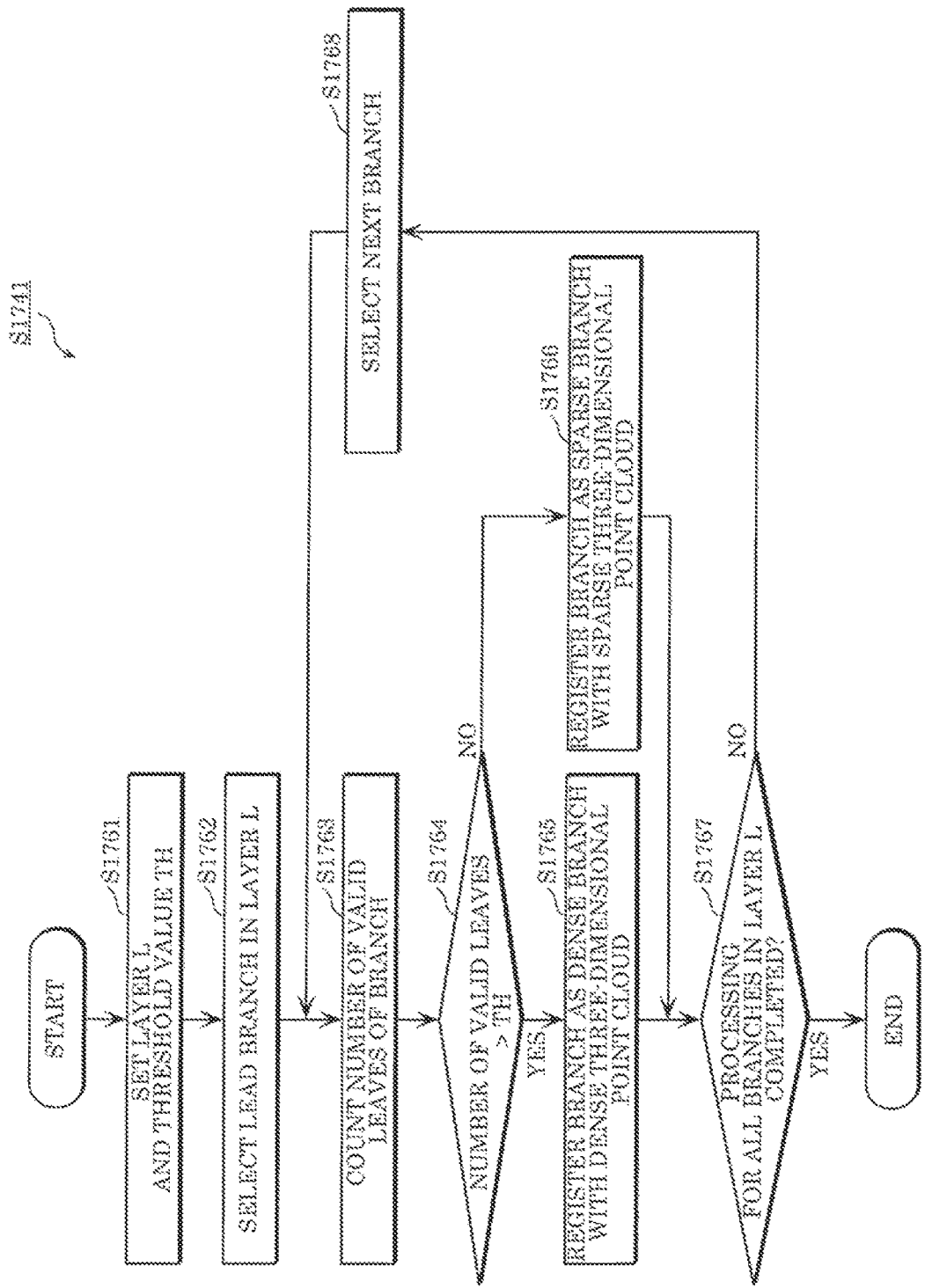
FIG. 100 is a flowchart of a process of separating three-dimensional points according to Embodiment 10.

FIG. 100 is a flowchart of the process of separating three-dimensional points (S1741) illustrated in FIG. 98. First, the three-dimensional data encoding device sets layer L and threshold value TH (S1761). It should be noted that the three-dimensional data encoding device may append information indicating set layer L and threshold value TH, to a bitstream. In other words, the three-dimensional data encoding device may generate a bitstream including information indicating set layer L and threshold value TH.

Next, the three-dimensional data encoding device moves a target position from a root of an octree to a lead branch in layer L. In other words, the three-dimensional data encoding device selects the lead branch in layer L as a current branch (S1762).

Then, the three-dimensional data encoding device counts the number of valid leaves of the current branch in layer L (S1763). When the number of the valid leaves of the current branch is greater than threshold value TH (YES in S1764), the three-dimensional data encoding device registers the current branch as a dense branch with a dense three-dimensional point cloud (S1765). In contrast, when the number of the valid leaves of the current branch is less than threshold value TH (NO in S1764), the three-dimensional data encoding device registers the current branch as a sparse branch with a sparse three-dimensional point cloud (S1766).

When processing of all branches in layer L is not completed (NO) in S1767), the three-dimensional data encoding device moves the target position to the next branch in layer L. In other words, the three-dimensional data encoding device selects the next branch in layer L as a current branch (S1768). And then, the three-dimensional data encoding device performs step S1763 and the subsequent steps on the selected next current branch.

The above-described process is repeated until the processing of all the branches in layer L is completed (YES in S1767).

It should be noted that although layer L and threshold value TH are preset in the above description, the present embodiment is not necessarily limited to this. For example, the three-dimensional data encoding device sets different combinations of layer L and threshold value TH, generates a dense three-dimensional point cloud and a sparse three-dimensional point cloud using each of the combinations, and encodes the dense three-dimensional point cloud and the sparse three-dimensional point cloud. The three-dimensional data encoding device finally encodes the dense three-dimensional point cloud and the sparse three-dimensional point cloud using, among the combinations, a combination of layer L and threshold value TH having the highest coding efficiency for encoded data generated. This makes it possible to improve the coding efficiency. Moreover, for example, the three-dimensional data encoding device may calculate layer L and threshold value TH. For example, the three-dimensional data encoding device may set, to layer L, a value half as much as the maximum value of layers included in a tree structure. Furthermore, the three-dimensional data encoding device may set, to threshold value TH, a value half as much as a total number of three-dimensional points included in the tree structure.

In the above description, the example has been shown in which the inputted three-dimensional point cloud is separated into two types of three-dimensional point cloud, that is, the dense three-dimensional point cloud and the sparse three-dimensional point cloud. The three-dimensional data encoding device, however, may separate the inputted three-dimensional point cloud into at least three types of three-dimensional point cloud. For example, when the number of valid leaves of a current branch is greater than or equal to first threshold value TH1, the three-dimensional data encoding device classifies the current branch into a first dense three-dimensional point cloud, and when the number of the valid leaves of the current branch is less than first threshold value TH1 and greater than or equal to second threshold value TH2, the three-dimensional data encoding device classifies the current branch into a second dense three-dimensional point cloud. When the number of the valid leaves of the current branch is less than second threshold value TH2 and greater than or equal to third threshold value TH3, the three-dimensional data encoding device classifies the current branch into a first sparse three-dimensional point cloud, and when the number of the valid leaves of the current branch is less than third threshold value TH3, the three-dimensional data encoding device classifies the current branch into a second sparse three-dimensional point cloud.

The following describes an example of a syntax of encoded data of a three-dimensional point cloud according to the present embodiment. FIG. 101 is a diagram illustrating an example of this syntax. pc_header( ) is, for example, header information of inputted three-dimensional points.

num_sub_pc illustrated in FIG. 101 indicates the number of three-dimensional point sub-clouds. numPoint[i] indicates the number of three-dimensional points included in the i-th three-dimensional point sub-cloud. coding_type[i] is coding type information indicating a coding type (an encoding scheme) applied to the i-th three-dimensional point sub-cloud. For example, coding_type=00 indicates that the location encoding has been applied. coding_type=01 indicates that the occupancy encoding has been applied. coding_type=10 or 11 indicates that another encoding scheme has been applied.

data_sub_cloud( ) is encoded data of the i-th three-dimensional point sub-cloud. coding_type_00_data is encoded data to which a coding type of 00 indicated by coding type has been applied, and is encoded data to which the location encoding has been applied, for example, coding_type_01_data is encoded data to which a coding type of 01 indicated by coding_type has been applied, and is encoded data to which the occupancy encoding has been applied, for example.

end_of_data is end information indicating the end of encoded data. For example, a constant bit sequence not used for encoded data is assigned to end_of_data. This enables the three-dimensional data decoding device to, for example, skip decoding of encoded data that need not be decoded, by searching a bitstream for a bit sequence of end_of_data.

It should be noted that the three-dimensional data encoding device may entropy encode the encoded data generated by the above-described method. For example, the three-dimensional data encoding device binarizes each value and performs arithmetic coding on the binarized value.

Although the example of the quadtree structure or the octree structure has been shown in the present embodiment, the present embodiment is not necessarily limited to this. The above-described method may be applied to an N-ary (N is an integer greater than or equal to 2) tree, such as a binary tree and a hexadecatree, or another tree structure.

Variation

In the above example, as illustrated in FIG. 92 and FIG. 93, the tree structure is encoded that includes the dense branch and the upper layer (the tree structure from the root of the whole tree structure to the root of the dense branch), and the tree structure is encoded that includes the sparse branch and the upper layer (the tree structure from the root of the whole tree structure to the root of the sparse branch). In the present variation, the three-dimensional data encoding device separates a dense branch and a sparse branch, and encodes the dense branch and the sparse branch. In other words, a tree structure to be encoded does not include a tree structure of an upper layer. For example, the three-dimensional data encoding device applies the occupancy encoding to a dense branch, and applies the location encoding to a sparse branch.

FIG. 102 is a diagram illustrating an example of a dense branch separated from the tree structure illustrated in FIG. 88. FIG. 103 is a diagram illustrating an example of a sparse branch separated from the tree structure illustrated in FIG. 88. In the present variation, the tree structures illustrated in FIG. 102 and FIG. 103 are encoded.

The three-dimensional data encoding device encodes information indicating a position of a branch instead of encoding a tree structure of an upper layer. For example, this information indicates a position of a root of a branch.

For example, the three-dimensional data encoding device encodes, as encoded data of a dense branch, layer information indicating a layer in which the dense branch is generated, and branch information indicating what number branch in the layer the dense branch is. This enables the three-dimensional data decoding device to decode the layer information and the branch information from a bitstream, and grasp which three-dimensional point cloud of what number branch in which layer the decoded dense branch is. Likewise, the three-dimensional data encoding device encodes, as encoded data of a sparse branch, layer information indicating a layer in which the sparse branch is generated, and branch information indicating what number branch in the layer the sparse branch is present, using these layer information and branch information.

This enables the three-dimensional data decoding device to decode the layer information and the branch information from a bitstream, and grasp which three-dimensional point cloud of what number branch in which layer the decoded sparse branch is, using these layer information and branch information. Accordingly, since it is possible to reduce overhead resulting from encoding information of a layer higher than the dense branch or the sparse branch, it is possible to improve the coding efficiency.

It should be noted that branch information may indicate a value assigned to each branch in a layer indicated by layer information. Moreover, branch information may indicate a value assigned to each node from a root of an octree as a starting point. In this case, layer information need not be encoded. Furthermore, the three-dimensional data encoding device may generate dense branches and sparse branches.

Figure 104:
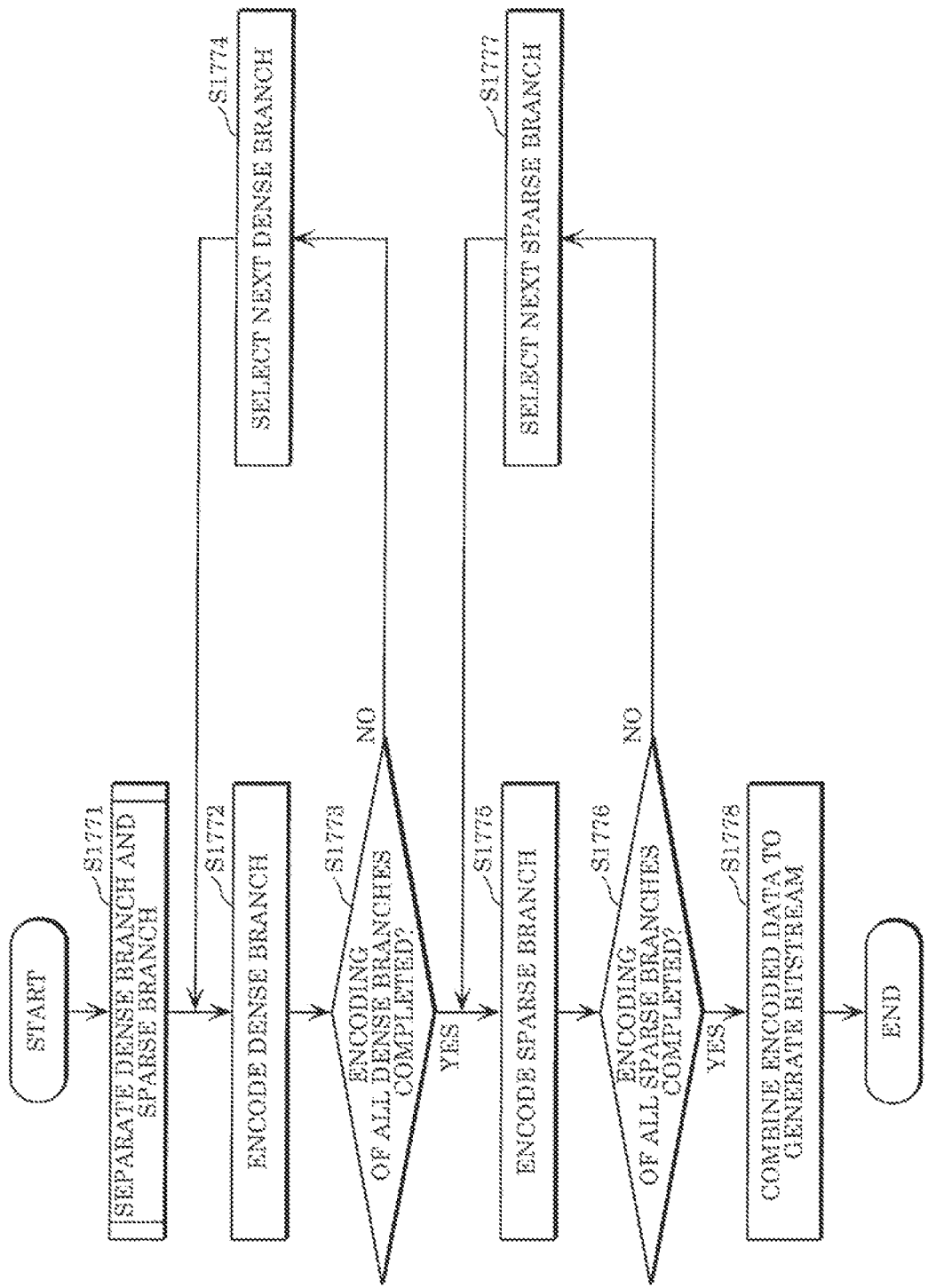
FIG. 104 is a flowchart of an encoding process according to a variation of Embodiment 10.

FIG. 104 is a flowchart of an encoding process according to the present variation. First, the three-dimensional data encoding device generates one or more sparse branches and one or more dense branches from an inputted three-dimensional point cloud (S1771).

Next, the three-dimensional data encoding device generates encoded data by encoding each of the one or more dense branches (S1772). Then, the three-dimensional data encoding device determines whether encoding of all the dense branches generated in step S1771 is completed (S1774).

When the encoding of all the dense branches is not completed (NO in S1773), the three-dimensional data encoding device selects the next dense branch (S1774) and generates encoded data by encoding the selected dense branch (S1772).

On the other hand, when the encoding of all the dense branches is completed (YES in S1773), the three-dimensional data encoding device generates encoded data by encoding each of the one or more sparse branches (S1775). Next, the three-dimensional data encoding device determines whether encoding of all the sparse branches generated in step S1771 is completed (S1776).

When the encoding of all the sparse branches is not completed (NO in S1776), the three-dimensional data encoding device selects the next sparse branch (S1777) and generates encoded data by encoding the selected sparse branch (S1775).

On the other hand, when the encoding of all the sparse branches is completed (YES in S1776), the three-dimensional data encoding device combines the encoded data generated in steps S1772 and S1775 to generate a bitstream (S1778).

Figure 105:
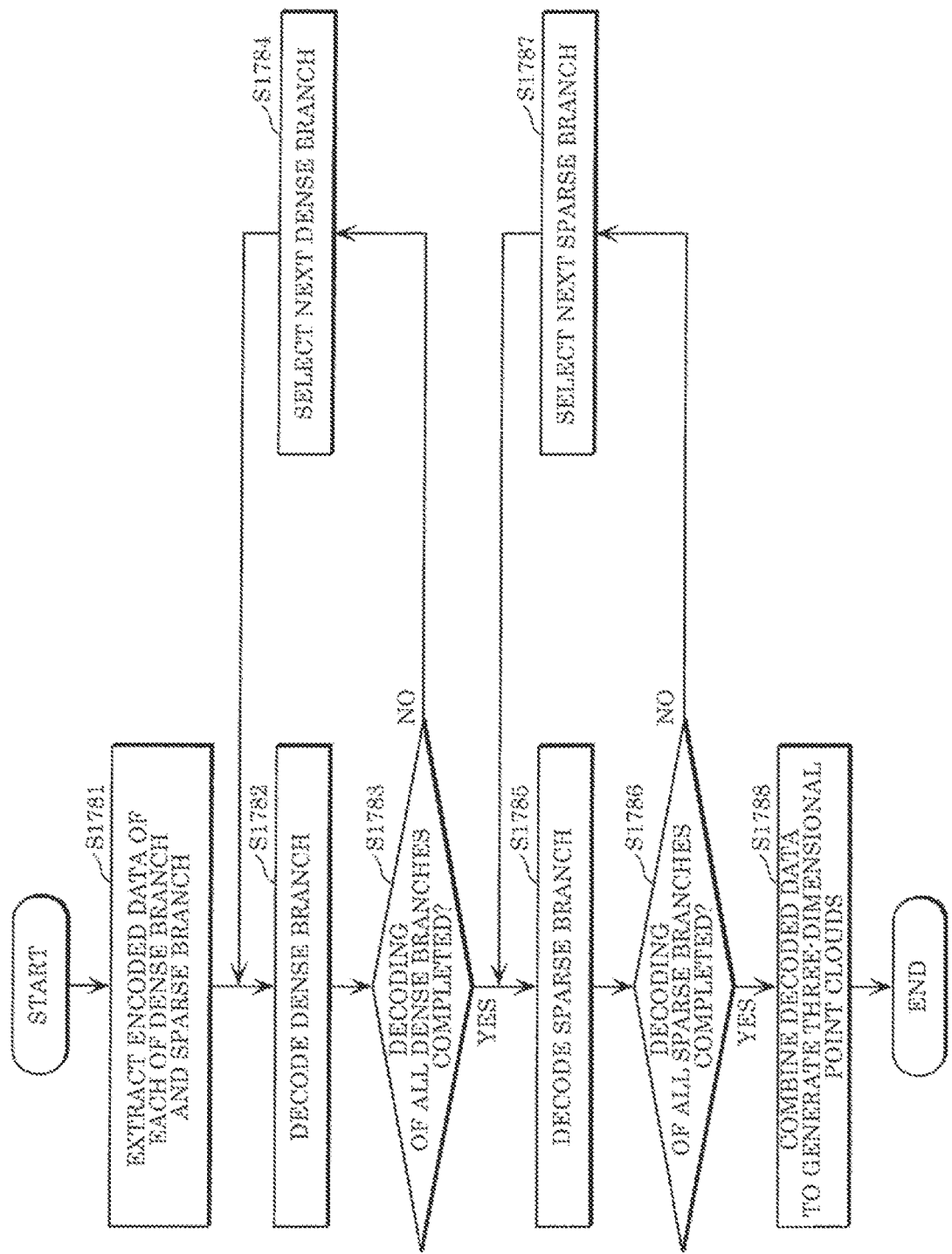
FIG. 105 is a flowchart of a decoding process according to the variation of Embodiment 10.

FIG. 105 is a flowchart of a decoding process according to the present variation. First, the three-dimensional data decoding device extracts one or more encoded data items of respective dense branches, and one or more encoded data items of respective sparse branches, from a bitstream (S1781). Next, the three-dimensional data decoding device obtains decoded data of each of the dense branches by decoding the encoded data of the dense branch (S1782).

Then, the three-dimensional data decoding device determines whether decoding of the encoded data items of all the dense branches extracted in step S1781 is completed (S1783). When the decoding of the encoded data items of all the dense branches is not completed (NO in S1783), the three-dimensional data decoding device selects the encoded data of the next dense branch (S1784) and obtains decoded data of the dense branch by decoding the selected encoded data of the dense branch (S1782).

On the other hand, when the decoding of the encoded data items of all the dense branches is completed (YES in S1783), the three-dimensional data decoding device obtains decoded data of each of the sparse branches by decoding the encoded data of the sparse branch (S1785).

After that, the three-dimensional data decoding device determines whether decoding of the encoded data items of all the sparse branches extracted in step S1781 is completed (S1786). When the decoding of the encoded data items of all the sparse branches is not completed (NO in S1786), the three-dimensional data decoding device selects the encoded data of the next sparse branch (S1787) and obtains decoded data of the sparse branch by decoding the selected encoded data of the sparse branch (S1785).

On the other hand, when the decoding of the encoded data items of all the sparse branches is completed (YES in S1786), the three-dimensional data decoding device combines the decoded data obtained in steps S1782 and S1785 to generate a three-dimensional point cloud (S1788).

It should be noted that the three-dimensional data encoding device and the three-dimensional data decoding device may encode and decode any one of a dense branch and a sparse branch first. In addition, encoding processes or decoding processes may be performed in parallel using processors etc.

Moreover, the three-dimensional data encoding device may encode one of a dense branch and a sparse branch. In addition, the three-dimensional data encoding device may encode part of dense branches. For example, when a specific dense branch includes important information, the three-dimensional data encoding device extracts dense branches and sparse branches from an inputted three-dimensional point cloud, and encodes the dense branch including the important information but does not encode the other dense branches and sparse branches. This enables the three-dimensional data encoding device to append the important information to a stream while reducing an amount of bit. For example, when, between a server and a client, the client sends to the server a transmission request for three-dimensional point cloud information about the surroundings of the client, the server encodes important information about the surroundings of the client as a dense branch and transmits the important information to the client. This enables the server to transmit the information requested by the client while reducing a network bandwidth.

Moreover, the three-dimensional data decoding device may decode one of a dense branch and a sparse branch. In addition, the three-dimensional data decoding device may decode part of dense branches. For example, when a specific dense branch includes important information, the three-dimensional data decoding device decodes the specific dense branch but does not decode other dense branches and sparse branches. This enables the three-dimensional data decoding device to obtain necessary information while reducing a processing load of the decoding process.

Figure 106:
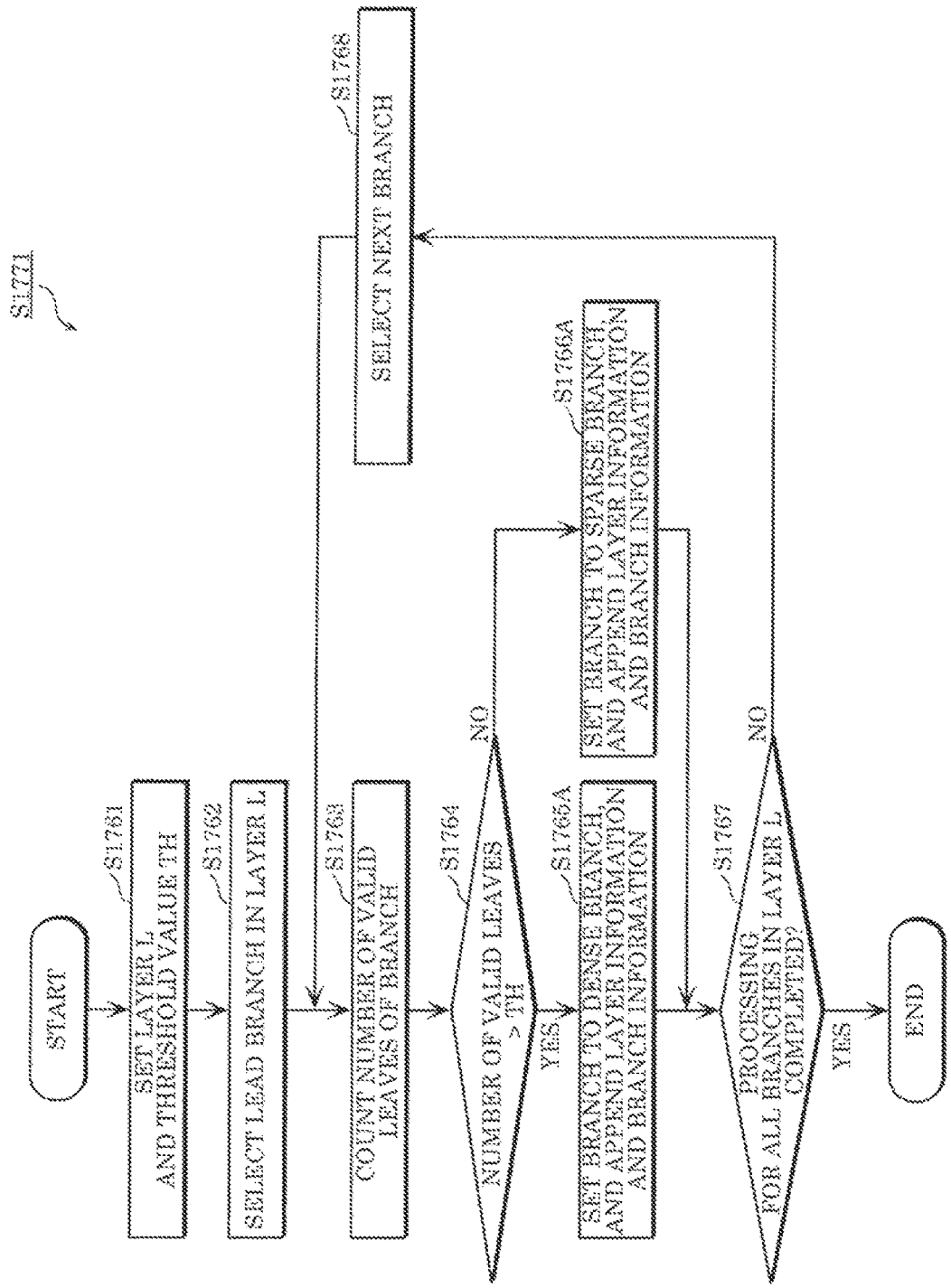
FIG. 106 is a flowchart of a process of separating three-dimensional points according to the variation of Embodiment 10.

FIG. 106 is a flowchart of the process of separating three-dimensional points (S1771) illustrated in FIG. 104. First, the three-dimensional data encoding device sets layer L and threshold value TH (S1761). It should be noted that the three-dimensional data encoding device may append information indicating set layer L and threshold value TH, to a bitstream.

Next, the three-dimensional data encoding device selects a lead branch in layer L as a current branch (S1762). Then, the three-dimensional data encoding device counts the number of valid leaves of the current branch in layer L (S1763). When the number of the valid leaves of the current branch is greater than threshold value TH (YES in S1764), the three-dimensional data encoding device sets the current branch as a dense branch, and appends layer information and branch information to a bitstream (S1765A). On the other hand, when the number of the valid leaves of the current branch is less than threshold value TH (NO in S1764), the three-dimensional data encoding device sets the current branch as a sparse branch, and appends layer information and branch information to a bitstream (S1766A).

When processing of all branches in layer L is not completed (NO in S1767), the three-dimensional data encoding device selects the next branch in layer L as a current branch (S1768). And then, the three-dimensional data encoding device performs step S1763 and the subsequent steps on the selected next current branch. The above-described process is repeated until the processing of all the branches in layer L is completed (YES in S1767).

It should be noted that although layer L and threshold value TH are preset in the above description, the present disclosure is not necessarily limited to this. For example, the three-dimensional data encoding device sets different combinations of layer L and threshold value TH, generates a dense branch and a sparse branch using each of the combinations, and encodes the dense branch and the sparse branch. The three-dimensional data encoding device finally encodes the dense branch and the sparse branch using, among the combinations, a combination of layer L and threshold value TH having the highest coding efficiency for encoded data generated. This makes it possible to improve the coding efficiency. Moreover, for example, the three-dimensional data encoding device may calculate layer L and threshold value TH. For example, the three-dimensional data encoding device may set, to layer L, a value half as much as the maximum value of layers included in a tree structure. Furthermore, the three-dimensional data encoding device may set, to threshold value TH, a value half as much as a total number of three-dimensional points included in the tree structure.

The following describes an example of a syntax of encoded data of a three-dimensional point cloud according to the present variation. FIG. 107 is a diagram illustrating an example of this syntax. The example of the syntax illustrated in FIG. 107 is obtained by appending layer_id[i] that is layer information and branch_id[i] that is branch information, to the example of the syntax illustrated in FIG. 101.

layer_id[i] indicates a layer number of the i-th three-dimensional point sub-cloud. branch_id[i] indicates a branch number in layer_id[i] of the i-th three-dimensional point sub-cloud.

layer_id[i] and branch_id[i] are layer information and branch information that indicate, for example, a position of a branch in an octree. For example, layer_id[i]=2 and branch_id[i]=5 indicate that the i-th branch is the fifth branch in layer 2.

It should be noted that the three-dimensional data encoding device may entropy encode the encoded data generated by the above-described method. For example, the three-dimensional data encoding device binarizes each value and performs arithmetic coding on the binarized value.

Although the example of the quadtree structure or the octree structure has been given in the present variation, the present disclosure is not necessarily limited to this. The above-described method may be applied to an N-ary (N is an integer greater than or equal to 2) tree, such as a binary tree and a hexadecatree, or another tree structure.

Figure 108:
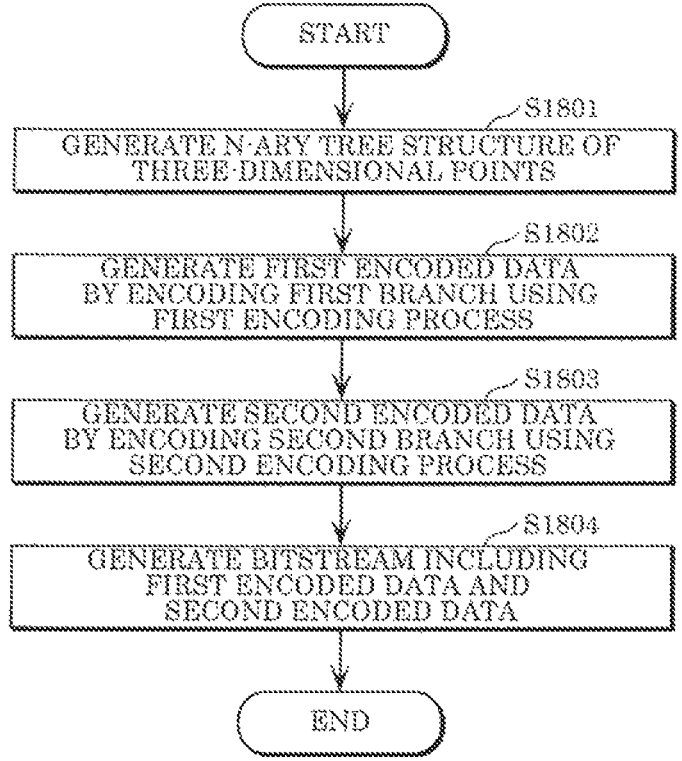
FIG. 108 is a flowchart of an encoding process according to Embodiment 10.

As stated above, the three-dimensional data encoding device according to the present embodiment performs the process illustrated in FIG. 108.

First, the three-dimensional data encoding device generates an N-ary (N is an integer greater than or equal to 2) tree structure of three-dimensional points included in three-dimensional data (S1801).

Next, the three-dimensional data encoding device generates first encoded data by encoding, using a first encoding process, a first branch having, as a root, a first node included in a first layer that is one of layers included in the N-ary tree structure (S1802).

In addition, the three-dimensional data encoding device generates second encoded data by encoding, using a second encoding process different from the first encoding process, a second branch having, as a root, a second node that is included in the first layer and different from the first node (S1803).

Then, the three-dimensional data encoding device generates a bitstream including the first encoded data and the second encoded data (S1804).

Since this enables the three-dimensional data encoding device to apply an encoding process suitable for each branch included in the N-ary tree structure, it is possible to improve the coding efficiency.

For example, the number of three-dimensional points included in the first branch is less than a predetermined threshold value, and the number of three-dimensional points included in the second branch is greater than the threshold value. In other words, when the number of three-dimensional points included in a current branch is less than a threshold value, the three-dimensional data encoding device sets the current branch as the first branch, and when the number of three-dimensional points included in the current branch is greater than the threshold value, the three-dimensional data encoding device sets the current branch as the second branch.

For example, the first encoded data includes first information indicating that a first N-ary tree structure of first three-dimensional points included in the first branch is expressed using a first formula. The second encoded data includes second information indicating that a second N-ary tree structure of second three-dimensional points included in the second branch is expressed using a second formula. In other words, the first encoding process and the second encoding process differ in encoding scheme.

For example, the location encoding is used in the first encoding process, and the occupancy encoding is used in the second encoding process. In other words, the first information includes pieces of three-dimensional point information each of which is associated with a corresponding one of the first three-dimensional points. Each of the pieces of three-dimensional point information includes an index associated with each of layers in the first N-ary tree structure. Each of the indexes indicates, among N sub-blocks belonging to a corresponding one of the layers, a sub-block to which a corresponding one of the first three-dimensional points belongs. The second information includes pieces of 1-bit information each of which is associated with a corresponding one of sub-blocks belonging to layers in the second N-ary tree structure, and indicates whether a three-dimensional point is present in the corresponding sub-block.

For example, a quantization parameter used in the second encoding process is different from a quantization parameter used in the first encoding process. In other words, the first encoding process and the second encoding process are identical in encoding scheme, but differ in parameter for use.

For example, as illustrated in FIG. 92 and FIG. 93, in the encoding of the first branch, the three-dimensional data encoding device encodes, using the first encoding process, the tree structure including the first branch and the tree structure from the root of the N-ary tree structure to the first node, and in the encoding of the second branch, the three-dimensional data encoding device encodes, using the second encoding process, the tree structure including the second branch and the tree structure from the root of the N-ary tree structure to the second node.

For example, the first encoded data includes encoded data of the first branch, and third information indicating a position of the first node in the N-ary tree structure. The second encoded data includes encoded data of the second branch, and fourth information indicating a position of the second node in the N-ary tree structure.

For example, the third information includes information (layer information) indicating the first layer, and information (branch information) indicating which one of nodes included in the first layer the first node is. The fourth information includes the information (layer information) indicating the first layer, and information (branch information) indicating which one of nodes included in the first layer the second node is.

For example, the first encoded data includes information (numPoint) indicating the number of three-dimensional points included in the first branch, and the second encoded data includes information (numPoint) indicating the number of three-dimensional points included in the second branch.

For example, the three-dimensional data encoding device includes a processor and memory, and the processor performs the above process using the memory.

Figure 109:
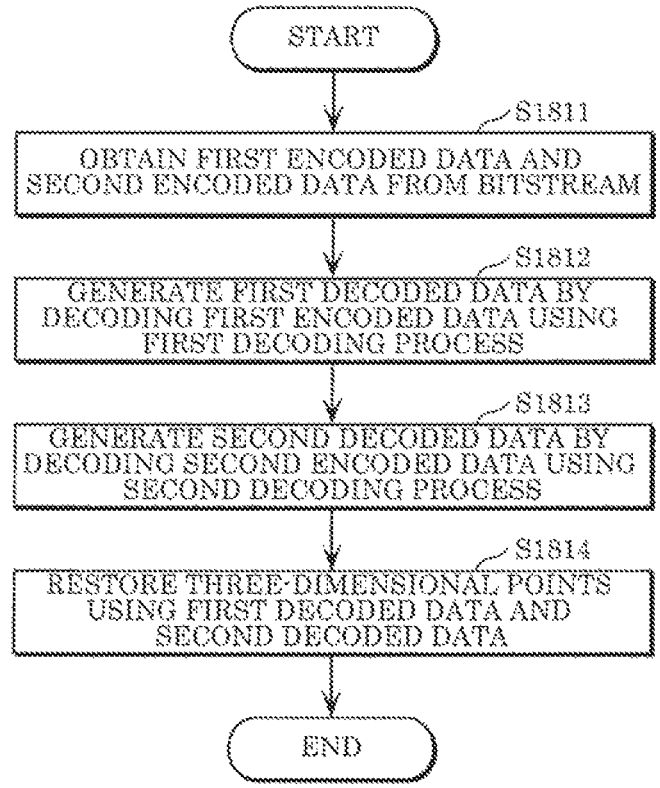
FIG. 109 is a flowchart of a decoding process according to Embodiment 10.

The three-dimensional data decoding device according to the present embodiment performs the process illustrated in FIG. 109.

First, the three-dimensional data decoding device obtains, from a bitstream, first encoded data obtained by encoding a first branch having, as a root, a first node included in a first layer that is one of layers included in an N-ary (N is an integer greater than or equal to 2) tree structure of three-dimensional points, and second encoded data obtained by encoding a second branch having, as a root, a second node that is included in the first layer and different from the first node (S1811).

Next, the three-dimensional data decoding device generates first decoded data of the first branch by decoding the first encoded data using a first decoding process (S1812).

In addition, the three-dimensional data decoding device generates second decoded data of the second branch by decoding the second encoded data using a second decoding process different from the first decoding process (S1813).

Then, the three-dimensional data decoding device restores three-dimensional points using the first decoded data and the second decoded data (S1814). For example, these three-dimensional points include three-dimensional points indicated by the first decoded data, and three-dimensional points indicated by the second decoded data.

This enables the three-dimensional data decoding device to decode the bitstream for which the coding efficiency is improved.

For example, the number of three-dimensional points included in the first branch is less than a predetermined threshold value, and the number of three-dimensional points included in the second branch is greater than the threshold value.

For example, the first encoded data includes first information indicating that a first N-ary tree structure of first three-dimensional points included in the first branch is expressed using a first formula. The second encoded data includes second information indicating that a second N-ary tree structure of second three-dimensional points included in the second branch is expressed using a second formula. In other words, the first decoding process and the second decoding process differ in encoding scheme (decoding scheme).

For example, the location encoding is used for the first encoded data, and the occupancy encoding is used for the second encoded data. In other words, the first information includes pieces of three-dimensional point information each of which is associated with a corresponding one of the first three-dimensional points. Each of the pieces of three-dimensional point information includes an index associated with each of layers in the first N-ary tree structure. Each of the indexes indicates, among N sub-blocks belonging to a corresponding one of the layers, a sub-block to which a corresponding one of the first three-dimensional points belongs. The second information includes pieces of 1-bit information each of which is associated with a corresponding one of sub-blocks belonging to layers in the second N-ary tree structure, and indicates whether a three-dimensional point is present in the corresponding sub-block.

For example, a quantization parameter used in the second decoding process is different from a quantization parameter used in the first decoding process. In other words, the first decoding process and the second decoding process are identical in encoding scheme (decoding scheme), but differ in parameter for use.

For example, as illustrated in FIG. 92 and FIG. 93, in the decoding of the first branch, the three-dimensional data decoding device decodes, using the first decoding process, the tree structure including the first branch and the tree structure from the root of the N-ary tree structure to the first node, and in the decoding of the second branch, the three-dimensional data decoding device decodes, using the second decoding process, the tree structure including the second branch and the tree structure from the root of the N-ary tree structure to the second node.

For example, the first encoded data includes encoded data of the first branch, and third information indicating a position of the first node in the N-ary tree structure. The second encoded data includes encoded data of the second branch, and fourth information indicating a position of the second node in the N-ary tree structure.

For example, the third information includes information (layer information) indicating the first layer, and information (branch information) indicating which one of nodes included in the first layer the first node is. The fourth information includes the information (layer information) indicating the first layer, and information (branch information) indicating which one of nodes included in the first layer the second node is.

For example, the first encoded data includes information (numPoint) indicating the number of three-dimensional points included in the first branch, and the second encoded data includes information (numPoint) indicating the number of three-dimensional points included in the second branch.

For example, the three-dimensional data decoding device includes a processor and memory, and the processor performs the above process using the memory.

A three-dimensional data encoding device, a three-dimensional data decoding device, and the like according to the embodiments of the present disclosure have been described above, but the present disclosure is not limited to these embodiments.

Note that each of the processors included in the three-dimensional data encoding device, the three-dimensional data decoding device, and the like according to the above embodiments is typically implemented as a large-scale integrated (LSI) circuit, which is an integrated circuit (IC). These may take the form of individual chips, or may be partially or entirely packaged into a single chip.

Such IC is not limited to an LSI, and thus may be implemented as a dedicated circuit or a general-purpose processor. Alternatively, a field programmable gate array (FPGA) that allows for programming after the manufacture of an LSI, or a reconfigurable processor that allows for reconfiguration of the connection and the setting of circuit cells inside an LSI may be employed.

Moreover, in the above embodiments, the structural components may be implemented as dedicated hardware or may be realized by executing a software program suited to such structural components. Alternatively, the structural components may be implemented by a program executor such as a CPU or a processor reading out and executing the software program recorded in a recording medium such as a hard disk or a semiconductor memory.

The present disclosure may also be implemented as a three-dimensional data encoding method, a three-dimensional data decoding method, or the like executed by the three-dimensional data encoding device, the three-dimensional data decoding device, and the like.

Also, the divisions of the functional blocks shown in the block diagrams are mere examples, and thus a plurality of functional blocks may be implemented as a single functional block, or a single functional block may be divided into a plurality of functional blocks, or one or more functions may be moved to another functional block. Also, the functions of a plurality of functional blocks having similar functions may be processed by single hardware or software in a parallelized or time-divided manner.

Also, the processing order of executing the steps shown in the flowcharts is a mere illustration for specifically describing the present disclosure, and thus may be an order other than the shown order. Also, one or more of the steps may be executed simultaneously (in parallel) with another step.

A three-dimensional data encoding device, a three-dimensional data decoding device, and the like according to one or more aspects have been described above based on the embodiments, but the present disclosure is not limited to these embodiments. The one or more aspects may thus include forms achieved by making various modifications to the above embodiments that can be conceived by those skilled in the art, as well forms achieved by combining structural components in different embodiments, without materially departing from the spirit of the present disclosure.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure is applicable to a three-dimensional data encoding device and a three-dimensional data decoding device.

What is claimed is:

1. A method for encoding there-dimensional data, comprising:
    encoding a first node, using a first encoding process, included in one of levels in an N-ary tree representing three-dimensional points, where N is greater than or equal to 2;
    encoding a second node, using a second encoding process, included in one of levels in the N-ary tree; and
    generating a bitstream including the first node encoded and the second node encoded, wherein
    the first encoding process is different from the second encoding process,
    a total number of one or more point positions in the first node is less than a predetermined threshold value,
    one or more point positions in the first node are expressed using a first formula, and
    one or more point positions in the second node are expressed using a second formula different from the first formula.

2. The method according to claim 1, wherein
    a total number of point positions in the second node is greater than the predetermined threshold value.

3. The method according to claim 1, wherein
    the first node indicates each position in each level corresponding to a point,
    the second node includes N child nodes, and
    the second node indicates child nodes, including a point, out of the N child nodes.

4. The method according to claim 1, wherein
    a quantization parameter used in the second encoding process is different from a quantization parameter used in the first encoding process.

5. The method according to claim 1, wherein
    the N is eight.

6. The method according to claim 1, further comprising:
    determining an integer of N from two, four or eight.

7. A method for decoding three-dimensional data, comprising:
    obtaining an N-ary tree representing three-dimensional points, where N is greater than or equal to 2;
    when the N-ary tree includes a first node, decoding the first node using a first decoding process;
    when the N-ary tree includes a second node, decoding the second node using a second decoding process; and
    decoding positions of the three-dimensional points using the first node decoded and the second node decoded, wherein
    the first decoding process is different from the second decoding process,
    a total number of point positions in the first node is less than a predetermined threshold value,
    one or more point positions in the first node are expressed using a first formula, and
    one or more point positions in the second node are expressed using a second formula different from the first formula.

8. The method according to claim 7, wherein
    a total number of point positions in the second node is greater than the predetermined threshold value.

9. The method according to claim 7, wherein
    the first node indicates each position in each level corresponding to a point,
    the second node includes N child nodes, and
    the second node indicates child nodes, including a point, out of the N child nodes.

10. The method according to claim 7, wherein
    a quantization parameter used in the second decoding process is different from a quantization parameter used in the first decoding process.

11. The method according to claim 7, wherein
    the N is eight.

12. The method according to claim 7, further comprising:
    determining an integer of N from two, four or eight.

13. A device for encoding three-dimensional data, comprising:
    a processor; and
    memory,
    wherein using the memory, the processor:
    encodes a first node, using a first encoding process, included in one of levels in an N-ary tree representing three-dimensional points, where N is greater than or equal to 2;
    encodes a second node, using a second encoding process, included in one of levels in the N-ary tree; and
    generates a bitstream including the first node encoded and the second node encoded, wherein
    the first encoding process is different from the second encoding process,
    a total number of one or more point positions in the first node is less than a predetermined threshold value,
    one or more point positions in the first node are expressed using a first formula, and
    one or more point positions in the second node are expressed using a second formula different from the first formula.

14. A device for decoding three-dimensional data, comprising:
    a processor; and
    memory,
    wherein using the memory, the processor:
    obtains an N-ary tree representing three-dimensional points, where N is greater than or equal to 2;
    when the N-ary tree includes a first node, decodes the first node using a first decoding process;
    when the N-ary tree includes a second node, decodes the second node using a second decoding process; and
    decodes positions of the three-dimensional points using the first node decoded and the second node decoded, wherein
    the first decoding process is different from the second decoding process,
    a total number of point positions in the first node is less than a predetermined threshold value,
    one or more point positions in the first node are expressed using a first formula, and one or more point positions in the second node are expressed using a second formula different from the first formula.

\* \* \* \* \*